US009646121B2

(12) United States Patent
Inoue

(10) Patent No.: US 9,646,121 B2
(45) Date of Patent: May 9, 2017

(54) SEMICONDUCTOR DEVICE SIMULATOR, SIMULATION METHOD, AND NON-TRANSITORY COMPUTER READABLE MEDIUM

(71) Applicant: Renesas Electronics Corporation, Kawasaki, Kanagawa (JP)

(72) Inventor: Hikari Inoue, Kanagawa (JP)

(73) Assignee: Renesas Electronics Corporation, Kanagawa (JP)

(*) Notice: Subject to any disclaimer, the term of this patent is extended or adjusted under 35 U.S.C. 154(b) by 651 days.

(21) Appl. No.: 14/218,520

(22) Filed: Mar. 18, 2014

(65) Prior Publication Data

US 2014/0288912 A1 Sep. 25, 2014

(30) Foreign Application Priority Data

Mar. 21, 2013 (JP) ................................ 2013-058308
Mar. 21, 2013 (JP) ................................ 2013-058309

(51) Int. Cl.

*G06F 17/50* (2006.01)
*H04L 29/08* (2006.01)
*A23L 5/30* (2016.01)
*G06K 9/00* (2006.01)

(52) U.S. Cl.

CPC ............ *G06F 17/5036* (2013.01); *A23L 5/30* (2016.08); *G06K 9/00771* (2013.01); *H04L 67/12* (2013.01)

(58) Field of Classification Search

None

See application file for complete search history.

(56) References Cited

U.S. PATENT DOCUMENTS

| | | | | |
|---|---|---|---|---|
| 8,226,557 B2 * | 7/2012 | Say | A61B 5/14532 | 600/365 |
| 8,255,026 B1 * | 8/2012 | Al-Ali | A61B 5/14551 | 600/310 |
| 2001/0036231 A1 * | 11/2001 | Easwar | G06T 9/007 | 375/240.19 |
| 2001/0056446 A1 | 12/2001 | Ishigami et al. | | |
| 2002/0040968 A1 * | 4/2002 | Black | A23L 5/30 | 250/393 |
| 2005/0165731 A1 * | 7/2005 | Funk | G05B 15/02 | |
| 2006/0202036 A1 * | 9/2006 | Wang | G06K 7/10722 | 235/462.07 |

(Continued)

OTHER PUBLICATIONS

Webench Designer of Texas Instruments, URL:http://www.tij.co.jp/tihome/jp/docs/homepage.tsp>, searched on Mar. 13, 2013, 1 [age.

*Primary Examiner* — Kandasamy Thangavelu
(74) *Attorney, Agent, or Firm* — Foley & Lardner LLP

(57) ABSTRACT

A web simulator includes a sensor database, an account database that stores access authorization table, an authentication processing unit that specifies access authorization of an access by reference to the access authorization table, a sensor registration and update unit that registers/updates sensor information in the sensor database in accordance with an instruction of access, and a simulation execution unit that executes simulation of a connection circuit in which a sensor indicated by the registered/updated sensor information and a semiconductor device having an analog front-end circuit are connected.

18 Claims, 122 Drawing Sheets

(56) References Cited

U.S. PATENT DOCUMENTS

| | | | | |
|---|---|---|---|---|
| 2007/0052809 | A1* | 3/2007 | Hammadou | H04N 7/185<br>348/211.3 |
| 2007/0274561 | A1* | 11/2007 | Rhoads | G06F 3/017<br>382/100 |
| 2008/0174678 | A1* | 7/2008 | Solomon | G02B 27/0025<br>348/231.99 |
| 2008/0285797 | A1* | 11/2008 | Hammadou | G06K 9/00771<br>382/103 |
| 2010/0146691 | A1* | 6/2010 | Chan | E03D 5/105<br>4/313 |
| 2013/0201316 | A1* | 8/2013 | Binder | H04L 67/12<br>348/77 |
| 2013/0278427 | A1* | 10/2013 | Setton | G08B 21/12<br>340/584 |

* cited by examiner

○: AUTHORIZED ×: NOT AUTHORIZED

| ACCOUNT ID | | | AUTHORIZATION | SENSOR DB REGISTRATION AND UPDATE | | BIAS CIRCUIT DB REGISTRATION AND UPDATE | | | BIAS CIRCUIT SELECTION AND UPDATE | | SIMULATION EXECUTION |
|---|---|---|---|---|---|---|---|---|---|---|---|
| | | | | COMPANY A | COMPANY B | COMMON | COMPANY A | COMPANY B | COMPANY A | COMPANY B | |
| SYSTEM DEVELOPER | | | AUTHORIZED TO REGISTER AND UPDATE ALL DB AND EXECUTE SIMULATION | ○ | ○ | ○ | ○ | ○ | ○ | ○ | ○ |
| SENSOR VENDOR | COMPANY A | A1 | AUTHORIZED TO REGISTER AND UPDATE SENSOR DB AND BIAS CIRCUIT DB OF COMPANY A, SELECT AND UPDATE BIAS CIRCUITS, AND EXECUTE SIMULATION | ○ | × | × | ○ | × | ○ | × | ○ |
| | COMPANY A | A2 | AUTHORIZED TO REGISTER AND UPDATE SENSOR DB OF COMPANY A, SELECT AND UPDATE BIAS CIRCUITS, AND EXECUTE SIMULATION | ○ | × | × | × | × | ○ | × | ○ |
| | COMPANY B | B1 | AUTHORIZED TO REGISTER AND UPDATE SENSOR DB AND BIAS CIRCUIT DB OF COMPANY B, SELECT AND UPDATE BIAS CIRCUITS, AND EXECUTE SIMULATION | × | ○ | × | × | ○ | × | ○ | ○ |
| | COMPANY B | B2 | AUTHORIZED TO SELECT AND UPDATE BIAS CIRCUITS OF COMPANY B, AND EXECUTE SIMULATION | × | × | × | × | × | × | ○ | ○ |
| USER | | | AUTHORIZED TO EXECUTE SIMULATION FOR ALL SENSORS | × | × | × | × | × | × | × | ○ |

| No | MODEL NAME | SENSOR TYPE | INPUT RANGE | | OUTPUT FORMAT |
|---|---|---|---|---|---|
| | | | MIN | MAX | |
| 1 | xxxxx1 | Pressure | 0Pa | 98.1kPa | DIFFERENTIAL VOLTAGE |
| 2 | xxxxx2 | Pressure | 0Pa | 10kPa | DIFFERENTIAL VOLTAGE |
| 3 | xxxxx3 | Pressure | 0Pa | 100kPa | VOLTAGE |
| 4 | xxxxx4 | Pressure | 0Pa | 10.0kPa | VOLTAGE |
| 5 | xxxxx5 | Gyro | 0deg/s | 300deg/s | VOLTAGE |
| 6 | xxxxx6 | Gyro | 0deg/s | 300deg/s | VOLTAGE |
| 7 | xxxxx7 | Hall Effect | 0T | 50mT | DIFFERENTIAL VOLTAGE |
| 8 | xxxxx8 | Hall Effect | 0T | 50mT | DIFFERENTIAL VOLTAGE |
| 9 | xxxxx9 | Photodiode | 0W | 3mW | VOLTAGE |
| 10 | xxxxx10 | Photodiode | 0.1W | 10mW | VOLTAGE |

FORMAT CONVERSION UNIT 440

D103

| No | SENSOR TYPE | MANUFACTURER | MODEL NAME | INPUT RANGE | | UNIT | OUTPUT FORMAT |
|---|---|---|---|---|---|---|---|
| | | | | MIN | MAX | | |
| 1 | Pressure | ZZZZZZZZ | xxxxx1 | 0 | 98.1k | Pa | DIFFERENTIAL VOLTAGE |
| 2 | Pressure | ZZZZZZZZ | xxxxx2 | 0 | 10k | Pa | DIFFERENTIAL VOLTAGE |
| 3 | Pressure | ZZZZZZZZ | xxxxx3 | 0 | 100k | Pa | VOLTAGE |
| 4 | Pressure | ZZZZZZZZ | xxxxx4 | 0 | 10.0k | Pa | VOLTAGE |
| 5 | Gyro | ZZZZZZZZ | xxxxx5 | 0 | 300 | deg/s | VOLTAGE |
| 6 | Gyro | ZZZZZZZZ | xxxxx6 | 0 | 300 | deg/s | VOLTAGE |
| 7 | Hall Effect | ZZZZZZZZ | xxxxx7 | 0 | 50m | T | DIFFERENTIAL VOLTAGE |
| 8 | Hall Effect | ZZZZZZZZ | xxxxx8 | 0 | 50m | T | DIFFERENTIAL VOLTAGE |
| 9 | Photodiode | ZZZZZZZZ | xxxxx9 | 0 | 3m | W | VOLTAGE |
| 10 | Photodiode | ZZZZZZZZ | xxxxx10 | 0.1 | 10m | W | VOLTAGE |

D102

| No | | 1 | 2 | 3 | 4 | 5 | 6 | 7 | 8 | 9 | 10 |
|---|---|---|---|---|---|---|---|---|---|---|---|
| MODEL NAME | | xxxxx1 | xxxxx2 | xxxxx3 | xxxxx4 | xxxxx5 | xxxxx6 | xxxxx7 | xxxxx8 | xxxxx9 | xxxxx10 |
| SENSOR TYPE | | Pressure | Pressure | Pressure | Pressure | Gyro | Gyro | Hall Effect | Hall Effect | Photodiode | Photodiode |
| OUTPUT FORMAT | | DIFFERENTIAL VOLTAGE | DIFFERENTIAL VOLTAGE | VOLTAGE | VOLTAGE | VOLTAGE | VOLTAGE | DIFFERENTIAL VOLTAGE | DIFFERENTIAL VOLTAGE | VOLTAGE | VOLTAGE |
| INPUT RANGE | MIN | 0 | 0 | 0 | 0 | 0 | 0 | 0 | 0 | 0 | 0.1 |
| | MAX | 98.1k | 10k | 100k | 10.0k | 300 | 300 | 50m | 50m | 3m | 10m |
| UNIT | | Pa | Pa | Pa | Pa | deg/s | deg/s | T | T | W | W |

FORMAT CONVERSION UNIT 440

D103

| No | SENSOR TYPE | MANUFACTURER | MODEL NAME | INPUT RANGE MIN | INPUT RANGE MAX | UNIT | OUTPUT FORMAT |
|---|---|---|---|---|---|---|---|
| 1 | Pressure | ZZZZZZZZ | xxxxx1 | 0 | 98.1k | Pa | DIFFERENTIAL VOLTAGE |
| 2 | Pressure | ZZZZZZZZ | xxxxx2 | 0 | 10k | Pa | DIFFERENTIAL VOLTAGE |
| 3 | Pressure | ZZZZZZZZ | xxxxx3 | 0 | 100k | Pa | VOLTAGE |
| 4 | Pressure | ZZZZZZZZ | xxxxx4 | 0 | 10.0k | Pa | VOLTAGE |
| 5 | Gyro | ZZZZZZZZ | xxxxx5 | 0 | 300 | deg/s | VOLTAGE |
| 6 | Gyro | ZZZZZZZZ | xxxxx6 | 0 | 300 | deg/s | VOLTAGE |
| 7 | Hall Effect | ZZZZZZZZ | xxxxx7 | 0 | 50m | T | DIFFERENTIAL VOLTAGE |
| 8 | Hall Effect | ZZZZZZZZ | xxxxx8 | 0 | 50m | T | DIFFERENTIAL VOLTAGE |
| 9 | Photodiode | ZZZZZZZZ | xxxxx9 | 0 | 3m | W | VOLTAGE |
| 10 | Photodiode | ZZZZZZZZ | xxxxx10 | 0.1 | 10m | W | VOLTAGE |

| No | MODEL NAME | SENSOR TYPE | UNIT OF MEASUREMENT | INPUT RANGE | | OUTPUT FORMAT | UNIT OF OUTPUT | ENVIRONMENTAL DEPENDENCE | RANGE OF DEPENDENCE | SENSOR CHARACTERISTICS | | | |
|---|---|---|---|---|---|---|---|---|---|---|---|---|---|
| | | | | MIN | MAX | | | | | X1 | Y1 | X2 | Y2 |
| 1 | xxxxx1 | Pressure | Pa | 0 | 98.1k | DIFFERENTIAL VOLTAGE | V | TEMPERATURE (℃) | -40 | 0 | 0 | 100m | 100m |
| 1 | xxxxx1 | Pressure | Pa | 0 | 98.1k | DIFFERENTIAL VOLTAGE | V | TEMPERATURE (℃) | 25 | 0 | 0 | 100m | 90m |
| 1 | xxxxx1 | Pressure | Pa | 0 | 98.1k | DIFFERENTIAL VOLTAGE | V | TEMPERATURE (℃) | 125 | 0 | 0 | 100m | 80m |
| 2 | xxxxx2 | PhotoTransistor | W | 0 | 200 | CURRENT | A | TEMPERATURE (℃) | 0 | 0 | 0 | 100m | 85m |
| 2 | xxxxx2 | PhotoTransistor | W | 0 | 200 | CURRENT | A | TEMPERATURE (℃) | 25 | 0 | 0 | 100m | 100m |
| 2 | xxxxx2 | PhotoTransistor | W | 0 | 200 | CURRENT | A | TEMPERATURE (℃) | 60 | 0 | 0 | 100m | 120m |
| 3 | xxxxx3 | PhotoDiode | W | 0 | 3m | CURRENT | A | DISTANCE (m) | 0.01 | 0 | 0 | 3m | 5000u |
| 3 | xxxxx3 | PhotoDiode | W | 0 | 3m | CURRENT | A | DISTANCE (m) | 0.1 | 0 | 0 | 3m | 500u |
| 3 | xxxxx3 | PhotoDiode | W | 0 | 3m | CURRENT | A | DISTANCE (m) | 1 | 0 | 0 | 3m | 50u |
| 4 | xxxxx4 | Infrared ray sensor | μm | 7 | 14 | VOLTAGE | V | PRESSURE (Pa) | 0.03 | 7 | 0 | 14 | 600m |
| 4 | xxxxx4 | Infrared ray sensor | μm | 7 | 14 | VOLTAGE | V | PRESSURE (Pa) | 1 | 7 | 0 | 14 | 20m |
| 4 | xxxxx4 | Infrared ray sensor | μm | 7 | 14 | VOLTAGE | V | PRESSURE (Pa) | 100 | 7 | 0 | 14 | 5m |

Fig. 107

SEMICONDUCTOR DEVICE SIMULATOR, SIMULATION METHOD, AND NON-TRANSITORY COMPUTER READABLE MEDIUM

CROSS-REFERENCE TO RELATED APPLICATIONS

This application is based upon and claims the benefit of priority from Japanese patent application No. 2013-058308, filed on Mar. 21, 2013 and Japanese patent application No. 2013-058309, filed on Mar. 21, 2013, the disclosure of which is incorporated herein in its entirety by reference.

BACKGROUND

The present invention relates to a semiconductor device simulator, a simulation method and a non-transitory computer readable medium, and it is suitably applicable to a simulator, a simulation method and a non-transitory computer readable medium for a semiconductor device having an analog front-end circuit, for example.

Sensors are increasingly employed in various equipments such as consumer products, industrial products and medical products because of improvement of usability, enlargement of ecosystem, penetration of health care, enhancement of security and the like. Factors behind this trend include the improved usability of a sensor device and the low voltage and the low power of an analog circuit which is essential to implement a sensor to allow system downsizing and cost reduction. There are various types of sensors including a temperature sensor, an infrared sensor, a photosensor and a shock sensor, and a circuit for processing a sensor signal is formed and characteristics are set in accordance with their principle of operation.

In such equipment, a control device such as a microcomputer performs control processing in accordance with a measurement result of a sensor. Because a measurement signal that is output from a sensor cannot be processed by a control device such as a microcomputer, analog front-end (AFE) processing such as amplification to a specified level and removal of noise is performed by an analog front-end circuit before input to the microcomputer. The analog front-end processing requires design according to the principle of operation and the characteristics of a sensor and further requires design know-how specific to analog, and therefore a dedicated AFE circuit or a dedicated IC has been developed for a specific sensor by narrowing down the principle of operation and the characteristics of a sensor to be processed.

As a design support tool for designing such an AFE circuit, a circuit simulator (which is also referred to simply as "simulator") has been used. Widely used circuit simulators are a stand alone simulator that executes simulation on a single computer and a web server simulator (which is referred to as "web simulator") that executes simulation on an online web server. For example, "WEBENCH Designer" of Texas Instruments is known as a web simulator according to related art (Internet <URL:http://www.tij.co.jp/tihome/jp/docs/homepage.tsp>, [Searched on Mar. 13, 2013]).

The "WEBENCH Designer" is a web simulator for a semiconductor device that includes an AFE circuit for a sensor. In the "WEBENCH Designer", simulation is performed after a user selects a sensor to be connected to an AFE circuit and then sets a physical quantity to be detected by the sensor. In the "WEBENCH Designer", the user can adjust the gain of an amplifier in the AFE circuit by using a simulation result as a reference.

Note that United States Patent Publication No. 2001/0056446 is also known as a web simulator for a semiconductor device according to related art.

SUMMARY

In the web simulator according to related art such as the "WEBENCH Designer" of Texas Instruments described above, various information about a sensor, which is a circuit to be simulated, are registered and managed in a database (storage unit). In such a system, a system developer (administrator) who is an administrator of a simulator generally accesses the database and registers or updates information related to the sensor.

However, in the web simulator according to related art, a person who is not so familiar with and not knowledgeable about a sensor to be registered, such as a system administrator, carries out writing, such as registration and update, in the database, which causes a problem that there is a possibility of writing incorrect sensor information.

Further, in the web simulator according to related art such as the "WEBENCH Designer" of Texas Instruments described above, a user needs to set detailed conditions for simulation in accordance with physical environmental conditions of a sensor. For example, in the case where the characteristics of a sensor vary depending on physical environmental conditions, a user needs to correct the characteristics of the sensor in accordance with the physical environmental conditions and executes simulation.

Therefore, it is difficult for a user who is not knowledgeable about a sensor to appropriately correct the characteristics of the sensor in accordance with the physical environmental conditions, which causes a problem of not being able to perform accurate simulation.

The other problems and novel features of the present invention will become apparent from the description of the specification and the accompanying drawings.

According to one embodiment, a semiconductor device simulator includes a sensor information storage unit, an account information storage unit, an access authorization specifying unit, a sensor writing unit, and a simulation execution unit.

The sensor information storage unit stores first sensor information belonging to a first access group and second sensor information belonging to a second access group. The account information storage unit stores first access authorization information permitting writing of the first sensor information to the first access group and denying writing of the second sensor information to the second access group for an account belonging to the first access group. The access authorization specifying unit specifies access authorization to the first access group and the second access group in accordance with an account of an accepted access by reference to the stored first access authorization information. The sensor writing unit writes the first sensor information to the first access group permitted to write based on the specified access authorization in accordance with the access. The simulation execution unit executes simulation of a circuit including a sensor indicated by the written first sensor information and a semiconductor device having an analog front-end circuit with a variable circuit configuration in accordance with the access.

According to another embodiment, a semiconductor device simulator includes a sensor information storage unit, a selection unit, and a simulation execution unit.

The sensor information storage unit stores a plurality of sensor characteristics of a sensor to operate under certain driving conditions and a plurality of different physical environmental conditions, the plurality of sensor characteristics respectively corresponding to the plurality of physical environmental conditions. The selection unit selects physical environmental conditions where simulation is to be performed from the plurality of physical environmental conditions. The simulation execution unit executes simulation of a circuit including a sensor having the sensor characteristics corresponding to the selected physical environmental conditions and a semiconductor device having an analog front-end circuit with a variable circuit configuration.

According to one embodiment described above, it is possible to prevent writing of incorrect sensor information. Further, according to another embodiment described above, it is possible to execute simulation with high accuracy.

BRIEF DESCRIPTION OF THE DRAWINGS

The above and other aspects, advantages and features will be more apparent from the following description of certain embodiments taken in conjunction with the accompanying drawings, in which:

FIG. 29 is a diagram showing an example of access authorization table according to the first embodiment;

FIG. 888 is a display image diagram of a display screen used in a simulation method of the web simulator according to the second embodiment;

FIG. 91A is a diagram to explain the operation of a simulation method of the web simulator according to the third embodiment;

FIG. 91B is a diagram to explain the operation of a simulation method of the web simulator according to the third embodiment;

FIG. 100 is a characteristic graph to explain an overview of a simulation method according to the fourth embodiment;

FIG. 101 is a functional block diagram of a web simulator according to the fourth embodiment;

FIG. 102 is a display image diagram of a display screen used in a simulation method of the web simulator according to the fourth embodiment;

FIG. 103 is a display image diagram of a display screen used in a simulation method of the web simulator according to the fourth embodiment;

FIG. 104 is a display image diagram of a display screen used in a simulation method of the web simulator according to the fourth embodiment;

FIG. 105 is a display image diagram of a display screen used in a simulation method of the web simulator according to the fourth embodiment;

FIG. 106 is a display image diagram of a display screen used in a simulation method of the web simulator according to the fourth embodiment;

FIG. 107 is a diagram showing an example of input data to be input to the web simulator according to the fourth embodiment;

FIG. 108 is a diagram of a setting system of a semiconductor device according to a fifth embodiment; and FIG. 109 is a flowchart showing a setting method of the semiconductor device according to the fifth embodiment.

DETAILED DESCRIPTION

First Embodiment

A first embodiment is described hereinafter with reference to the drawings. In this embodiment, in order to make optimum settings to a semiconductor device with a variable circuit configuration and circuit characteristics, simulation is performed for the same circuit as the semiconductor device.

Figure 1:
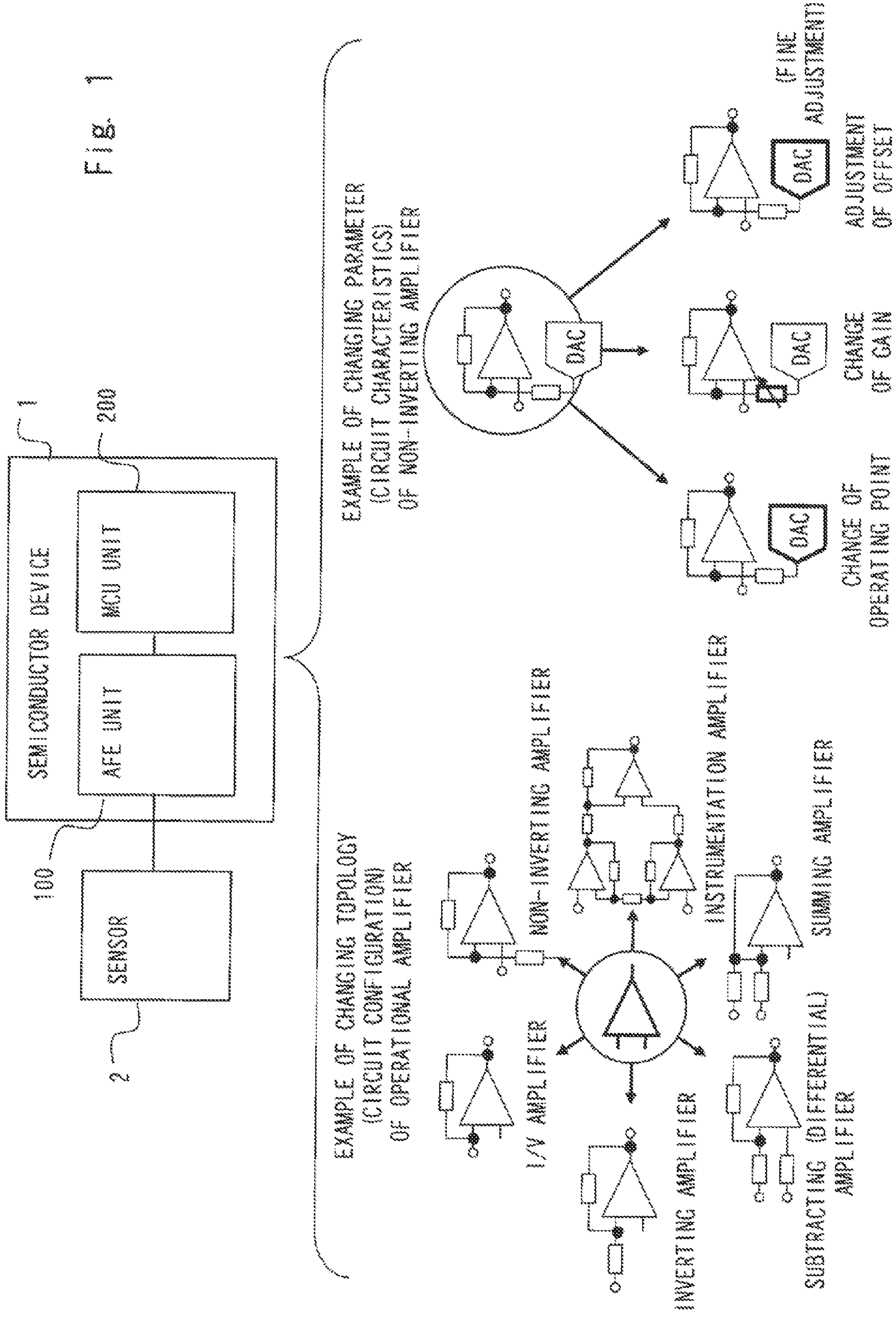
FIG. 1 is a diagram of a sensor system according to a first embodiment.

To help understanding of a simulator according to this embodiment, a semiconductor device that includes a circuit to be simulated is described firstly. FIG. 1 shows a configuration of a sensor system including a semiconductor device according to this embodiment.

As shown in FIG. 1, the sensor system includes a sensor 2 and a semiconductor device 1 that is connected to the sensor 2.

As the sensor 2, various sensors such as a current output sensor that outputs a current in accordance with a detection result, a voltage output sensor that outputs a voltage in accordance with a detection result, and a sensor that outputs a faint differential signal, in accordance with a detection result may be used.

The semiconductor device 1 includes a MCU unit 200 and an AFE unit 100. The semiconductor device 1 is a SoC (System-on-a-chip) on which a semiconductor chip of the MCU unit 200 and a semiconductor chip of the AFE unit 100 are integrated into one semiconductor device, for example. Note that the semiconductor device 1 may be one-chip semiconductor device including the MCU unit 200 and the AFE unit 100. Further, the semiconductor device 1 may be a semiconductor device including the MCU unit 200 only and a semiconductor device including the AFE unit 100 only. In the simulator descried later, the sensor 2 and the AFE unit 100 in semiconductor device 1 are targets of simulation. Hereinafter, a device including the AFE unit 100 and the MCU unit 200 is referred to as the semiconductor device 1 in some cases, and a device including the AFE unit 100 only is referred to as the semiconductor device 1 in other cases. Note that functions that are described below for each of the MCU unit 200 and the AFE unit 100 may belong to the other unit (the MCU unit 200 or the AFE unit 100) in some cases.

The MCU unit (control unit) 200 is a micro controller that converts a measurement signal (detection signal) of the sensor 2 that is input through the AFE unit 100 from analog to digital and performs control processing in accordance with a detection result. Further, the MCU unit 200 outputs a control signal for changing the settings of the configuration and characteristics of the AFE unit 100 to the AFE unit 100.

The AFE unit (analog input unit) 100 is an analog circuit that performs analog front-end processing such as amplification and filtering on the measurement signal that is output from the sensor 2 to generate a signal that is processable by the MCU unit 200. Further, the AFE unit 100 can change its topology (circuit configuration) and parameters (circuit characteristics) as shown in FIG. 1.

As shown in the FIG. 1, it is possible to change from the configuration of an operational amplifier circuit to an I/V amplifier, a subtracting (differential) amplifier, a summing amplifier, an inverting amplifier, a non-inverting amplifier and an instrumentation amplifier. Further, as shown in the example of parameters of a non-inverting amplifier, a change of operating point, a change of gain and adjustment of offset can be made.

The semiconductor device 2 according to this embodiment may be configured as a plurality of types (TYPE) of semiconductor devices suitable for different applications depending on the configuration of an internal circuit of the AFE unit 100. Hereinafter, the semiconductor device 1 of TYPE 0, which is designed for general systems, is described with reference to FIGS. 2 to 20, the semiconductor device 1 of TYPE 1, which is designed for general measuring instrument, is described with reference to FIGS. 21 to 22, and the semiconductor device 1 of TYPE 2, which is designed for motor control, is described with reference to FIGS. 23 to 25. Note that any one of TYPE 0 to 2 is referred to simply as the semiconductor device 1 in some cases.

Figure 2:
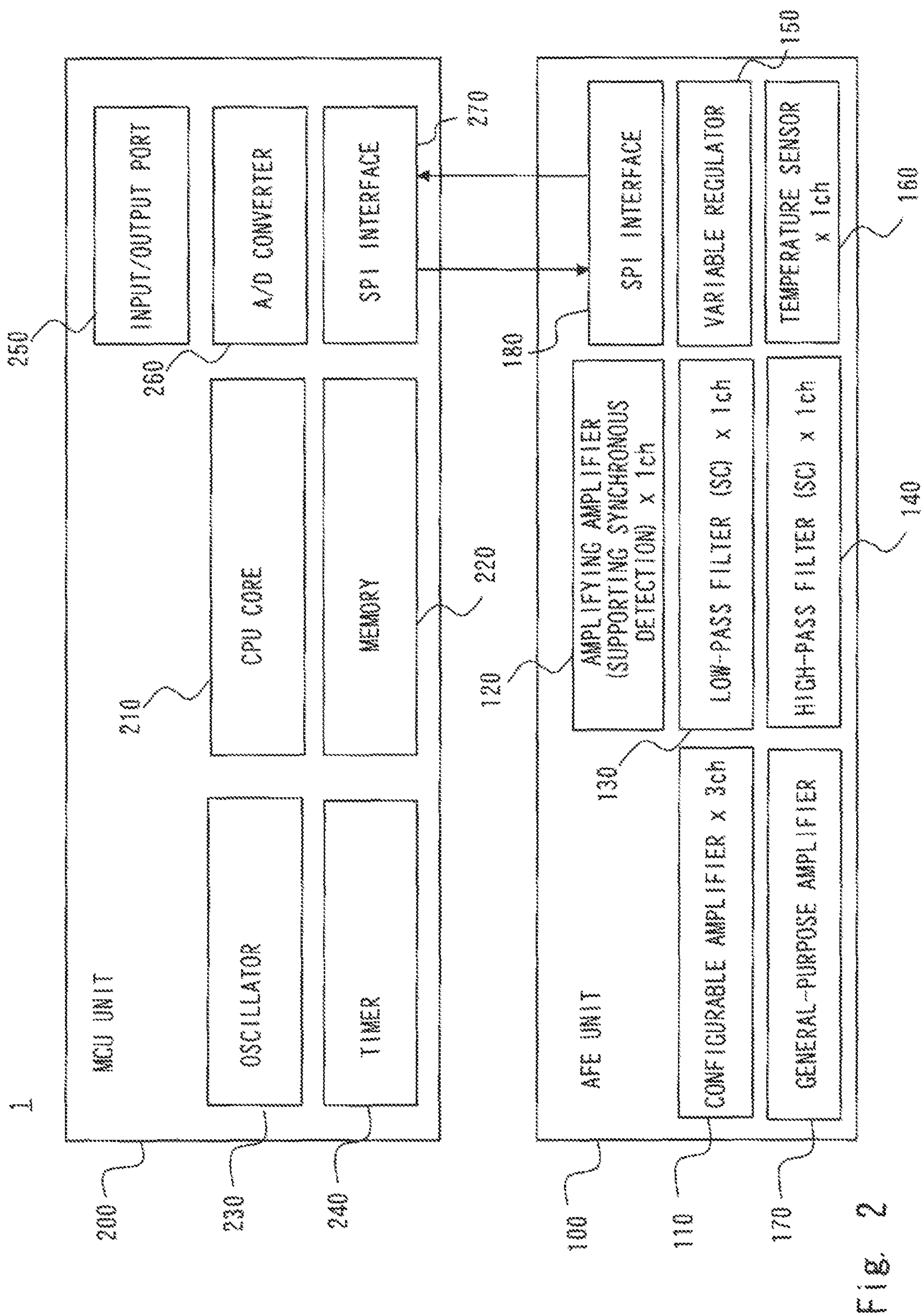
FIG. 2 is a circuit block diagram of a semiconductor device according to the first embodiment.

FIG. 2 shows a circuit block of the semiconductor device 1 of TYPE 0. As shown in FIG. 2, the MCU unit 200 includes a CPU core 210, a memory 220, an oscillator 230, a timer 240, an input/output port 250, an A/D converter 260, and an SPI (Serial Peripheral Interface) interface 270. Note that the MCU unit 200 includes other circuits for implementing the functions of a microcontroller, such a DMA and various arithmetic circuits, for example.

The CPU core 210 executes a program stored in the memory 220 and performs control processing according to the program. The memory 220 stores the program to be executed by the CPU core 210 and various data. The oscillator 230 generates an operating clock of the MCU unit 200 and further supplies the clock to the AFE unit 100 according to need. The timer 240 is used for the control operation of the MCU unit 200.

The input/output port 250 is an interface for inputting and outputting data or the like to and from external devices of the semiconductor device 1, and it is connectable to an external computer device or the like as described later, for example.

The A/D converter 260 converts a measurement signal of the sensor 2 that is input through the AFE unit 100 from analog to digital. The power of the A/D converter 260 is supplied from the AFE unit 100.

The SPI (Serial Peripheral Interface) interface 270 is an interface for inputting and outputting data or the like to and from the AFE unit 100. Note that the SPI interface 270 is a general-purpose serial interface, and another microcontroller or microcomputer can connect to the AFE unit 100 if it supports SPI.

The semiconductor device 1 of TYPE 0 shown in FIG. 2 has a configuration compatible with general-purpose applications. To be specific, a complete AFE circuit for sensor is mounted to allow connection with sensors of various types and characteristics. Specifically, the AFE unit 100 includes a configurable amplifier 110, a gain amplifier supporting synchronous detection (which is also referred to hereinafter as a gain amplifier) 120, a Switched Capacitor (SC) low-pass filter (hereinafter as a low-pass filter) 130, an SC high-pass filter (hereinafter as a high-pass filter) 140, a variable regulator 150, a temperature sensor 160, a general-purpose amplifier 170, and an SPI interface 180.

The configurable amplifier 110 is an amplification circuit that amplifies a signal which is input from the outside such as the sensor 2, and its circuit configuration, characteristics and operation can be set according to control from the MCU unit 200. The configurable amplifier 110 includes 3ch amplifiers, i.e., three amplifiers. Many different circuit configurations can be implemented by the three amplifiers.

The gain amplifier 120 is an amplification circuit supporting synchronous detection that amplifies an output of the configurable amplifier 110 and a signal input from the outside such as the sensor 2, and its characteristics and operation can be set according to control from the MCU unit 200.

The low-pass filter 130 is an SC filter that removes high-frequency components of outputs of the configurable amplifier 110 and the gain amplifier 120 and signals input from the outside such as the sensor 2, and allows low-frequency components thereof to pass through, and its characteristics and operation can be set according to control from the MCU unit 200. The high-pass filter 140 is an SC filter that removes low-frequency components of outputs of the configurable amplifier 110 and the gain amplifier 120 and signals input from the outside such as the sensor 2, and allows high-frequency components thereof to pass through, and its characteristics and operation can be set according to control from the MCU unit 200.

The variable regulator 150 is a variable voltage source that supplies a voltage to the A/D converter 260 of the MCU unit 200, and its characteristics and operation can be set according to control from the MCU unit 200. The temperature sensor 160 is a sensor that measures the temperature of the semiconductor device 1, and its operation can be set according to control from the MCU unit 200.

The general-purpose amplifier 170 is an amplifier that amplifies a signal that is input from the outside such as the sensor 2, and its operation can be set according to control from the MCU unit 200. The SPI interface 180 is an interface for inputting and outputting data or the like to and from the MCU unit 200 and is connected to the SPI interface 270 of the MCU unit 200 through an SPI bus. Note that, in the case where the semiconductor device 1 does not have the MCU unit 200, the SPI interface 180 is connected to an external terminal of the semiconductor device 1, and thereby the AFE unit 100 is connected to an external microcontroller, emulator or the like via the external terminal.

Figure 3:
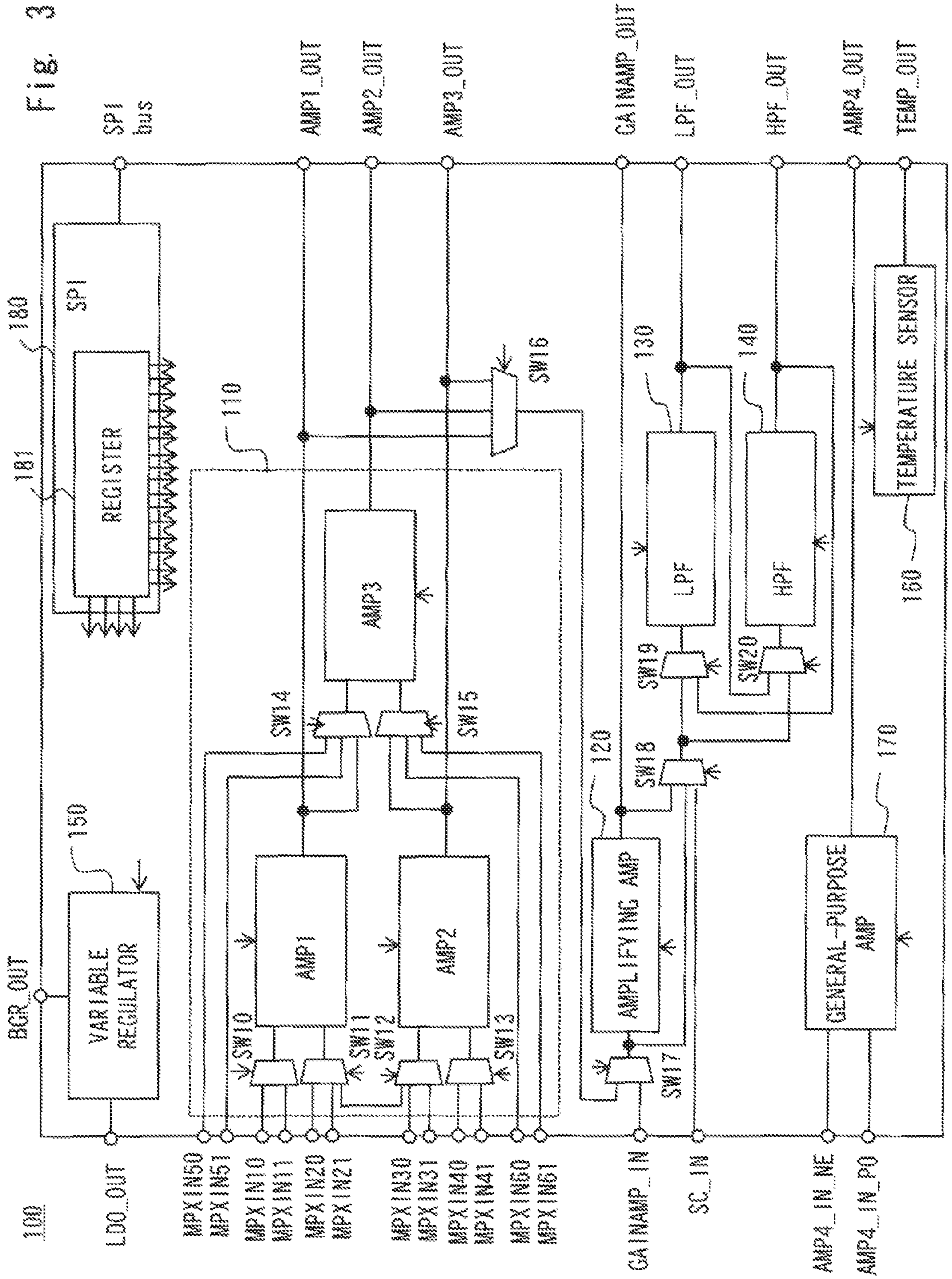
FIG. 3 is a diagram showing connections in a circuit of the semiconductor device according to the first embodiment.

The configuration of the AFE unit 100 in the semiconductor device 1 of TYPE 0 is described in detail hereinafter. FIG. 3 shows connections of circuits in the AFE unit 100. The SPI interface 180 is connected to external terminals (CS, SCLK, SDO, SDI) that are connected to the SPI bus and includes a register (control register) 181. The configuration information (setting information) for changing the configuration and characteristics of the circuit is input from the MCU unit 200 through the SPI interface and stored into the register 181. The register 181 is connected to the respective circuits in the AFE unit 100, and the configuration and characteristics of each circuit in the AFE unit 100 are set according to the configuration information in the register 181.

The configurable amplifier 110 includes individual amplifiers AMP1, AMP2 and AMP3, and switches SW10 to SW15 for switching input and output of the amplifiers are connected thereto.

In the individual amplifier AMP1, one input terminal is connected to MPXIN10 or MPXIN11 through the switch SW10, the other input terminal is connected to MPXIN20 or MPXIN21 through the switch SW11, and the output terminal is connected to AMP1_OUT. Likewise, in the individual amplifier AMP2, one input terminal is connected to MPXIN30 or MPXIN31 through the switch SW12, the other input terminal is connected to MPXIN40 or MPXIN41 through the switch SW13, and the output terminal is connected to AMP2_OUT.

Further, in the individual amplifier AMP3, one input terminal is connected to MPXIN50, MPXIN51 or the output terminal of the AMP1 through the switch SW14, the other input terminal is connected to MPXIN60, MPXIN61 or the output terminal of the AMP2 through the switch SW15, and the output terminal is connected to AMP3_OUT. The output terminals of the AMP1 to AMP3 are connected also to the gain amplifier 120, the low-pass filter 130 and the high-pass filter 140.

In the configurable amplifier 110, the switches SW10 to SW15 are switched according to the set value of the register 181, and thereby the connections of the AMP1 to AMP3 are changed, and the internal circuit configuration and characteristics are also changed as described later.

Figure 4:
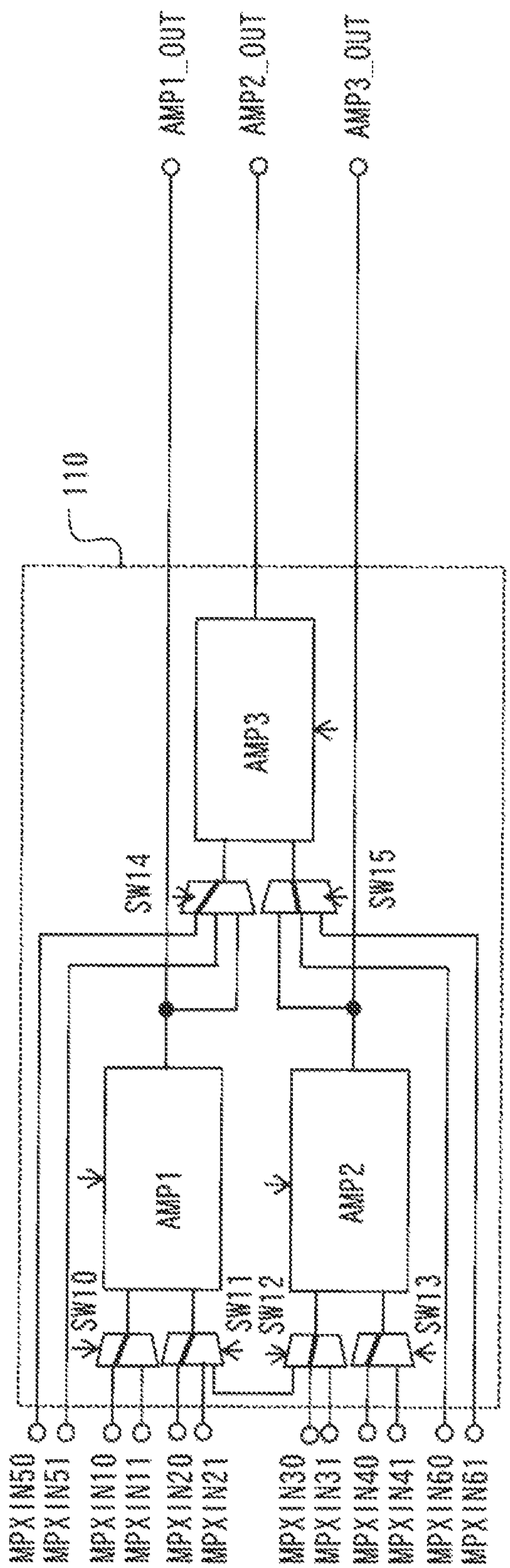
FIG. 4 is a diagram showing an example of connections in a circuit of the semiconductor device according to the first embodiment.
Figure 5:
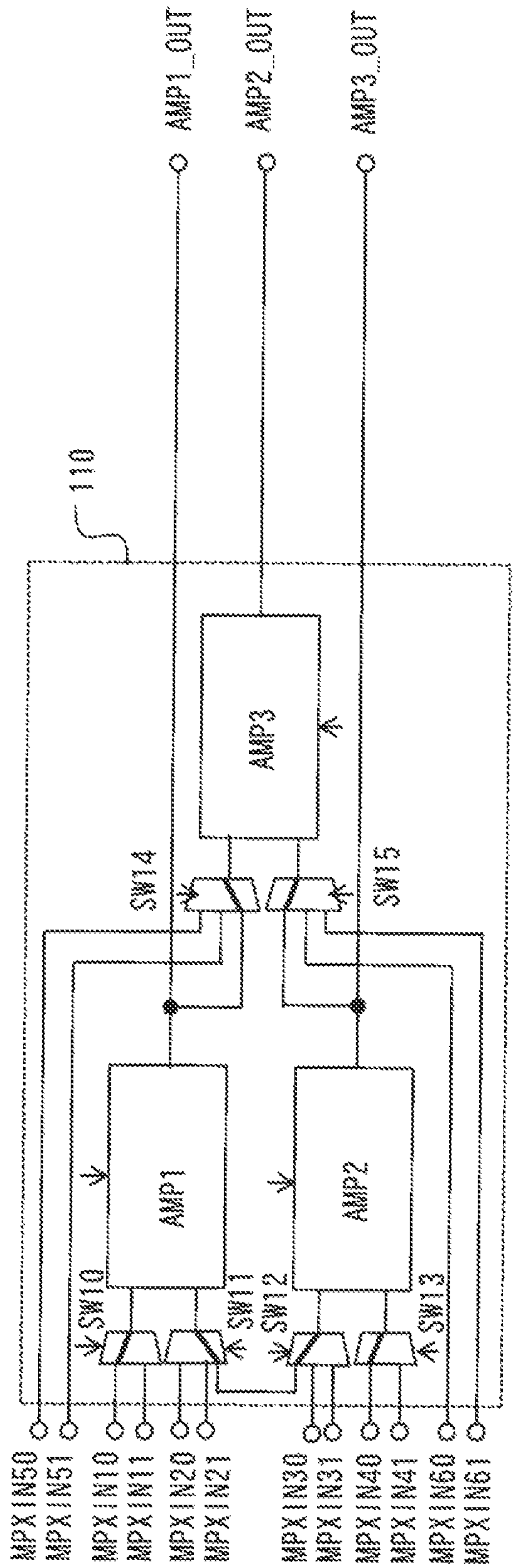
FIG. 5 is a diagram showing an example of connections in a circuit of the semiconductor device according to the first embodiment.

FIGS. 4 and 5 are examples of switching the connections of the AMP1 to AMP3 by the switches SW10 to SW15. In FIG. 4, by the setting of the register 181, the switches SW11 and SW11 are switched to connect the input terminals of the AMP1 to the MPXIN10 and MPXIN20, the switches SW12 and SW13 are switched to connect the input terminals of the AMP2 to the MPXIN30 and MPXIN40, and the switches SW14 and SW15 are switched to connect the input terminals of the AMP3 to the MPXIN50 and MPXIN60. In these connections, the AMP1, AMP2 and AMP3 can operate as independent amplifiers.

In FIG. 5, by the setting of the register 181, the switch SW10 is switched to connect one input terminal of the AMP1 to the MPXIN10, the switch SW13 is switched to connect one input terminal of the AMP2 to the MPXIN40, the switches SW11 and SW12 are switched to connect the other input terminal of the AMP1 to the other input terminal of the AMP2, the switches SW14 and SW15 are switched to connect one input terminal, of the AMP3 to the output terminal of the AMP1 and connect the other input terminal of the AMP3 to the output terminal of the AMP2. In these connections, an instrumentation amplifier connecting the AMP1 to AMP3 can be configured.

Further, as shown in FIG. 3, switches SW16 and SW17 for switching input are connected to the gain amplifier 120. In the gain amplifier 120, the input terminal is connected to the output terminals of the AMP1 to AMP3 through the switches SW16 and SW17 or connected to GAINAMP_IN through the switch SW17, and the output terminal is connected to GAINAMP_OUT. The output terminal of the gain amplifier 120 is connected also to the low-pass filter 130 and the high-pass filter 140. Note that the connection of the output terminals of the AMP1 to AMP3 and the external terminal and the gain amplifier may be switched by the switch SW16.

Switches SW18 and SW19 for switching input are connected to the low-pass filter 130, and switches SW18 and SW20 for switching input are connected to the high-pass filter 140. In the low-pass filter 130, the input terminal is connected to the output terminals of the AMP1 to AMP3, the output terminal of the gain amplifier 320 or SC_IN through the switches SW16, SW17, SW18 and SW19, or connected to the output terminal of the high-pass filter 140 through the switch SW19, and the output terminal is connected to LPF_OUT. In the high-pass filter 140, the input terminal is connected to the output terminals of the AMP1 to AMP3, the output terminal of the gain amplifier 120 or SC_IN through the switches SW16, SW17, SW18 and SW20, or connected to the output terminal of the low-pass filter 130 through the switch SW19, and the output terminal is connected to HPF_OUT. Note that switches may be placed between the output terminals of the low-pass filter 130 and the high-pass filter 140 and external terminals so that the connections of the output terminals of the low-pass filter 130 and the high-pass filter 140 and the external terminals and the switches SW19 and SW20 may be switched.

In the gain amplifier 120, the low-pass filter 130 and the high-pass filter 140, the switches SW16 to SW20 are switched according to the set value of the register 181, and the connections of the gain amplifier 120, the low-pass filter 130 and the high-pass filter 140 are changed, and the internal characteristics are also changed as described later.

Figure 6:
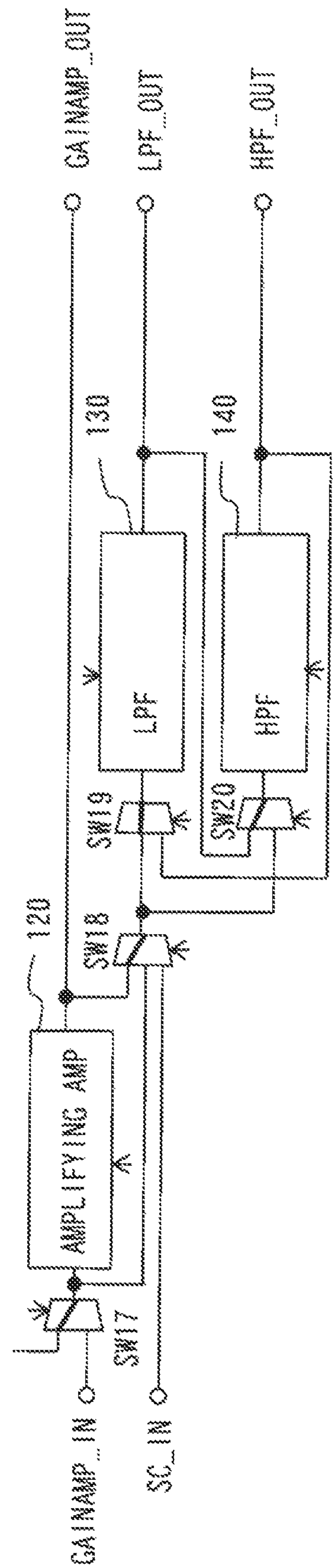
FIG. 6 is a diagram showing an example of connections in a circuit of the semiconductor device according to the first embodiment.
Figure 7:
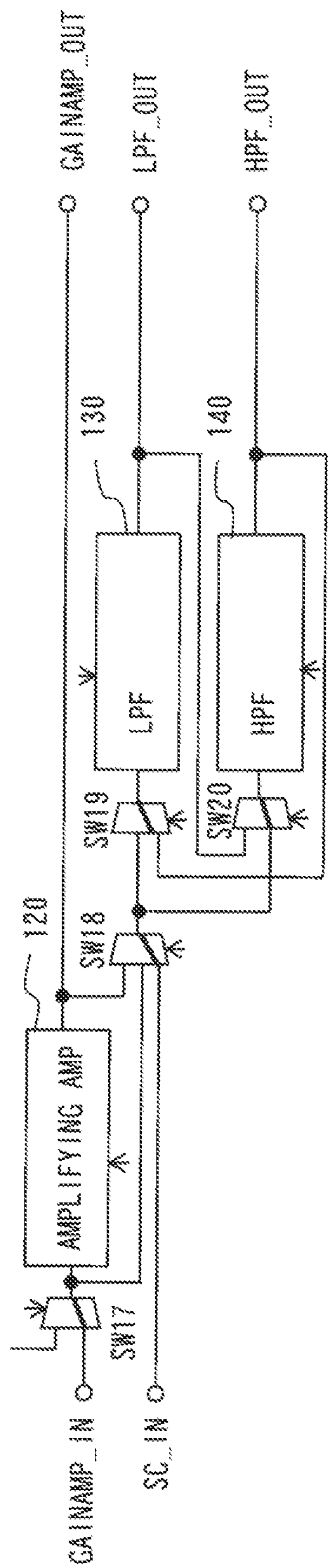
FIG. 7 is a diagram showing an example of connections in a circuit of the semiconductor device according to the first embodiment.

FIGS. 6 and 7 are examples of switching the connections of the gain amplifier 120, the low-pass filter 130 and the high-pass filter 140 by the switches SW17 to SW20. In FIG. 6, by the setting of the register 381, the switch SW17 is switched to connect the input terminal of the gain amplifier 120 to any output terminal of the AMP1 to AMP3, the switches SW18 and SW19 are switched to connect the input terminal of the low-pass filter 130 to the output terminal of the gain amplifier 320, and the switch SW20 is switched to connect the input terminal of the high-pass filter 140 to the output terminal of the low-pass filter 130. In this switching, a circuit in which any one of the AMP1 to AMP3, the gain amplifier 120, the low-pass filter 130 and the high-pass filter 140 are connected in this order can be formed.

In FIG. 7, by the setting of the register 181, the switch SW17 is switched to connect the input terminal of the gain amplifier 120 to GAINAMP_IN, the switches SW18 and SW20 are switched to connect the input terminal of the high-pass filter 140 to SC_IN, and the switch SW19 is switched to connect the input terminal of the low-pass filter 130 to the output terminal of the high-pass filter 140. In this switching, the gain amplifier 120 can operate as a single independent amplifier, and a circuit in which the high-pass filter 140 and the low-pass filter 130 are connected in this order can be formed.

Further, as shown in FIG. 3, in the variable regulator 150, the output terminal is connected to BGR_OUT and LDO_OUT. The characteristics of the variable regulator 150 are changed as described later according to the set value of the register 181.

In the temperature sensor 160, the output terminal is connected to TEMP_OUT. The characteristics of the temperature sensor 160 are changed as described later according to the set value of the register 181.

In the general-purpose amplifier 170, one input terminal is connected to AMP4_IN_NE, the other input terminal is connected to AMP4_IN_PO, and the output terminal is connected to AMP4_OUT. The general-purpose amplifier is formed by one operational amplifier, and the power on/off is set according to the set value of the register 181.

A specific circuit configuration of the configurable amplifier 110 is described hereinafter with reference to FIGS. 8 to 14.

The configurable amplifier 110 is an amplifier for amplifying a sensor output signal, and its topology (circuit configuration) and parameters (circuit characteristics) can be changed according to the setting of the control register. As a change in characteristics, the gain can be set to be variable. For example, in the case of using the individual amplifiers independently of one another, the gain can be set to a range of 6 dB to 46 dB in steps of 2 dB, and in the case of using them as an instrumentation amplifier, the gain can be set to a range of 20 dB to 60 dB in steps of 2 dB. Further, the slew rate can be set to be variable, and the power on/off can be switched by power-off mode.

Figure 8:
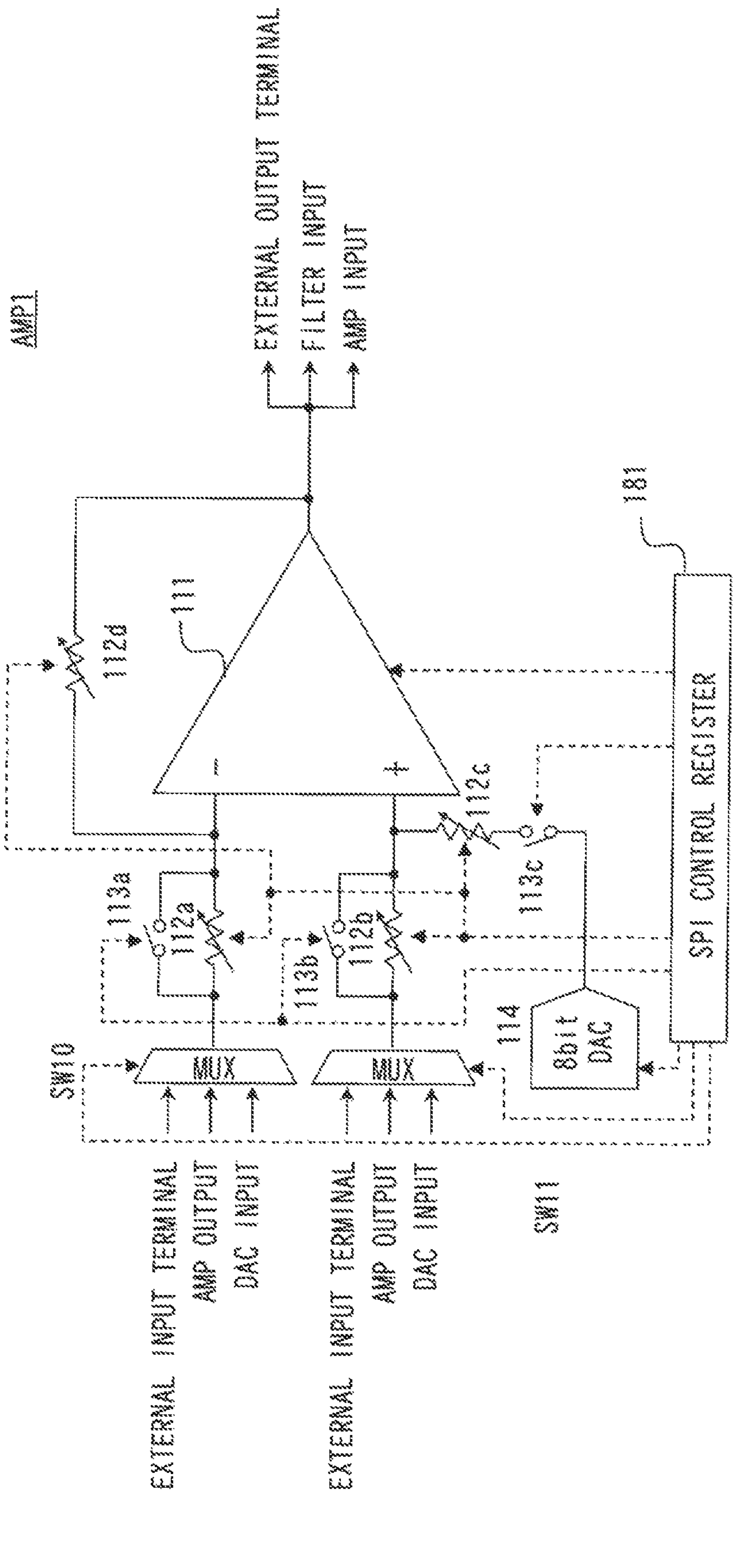
FIG. 8 is a circuit diagram showing a circuit configuration of the semiconductor device according to the first embodiment.

FIG. 8 shows a circuit configuration of an individual amplifier AMP1 of the configurable amplifier 110. The AMP2 and AMP3 have the same configuration.

As shown in FIG. 8, the individual amplifier AMP1 includes an operational amplifier 111 and further includes variable resistors 112*a* to 112*d*, switches 113*a* to 113*c* and a DAC 114 that are connected to terminals of the operational amplifier 111, and multiplexers (switches) SW10 and SW11 are connected to the AMP1 as shown in FIG. 3.

According to the set value of the register 181, the input of the operational amplifier 111 can be switched by the multiplexers SW10 and SW11, the presence or absence of the variable resistors (input resistors) 112*a* and 112*b* can be switched by the switches 113*a* and 113*b*, and the connection of the DAC 114 can be switched by the switch 113*c*. Note that the output of the operational amplifier 111 is connected to the gain amplifier 120, the low-pass filter 130 or the high-pass filter 140 by switching of the switches SW16, SW17 and SW18 as shown in FIG. 3. Further, the gain, operating point, offset and the like of the AMP1 can be changed by changing the resistance values of the variable resistors 112*a*, 112*b*, 112*c* and 112*d* and the setting of the DAC 114 according to the set value of the register 181. Further, the power on/off can be controlled according to the set value of the register 181. Furthermore, the slew rate can be controlled by changing the operation mode of the operational amplifier to high-speed mode, medium-speed mode or low-speed mode according to the set value of the register 181.

An I/V amplifier, an inverting amplifier, a subtracting (differential) amplifier, a non-inverting amplifier, and a summing amplifier can be formed by switching of the switches and multiplexers.

Figure 9:
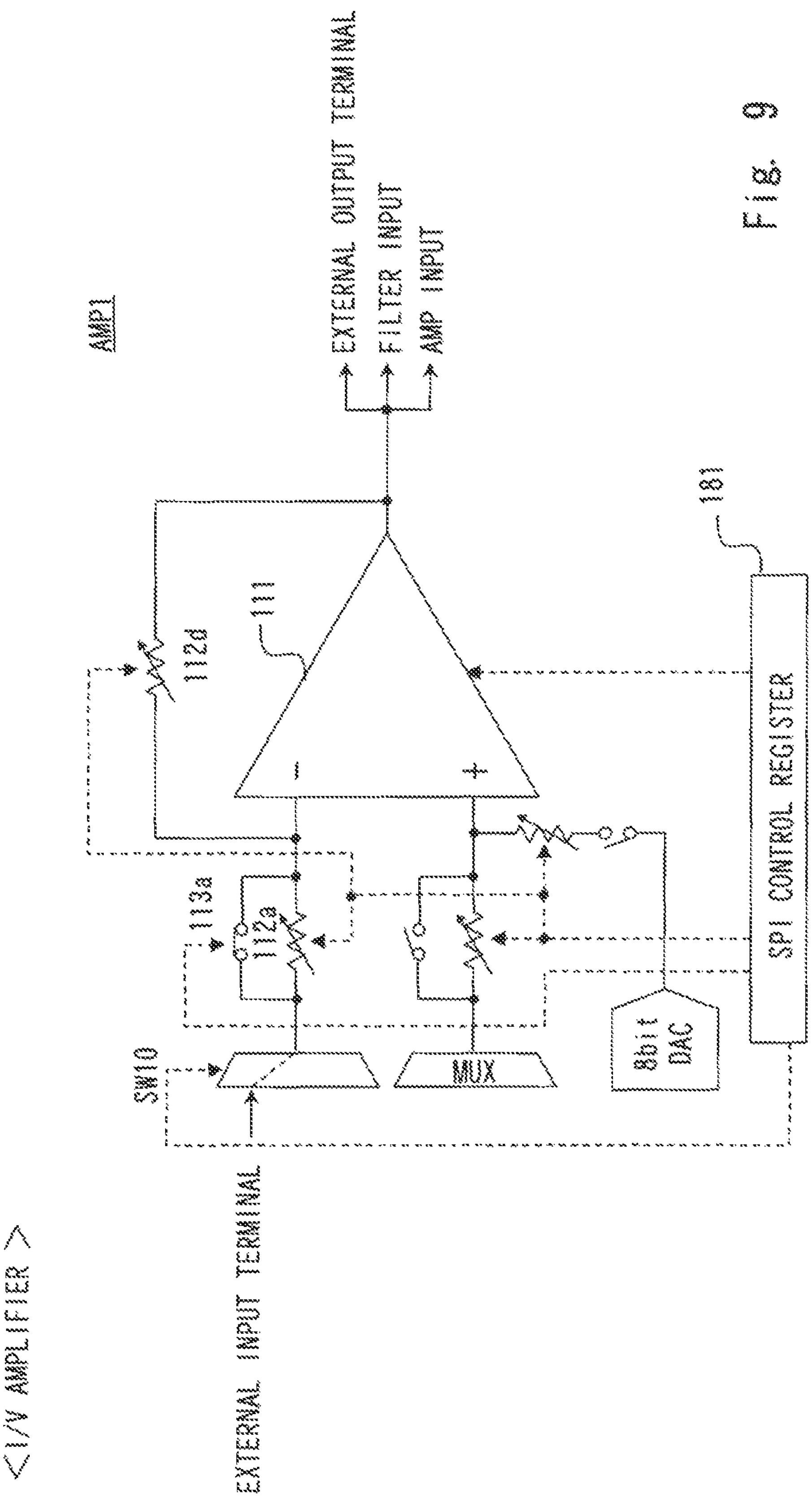
FIG. 9 is a circuit diagram showing an alternative example of a circuit configuration of the semiconductor device according to the first embodiment.

FIG. 9 shows an example of forming an I/V amplifier. According to the setting of the register 181, the multiplexer SW10 is switched to connect the external input terminal (MPXIN10) to the inverting input terminal, the switch 113*a* is turned on, and the variable resistor 112*a* is short-circuited. In such connections, an I/V amplifier is formed. Further, by the setting of the register 181, the resistance values of the variable resistors 112*a* and 112*d* are changed to set the gain of the amplifier. When a signal of a current-type sensor is input from the external input terminal, the i/V amplifier converts the input current into a voltage and outputs the voltage.

Figure 10:
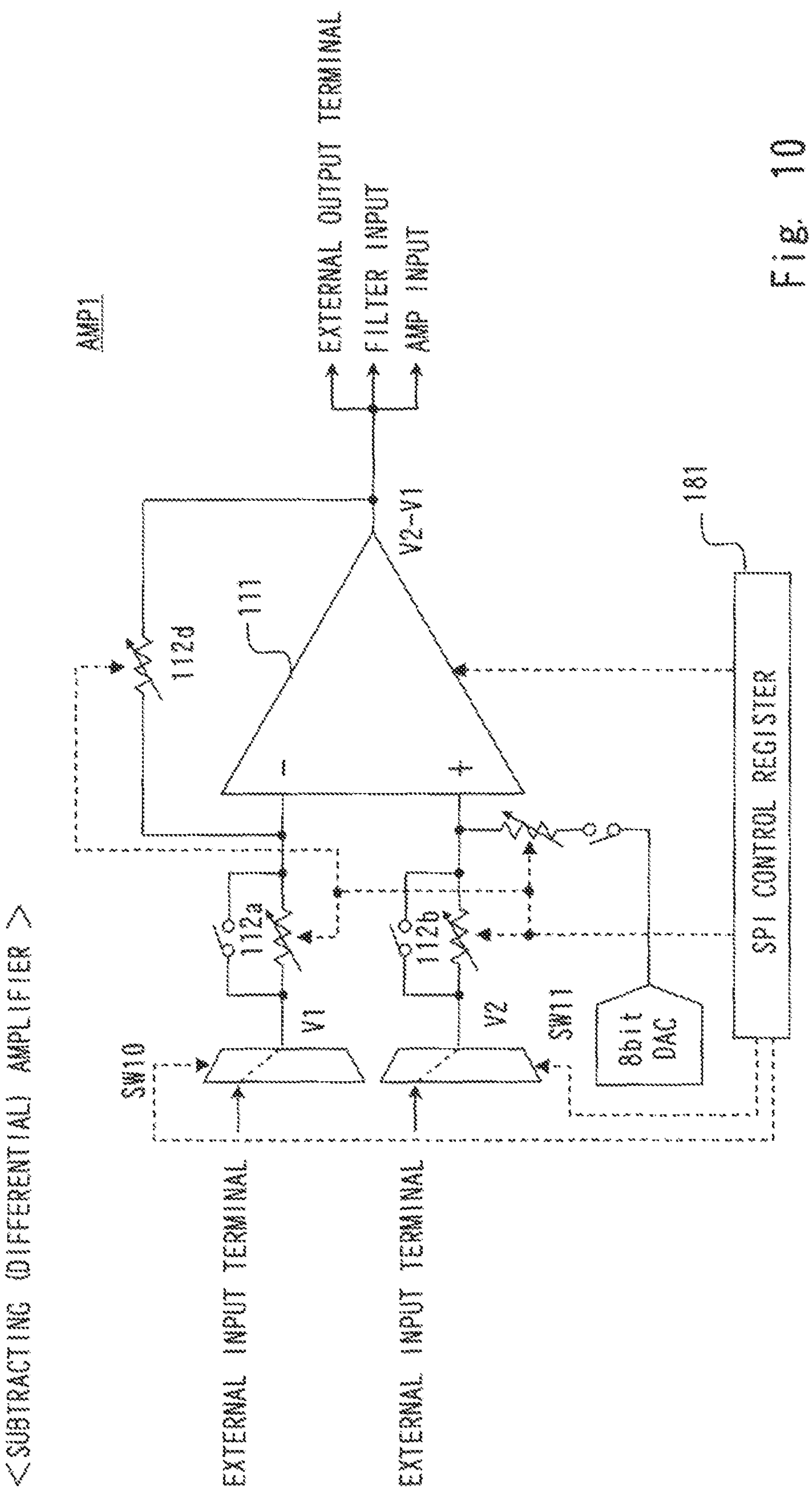
FIG. 10 is a circuit diagram showing an alternative example of a circuit configuration of the semiconductor device according to the first embodiment.

FIG. 10 is an example of forming a subtracting (differential) amplifier. According to the setting of the register 181, the multiplexers SW10 and SW11 are switched to connect the external input terminal (MPXIN10) to the inverting input terminal and connect the external input terminal (MPXIN20) to the non-inverting input terminal. In such connections, a subtracting amplifier is formed. Further, by the setting of the register 181, the resistance values of the variable resistors 112*a*, 112*b* and 112*d* are changed to set the gain of the amplifier. When two signals (V1, V2) are input from the external input terminals, the subtracting amplifier outputs a voltage (V2−V1) obtained by subtracting one input voltage from the other input voltage.

Figure 11:
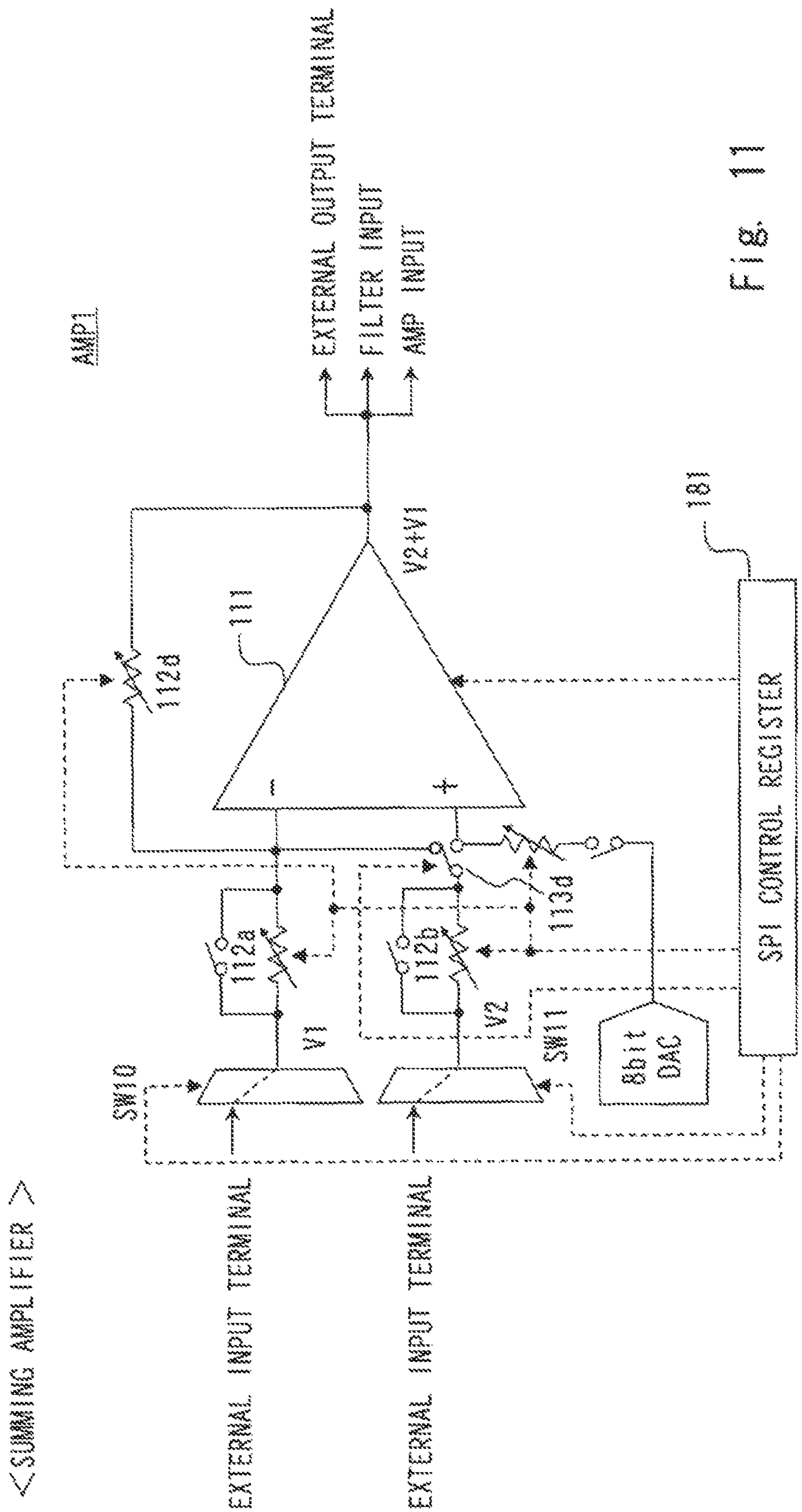
FIG. 11 is a circuit diagram showing an alternative example of a circuit configuration of the semiconductor device according to the first embodiment.

FIG. 11 shows an example of forming a summing amplifier. It is assumed that a switch 113*d* is placed between the variable resistor 112*b* and the inverting input terminal. According to the setting of the register 181, the multiplexers SW10 and SW11 and the switch 113*d* are switched to connect the external input terminal (MPXIN10) and the external input terminal (MPXIN20) to the inverting input terminal. In such connections, a summing amplifier is formed. Further, by the setting of the register 181, the resistance values of the variable resistors 112*a*, 112*b* and 112*d* are changed to set the gain of the amplifier. When two signals (V1, V2) are input from the external input terminals, the summing amplifier outputs a voltage (V1+V2) obtained by summing one input voltage and the other input voltage.

Figure 12:
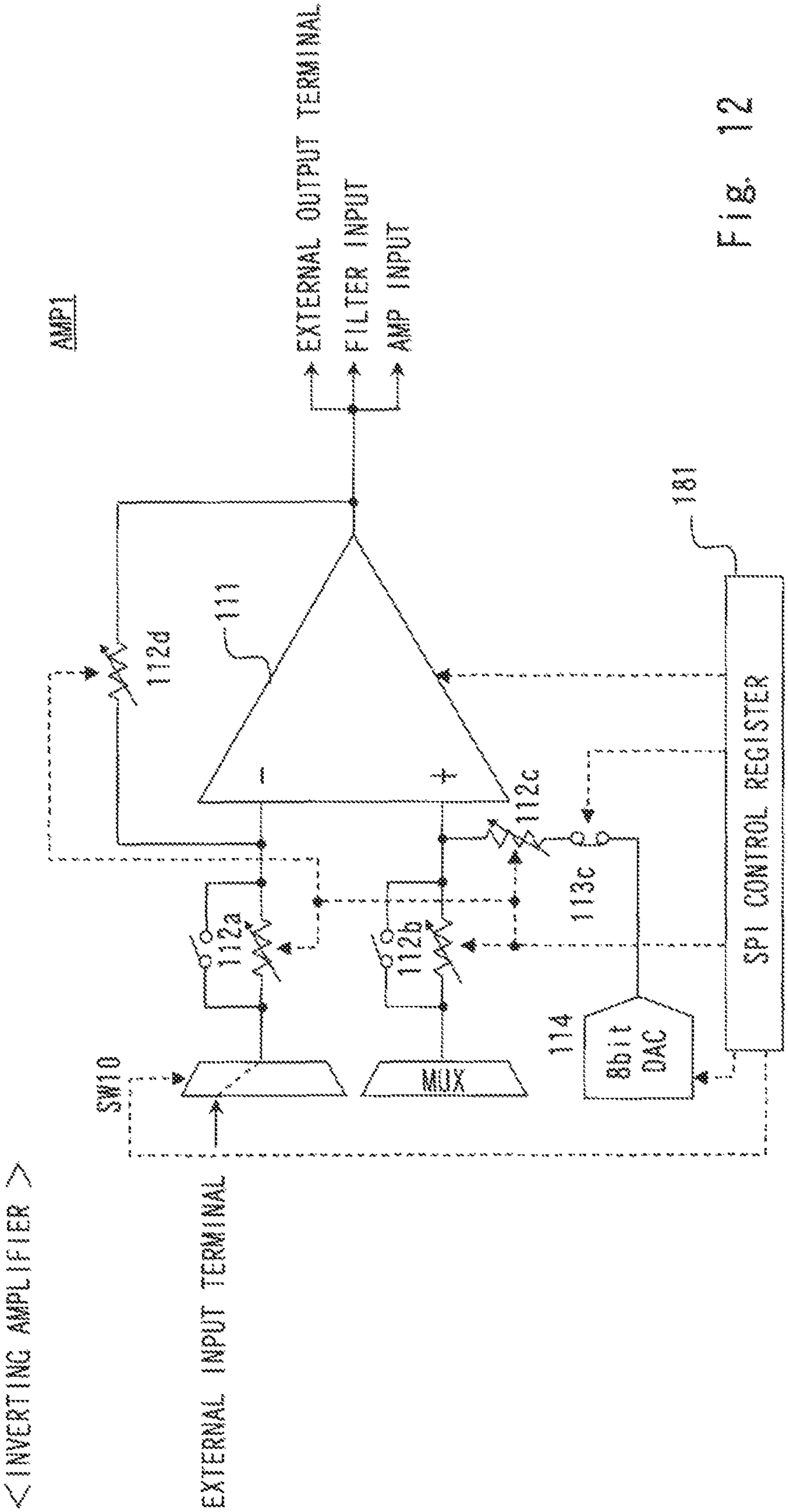
FIG. 12 is a circuit diagram showing an alternative example of a circuit configuration of the semiconductor device according to the first embodiment.

FIG. 12 shows an example of forming an inverting amplifier. According to the setting of the register, the multiplexer SW10 is switched to connect the external input terminal (MPXIN10) to the inverting input terminal, the switch 113*c* is turned on to connect the output of the DAC 114 to the non-inverting input terminal. In such connections, an inverting amplifier is formed. Further, by the setting of the register 181, the resistance values of the variable resistors 112*a* and 112*d* are changed to set the gain of the amplifier, and the output voltage of the DAC is changed to adjust the operating point and offset of the amplifier. When a signal of a voltage-type sensor is input from the external input terminal, the inverting amplifier outputs a voltage generated by inverting amplification of the input voltage.

Figure 13:
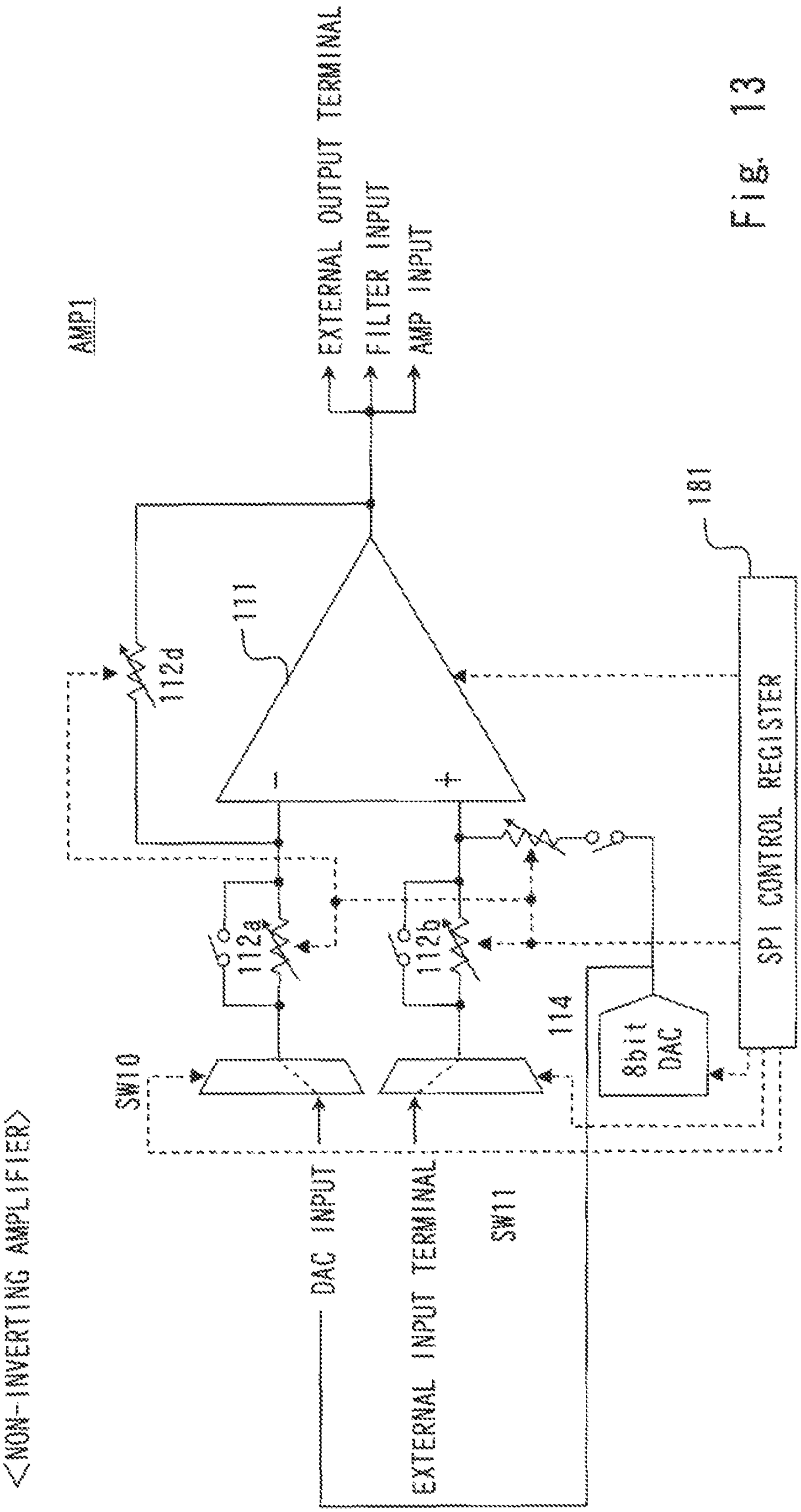
FIG. 13 is a circuit diagram showing an alternative example of a circuit configuration of the semiconductor device according to the first embodiment.

FIG. 13 shows an example of forming a non-inverting amplifier. According to the setting of the register, the multiplexer SW10 is switched to connect the output of the DAC 114 to the inverting input terminal, and the multiplexer SW11 is switched to connect the external input terminal (MPXIN20) to the non-inverting input terminal. In such connections, a non-inverting amplifier is formed. Further, by the setting of the register 181, the resistance values of the variable resistors 112*a* and 112*d* are changed to set the gain of the amplifier, and the output voltage of the DAC is changed to adjust the operating point and offset of the amplifier. When a signal of a voltage-type sensor is input from the external input terminal, the non-inverting amplifier outputs a voltage generated by non-inverting amplification of the input voltage (which is in-phase with the input).

Figure 14:
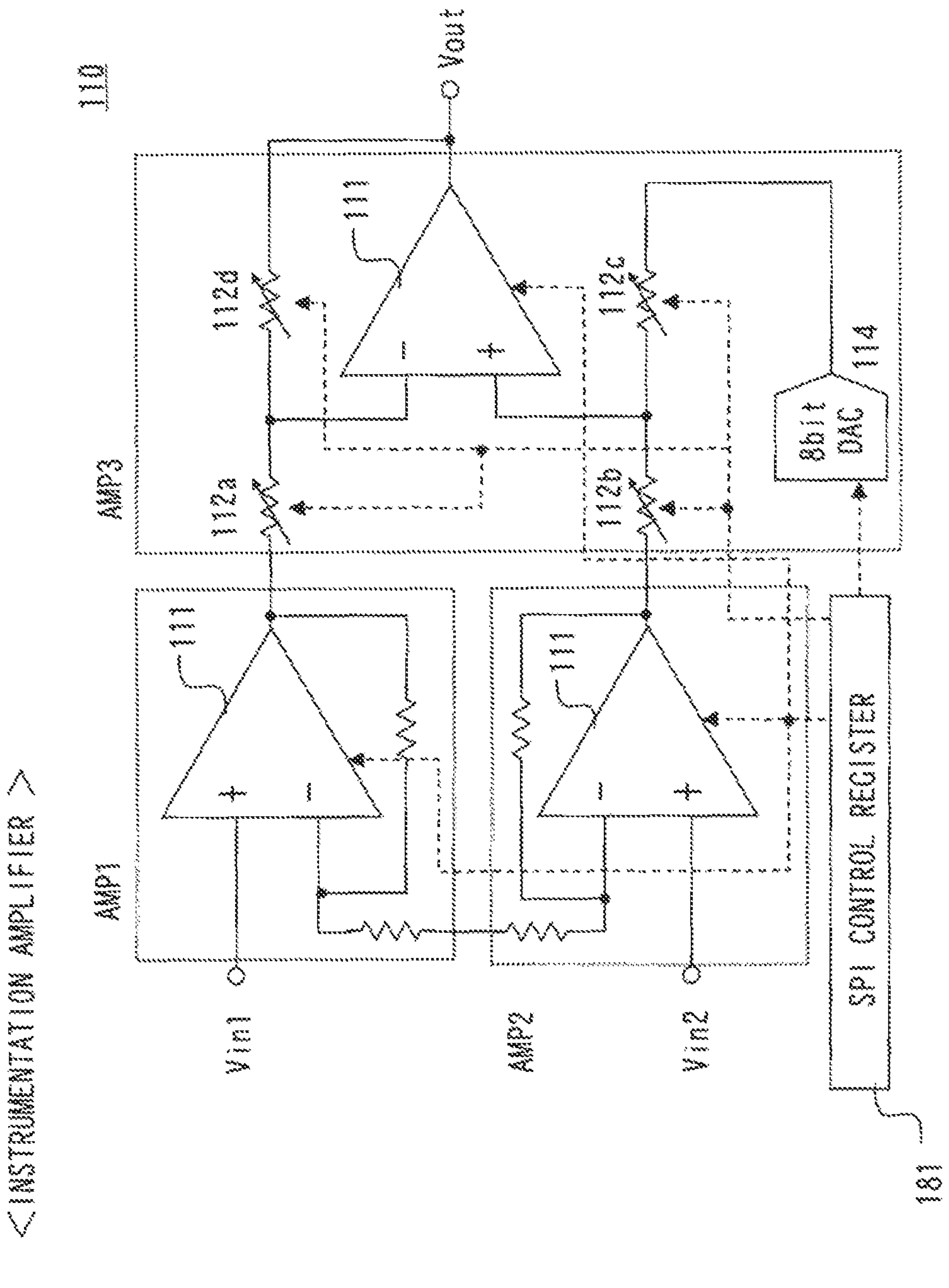
FIG. 14 is a circuit diagram showing an alternative example of a circuit configuration of the semiconductor device according to the first embodiment.

FIG. 14 shows an example of forming an instrumentation amplifier using the AMP1 to AMP3. As shown in FIG. 5, according to the setting of the register 181, the AMP1 to AMP3 are connected by the multiplexers (switches) SW10 and SW15, and thereby the instrumentation amplifier of FIG. 14 can be formed. Note that, although the switches are not illustrated, the switch 113*b* is turned on and the variable resistor 112*b* is short-circuited in the AMP1, the switch 113*b* is turned on and the variable resistor 112*b* is short-circuited in the AMP2, and the switch 113*c* is turned on and the DAC 114 is connected to the non-inverting input terminal in the AMP3.

Further, by the setting of the register 181, the resistance values of the variable resistors 112*a* and 112*d* of the AMP3 are changed to set the gain of the instrumentation amplifier, and the output voltage of the DAC 1.14 is changed to adjust the operating point and offset of the instrumentation amplifier. When a faint differential signal is input from the external input terminal, the instrumentation amplifier outputs a voltage generated by non-inverting amplification in the AMP1 and AMP2 and differential amplification in the AMP3 on the differential signal.

Specific circuit configurations of other circuits in the AFE unit 100 are described hereinafter with reference to FIG. 15 to 20.

Figure 15:
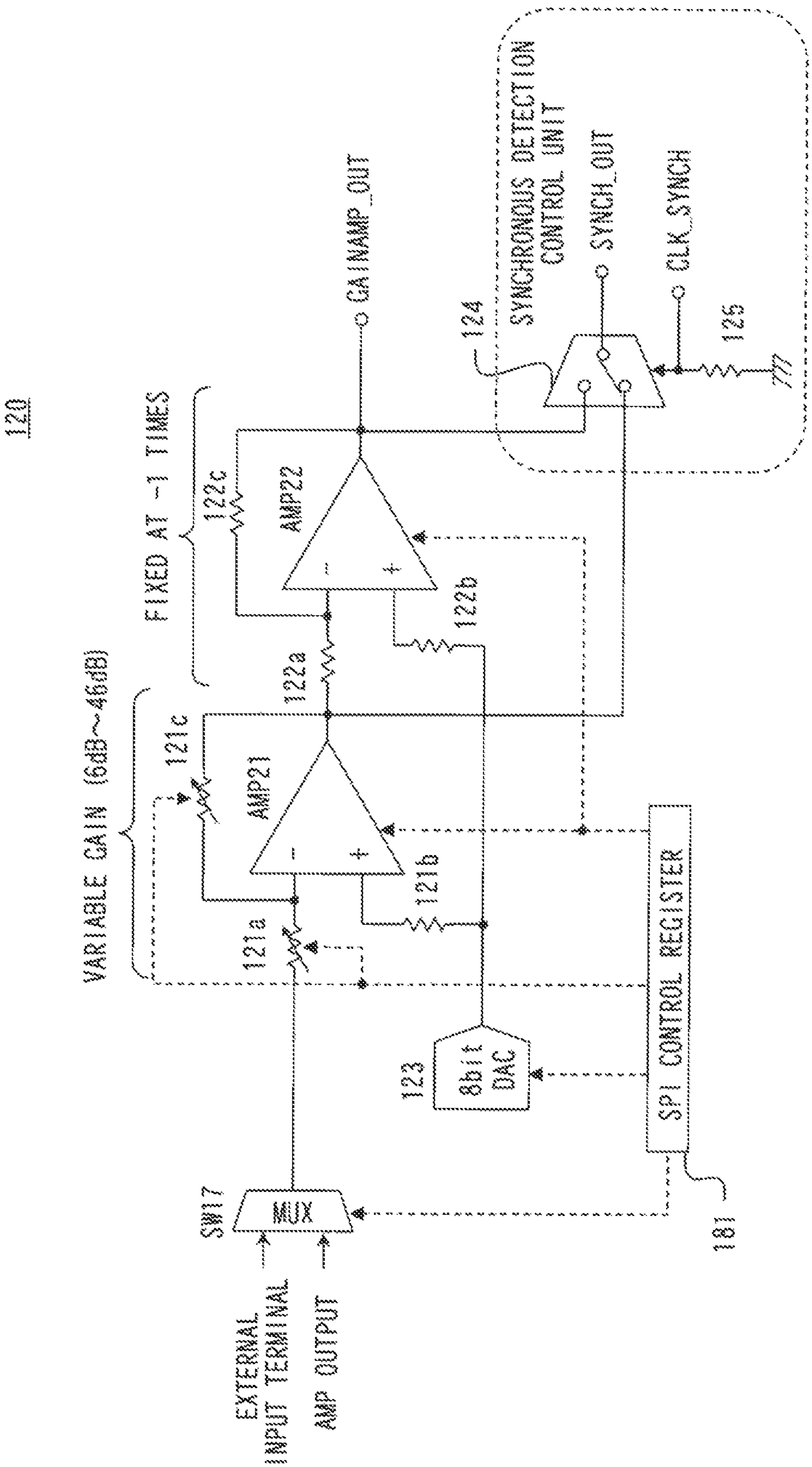
FIG. 15 is a circuit diagram showing a circuit configuration of the semiconductor device according to the first embodiment.

FIG. 15 shows a circuit configuration of the gain amplifier 120. The gain amplifier 120 supports the synchronous detection function and performs the amplification and synchronous detection of input signals. As a change in characteristics, the gain amplifier 120 can set the gain to be variable. For example, the gain can be set to a range of 6 dB to 46 dB in steps of 2 dB. Further, the power on/off can be switched by power-off mode.

As shown in FIG. 15, the gain amplifier 120 includes operational amplifiers AMP21 and AMP22 and further includes variable resistors 121*a* and 121*c*, fixed resistors 121*b*, 122*a*, 122*b* and 122*c*, and a DAC 123 that are connected to terminals of the operational amplifiers AMP21 and AMP22. Further, a multiplexer (switch) SW17 is connected as shown in FIG. 3. The gain amplifier 120 further includes a synchronous detection switch 124 and a fixed resistor 125 as a synchronous detection control unit for performing synchronous detection.

According to the set value of the register 181, the multiplexer SW17 is controlled to switch the input of the gain amplifier 120. Further, by changing the resistance values of the variable resistors 121*a* and 121*c* and the setting of the DAC 123 according to the set value of the register 181, the gain of the AMP21, the operating point and offset of the AMP21 and AMP22 and the like can be changed. Further, the power on/off of the operational amplifiers AMP21 and AMP22 can be controlled according to the set value of the register 181.

In the gain amplifier 120, when a signal is input from the AMP1 to AMP3 or the external input terminal, a signal generated by inverting amplification in the AMP21 and inverting amplification in the AMP22 is output to GAINAMP_OUT.

Further, a synchronous clock CLK_SYNCH is input from the MCU unit 200, the connection of the synchronous detection switch 124 is switched at the timing of the synchronous clock CLK_SYNCH, and the output signal of any of the AMP21 and the AMP22 is output to SYNCH_OUT.

Figure 16:
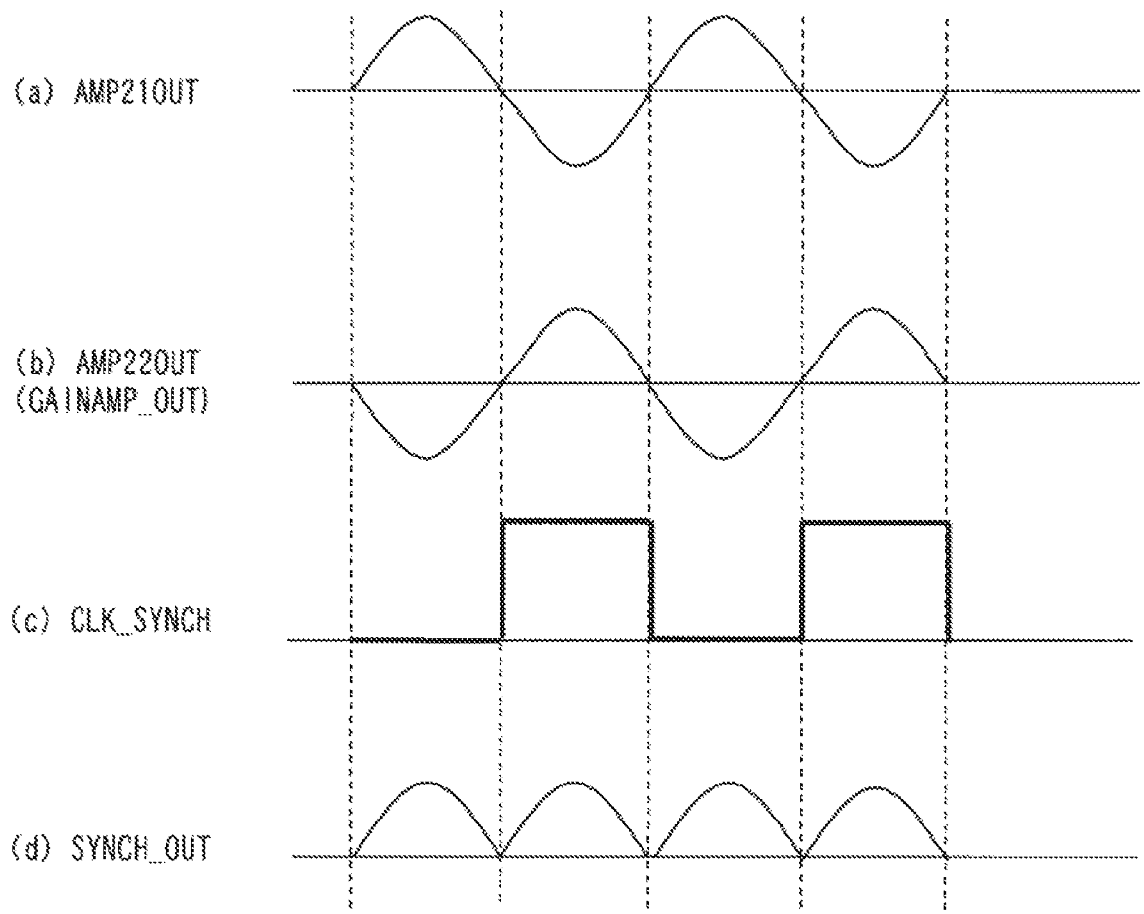
FIG. 16 is a timing chart showing an operation of a circuit of the semiconductor device according to the first embodiment.

FIG. 16 is a timing chart showing the output operation of the gain amplifier 120. As shown in part (a) of FIG. 16, the AMP21 outputs the inverting signal of the input signal and, as shown in part (b) of FIG. 16, the AMP22 outputs the inverting signal of the above inverting signal. The output signal of the AMP22 is output as the output of the gain amplifier 120 to GAINAMP_OUT.

The MCU unit 200 is connected to GAINAMP_OUT and generates a clock according to a signal of GAINAMP_OUT. In this example, as shown in part (c) of FIG. 16, when GAINAMP_OUT is a higher level than a reference value, CLK_SYNCH at High level is generated. Then, the synchronous clock CLK_SYNCH is supplied to the gain amplifier 120.

The synchronous detection switch 124 switches over a connecting of SYNCH_OUT between the AMP21 and AMP22 according to CLK_SYNCK. When the clock CLK_SYNCK is at Low level, the synchronous detection switch 124 connects to the AMP21 to output the output of the AMP21 to SYNCH_OUT, and when the clock CLK_SYNCK is at High level, the synchronous detection switch 124 connects to the AMP22 to output the output of the AMP22 to SYNCH_OUT. Then, as shown in part (d) of FIG. 16, synchronous detection is performed and a full-wave rectified signal is output from SYNCH_OUT.

Figure 17:
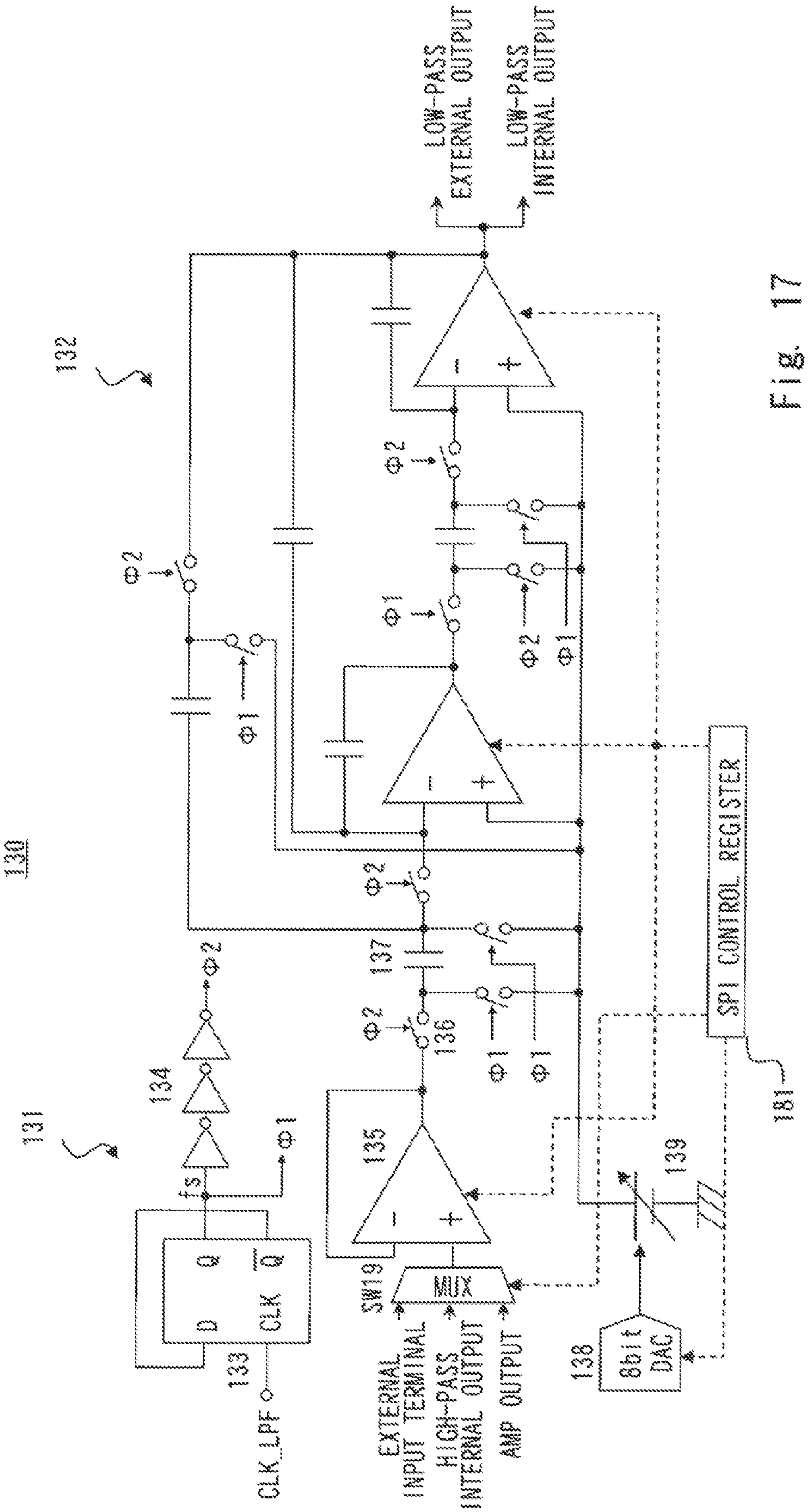
FIG. 17 is a circuit diagram showing a circuit configuration of the semiconductor device according to the first embodiment.

FIG. 17 shows a circuit configuration of the low-pass filter 130. The low-pass filter 130 is a SC (Switched Capacitor) low-pass filter with a variable cutoff frequency and used for filtering of an input signal.

As the characteristics of the low-pass filter 130, a Q value is a fixed value, which is 0.702, for example. As a change in characteristics, the cutoff frequency fc can be set to be variable. For example, it can be set to a range of 9 Hz to 900 Hz. Further, the power on/off can be switched by power-off mode.

As shown in FIG. 17, the low-pass filter 130 includes a switching signal generation unit 131 that generates a switching signal and a filtering unit 132 that filters an input signal according to the switching signal.

The switching signal generation unit 131 includes a flip-flop 133 and a plurality of inverters 134. The filtering unit 132 includes a plurality of operational amplifiers 135 and further includes a plurality of switches 136 connected to the plurality of operational amplifiers 135, a capacitor 137, and a variable power supply 139 that is controlled by a DAC 138. Further, a multiplexer (switch) SW19 is connected as shown in FIG. 3.

According to the set value of the register 181, the multiplexer SW19 is controlled to switch the input of the low-pass filter 130. Further, according to the set value of the register 181, the setting of the DAC 138 is changed to control the variable power supply 139 to thereby change the operating point, offset and the like of the amplifier. Further, according to the set value of the register 181, the on/off of the power supply of the low-pass filter 130 can be controlled.

In the low-pass filter 130, the clock CLK_LPF is input to the switching signal generation unit 131 from the outside, and switching signals Φ1 and Φ2 are generated by the flip-flop 133 and the inverters 134. In the filtering unit 132, when a signal is input from the external input terminal, the gain amplifier 120 or the like, the signal is output through three operational amplifiers 135 and, at that time, the switches 136 are turned on/off by the switching signals Φ1 and Φ2, and thereby a connection of the capacitor 137 is switched. Consequently, a signal after removal of higher frequency components than the cutoff frequency of the input signal is output.

The cutoff frequency can be changed by the clock CLK_LPF that is input from the outside by the MCU unit 200. To be specific, the cutoff frequency is fc=0.009×fs. In this formula, fs=(½)×f (f is the frequency of CLK_LPF).

Figure 18:
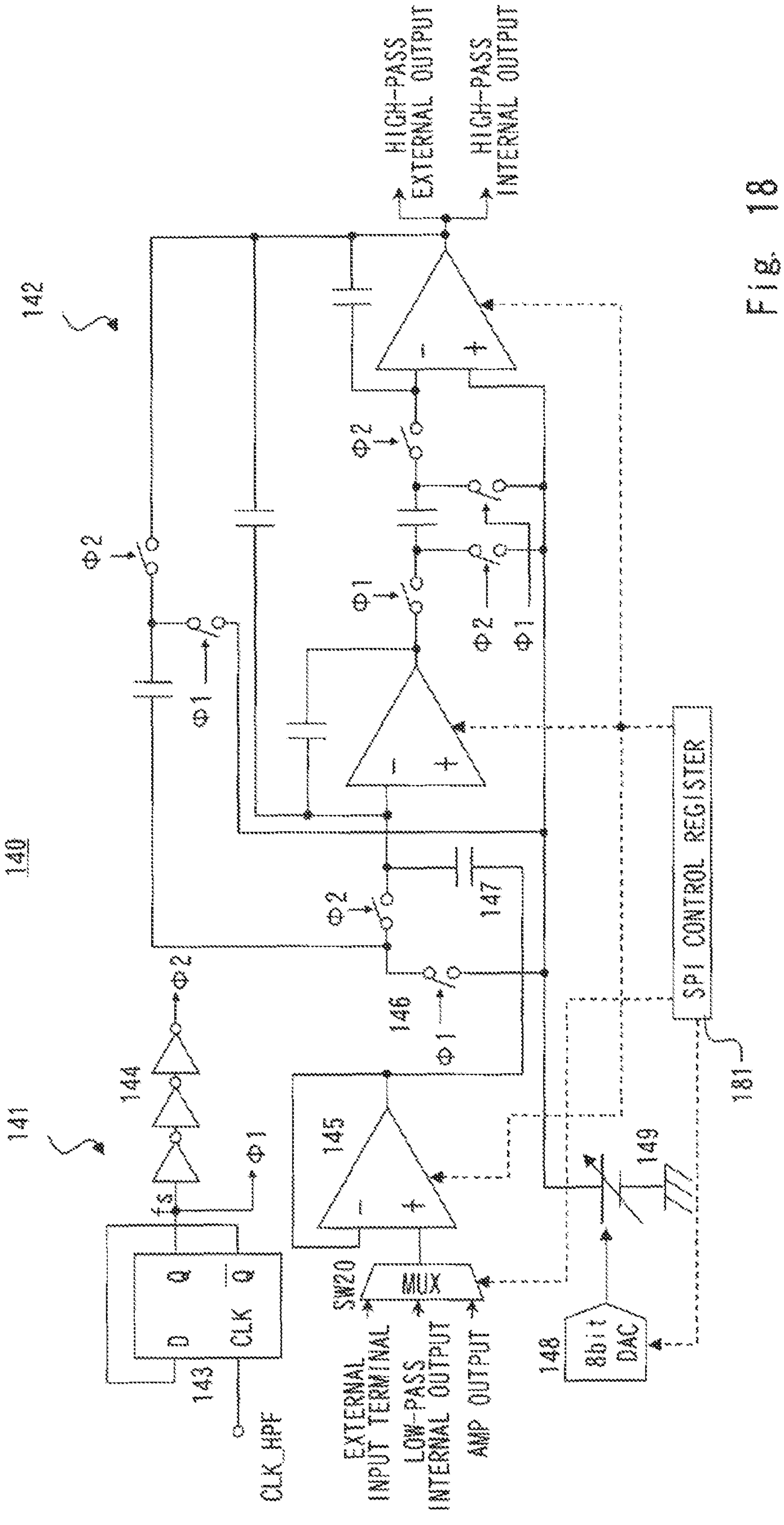
FIG. 18 is a circuit diagram showing a circuit configuration of the semiconductor device according to the first embodiment.

FIG. 18 shows a circuit configuration of the high-pass filter 140. The high-pass filter 140 is a SC high-pass filter with a variable cutoff frequency and used for filtering of an input signal.

As the characteristics of the high-pass filter 140, a Q value is a fixed value, which is 0.702, for example. As a change in characteristics, the cutoff frequency fc can be set to be variable. For example, it can be set to a range of 8 Hz to 800 Hz. Further, the power on/off can be switched by power-off mode.

As shown in FIG. 18, the high-pass filter 140 includes a switching signal generation unit 141 that generates a switching signal and a filtering unit 142 that filters an input signal according to the switching signal.

The switching signal generation unit 141 includes a flip-flop 143 and a plurality of inverters 144. The filtering unit 142 includes a plurality of operational amplifiers 145 and further includes a plurality of switches 146 connected to the plurality of operational amplifiers 145, a capacitor 147, and a variable power supply 149 that is controlled by a DAC 148. Further, a multiplexer (switch) SW20 is connected as shown in FIG. 3.

According to the set value of the register 181, the multiplexer SW20 is controlled to switch the input of the high-pass filter 140. Further, according to the set value of the register 181, the setting of the DAC 148 is changed to control the variable power supply 149 to thereby change the operating point, offset and the like of the amplifier. Further, according to the set value of the register 181, the on/off of the power supply of the high-pass filter 140 can be controlled.

In the high-pass filter 140, the clock CLK_HPF is input to the switching signal generation unit 141 from the outside, and switching signals Φ1 and Φ2 are generated by the flip-flop 143 and the inverters 144. In the filtering unit 142, when a signal is input from the external input terminal, the gain amplifier 120 or the like, the signal is output through three operational amplifiers 145 and, at that time, the switches 146 are turned on/off by the switching signals Φ1 and Φ2, and thereby a connection of the capacitor 147 is switched. Consequently, a signal after removal of lower frequency components than the cutoff frequency of the input signal is output.

The cutoff frequency can be changed by the clock CLK_HPF that is input from the outside by the MCU unit 200. To be specific, the cutoff frequency is fc=0.008×fs. In this formula, fs=(½)×f (f is the frequency of CLK_HPF).

Figure 19:
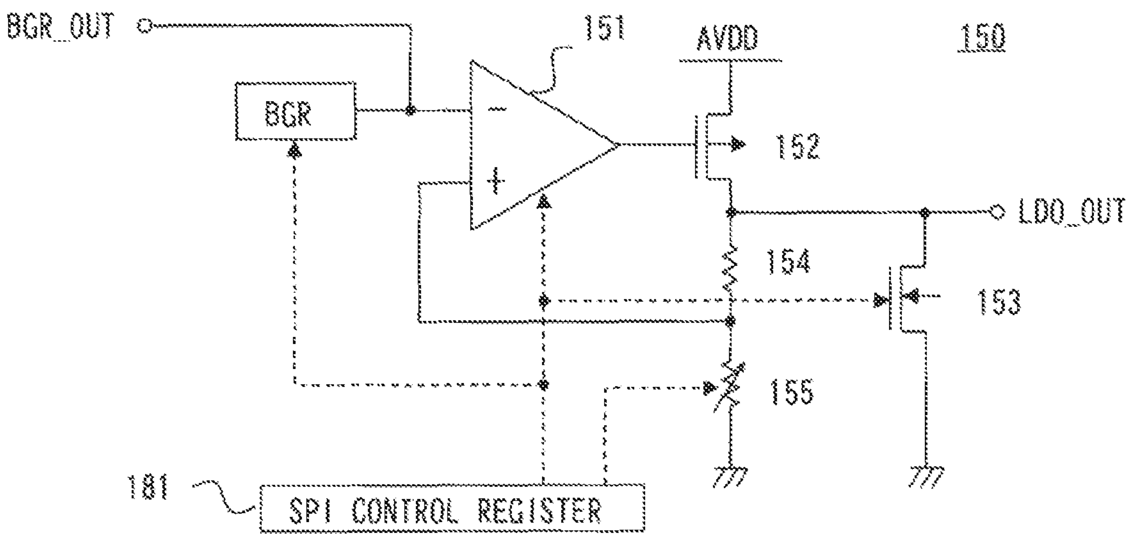
FIG. 19 is a circuit diagram showing a circuit configuration of the semiconductor device according to the first embodiment.

FIG. 19 shows a circuit configuration of the variable regulator 150. The variable regulator 150 is a regulator that makes the output voltage variable, and it is a reference power supply generation circuit of the A/D converter 260 of the MCU unit 200. As a change in characteristics, the variable regulator 150 can set the output voltage to a range of 2.0V to 3.3V in steps of 0.1V with an accuracy of ±5%. Further, the output current is 15 mA, and the on/off of the output power supply can be controlled.

As shown in FIG. 19, the variable regulator 150 includes an operational amplifier 151 and further includes a band gap reference BGR that is connected to the input side of the operational amplifier 151, and transistors 152 and 153, a fixed resistor 154, and a variable resistor 155 that are connected to the output side of the operational amplifier 151.

According to the set value of the register 181, the voltage of the BGR is set, and the output voltage can be changed by changing resistance value of the variable resistor 155. Further, according to the set value of the register 181, the power on/off of the operational amplifier 151 and the on/off of the transistor 153 are switched, and the start and stop of output of the output voltage are controlled.

In the variable regulator 15C, the voltage of the BGR is output from BGR_OUT. The operational amplifier 151 operates in accordance with the voltage of the BGR and the voltage of the variable resistor 155 to control the transistor 152, and the voltage corresponding to the ratio of the fixed resistor 154 and the variable resistor 155 is output.

Figure 20:
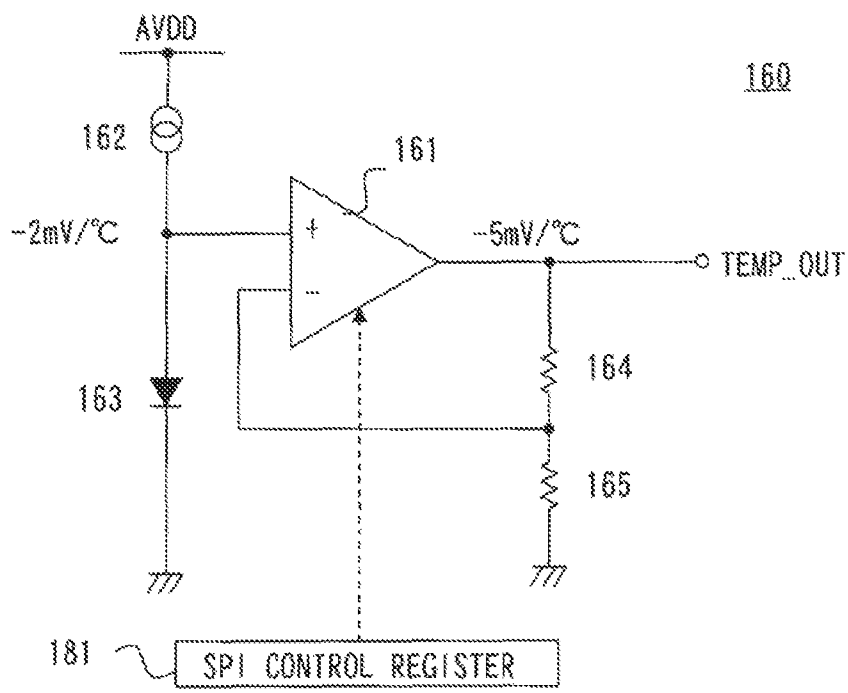
FIG. 20 is a circuit diagram showing a circuit configuration of the semiconductor device according to the first embodiment.

FIG. 20 shows a circuit configuration of the temperature sensor 160. The temperature sensor 160 is a sensor that measures the temperature of the semiconductor device 1, and it can be used for the MCU unit 200 to make correction of the temperature characteristics or the like based on the measurement result. For example, as the characteristics of the temperature sensor 160, the output temperature coefficient is −5 mV/° C. Further, the power on/off can be switched by power-off mode.

As shown in FIG. 20, the temperature sensor 160 includes an operational amplifier 161 and further includes a current source 162 and a diode 163 that are connected to the input side of the operational amplifier 161, and fixed resistors 164 and 165 that are connected to the output side of the operational amplifier 161. The power supply of the operational amplifier 161 can be turned on/off according to the set value of the register 181.

In the temperature sensor 160, the voltage of the diode 163 changes at −2 mV/° C. according to the temperature, and the operational amplifier 161 makes non-inverting amplification of the voltage and outputs it as −5 mV/° C.

As described above, the semiconductor device 1 of TYPE 0 can set the circuit configuration and characteristics of the AFE unit 100 inside the semiconductor device 1 to be variable. Therefore, one semiconductor can connect with various sensors and thus can be used for many application systems (applications).

For example, in the case where the circuit configuration of the configurable amplifier 110 is set as a non-inverting amplifier, a voltage output sensor can be connected, thus being applicable to an application system using an infrared sensor, a temperature sensor, a magnetic sensor and the like. As an example, it can be used for a digital camera with an infrared sensor, a printer with a temperature sensor, a tablet terminal with a magnetic sensor, an air conditioner with an infrared sensor and the like.

Further, in the case where the circuit configuration of the configurable amplifier 110 is set as an instrumentation amplifier, a faint differential output sensor can be connected, thus being applicable to an application system using a pressure sensor, a gyro sensor, a shock sensor and the like. As an example, it can be used for a blood-pressure meter with a pressure sensor, a scale with a pressure sensor, a mobile phone with a gyro sensor, a liquid crystal television with a shock sensor and the like.

Further, in the case where the circuit configuration of the configurable amplifier 110 is set as an I/V amplifier, a current output sensor can be connected, thus being applicable to an application system using a photodiode, a presence sensor, an infrared sensor and the like. As an example, it can be used for a digital camera with a photodiode, a monitoring camera with a presence sensor, a toilet seat with a presence sensor, a barcode reader with an infrared sensor and the like.

Figure 21:
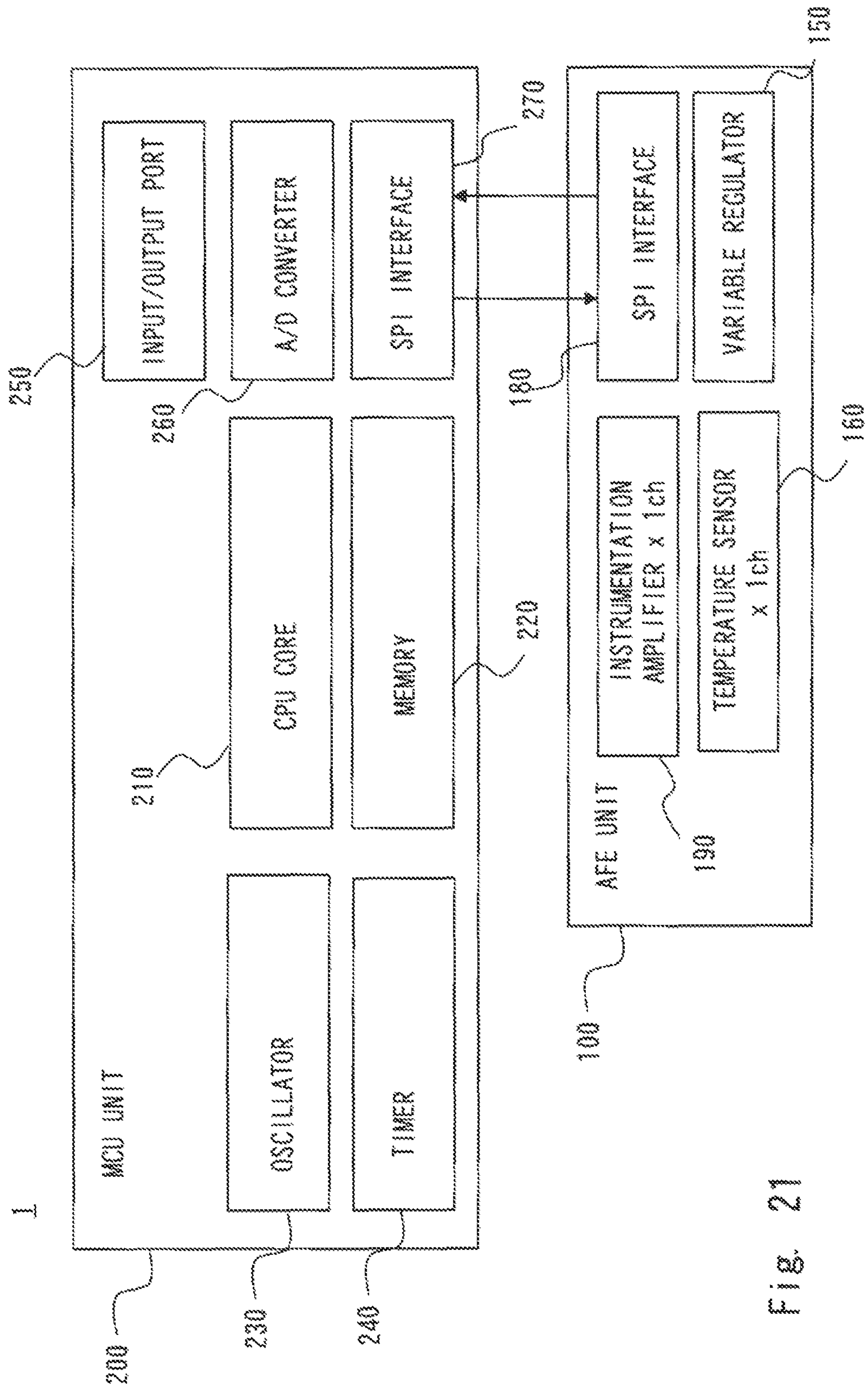
FIG. 21 is a circuit block diagram of the semiconductor device according to the first embodiment.

FIG. 21 shows a circuit block of the semiconductor device 1 of TYPE 1. The semiconductor device of TYPE 0 shown in FIG. 2 is intended for use in a general-purpose system, and a complete AFE circuit that is required for many sensors is included. On the other hand, the semiconductor device of TYPE 1 is intended for use in a common measuring instrument, and an AFE circuit that is required only for a sensor of a common measuring instrument is included.

As shown in FIG. 21, in the semiconductor device 1 of TYPE 1, the configuration of the MCU unit 200 is the same as that of FIG. 2, and the AFE unit 100 includes an instrumentation amplifier 190, the variable regulator 150, the temperature sensor 160, and the SPI interface 180. Compared with the semiconductor device 1 in FIG. 2, the AFE unit 100 does not include the configurable amplifier, the gain amplifier supporting synchronous detection, the SC low-pass filter, the SC high-pass filter, and the general-purpose amplifier, and it includes only the instrumentation amplifier instead. The variable regulator 150, the temperature sensor 160 and the SPI interface 180 are the same as those shown in FIG. 2.

The instrumentation amplifier 190 is an amplification circuit that supports a sensor of a common measuring instrument and can amplify a faint differential signal. The instrumentation amplifier 190 is the same circuit as the instrumentation amplifier which can be formed by the configurable amplifier 110 shown in FIG. 2. The circuit configuration of the instrumentation amplifier 190 is fixed, and only the characteristics can be changed.

Figure 22:
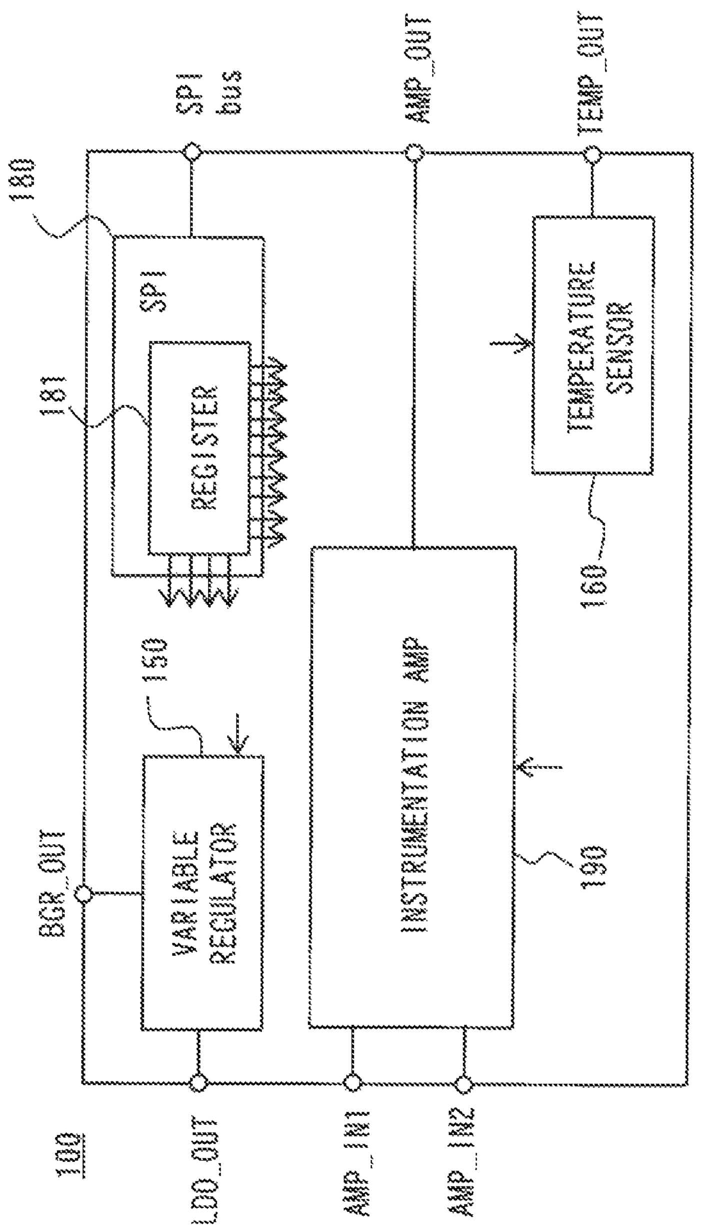
FIG. 22 is a diagram showing connections in a circuit of the semiconductor device according to the first embodiment.

FIG. 22 shows connections of the circuits in the AFE unit 100 in the semiconductor device 1 of TYPE 1. The variable regulator 150, the temperature sensor 160 and the SPI interface 180 are the same as those shown in FIG. 3.

Because the circuit configuration of the instrumentation amplifier 190 is fixed, the instrumentation amplifier 190 does not include a switch (multiplexer) for switching the configuration. In the instrumentation amplifier 190, one input terminal is connected to AMP_IN1, the other input terminal is connected to AMP_IN2, and the output terminal is connected to AMP_OUT. Note that switches for selecting connections with a plurality of external terminals may be included.

A specific circuit configuration of each circuit in the AFE unit 100 in the semiconductor device of TYPE 1 is the same as that of the semiconductor device in FIG. 2, and thus not redundantly described. In other words, the circuit configuration of the instrumentation amplifier 190 is the configuration shown in FIG. 14, and the instrumentation amplifier 190 can set the gain by changing the resistance value and can change the operating point, offset and the like by changing the setting of the DAC, as shown in FIG. 14.

As described above, in the semiconductor device 1 of TYPE 1, the circuit configuration of the AFE unit 100 is fixed, and only the characteristics can be set to be variable. Therefore, one semiconductor device can support specific sensors having different characteristics, and it can be used for a specific application system.

For example, the semiconductor device 1 is applicable to an application system using a pressure sensor, a gyro sensor, a shock sensor or the like, which is a sensor with a faint differential output, just like the case where the instrumentation amplifier is formed in the semiconductor device 1 of TYPE 0.

Figure 23:
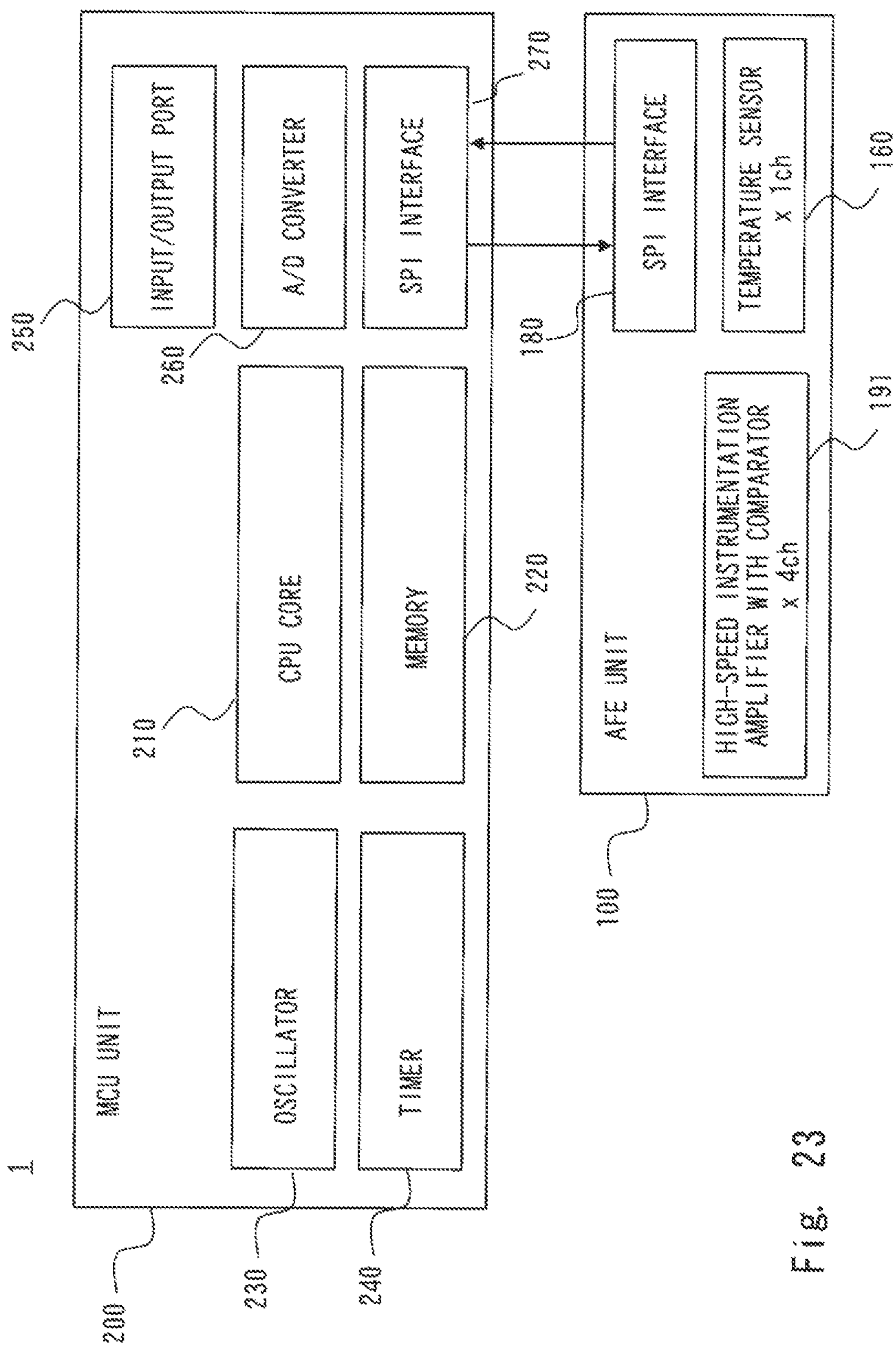
FIG. 23 is a circuit block diagram of the semiconductor device according to the first embodiment.

FIG. 23 shows another example of a circuit block of the semiconductor device 2 of TYPE 2. The semiconductor device of TYPE 0 shown in FIG. 2 is intended for use in a general-purpose system and includes a complete AFE circuit that is required for many sensors. On the other hand, the semiconductor device of TYPE 2 is intended for use in motor control and includes an AFE circuit that is required only for motor control.

As shown in FIG. 23, in the semiconductor device 1 of TYPE 2, the configuration of the MCU unit 200 is the same as that of FIG. 2, and the AFE unit 100 includes a high-speed instrumentation amplifier 191 with a built-in comparator, the temperature sensor 160, and the SPI interface 180. Compared with the semiconductor device in FIG. 2, the AFE unit 100 does not include the configurable amplifier, the amplifying amplifier supporting synchronous detection, the SC low-pass filter, the SC high-pass filter, the general-purpose amplifier and the variable regulator, and includes only the high-speed instrumentation amplifier 191 with a built-in comparator instead. The temperature sensor 160 and the SPI interface 180 are the same as those shown in FIG. 2.

The high-speed instrumentation amplifier with a built-in comparator (which is referred to hereinafter also as a high-speed instrumentation amplifier) 191 is an amplification circuit that supports motor control and can amplify a faint differential signal at high speed, and further includes a comparator for making comparison of the output voltage. The AFE unit 100 includes a plurality of (multi-ch) high-speed instrumentation amplifiers 191 to enable control of a multi-phase motor, and it includes four (4ch) instrumentation amplifiers in this example. The circuit configuration of the high-speed instrumentation amplifier 191 is fixed, and only the characteristics can be changed.

Figure 24:
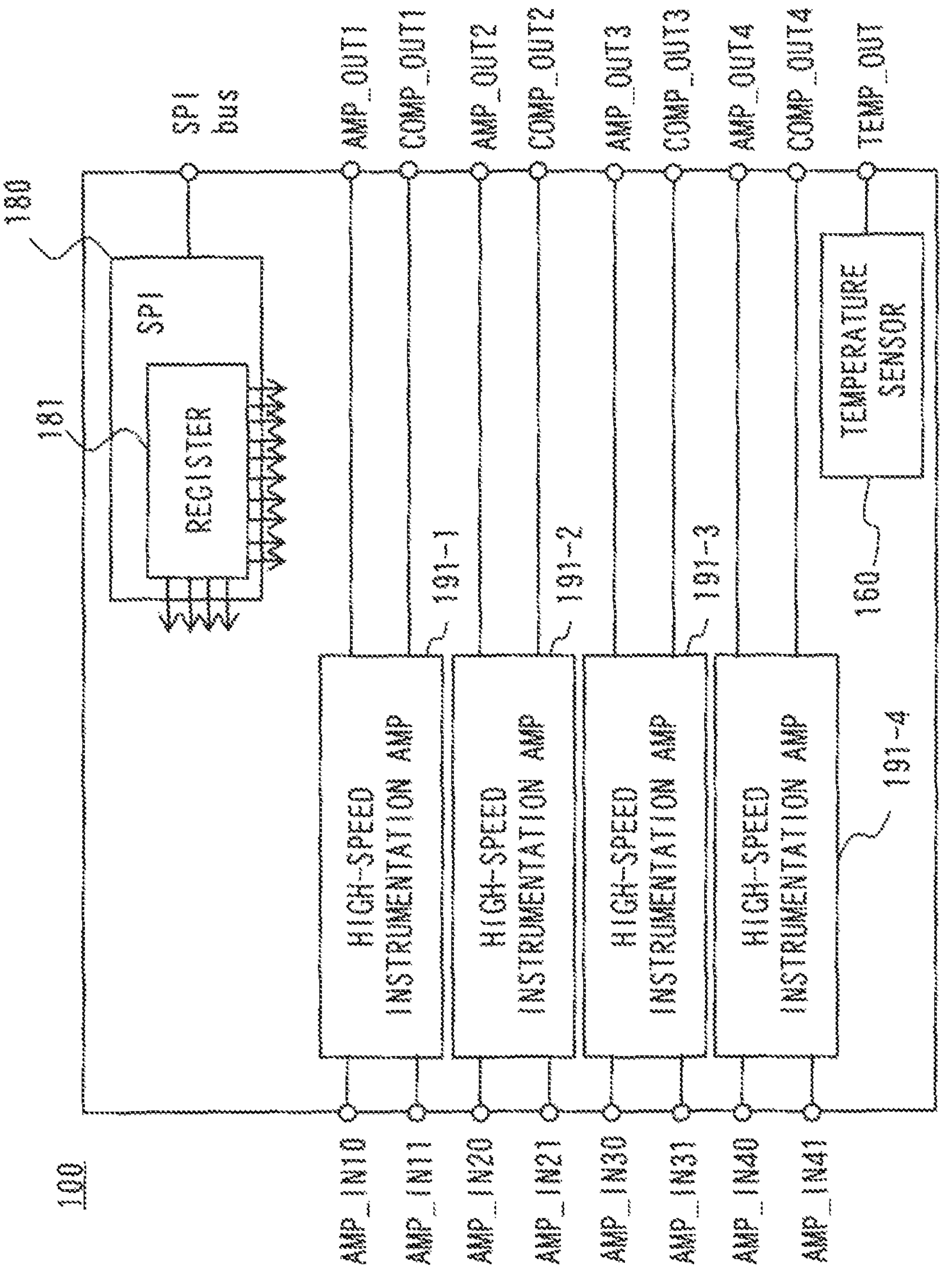
FIG. 24 is a diagram showing connections in a circuit of the semiconductor device according to the first embodiment.

FIG. 24 shows connections of the circuits in the AFE unit 100 in the semiconductor device 1 of TYPE 2. The temperature sensor 160 and the SPI interface 180 are the same as those shown in FIG. 3.

Because the circuit configuration of the high-speed instrumentation amplifier 191 is fixed, the high-speed instrumentation amplifier 191 does not include a switch (multiplexer) for switching the configuration. Four high-speed instrumentation amplifiers 191-1 to 191-4 are independent of one another.

Specifically, in the high-speed instrumentation amplifiers 191-1 to 191-4, one input terminals are connected to AMP_IN10, 20, 30 and 40, other input terminals are connected to AMP_IN11, 21, 31 and 41, the output terminals of amplifiers are connected to AMP_OUT1 to 4, and the output terminals of comparators are connected to COMP_OUT1 to 4, respectively. Note that switches for selecting connections with a plurality of external terminals may be included.

Figure 25:
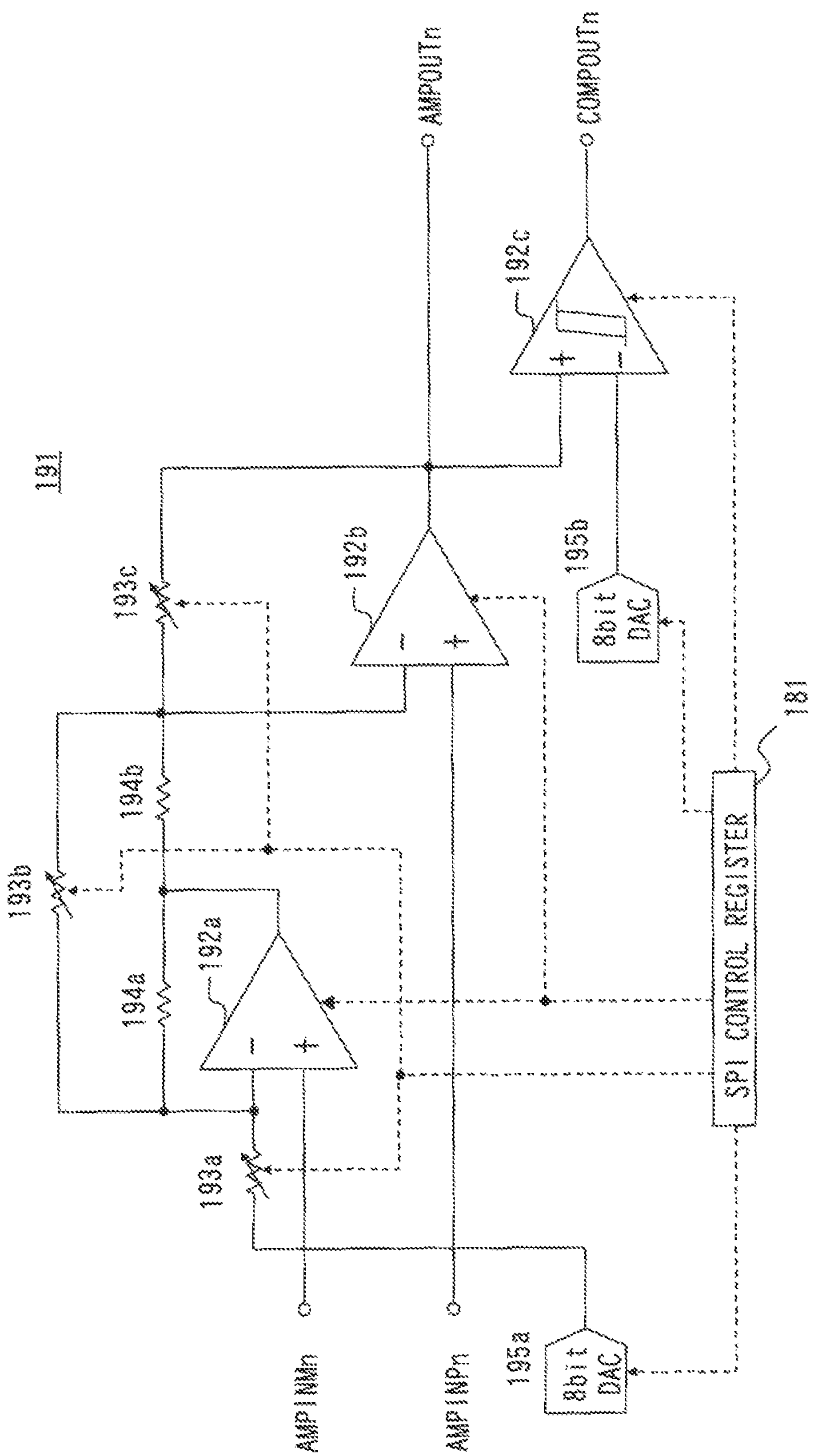
FIG. 25 is a circuit diagram showing a circuit configuration of the semiconductor device according to the first embodiment.

FIG. 25 shows a specific circuit configuration of the high-speed instrumentation amplifier 191. The high-speed instrumentation amplifier 191 is a high-speed instrumentation amplifier with a comparator intended for motor control, and it performs the amplification and voltage comparison of the output signal of a sensor used for motor control. As a change in characteristics, the gain of the high-speed instrumentation amplifier 191 can be set to be variable. For example, the gain can be set to a range of 10 dB to 34 dB in steps of 2 dB. Further, the slew rate can be set to be variable, and the power on/off can be switched by power-off mode.

Further, the high-speed instrumentation amplifier 191 includes a comparator for comparison of high-speed instrumentation amplifier output, and the hysteresis voltage and reference voltage of the comparator are variable.

As shown in FIG. 25, the high-speed instrumentation amplifier 191 includes operational amplifiers 192*a* and 192*b* that operate as instrumentation amplifiers and an operational amplifier 192*c* that operates as a hysteresis comparator, and further includes variable resistors 193*a* to 193*c* that are connected to the operational amplifiers 192*a* to 192*c*, fixed resistors 194*a* and 194*b*, and DACs 195*a* and 195*b*.

The gain, operating point, offset and the like of the high-speed instrumentation amplifier 191 can be changed by changing the resistance values of the variable resistors 193*a* to 193*c* and the setting of the DAC 195*a* according to the set value of the register 181. Further, the hysteresis voltage (reference voltage) of the comparator can be changed by the setting of the DAC 195*b*. Furthermore, the power on/off of the operational amplifiers 192*a* to 192*c* can be controlled according to the set value of the register 181.

In the high-speed instrumentation amplifier 191, when differential signals are input from external input terminals AMPINMn, AMPINPn (corresponding to AMPIN10, 11 to AMPIN40, 41), signals that are non-inverting amplified at high speed by two stages of instrumentation amplifiers composed of the operational amplifiers 192*a* and 192*b* are output to AMPOUTn (corresponding to AMPOUT1 to AMPOUT4). Further, a comparison signal as a result of comparing the output signal of the AMPOUTn and the reference voltage is output from the hysteresis comparator composed of the operational amplifiers 192*c*. Note that the MCU unit 200 performs motor control according to signals at AMPOUTn and COMPOUTn.

As described above, in the semiconductor device 1 of TYPE 2, the circuit configuration of the AFE unit 100 is fixed, and only the characteristics can be set to be variable. Therefore, one semiconductor device can support specific sensors having different characteristics, and it can be used for a specific application system. Particularly, it can be connected to a drive circuit of a multi-phase motor or the like.

The following effects are obtained by the semiconductor device 1 described above. First, reduction in size and power consumption is achieved. The MCU and AFE circuits are included inside the semiconductor device 1, and the size can be reduced compared to the case where a plurality of analog circuit ICs are mounted on a mounting board. Further, in the low power consumption mode, the power of the AFE unit is off to enter the sleep mode of the MCU unit, the power consumption can be reduced.

Further, an analog IC development process can be reduced. To develop an analog circuit suitable for a sensor, the process of circuit design, mask design, mask production and sample production is typically required, which can take three to eight months. According to the above-described the semiconductor device 1, an analog circuit compatible with a sensor can be formed simply by changing the setting of the semiconductor device 1, and therefore the semiconductor device can be developed without performing the development process from circuit design to sample production. It is thus possible to develop a sensor system in a short period and make timely entry into the market.

In addition, one semiconductor device 1 can be used for a plurality of application systems. According to the above-described the semiconductor device 1, the circuit configuration is freely changeable, and therefore one semiconductor device is connectable with various types of sensors such as a current-type sensor and a voltage-type sensor. There is thus no need to develop different semiconductor devices for different sensors, which enables reduction of a development period.

Further, in the semiconductor device of TYPE 1, the semiconductor device is intended for use in a common measuring instrument, and only the instrumentation amplifier oz the like, which is required for the common measuring instrument, is included, and, in the semiconductor device of TYPE 2, the semiconductor device is intended for use in motor control, and only the high-speed instrumentation amplifier or the like, which is required for motor control, is included. Thus, the semiconductor device does not include unnecessary circuits, which allows simplification of the circuit configuration and size reduction and lower power consumption in the semiconductor device.

In the semiconductor device 1 described above, it is necessary to determine the configuration and characteristics of the AFE unit 100 in accordance with a sensor to be connected. Thus, in the design development of a sensor system using a sensor and the semiconductor device 1, simulation is performed for the operation of the sensor and the semiconductor device 1. Simulation that is performed in the development process of a sensor system including a sensor and the semiconductor device 1 is described hereinafter. Although the semiconductor device 1 including the AFE unit 100 only is mainly described as a target of simulation, simulation can be performed in the same manner for the semiconductor device 1 including the AFE unit 100 and the MCU unit 200.

Figure 26:
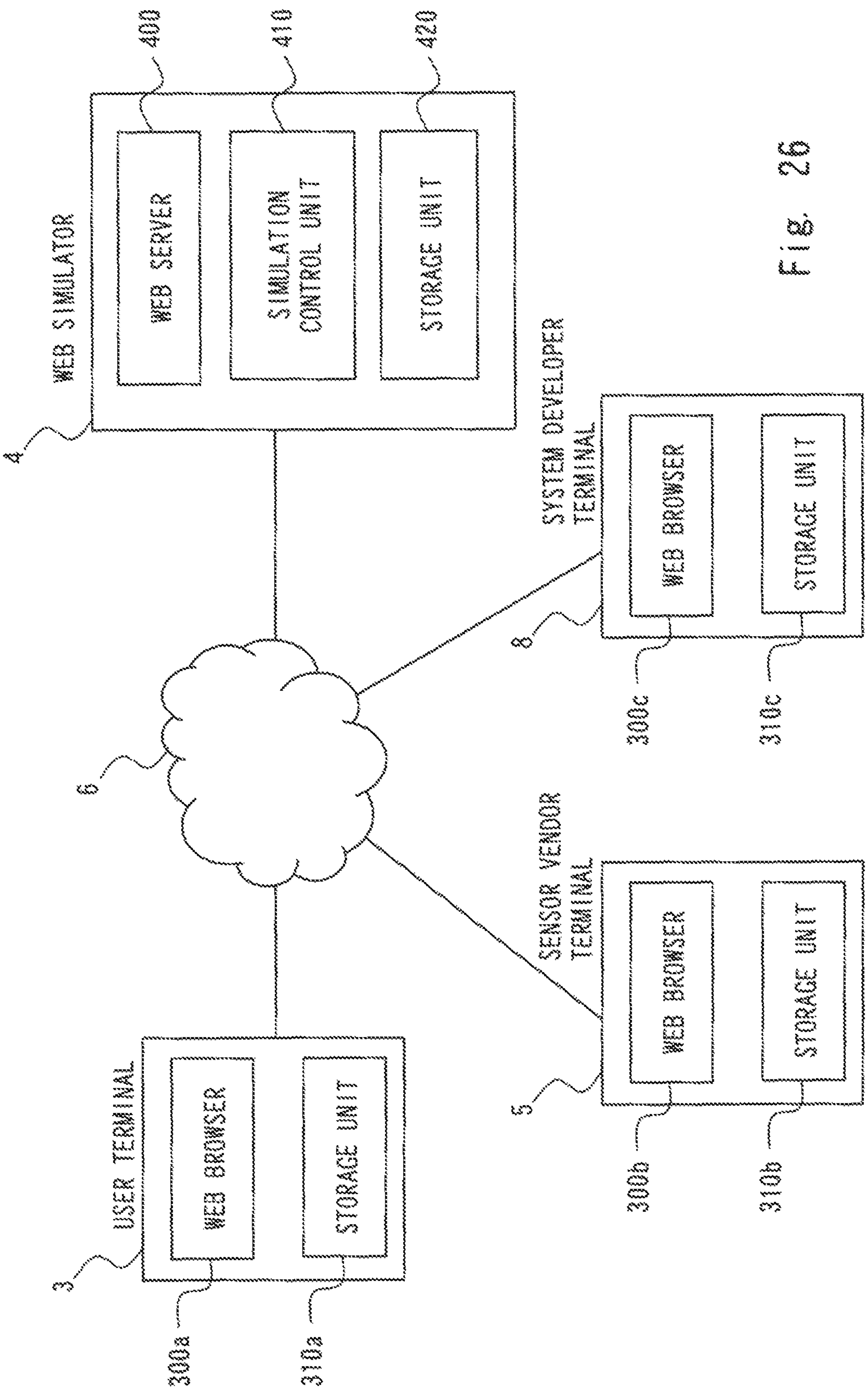
FIG. 26 is a diagram of a simulation system according to the first embodiment.

FIG. 26 shows a configuration of a simulation system (design support system) for simulating the operation of the semiconductor device 1 according to this embodiment.

As shown in FIG. 26, the simulation system includes a user terminal 3, a web simulator 4, a sensor vendor terminal 5, and a system developer terminal 8 that are connected to be able to communicate with one another through a network 6. The user terminal 3 is a terminal that is operated by a user of the simulation system, and it accesses the web simulator 4 in response to the user's operation and requests execution of simulation of the semiconductor device 1 with a configuration desired by the user. The sensor vendor terminal 5 is a terminal that is operated by a sensor vendor that manufactures/sells a sensor, and it accesses the web simulator 4 in response to the sensor vendor's operation and requests registration/update/deletion of information related to a sensor desired by the sensor vendor and further requests execution of simulation of the semiconductor device 1. The system developer terminal (administration terminal) 8 is a terminal that is operated by a system developer (administrator) that develops (administers) the web simulator 4, and it accesses the web simulator 4 in response to the system developer's operation and requests registration/update/deletion of information related to a sensor and further requests execution of simulation of the semiconductor device 1. The web simulator 4 executes simulation of the semiconductor device 1 in response to a request from the user terminal 3, the sensor vendor terminal 5 or the system developer terminal 8 and further performs registration/update/deletion (hereinafter, update includes deletion in some cases) of information related to a sensor in a storage unit 420 (database) in response to a request from the sensor vendor terminal 5 or the system developer terminal 8. Note that, although registration or update of information related to a sensor is mainly described in this embodiment, the present invention can be applied in the same manner for deletion of information related to a sensor also, as for update of the information.

The user terminal 3 mainly includes a web browser 300*a* and a storage unit 310*a*. The web simulator 4 mainly includes a web server 400, a simulation control unit 410, and a storage unit 420. The sensor vendor terminal 5 mainly includes a web browser 300*b* and a storage unit 310*b*. The system developer terminal 8 mainly includes a web browser 300*c* and a storage unit 310*c*.

The network 6 is the Internet or the like, for example, and it is a network allowing transmission of web page information between the user terminal 3, the sensor vendor terminal 5 and the system developer terminal 8, and the web simulator 4. The network 6 may be a wired network or a wireless network.

The web browser 300*a* of the user terminal 3 displays a web page based on the web page information received from the web server 400 on a display device. The web browser 300*a* also serves as a user interface that receives a user's operation and accesses the web server 400 in response to the user's operation to execute simulation in the web simulator 4.

The storage unit 310*a* of the user terminal 3 stores various data, program and the like for implementing the functions of the user terminal 3. Further, the storage unit 310*a* downloads register information to be set to the register 181 of the semiconductor device 1 from the web simulator 4 and stores it, as described later.

The web browser 300*b* of the sensor vendor terminal 5 displays a web page based on the web page information received from the web server 400 on a display device. The web browser 300*b* also serves as a sensor vendor (user) interface that receives a sensor vendor's operation and accesses the web server 400 in response to the sensor vendor's operation to register or update information related to a sensor or execute simulation in the web simulator 4. The storage unit 310*b* of the sensor vendor terminal 5 stores various data, program and the like for implementing the functions of the sensor vendor terminal 5.

The web browser 300*c* of the system developer terminal 8 displays a web page based on the web page information received from the web server 400 on a display device. The web browser 300*c* also serves as a system developer (user) interface that receives a system developer's operation and accesses the web server 400 in response to the system developer's operation to perform registration/update of information related to a sensor or simulation in the web simulator 4. The storage unit 310*c* of the system developer terminal 8 stores various data, program and the like for implementing the functions of the system developer terminal 8.

Note that, because the web browsers 300*a*, 300*b* and 300*c* have the same structure, any or all of them are referred to simply as the web browser 300 in some cases. Further, because the storage units 310*a*, 310*b* and 310*c* also have the same structure, any or all of them are referred to simply as the storage unit 310 in some cases.

The web server 400 of the web simulator 4 is a server that provides a web service of a web simulator to the web browser 300. The web server 400 receives access from the web browser 300 and transmits web page information to be displayed on the web browser 300 in response to the access.

The simulation control unit 410 of the web simulator 4 implements the function of simulating a sensor and the semiconductor device 1. As described later, the web simulator 4 sets the circuit configuration of a sensor and the semiconductor device 1 to be simulated, sets parameters required for simulation and executes simulation.

The storage unit 420 of the web server 400 stores various data, program and the like for implementing the function of the web simulator 4. As described later, the storage unit 420 stores information of a selectable sensor, information of a bias circuit suitable for a sensor, information of an analog circuit suitable for a sensor and a bias circuit and the like.

Figure 27:
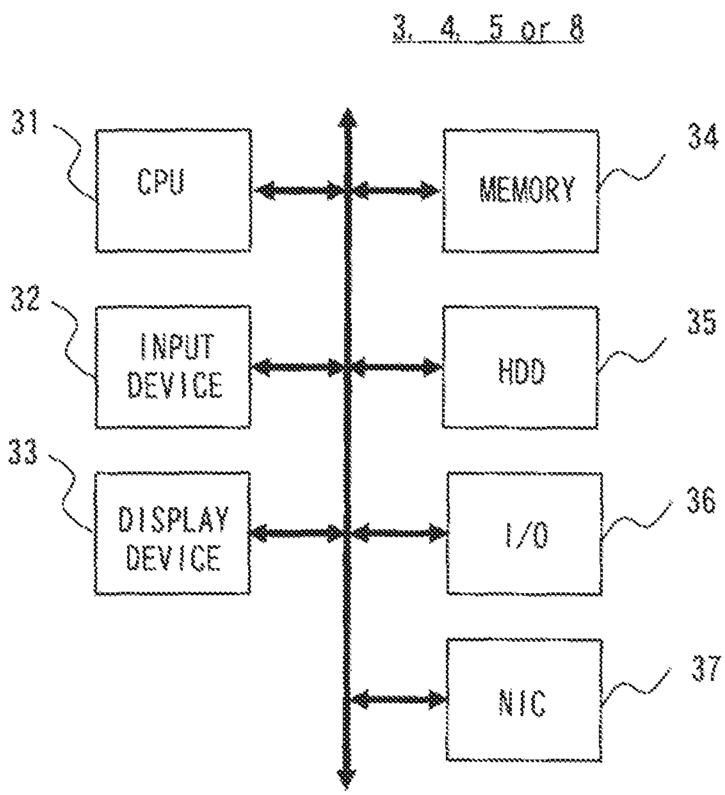
FIG. 27 is a hardware diagram of a device that constitutes the simulation system according to the first embodiment.

The user terminal 3, the sensor vendor terminal 5 and the system developer terminal 8 are computer devices such as personal computers that operate as client devices, and the web simulator 4 is a computer device such as a work station that operates as a server device. FIG. 27 shows an example of a hardware configuration to implement the user terminal 3, the web simulator 4, the sensor vendor terminal 5 or the system developer terminal 8. Note that the user terminal 3, the web simulator 4, the sensor vendor terminal 5 and the system developer terminal 8 may be composed of a plurality of computers, not limited to a single computer.

As shown in FIG. 27, the user terminal 3, the web simulator 4, the sensor vendor terminal 5 or the system developer terminal 8 is a general computer device and includes a central processing unit (CPU) 31 and a memory 34. The CPU 31 and the memory 34 are connected to a hard disk device (HDD) 35 as an auxiliary storage device through a bus. The user terminal 3, the sensor vendor terminal 5 and the system developer terminal 8 include an input device 32, such as a pointing device (mouse, joy stick etc.) and a keyboard, for input by a user or a sensor vendor, and a display device 33, such as a CRT or a liquid crystal display, for presenting visual data like GUI to a user, for example, as user interface hardware. The web simulator 4 may also have user interface hardware just like the user terminal 3, the sensor vendor terminal 5 and the system developer terminal 8.

In a storage medium such as the HDD 35, a program for giving instructions to the CPU 31 or the like and implementing the functions of the user terminal 3, the web simulator 4, the sensor vendor terminal 5 or the system developer terminal 8 in cooperation with the operation system can be stored. The program is executed by being loaded to the memory 34.

The program can be stored and provided to a computer using any type of non-transitory computer readable media. Non-transitory computer readable media include any type of tangible storage media. Examples of non-transitory computer readable media include magnetic storage media (such as floppy disks, magnetic tapes, hard disk drives, etc.), optical magnetic storage media (e.g. magneto-optical disks), CD-ROM (compact disc read only memory), CD-R (compact disc recordable), CD-R/W (compact disc rewritable), and semiconductor memories (such as mask ROM, PROM (programmable ROM), EPROM (erasable PROM), flash ROM, RAM (random access memory), etc.). The program may be provided to a computer using any type of transitory computer readable media. Examples of transitory computer readable media include electric signals, optical signals, and electromagnetic waves. Transitory computer readable media can provide the program to a computer via a wired communication line (e.g. electric wires, and optical fibers) or a wireless communication line.

Further, the user terminal 3, the web simulator 4, the sensor vendor terminal 5 or the system developer terminal 8 includes an input/output interface (I/O) 36 or NIC (Network Interface Card) 37 for connection with an external device. For example, the user terminal 3 is provided with a USB or the like for connection with the semiconductor device 1 or the like as the input/output interface 36. The user terminal 3, the web simulator 4, the sensor vendor terminal 5 and the system developer terminal 8 are provided with Ethernet (registered trademark) card or the like as the NIC 37 for connection with the network 6.

Figure 28A:
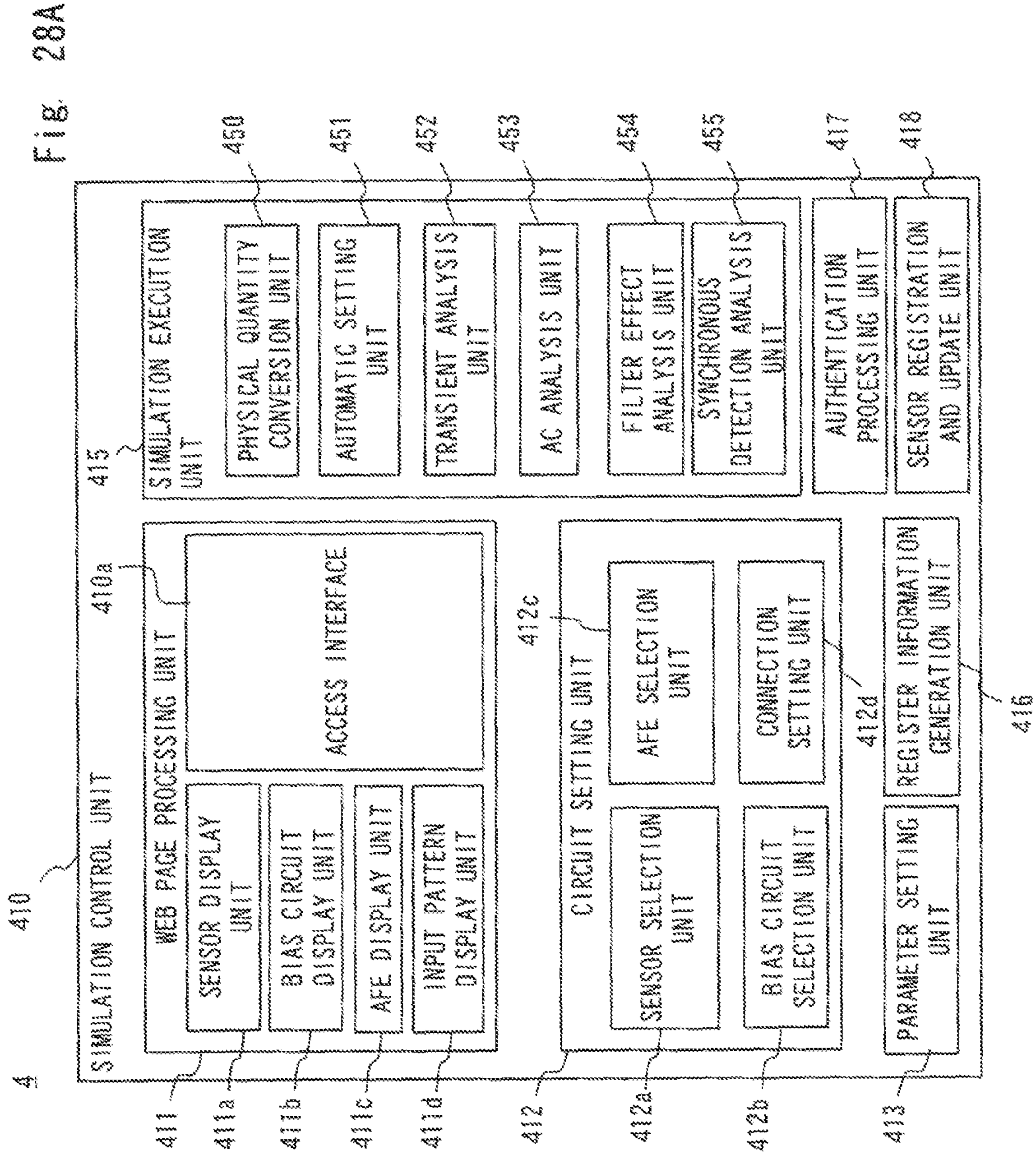
FIG. 28A is a functional block diagram of a web simulator according to the first embodiment.
Figure 28B:
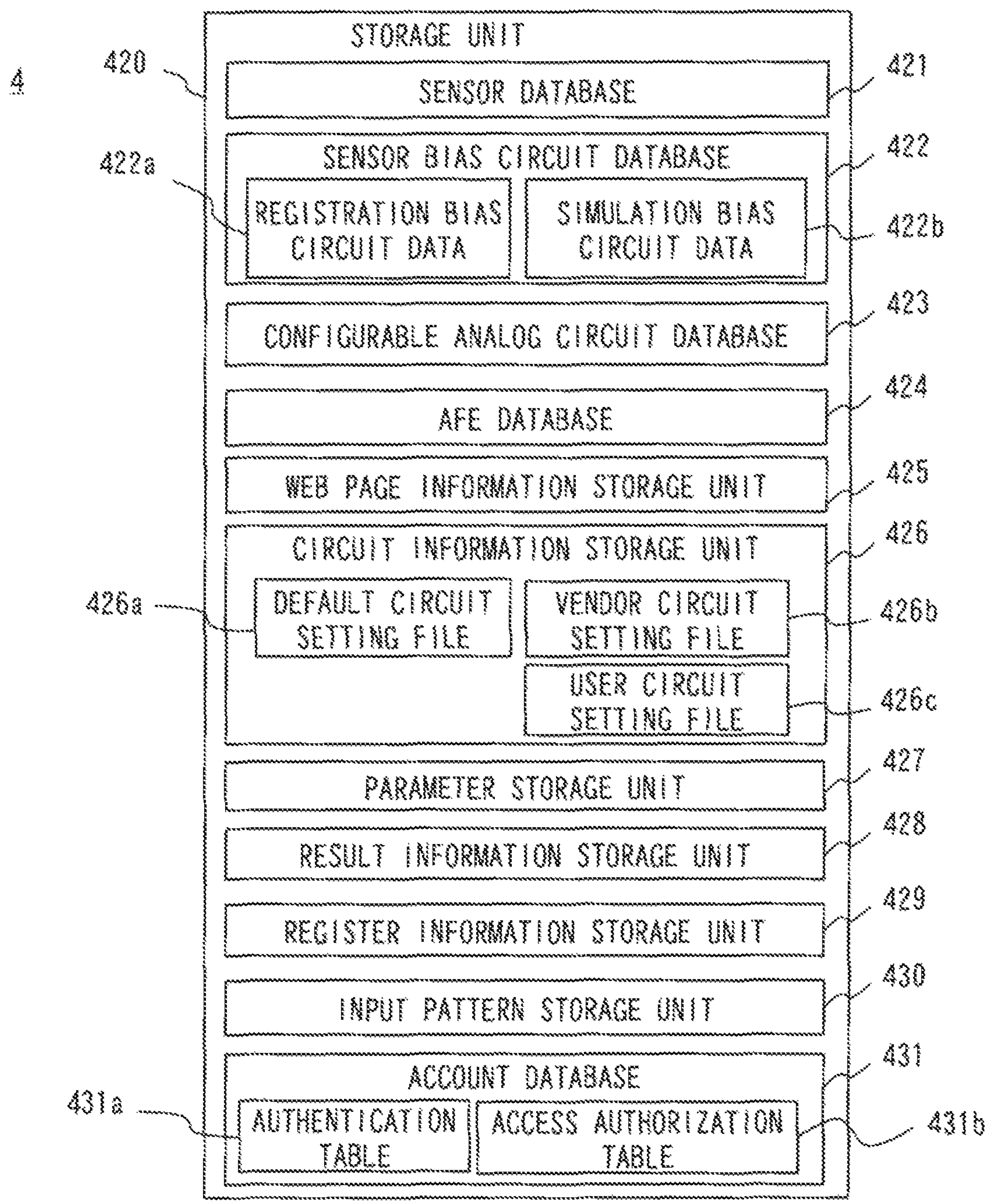
FIG. 28B is a functional block diagram of the web simulator according to the first embodiment.

FIGS. 28A and 28B show functional blocks of the simulation control unit 410 and various data stored in the storage unit 420 in the web simulator 4. Note that FIGS. 28A and 28B show just one example and the other configuration may be used as long as the process and display screen according to this embodiment described later can be implemented.

In the simulation control unit 410, the CPU 31 executes a simulation program and thereby implements the function of each unit for simulation. As shown in FIG. 28A, the simulation control unit 410 mainly includes a web page processing unit 411, a circuit setting unit 412, a parameter setting unit 413, a simulation execution unit 415, a register information generation unit 416, an authentication processing unit 417, and a sensor registration and update unit 418.

The storage unit 420 is implemented by the HDD 35 or the memory 34. As shown in FIG. 28B, the storage unit 420 includes a sensor database 421, a sensor bias circuit database 422, a configurable analog circuit database 423, an AFE database 424, a web page information storage unit 425, a circuit information storage unit 426, a parameter storage unit 427, a result information storage unit 428, a register information storage unit 429, an input pattern storage unit 430, and an account database 431. Note that each database and each storage unit may be divided or integrated according to need. For example, the sensor database 421 and the sensor bias circuit database 422 may be one sensor database. Further, the sensor bias circuit database 422 may be divided into a database for registration and a database for simulation.

The sensor database (sensor information storage unit) 421 is a database that stores sensor information related to sensors to be connected to the semiconductor device 1. The sensor information is information of datasheets of various types of sensors and contains information about the sensor type and characteristics, the output format indicating an output signal type, the number of terminals and the like. In the sensor database 421, a sensor, a type and characteristics are associated with one another. Further, a sensor vendor that has registered each sensor in the sensor database 421 is also associated, and only the sensor vendor that has registered a sensor can update the sensor information. Further, in the sensor database 421, a flag (data flag) is associated with each of the sensor information. The flag at least indicates that a sensor vendor has accessed and confirmed the sensor information, and it is a flag meaning that the sensor information is correct (assured). The flag contains a registration flag indicating that the sensor information is registered, an update flag indicating that the sensor information is updated, confirmation flag indicating that the sensor information is confirmed by a sensor vendor and the like, for example.

The sensor bias circuit database (bias circuit information storage unit) 422 is a database that stores bias circuits (bias methods) that can be used for various types of sensors. As information of a bias circuit, information about elements of the bias circuit, connections of those elements, output terminals and the like are contained. In the sensor bias circuit database 422, sensors registered in the sensor database 421 and bias circuits are stored in association with each other.

Particularly, the sensor bias circuit database 422 contains registration bias circuit data (first bias circuit information) 422*a* that is used to register a sensor in the sensor database 421 and simulation bias circuit data (second bias circuit information) 422*b* that is used to select a sensor to be simulated. In the registration bias circuit data 422*a*, a sensor type and a bias circuit are associated with each other in order to display a bias circuit that can be selected by a sensor vendor when the sensor vendor registers (updates) the sensor. In the simulation bias circuit data 422*b*, each sensor and a bias circuit are associated with each other in order to display a bias circuit that can be selected as a target of simulation by a user when the user performs simulation. Further, each of the bias circuits stored in the sensor bias circuit database 422 (422*a* and 422*b*) is associated with a sensor vendor that has registered the bias circuit, and only the sensor vendor that has registered the bias circuit and a system developer (administrator) can update and select the bias circuit information.

The configurable analog circuit database 423 is a database for selecting an analog circuit that is most suitable for a sensor and a sensor bias circuit. As information of the configurable analog circuit, information about the configuration of the configurable amplifier 110 of the semiconductor device 1, input terminals and the like are contained. In the configurable analog circuit database 423, a sensor, a bias circuit, and the configuration of the configurable amplifier 110 are associated with one another.

The AFE database 424 is a database that stores a data sheet of the semiconductor device 1. Particularly, the datasheet contains information about the configuration and characteristics of the AFE unit 100 and the like in order to execute simulation of the AFE unit 100 of the semiconductor device 1. In the AFE database 424, the semiconductor device 1 and the configuration of the AFE unit 100 are associated with each other. For example, the datasheets of the semiconductor devices 1 of TYPE 0 to TYPE 2 described above are stored in the AFE database 424.

The web page information storage unit 425 stores web page information for displaying various screens on a web browser 300 of the user terminal 3, the sensor vendor terminal 5 or the system developer terminal 8. The web page information is information for displaying a web page (screen) including GUI for simulating the semiconductor device 1 as described later.

The circuit information storage unit (circuit setting file storage unit) 426 stores a circuit setting file (circuit information) of a circuit to be simulated. The circuit setting file contains configuration information such as connections of a sensor, a bias circuit, circuit elements of the AFE unit 100 and various elements, and further contains characteristics information such as circuit parameters. In the circuit information storage unit 426, a plurality of circuit setting files are stored. In this example, a default circuit setting file 426*a*, a vendor circuit setting file 426*b* and a user circuit setting file 426*c* are contained. The default circuit setting file 426*a* is default circuit information that is automatically set (automatically connected) by a web simulator based on a sensor and a bias circuit. The vendor circuit setting file 426*b* is circuit information that is set by a sensor vendor (recommended by a sensor vendor) as the setting suitable for a sensor and a bias circuit. The user circuit setting file 426*c* is circuit information that is set by a user to perform simulation.

The parameter storage unit 427 stores simulation parameters required to execute simulation as simulation conditions. The simulation parameters include input information such as a physical quantity.

The result information storage unit 428 stores result information, which is a simulation execution result. The result information includes input and output waveform of each circuit in the AFE unit 100 as a simulation result of transient analysis, AC analysis, filter effect analysis and synchronous detection analysis. The register information storage unit 429 stores register information (configuration information) that is set to the register 181 of the semiconductor device 1. The input pattern storage unit 430 stores information about a plurality of waveform patterns of a signal input to a sensor. The input pattern storage unit 430 stores patterns such as a sine wave, a square wave, a triangle wave and a step response as input patterns.

The account database 431 stores account information to log into the web simulator 4 and access the database. As the account information, the account database 431 stores an authentication table 431*a* in which an account ID assigned to each user or sensor vendor and a password are associated with each other. The account database 431 further stores access authorization table 431*b* where access authorization to the database (storage unit) is set for each account ID. Note that the authentication table 431*a* and the access authorization table 431*b* are registered in advance by a system developer.

FIG. 29 shows one example of the access authorization table 431*b*. As shown in FIG. 29, in the access authorization table 431*b*, access authorization is set for each account ID. Further, the access authorization for each account ID is set for each sensor vendor with respect to data to be registered/updated. This enables access by the account ID of a sensor vendor related to a sensor only, and disables access by the account. ID of the other vendors. The access authorization includes authorization to register and update (change) a sensor of each sensor vendor in the sensor database 421, authorization to register and update a bias circuit of each sensor vendor in the sensor bias circuit database 422, authorization to select and update the bias circuit of each sensor vendor registered in the sensor bias circuit database 422, and authorization to execute simulation. The authorization for registration and update in the sensor bias circuit database 422 allows registration and update of a bias circuit in the registration bias circuit data 422*a*, and the authorization for selection and update in the sensor bias circuit database 422 allows selection and update of a bias circuit in the simulation bias circuit data 422*b*.

Using the access authorization table 431*b*, it is possible to identify any of a sensor vendor, a user and a system developer in accordance with the account ID and determine (decide) the access authorization. In the example of FIG. 29, access authorization is set for a system developer, accounts A1 and A2 of a sensor vendor company A, and accounts B1 and B2 of a sensor vendor company B. In the case of the account ID of the system developer, authorization is set to permit registration and update (modification) of all databases including the sensor database 421 and the sensor bias circuit database 422. To be specific, the system developer can register and update the sensors of the company A and the company B in the sensor database 421, can register and update a common (standard) bias circuit and bias circuits corresponding to the sensors of the company A and the company B in the sensor bias circuit database 422 (registration bias circuit data 422*a*), can select and update bias circuits corresponding to the sensors of the company A and the company B in the sensor bias circuit database 422 (simulation bias circuit data 422*b*), and can execute simulation using all the sensors and bias circuits registered.

In the case of the account ID of the sensor vendor, authorization is set to permit update (modification) of only the sensors registered by the sensor vendor among the sensors stored in the sensor database 421 and permit update (modification) of only the bias circuits corresponding to the sensors registered by the sensor vendor among the bias circuits stored in the sensor bias circuit database 422. By setting access authorization for each account of a sensor vendor, it is possible to avoid wrongly updating the sensor information of another sensor vendor and thereby improve the reliability of the sensor information.

In this example, in the case of the account A1 of the sensor vendor company A, authorization is set to permit registration and update of the sensor of the company A in the sensor database 421, registration and update of bias circuits corresponding to the sensor of the company A in the sensor bias circuit database 422 (registration bias circuit data 422*a*), selection and update of bias circuits corresponding to the sensor of the company A in the sensor bias circuit database 422 (simulation bias circuit data 422*b*), and simulation using the registered sensor and bias circuit of the company A. In the account A1, registration, update and selection of the sensor and bias circuit of the company B and registration and update of a common bias circuit are not permissible because there is no access authorization. In the case of the account A2 of the sensor vendor company A, authorization is set to permit registration and update of the sensor of the company A in the sensor database 421, selection and update of bias circuits corresponding to the sensor of the company A in the sensor bias circuit database 422 (simulation bias circuit data 422*b*), and simulation using the registered sensor and bias circuit of the company A. In the account A2, registration, update and selection of the sensor and bias circuit of the company B and registration and update of the common bias circuit and the bias circuit of the company A are not permissible because there is no access authorization.

In the case of the account B1 of the sensor vendor company B, authorization is set to permit registration and update of the sensor of the company B in the sensor database 421, registration and update of bias circuits corresponding to the sensor of the company B in the sensor bias circuit database 422 (registration bias circuit data 422*a*), selection and update of bias circuits corresponding to the sensor of the company B in the sensor bias circuit database 422 (simulation bias circuit data 422*b*), and simulation using the registered sensor and bias circuit of the company B. In the account B1, registration, update and selection of the sensor and bias circuit of the company A and registration and update of the common bias circuit are not permissible because there is no access authorization. In the case of the account B2 of the sensor vendor company B, authorization is set to permit selection and update of bias circuits corresponding to the sensor of the company B in the sensor bias circuit database 422 (simulation bias circuit data 422*b*), and simulation using the registered sensor and bias circuit of the company B. In the account B2, registration and update of the sensor of the company A, registration, update and selection of the sensor and bias circuit of the company B, and registration and update of the common bias circuit and the bias circuit of the company A are not permissible because there is no access authorization.

Note that knowledge about a simulation model of a simulator is required for registration/update of a bias circuit, and the bias circuit cannot be registered/updated unless a person can determine whether there is a change in simulation tool. Therefore, for example, the accounts A1 and B1 are assigned to a person who is knowledgeable about a simulator as well to permit registration and update of a bias circuit, and the accounts A2 and B2 are assigned to a person who is not knowledgeable about a simulator to permit only selection and registration of a bias circuit.

In the case of the account ID of a user, authorization is set to permit only reference to data open to public in the sensor database 421 and the sensor bias circuit database 422, and not to permit update (modification). In the case of the account ID of a user, simulation using the registered sensor and bias circuit that are open to public is permissible, and registration, update and selection of a sensor and a bias circuit are not permissible because there is no access authorization. Note that, although a user cannot register and update a sensor of a sensor vendor, the user can register and update a user's original sensor (custom sensor) in the sensor database 421.

The web page processing unit (web page display unit) 411 transmits web page information stored in the web page information storage unit 425 to the user terminal 3, the sensor vendor terminal 5 or the system developer terminal 8 through the web server 400 to display a web page (screen) containing GUI on the web browser 300 and further receives an input operation on GUI of the web page by a user, a sensor vendor or a system developer from the user terminal 3, the sensor vendor terminal 5 or the system developer terminal 8.

In other words, the web page processing unit 411 is an input/output interface that implements input and output with the user terminal 3, the sensor vendor terminal 5 or the system developer terminal 8 by GUI. The web page processing unit 411 includes an access interface 410*a* that receives access from the user terminal 3, the sensor vendor terminal 5 or the system developer terminal 8 and performs input and output with the user terminal 3, the sensor vendor terminal 5 or the system developer terminal 8.

The access interface 410*a* accesses the sensor database 421 and the sensor bias circuit database 422 in accordance with the access authorization determined by the authentication processing unit 417. A sensor vendor is set to have access authorization that permits registration/update of sensor information in the sensor database 421, and the sensor vendor can register/update the sensor information in the sensor database 421 by operating the sensor vendor terminal 5. A user is set to have access authorization that permits reference to the sensor information in the sensor database 421, and the user can refer to the sensor information that is open to public in the sensor database 421 by operating the user terminal 3 and execute simulation using the sensor information.

Each screen displayed on the user terminal 3, the sensor vendor terminal 5 or the system developer terminal 8 by the web page processing unit 411 are implemented by the access interface 410*a*. Note that a screen displayed only on the sensor vendor terminal 5 may be implemented by a sensor vendor input/output interface, a screen displayed only on the user terminal 3 may be implemented by a user input/output interface, a screen displayed only on the system developer terminal 8 may be implemented by a developer input/output interface, and screens displayed on the sensor vendor terminal 5, the user terminal 3, and the system developer terminal 8 may be implemented by the access interface 410*a*.

Stated differently, the web page processing unit 411 includes a display unit for displaying each screen. Specifically, the web page processing unit 411 includes a sensor display unit 411*a*, a bias circuit display unit 411*b*, an AFE display unit 411*c*, and an input pattern display unit 411*d*. The sensor display unit (selection unit) 411*a* displays a plurality of sensors corresponding to the type (or the output format etc.) of a sensor selected by a user or a sensor vendor by reference to the sensor database 421. Further, the sensor display unit 411*a* selects only the sensor for which access authorization is granted and, for example, displays only the sensors related to the sensor vendor that is making access. The bias circuit display unit (selection unit) 411*b* displays a plurality of bias circuits corresponding to the selected (input) sensor by reference to the sensor bias circuit database 422. Further, the bias circuit display unit 411*b* selects only the bias circuit for which access authorization is granted and, for example, displays only the bias circuits related to the sensor vendor that is making access. The AFE display unit (semiconductor device display unit) 411*c* displays a plurality of semiconductor devices 1 that include the configurable amplifier 110 having the set circuit configuration by reference to the AFE database 424. The input pattern display unit 411*d* displays a plurality of waveform patterns stored in the input pattern storage unit 430. Further, the web page processing unit 411 includes other display units corresponding to each screen, a sensor list display unit that displays a sensor list screen, a flag display unit that displays a flag on each screen and the like.

The circuit setting unit 412 generates a circuit setting file (circuit information) in accordance with an input operation on a web page (screen) by a user or a sensor vendor and stores it into the circuit information storage unit 426. The circuit setting unit 412 generates the circuit setting file in accordance with selections of a sensor, a bias circuit and the semiconductor device 1. For example, the circuit setting unit 412 includes a sensor selection unit 412*a*, a bias circuit selection unit 412*b*, an AFE selection unit 412*c*, and a connections setting unit 412*d*.

The sensor selection unit (sensor information input unit) 412*a* generates a circuit setting file based on information of a sensor selected by an operation of a user, a sensor vendor or a system developer among a plurality of sensors contained in the sensor database 421 which are displayed on the web page processing unit 411. Further, the sensor selection unit 412*a* receives necessary information such as the characteristics of the selected sensor from the user, the sensor vendor or the system developer and generates a circuit setting file based on the input information. The sensor selection unit 412*a* also serves as a sensor information input unit to which a sensor vendor registers/updates sensor information in the sensor database 421 (through an access interface). Further, the sensor selection unit 412*a* also serves as a sensor information input unit to which a user registers/updates sensor information of a user's original sensor (custom sensor) in the sensor database 421 (through an access interface).

The bias circuit selection unit 412*b* generates a circuit setting file based on information of a bias circuit that is selected by an operation of a user or a sensor vendor on the basis of access authorization among a plurality of bias circuits suitable for the selected sensor which are displayed on the web page processing unit 411.

The AFE selection unit (semiconductor device selection unit) 412*c* generates a circuit setting file based on information of the semiconductor device 1 that is selected by an operation of a user or a sensor vendor among a plurality of semiconductor devices 1 contained in the AFE database 424 which are displayed on the web page processing unit 411. The connection setting unit (circuit configuration setting unit) 412*d* refers to the configurable analog circuit database 423 and specifies the configurations and connections of the configurable amplifier 110 suitable for the selected sensor and bias circuit and further sets the configuration and connections of the configurable amplifier 110 by an operation of a user or a sensor vendor and thereby generates a circuit setting file (configuration information). Further, the connections setting unit 412*d* generates a circuit setting file (characteristics information) based on the characteristics of the configurable amplifier 110 set by an operation of a user or a sensor vendor.

The parameter setting unit 413 generates parameters for executing simulation in accordance with an input operation on a web page (screen) by a user or a sensor vendor and stores them into the parameter storage unit 427. The parameter setting unit (input pattern selection unit) 413 generates information of an input pattern of a physical quantity to be input to a sensor which is selected in accordance with a user operation among a plurality of waveform patterns displayed on the web page processing unit 411.

The simulation execution unit 415 refers to the circuit information storage unit 426 and the parameter storage unit 427 and executes simulation based on the circuit setting files (circuit information) and the parameters stored therein. The simulation execution unit 415 includes a physical quantity conversion unit (physical quantity-electrical characteristics conversion function) 450, an automatic setting unit 451, a transient analysis unit 452, an AC analysis unit 453, a filter effect analysis unit 454, and a synchronous detection analysis unit 455.

The physical quantity conversion unit 450 converts a physical quantity, which is sensor input information, into an electrical signal, which is sensor output. The physical quantity conversion unit 450 refers to the parameter storage unit 427 and generates an output signal of a sensor corresponding to a physical quantity that varies sequentially in time series in accordance with the set physical quantity input pattern.

The automatic setting unit (circuit characteristics setting unit) 451 automatically sets the circuit characteristics of the AFE unit 100 and stores the set circuit setting file (characteristics information) into the circuit information storage unit 426. The automatic setting unit 451 refers to the configuration information of the circuit setting file in the circuit information storage unit 426 and automatically sets the appropriate gain and offset of the configurable amplifier 110 in the set circuit configuration of the sensor, the bias circuit and the configurable amplifier 110. The automatic setting unit 451 simulates the operation of the configurable amplifier 110 and adjusts the circuit parameters such as the DAC voltage and gain of the configurable amplifier 110 so as to set the appropriate gain and offset.

The transient analysis unit 452 simulates the input and output characteristics of the AFE unit 100 in order to analyze the transient characteristics and stores the simulation result into the result information storage unit 428. The transient analysis unit 452 refers to the circuit information storage unit 426 and the parameter storage unit 427, simulates the circuit operation with the configuration that is set using the parameters as simulation conditions and generates a waveform indicating the input and output characteristics. The transient analysis unit 452 simulates the operation of the AFE unit 100 using a sensor output signal generated by converting the physical quantity input pattern that is input in time series by the physical quantity conversion unit 450 as an input signal to the AFE unit 100 and generates time-series output signals of the respective circuits in the AFE unit 100.

The AC analysis unit 453 simulates the frequency characteristics of the AFE unit 100 in order to analyze the AC characteristics and stores the simulation result into the result information storage unit 428. The AC analysis unit 453 refers to the circuit information storage unit 426 and the parameter storage unit 427, simulates the circuit operation with the configuration that is set using the parameters as simulation conditions and generates a waveform indicating the frequency characteristics. The AC analysis unit 453 generates a physical quantity input pattern for each frequency, and simulates the operation of the AFE unit 100 using a sensor output signal generated by converting the physical quantity input pattern for each frequency by the physical quantity conversion unit 450 as an input signal to the AFE unit 100 and generates an output signal for each frequency of the respective circuits in the AFE unit 100.

The filter effect analysis unit 454 simulates the input and output characteristics of the AFE unit 100 under the environment where noise occurs in order to analyze the filer effect and stores the simulation result into the result information storage unit 428. The filter effect analysis unit 454 refers to the circuit information storage unit 426 and the parameter storage unit 427, simulates the circuit operation with the configuration that is set using the parameters as simulation conditions and generates a waveform indicating the input and output characteristics under the noise environment. The filter effect analysis unit 454 adds noise to a physical quantity input pattern that is input in time series, and simulates the operation of the AFE unit 100 using a sensor output signal that is generated by converting the signal with noise by the physical quantity conversion unit 450 as an input signal to the AFE unit 100 and generates a time-series output signals of the respective circuits in the AFE unit 100.

The synchronous detection analysis unit 455 simulates the synchronous detection operation of the AFE unit 100 in order to analyze the synchronous detection operation and stores the simulation result into the result information storage unit 428. The synchronous detection analysis unit 455 refers to the circuit information storage unit 426 and the parameter storage unit 427, simulates the circuit operation with the configuration that is set using the parameters as simulation conditions and generates a waveform indicating the synchronous detection operation. The synchronous detection analysis unit 455 simulates the operation of the AFE unit 100 using a physical quantity input pattern that is input in time series and a synchronous clock as shown in FIG. 16 as input and generates time-series output signals of the respective circuits in the AFE unit 100.

The register information generation unit 416 generates register information to be set to the register 181 of the semiconductor device 1 and stores it into the register information storage unit 429. The register information generation unit 416 refers to the circuit setting file of the circuit information storage unit 426 and generates register information in accordance with the set circuit configuration and circuit characteristics of the AFE unit 100.

The authentication processing unit 417 receives a login request from the user terminal 3, the sensor vendor terminal 5 or the system developer terminal 8 and performs authentication. The authentication processing unit 417 refers to the authentication table 431*a* of the account database 431 and authenticates an account based on an account ID and a password input to the web browser 300. Further, the authentication processing unit 417 refers to the access authorization table 431*b* of the account database 431 and identifies whether the person is a sensor vendor, a user or a system developer based on the account ID and enables data registration and update in the sensor database 421 and the sensor bias circuit database 422 in accordance with the corresponding access authorization.

Figure 30A:
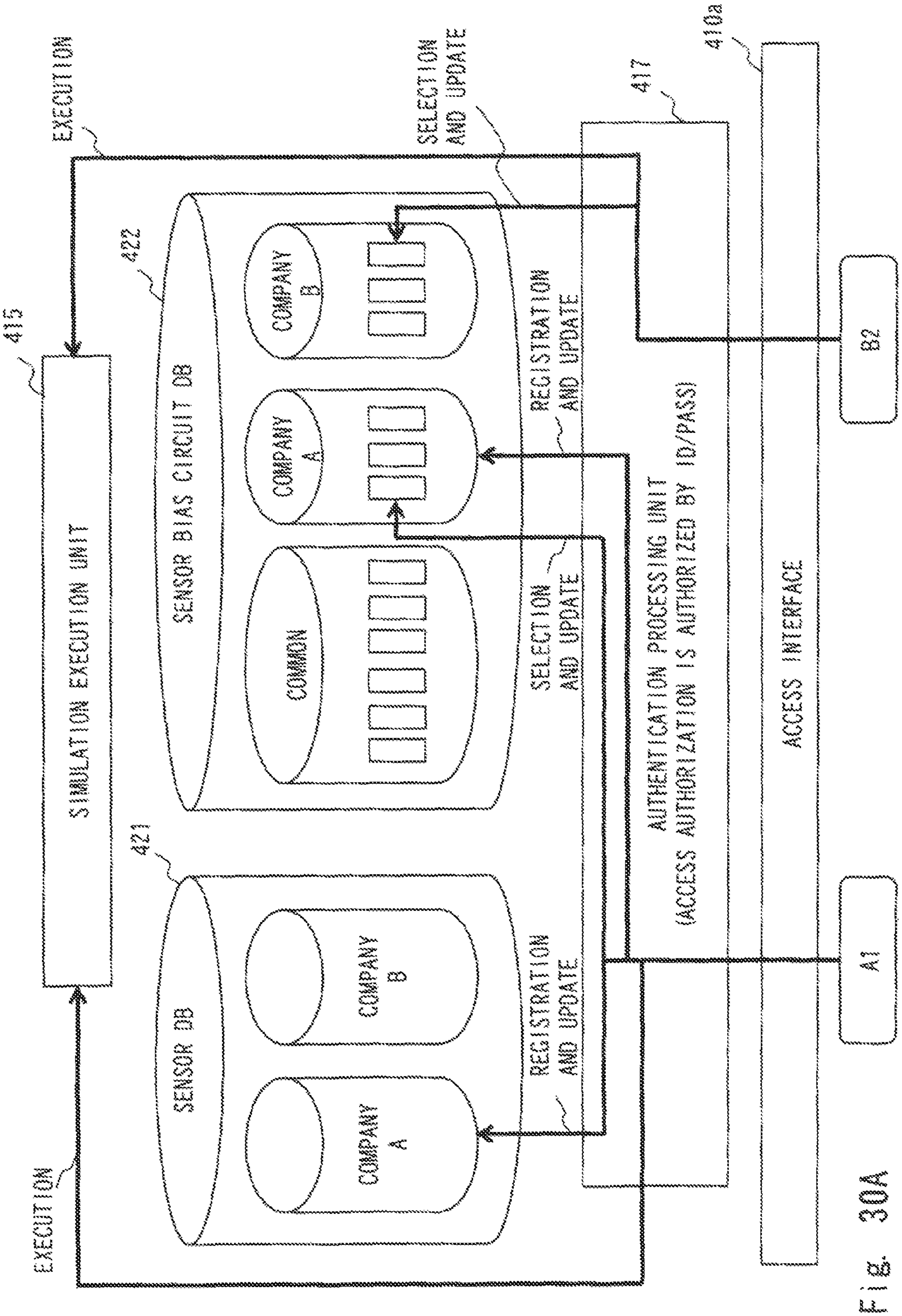
FIG. 30A is a diagram showing an overview of the operation of the web simulator according to the first embodiment.

FIG. 30A shows the overview of authentication of access by the accounts A1 and B2 in the access authorization table 431*b* of FIG. 29. When access is made from the sensor vendor terminal 5 to the web simulator 4 using the account A1, the access interface 410*a* accepts access, and the authentication processing unit 417 performs authentication. The authentication processing unit 417 refers to the authentication table 431*a* and determines that authentication is successful when the account A1 and the password match. Further, the authentication processing unit 417 refers to the access authorization table 431*b* and determines the access authorization of the account A1. Based on the access authorization table 431*b* shown in FIG. 29, the account A1 is permissible to register and update the sensor of the company A in the sensor database 421, register and update bias circuits corresponding to the sensor of the company A in the sensor bias circuit database 422, select and update bias circuits corresponding to the sensor of the company A in the sensor bias circuit database 422, and execute simulation using the registered sensor of the company A and the bias circuit. The account B2 is permissible to select and update bias circuits corresponding to the sensor of the company B in the sensor bias circuit database 422, and execute simulation using the registered sensor of the company B and the bias circuit. Further, a common bias circuit is registered in the sensor bias circuit database 422, and the system developer is permissible to register and update, and select and update all bias circuits including the common bias circuit and the bias circuits of the company A and the company B based on the access authorization table 431*b* shown in FIG. 29.

Figure 30B:
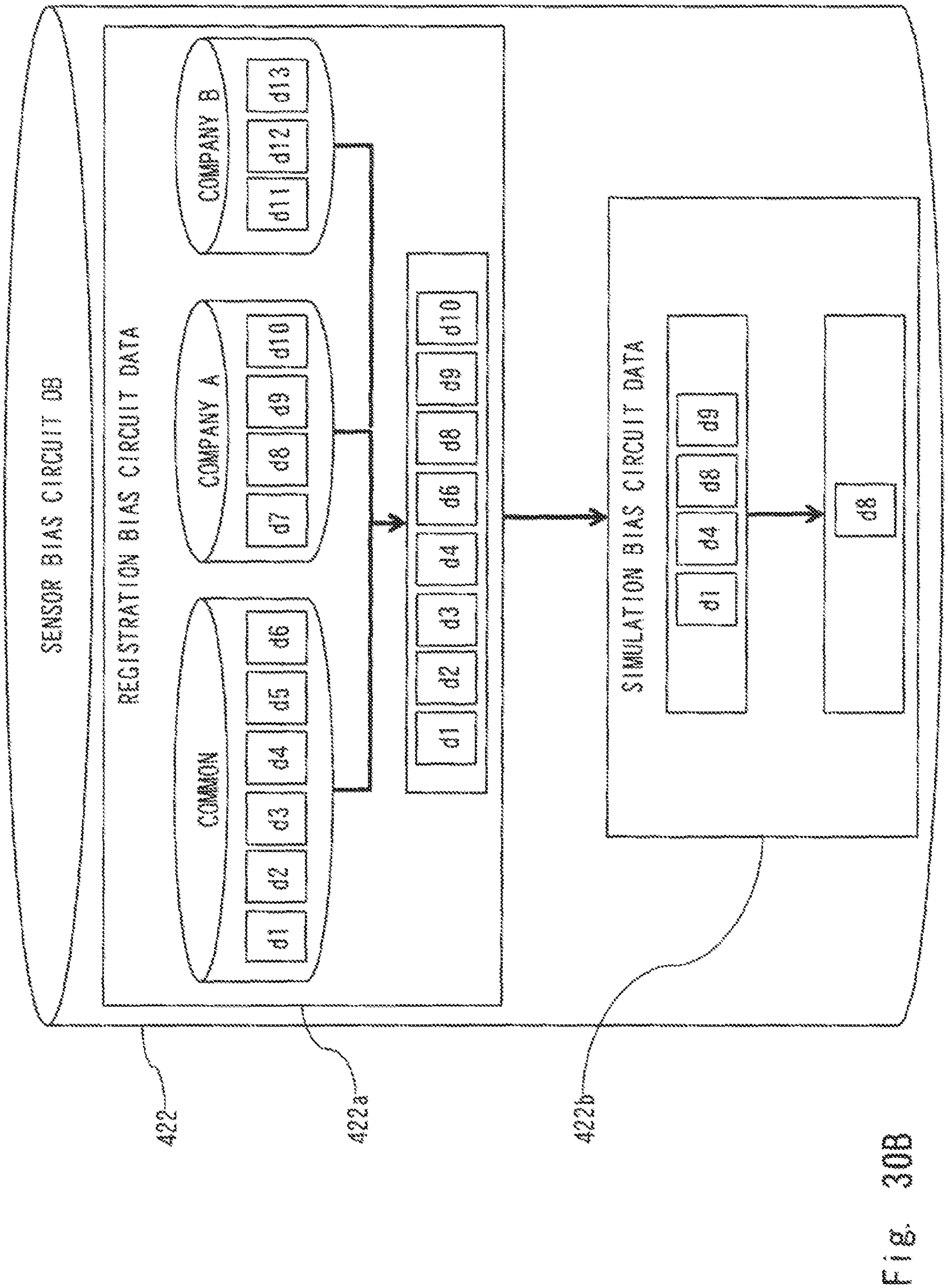
FIG. 30B is a diagram showing an overview of the operation of the web simulator according to the first embodiment.

FIG. 30B shows an image of association of bias circuit data registered in the sensor bias circuit database 422. As shown in FIG. 30B, common bias circuits d1 to d6, bias circuits d7 to d10 of the company A, and bias circuits d11 to d13 of the company B are registered in the registration bias circuit data 422*a*, for example. In the registration bias circuit data 422*a*, each bias circuit is associated with a sensor vendor and also associated with the type of a sensor. For example, the bias circuits d1 to d4 and d6 to d10, among the common bias circuits and the bias circuits of the company A, are associated as the bias circuits suitable for the sensor of the company A, and the bias circuits d1 to d4 and d6 to d10 are displayed on a screen as the bias circuits that can be selected by a sensor vendor. The sensor vendor selects the bias circuits d1, d4, d8 and d9 as the bias circuits appropriate for simulation of the sensor among the bias circuits d1 to d4 and d6 to d10, and then the bias circuits d1, d4, d8 and d9 and the sensor are registered in association with each other in the simulation bias circuit data 422*b*. The bias circuits d1, d4, d8 and d9 are displayed as the bias circuits that can be selected for simulation, and when a user selects the bias circuit d8, the sensor and the bias circuit d8 are associated with each other as the circuit to be simulated, and then simulation is performed thereon.

The sensor registration and update unit (sensor information registration unit) 418 registers/updates the sensor information input from the user terminal 3, the sensor vendor terminal 5 or the system developer terminal 8 in association with the sensor vendor or the like of the account to be input in the sensor database 421 based on the access authorization. Further, the sensor registration and update unit 418 registers/updates information of the bias circuits (simulation bias circuit data 422*b*) related to the sensor input from the user terminal 3, the sensor vendor terminal 5 or the system developer terminal 8 in association with the sensor vendor or the like of the account to be input in the sensor bias circuit database 422 based on the access authorization.

Figure 28C:
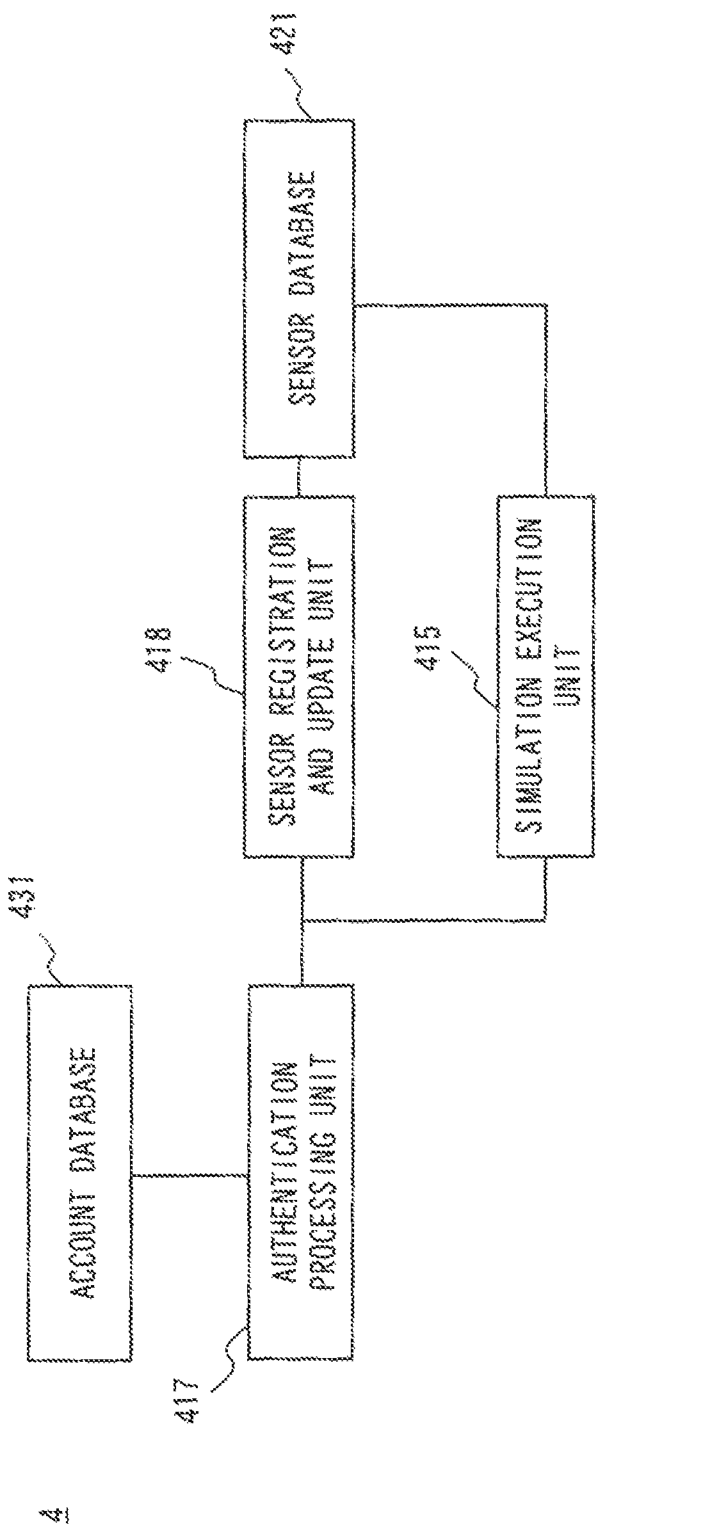
FIG. 28C is a functional block diagram of a web simulator according to the first embodiment.

Further, as shown in FIG. 28C, the web simulator 4 may be composed of some blocks among the blocks shown in FIGS. 28A and 28B. For example, the web simulator 4 includes a sensor database (sensor information storage unit) 421, an account database (account information storage unit) 431, an authentication processing unit (access authorization specifying unit) 417, a sensor registration and update unit (sensor writing unit) 418, and a simulation execution unit 415, as shown in FIG. 28C.

In FIG. 28C, the sensor database 421 stores first sensor information that belongs to a first access group (for example, the sensor vendor company A) and second sensor information that belongs to a second access group (for example, the sensor vendor company B). The account database 431 stores the access authorization table 431*b* (first access authorization information) that permits write (registration or write) of the first sensor information into the first access group and denies write of the second sensor information into the second access group for an account that belongs to the first access group. The authentication processing unit 417 refers to the stored access authorization table 431*b* and specifies the access authorization to the first access group and the second access group in accordance with the account of the accepted access. The sensor registration and update unit 418 writes the first sensor information to the first access group that is permitted to write based on the specified access authorization in accordance with the access. The simulation execution unit 415 executes simulation of the circuit including the sensor indicated by the first sensor information written as above and the semiconductor device 1 including the analog front-end circuit with a variable circuit configuration in accordance with the access.

Next, a simulation method that is executed in the simulation system according to this embodiment is described. The simulation method is achieved by performing each processing mainly in the web simulator 4 and displaying a screen on a display device of the user terminal 3 or the sensor vendor terminal 5, and therefore the processing performed in the web simulator 4 is described hereinbelow. Note that, an operation in the case where access is made from the user terminal 3 or the sensor vendor terminal 5 is mainly described below, and the case where access is made from the system developer terminal 8 is not described because it is the same as the case of the user terminal 3 and the sensor vendor terminal 5 except that registration and update are enabled for all databases.

Figure 31:
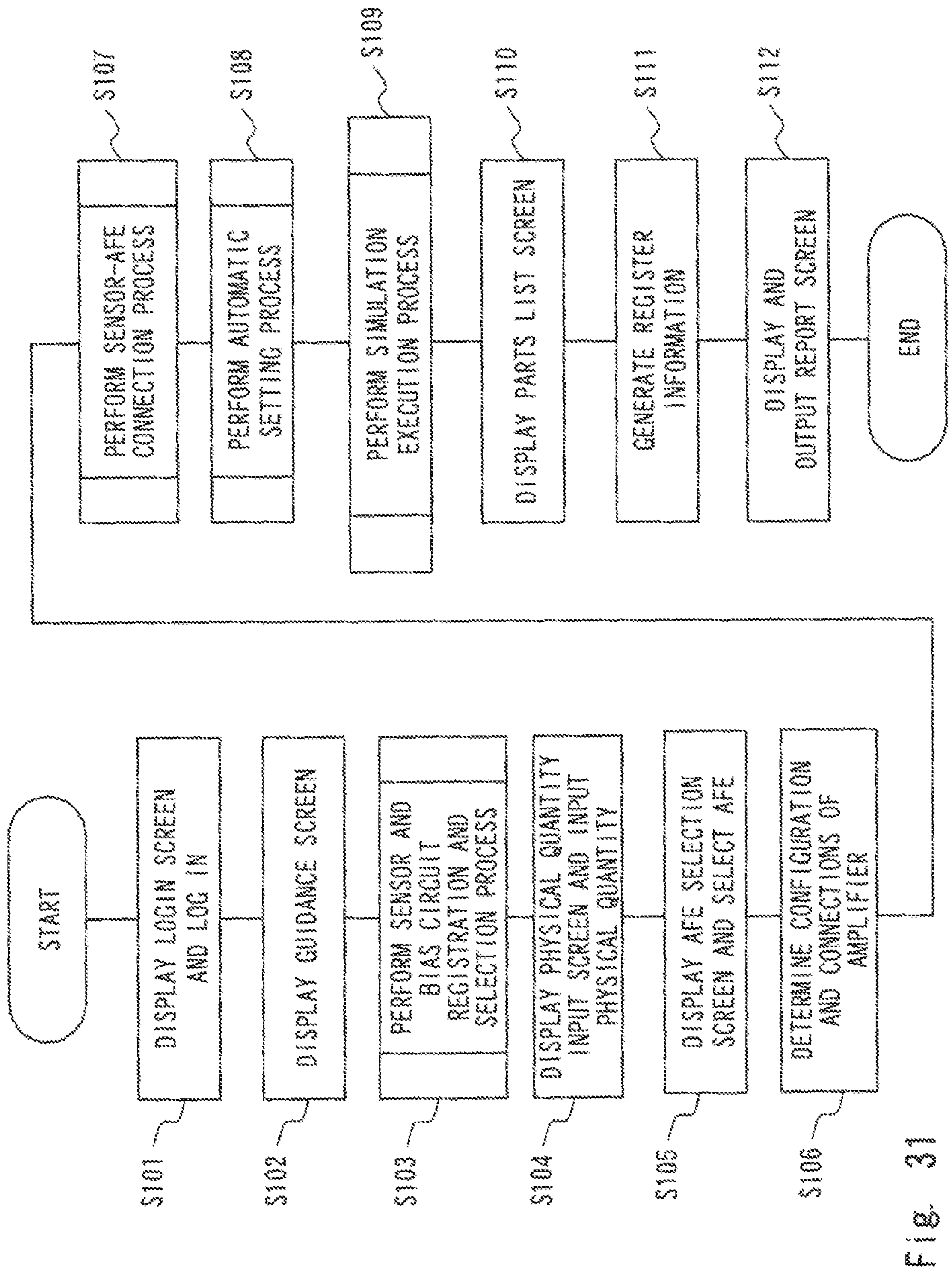
FIG. 31 is a flowchart showing a simulation method of the web simulator according to the first embodiment.

The flowchart of FIG. 31 shows the overall flow of a simulation process according to this embodiment. In this simulation process, the web simulator 4 (the web page processing unit 411) first displays a login screen on the user terminal 3 or the sensor vendor terminal 5, and a user or a sensor vendor logs in (S101). When the user or the sensor vendor specifies the URL of the web simulator 4 on the web browser 300 of the user terminal. 3 or the sensor vendor terminal 5, the web browser 300 accesses the web server 400, and a simulation program starts on the web simulator 4. Then, the web page processing unit 411 transmits web page information of the login screen to the user terminal. 3 or the sensor vendor terminal 5 to display the login screen on the web browser 300. When the user or the sensor vendor enters an account ID and a password on the web browser 300, the authentication processing unit 417 refers to the authentication table 431*a* of the account database 431 and authenticates the account. Further, the authentication processing unit 417 refers to the access authorization table 431*b* and identifies whether it is a sensor vendor or a user based on the account ID and determines the access authorization, and, after that, the processing in accordance with the access authorization is performed.

Note that the login screen may be common to a user and a sensor vendor or independent of each other. Further, in the simulation process, a login process may be different between a user and a sensor vendor. For example, different URLs of the web simulator 4 may be set for a user and a sensor vendor, and when access is made to the URL for the sensor vendor, the login process in S101 may be performed, and when access is made to the URL for the sensor vendor, the login process in the step S101 may be performed, and when access is made to the URL for the user, the login process in S101 may be skipped and the process may start from a guidance screen in the following step S102.

Next, the web simulator 4 (the web page processing unit 411) displays a guidance screen on the user terminal 3 or the sensor vendor terminal 5 (S102). When authentication of the account is successful by the login in S101, the web page processing unit 411 transmits web page information of a guidance screen, which is a start page of a simulator, to the user terminal 3 or the sensor vendor terminal 5 to display the guidance screen on the web browser 300.

Then, the web simulator 4 (the circuit setting unit 412, the sensor registration and update unit 418) performs a sensor and bias circuit registration and selection process (S103). When the user or the sensor vendor performs an operation to select a sensor, processing in accordance with the access authorization of the account is performed. Specifically, when the account is a sensor vendor, the sensor registration and update unit 418 performs registration and update of a sensor and a bias circuit in the database, and when the account is a user, the circuit setting unit 412 performs selection of a sensor and a bias circuit. The details of the sensor and bias circuit registration and selection process are described later. The circuit setting unit 412 stores the sensor and the bias circuit selected (registered/updated) by the sensor and bias circuit registration and selection process as circuit to be simulated into the circuit setting file of the circuit information storage unit 426.

Then, the web simulator 4 (the web page processing unit 411) displays a physical quantity input screen on the user terminal 3 or the sensor vendor terminal 5, and the user or the sensor vendor inputs a physical quantity (S104). When the user or the sensor vendor performs an operation to input the physical quantity of the sensor on the sensor selection screen or the bias circuit selection screen in S103, the web page processing unit 411 transmits web page information of the physical quantity input screen for the user or the sensor vendor to input the physical quantity of the sensor to the user terminal 3 or the sensor vendor terminal 5 to display the physical quantity input screen on the web browser 300. The web page processing unit 411 displays a plurality of input patterns (input waveforms) for inputting the physical quantity to be input to the sensor in time series on the physical quantity input screen, and the user or the sensor vendor selects the input pattern to be used for simulation. Further, the web page processing unit 411 refers to the sensor database 421, displays the input range of the physical quantity in accordance with the selected sensor on the physical quantity input screen, and the user or the sensor vendor sets the input range of the physical quantity. When the user or the sensor vendor inputs the input pattern and the input range of the physical quantity to be input to the sensor, the parameter setting unit 413 sets the input parameters into the parameter storage unit 427.

Then, the web simulator 4 (the web page processing unit 411) displays an AFE selection screen on the user terminal 3 or the sensor vendor terminal 5, and the user or the sensor vendor selects the AFE (semiconductor device) (S105). When the user or the sensor vendor performs an operation to select the semiconductor device 1 (the AFE unit 100) on the guidance screen in S102, the sensor selection screen in S103 or the like, the web page processing unit 411 transmits web page information of the AFE selection screen for the user or the sensor vendor to select the semiconductor device 1 to the user terminal 3 or the sensor vendor terminal 5 to display the AFE selection screen on the web browser 300.

The web page processing unit 411 refers to the AFE database 424 and extracts the semiconductor device 1 including the configurable amplifier 110 with the configuration suitable for the selected sensor and bias circuit. At this time, the web page processing unit 411 refers to the configurable analog circuit database 423, determines the configuration of the configurable amplifier 110 suitable for the selected sensor and bias circuit, and extracts the semiconductor device 1 including the configurable amplifier 110 with the determined configuration. Further, when the user or the sensor vendor specifies narrowing criteria such as the configuration of the semiconductor device 1 and the like, the web page processing unit 411 extracts the semiconductor devices 1 that match the narrowing criteria from the AFE database 424 and displays a list of the extracted semiconductor devices 1 on the AFE selection screen. When the user or the sensor vendor selects the semiconductor device 1 (the AFE unit 100) to be used from the list of the semiconductor devices 1 displayed on the on the AFE selection screen, the circuit setting unit 412 (the AFE selection unit 412*c*) stores the AFE unit 100 of the selected semiconductor device 1 as a circuit to be simulated into the circuit setting file of the circuit information storage unit 426.

Then, the web simulator 4 (the circuit setting unit 412) determines the configuration and connections of the configurable amplifier 110 (S106). When the sensor and the bias circuit are selected in S103 and the semiconductor device 1 is selected in S105, the circuit setting unit 412 refers to the configurable analog circuit database 423, determines the configuration of the configurable amplifier 110 suitable for the selected sensor and bias circuit, and determines the connections (connection terminals) of the configurable amplifier 110 with the sensor and the bias circuit as a default (automatic connection configuration. The circuit setting unit 412 (the connections setting unit 412*d*) stores information about the configuration and connections of the configurable amplifier 110 determined as above into the default circuit setting file 426*a* of the circuit information storage unit 426. In the case where the account is sensor vendor, a plurality of bias circuits can be selected for one sensor, and therefore connections are determined for each bias circuit and stored into a plurality of default circuit setting files 426*a* of the respective bias circuits.

Then, the web simulator 4 (the circuit setting unit 412) performs a sensor-AFE connection process (S107). When the semiconductor device 1 is selected in S105 and the connections of the configurable amplifier 110 with the sensor and the bias circuit are determined in S106, the circuit setting unit 412 performs the sensor-AFE connection process in order for the user or the sensor vendor to select the connection of a circuit to be simulated. The details of the sensor-AFE connection process are described later. The circuit setting unit 412 stores the selected connections as connections of a circuit to be simulated into the circuit setting file of the circuit information storage unit 426.

Then, the web simulator 4 (the automatic setting unit 451) performs an automatic setting process (S108). When the sensor, the bias circuit and the configuration and connections of the configurable amplifier 110 are determined in S103 to S107, the automatic setting unit 451 performs the automatic setting process in order to automatically set the default value of the configurable amplifier 110. The details of the automatic setting process are described later. The automatic setting unit 451 stores circuit parameters such as DAC output and gain of the configurable amplifier 110 set by the automatic setting process into the circuit setting file of the circuit information storage unit 426.

Then, the web simulator 4 (the simulation execution unit 415) performs a simulation execution process (S109). When the sensor and the bias circuit and the configuration and connections of the semiconductor device 1 (the AFE unit 100) are determined in S103 to S108, the simulation execution unit 415 executes simulation for transient analysis, AC analysis, filter effect analysis, synchronous detection analysis and the like in accordance with an operation of the user or the sensor vendor. The details of the simulation execution process are described later. The simulation execution unit 415 stores the simulation result obtained by the simulation execution process into the result information storage unit 428.

Then, the web simulator 4 (the web page processing unit 411) displays a parts list screen on the user terminal 3 or the sensor vendor terminal 5 (S110). When the user or the sensor vendor performs an operation to display a parts list (BOM: Bills of Materials) on the guidance screen of S102 or the simulation screen of S109 (which is described later), the web page processing unit 411 transmits web page information of the parts list screen for displaying a parts list to the user terminal 3 or the sensor vendor terminal 5 to display the parts list screen on the web browser 300. The web page processing unit 411 refers to the circuit setting file of the circuit information storage unit 426 and displays the parts list containing the sensor and the semiconductor device 1 selected as a target of simulation on the parts list screen. In the displayed parts list, a link is provided to a purchase site of parts, and when a user selects parts on the parts list screen, access is made to the purchase site of the parts, and the user can purchase the parts.

Then, the web simulator 4 (the register information generation unit 416) generates register information (S311). When the circuit configuration and circuit characteristics of the semiconductor device 1 (the AFE unit 100) are determined in S103 to S109, the register information generation unit 416 generates register information to be set to the register 181 of the semiconductor device 1. The register information generation unit 416 generates register information based on the circuit configuration and circuit characteristics of the semiconductor device 1 by referring to the circuit setting file of the circuit information storage unit 426 and stores the generated register information into the register information storage unit 429. Note that, because the register information is displayed on a report screen, the generation of the register information in S111 is performed at least before display of the report screen.

Then, the web simulator 4 (the web page processing unit 411) displays a report screen on the user terminal 3 or the sensor vendor terminal 5 (S112). When the user or the sensor vendor performs an operation to output a simulation result on the guidance screen in S102, the simulation screen in S109 or the like, the web page processing unit 411 transmits web page information of the report screen containing the simulation result to the user terminal 3 or the sensor vendor terminal 5 to display the report screen on the web browser 300. The web page processing unit 411 refers to the result information storage unit 428 and displays the simulation result on the report screen. Further, the web page processing unit 411 refers to the circuit information storage unit 426, the parameter storage unit 427 and the register information storage unit 429 and displays the sensor and the bias circuit to be simulated, the circuit configuration, connections and parameters of the semiconductor device 1 and further displays the resister information of the semiconductor device 1. Further, on the report screen, the register information can be downloaded to the user terminal 3 or the sensor vendor terminal 5 in response to an operation of the user or the sensor vendor.

Figure 32:
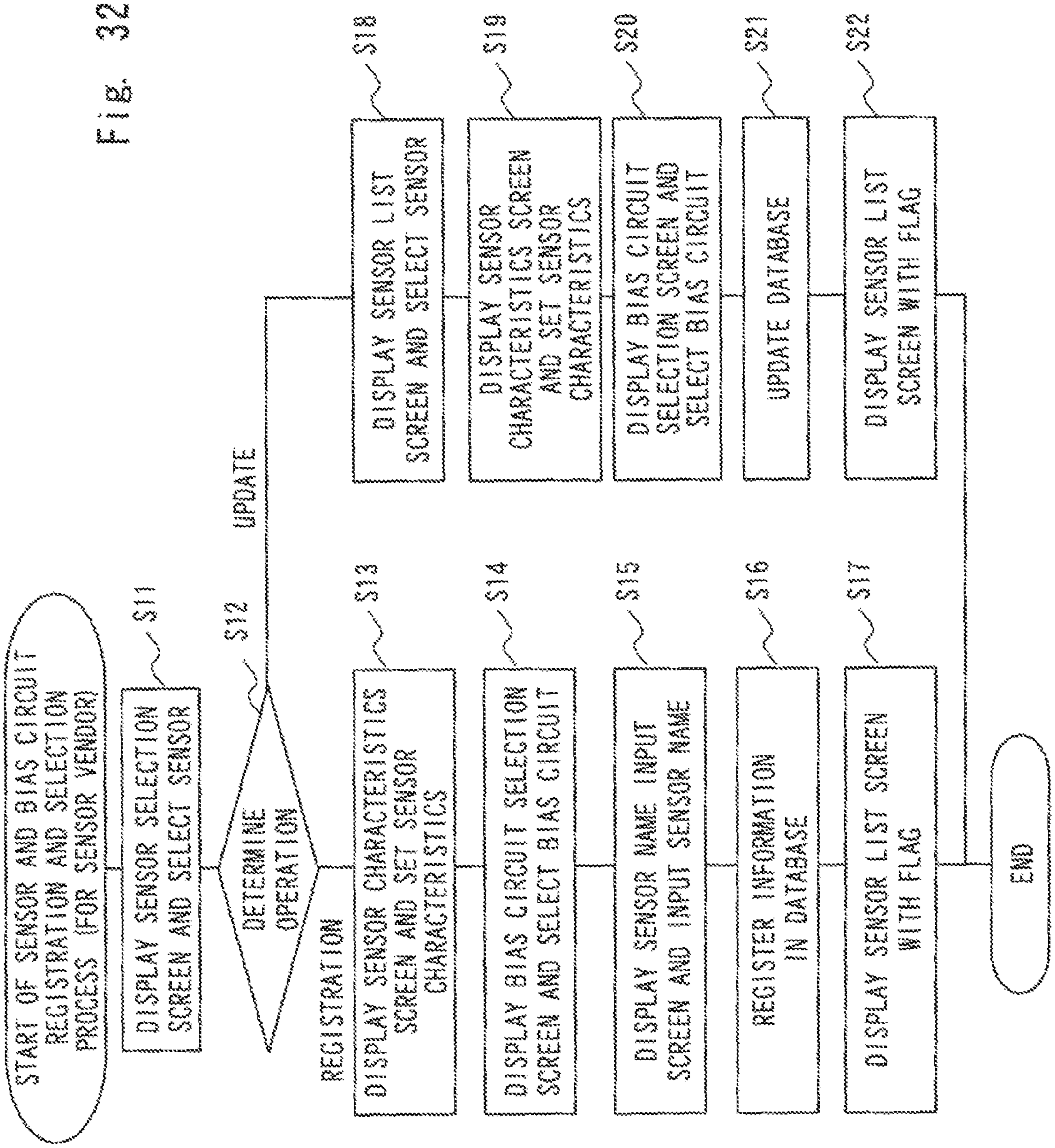
FIG. 32 is a flowchart showing a simulation method of the web simulator according to the first embodiment.

FIG. 32 shows the sensor and bias circuit registration and selection process according to this embodiment, which corresponds to the process of S103 in FIG. 31, and particularly shows the process for a sensor vendor. In other words, this process is performed when the account is a sensor vendor in S103.

First, the web page processing unit 411 displays a sensor selection screen on the sensor vendor terminal 5, and a sensor vendor selects the type of a sensor (S11). When the sensor vendor performs an operation to select a sensor on the guidance screen in S101 of FIG. 31, the web page processing unit 411 transmits web page information of the sensor selection screen for selecting a sensor to the sensor vendor terminal 5 to display the sensor selection screen on the web browser 300*b*. Then, when the sensor vendor selects the type of a sensor on the sensor selection screen, the sensor registration and update unit 418 identifies the selected type of a sensor as the type of a sensor to be registered/updated/deleted.

Next, the web page processing unit 411 determines an operation of the sensor vendor on the sensor selection screen (S12). In this step, it is determined whether the sensor vendor has performed an operation to register or update a sensor. When the access authorization of the account is set to permit registration and update of the sensor database 421 and registration and update of the sensor bias circuit database 422, the process after S13 is performed to register the sensor and the bias circuit of the sensor vendor itself or the process after S18 is performed to update the sensor and the bias circuit of the sensor vendor itself in response to the operation of the sensor vendor. When the access authorization of the account is set to permit selection and update of the sensor bias circuit database 422, the process after S18 is performed to select and update the bias circuit of the sensor vendor itself in response to the operation of the sensor vendor. For example, an input operation may be restricted on the display screen in accordance with the access authorization.

When the sensor vendor has selected registration of a sensor in S12, the web page processing unit 411 displays a sensor characteristics screen on the sensor vendor terminal 5, and the sensor vendor inputs the characteristics of a sensor (S13). When the sensor vendor performs an operation to register a sensor on the sensor selection screen in S11, the web page processing unit 411 transmits web page information of the sensor characteristics screen for setting the characteristics of the sensor to the sensor vendor terminal 5 to display the sensor characteristics screen on the web browser 300*b*. Then, when the sensor vendor selects the characteristics of the sensor on the sensor characteristics screen, the sensor registration and update unit 418 stores the set characteristics information of the sensor into the sensor database 421. Further, the sensor registration and update unit 418 stores the type of the sensor selected in S11 into the sensor database 421.

Then, the web page processing unit 411 displays a bias circuit selection screen on the sensor vendor terminal 5, and the sensor vendor selects a bias circuit (S14). When the sensor vendor performs an operation to set a bias circuit on the sensor characteristics screen in S13, the web page processing unit 411 transmits web page information of the bias circuit selection screen to the sensor vendor terminal 5 to display the bias circuit selection screen on the web browser 300*b*. The web page processing unit 411 refers to the registration bias circuit data 422*a* of the sensor bias circuit database 422, extracts a plurality of bias circuits suitable for the type of the sensor selected in S11, and displays them on the bias circuit selection screen. When the sensor vendor selects a bias circuit among the plurality of bias circuits displayed on the bias circuit selection screen, the sensor registration and update unit 418 stores the selected bias circuit into the simulation bias circuit data 422*b* of the sensor bias circuit database 422. In the simulation bias circuit data 422*b*, one sensor and a plurality of bias circuits can be associated with each other.

Then, the web page processing unit 411 displays a sensor name input screen on the sensor vendor terminal 5, and the sensor vendor inputs a sensor name (S15). When a bias circuit is selected on the bias circuit selection screen in S14, the web page processing unit 411 transmits web page information of the sensor name input screen to the sensor vendor terminal 5 to display the sensor name input screen on the web browser 300*b*. The sensor vendor can input an arbitrary sensor name on the sensor name input screen and thereby set the sensor name.

Then, the sensor registration and update unit 418 registers information related to the sensor in the sensor database 421 and the sensor bias circuit database 422 (S16). When the sensor name is input on the sensor name input screen in S15, the sensor registration and update unit 418 registers information of the sensor type and characteristics and the sensor name set in S11 to S15 into the sensor database 421, and information of the bias circuit into the sensor bias circuit database 422. Note that the information about the sensor may be registered in the database each time the information is input in S11 to S15 or may be registered all together in the database in S16. Further, the sensor registration and update unit 418 sets a registration flag indicating that the sensor information has been registered in the sensor database 421.

Then, the web page processing unit 411 displays a sensor list screen with a flag on the sensor vendor terminal 5 (S17). When registration in the database is done in S16, the web page processing unit 411 transmits web page information of the sensor list screen to the sensor vendor terminal 5 to display the sensor list screen on the web browser 300*b*. The web page processing unit 411 refers to the sensor database 421, extracts the sensors that have been already registered by the currently operating sensor vendor and displays the sensors including the one registered this time on the sensor list screen. Further, the web page processing unit 411 refers to a data flag for each sensor in the sensor list and displays the state of the data flag. In this example, because the sensor is registered in S16, a registration flag is set, and a flag mark indicating that registration is done is displayed.

On the other hand, when the sensor vendor has selected update of a sensor in S12, the web page processing unit 411 displays a sensor list screen on the sensor vendor terminal 5, and the sensor vendor selects a sensor (S18). When the sensor vendor performs an operation to update a sensor on the sensor selection screen in S11, the web page processing unit 411 transmits web page information of the sensor list screen to the sensor vendor terminal 5 to display the sensor list screen on the web browser 300*b*. The web page processing unit 411 refers to the sensor database 421 and extracts the sensor which the currently operating sensor vendor has access authorization and is permissible to update, that is the sensor registered by the currently operating sensor vendor, and displays the extracted sensor on the sensor list screen. Then, the sensor vendor selects a sensor to be updated from the sensor list.

Then, the web page processing unit 411 displays a sensor characteristics screen on the sensor vendor terminal 5, and the sensor vendor inputs the characteristics of a sensor (S19). When the sensor vendor selects a sensor to be updated on the sensor list screen in S18, the web page processing unit 411 transmits web page information of the sensor characteristics screen for setting the characteristics of the sensor to the sensor vendor terminal 5 to display the sensor characteristics screen on the web browser 300*b*. Then, when the sensor vendor changes and sets the characteristics of the sensor on the sensor characteristics screen, the sensor registration and update unit 418 updates the corresponding sensor information in the sensor database 421 with the set sensor characteristics information.

Then, the web page processing unit 411 displays a bias circuit selection screen on the sensor vendor terminal 5, and the sensor vendor selects a bias circuit (S20). When the sensor vendor performs an operation to set a bias circuit on the sensor characteristics screen in S19, the web page processing unit 411 transmits web page information of the bias circuit selection screen to the sensor vendor terminal 5 to display the bias circuit selection screen on the web browser 300*b*. As in S14, the web page processing unit 411 refers to the registration bias circuit data 422*a* of the sensor bias circuit database 422, extracts a plurality of bias circuits suitable for the type of the sensor selected in S11, and displays them on the bias circuit selection screen. When the sensor vendor adds/deletes a bias circuit among the plurality of bias circuits displayed on the bias circuit selection screen, the sensor registration and update unit 418 stores the addition/deletion of the bias circuit into the simulation bias circuit data 422*b* of the sensor bias circuit database 422.

Then, the sensor registration and update unit 418 updates the information related to the sensor in the sensor database 421 and the sensor bias circuit database 422 (S21). When the bias circuit is updated on the bias circuit selection screen in S20, the sensor registration and update unit 418 updates the information of the sensor type and characteristics set in S11, S18 to S20 in the sensor database 421 and updates the information of the bias circuit in the sensor bias circuit database 422. Note that those information about the sensor may be registered in the database each time the information is input in S1, S18 to S20 or may be registered all together in the database in S21. Further, the sensor registration and update unit 418 sets an update flag indicating that the sensor information has been updated in the sensor database 421.

Then, the web page processing unit 411 displays a sensor list screen with a flag on the sensor vendor terminal 5 (S22). When update in the database is done in S21, the web page processing unit 411 transmits web page information of the sensor list screen to the sensor vendor terminal 5 to display the sensor list screen on the web browser 300*b*. The web page processing unit 411 refers to the sensor database 421, extracts the sensors that have been already registered (updated) by the currently operating sensor vendor and displays the sensors including the one updated this time on the sensor list screen. Further, the web page processing unit 411 refers to a data flag for each sensor in the sensor list and displays the state of the data flag. In this example, because the sensor is updated in S21, an update flag is set, and a mark indicating that update is done is displayed. Although the method of updating a sensor and a bias circuit is described in detail above, a method of deleting a sensor and a bias circuit can be achieved in the same procedure. For example, when an operation to delete the selected sensor on the sensor list screen displayed as in S18 is performed, the corresponding information of the sensor and the bias circuit is deleted from the sensor database 421 and the sensor bias circuit database 422.

Figure 33:
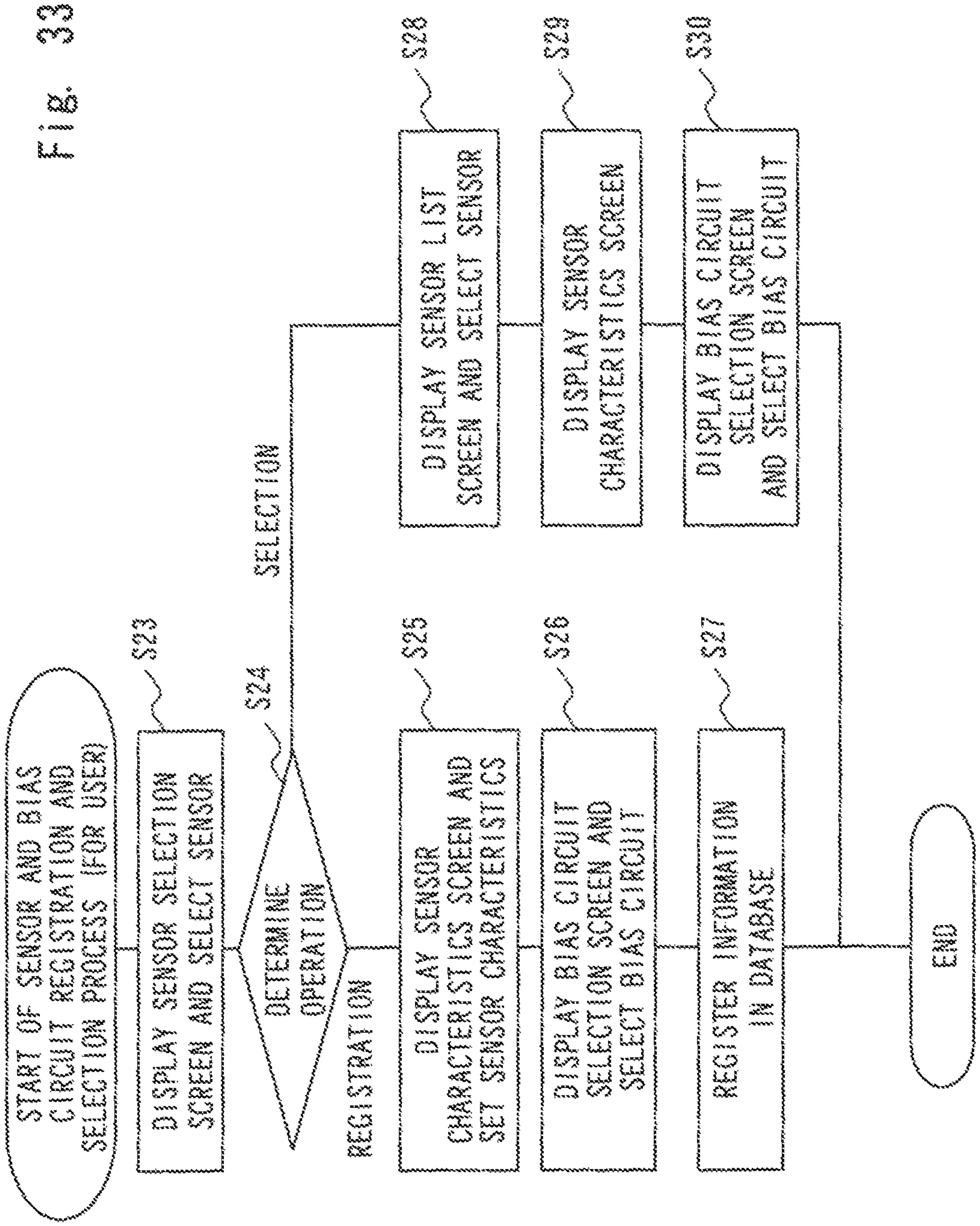
FIG. 33 is a flowchart showing a simulation method of the web simulator according to the first embodiment.

FIG. 33 shows the sensor and bias circuit registration and selection process according to this embodiment, which corresponds to the process of S103 in FIG. 31, and particularly shows the process for a sensor. In other words, this process is performed when the account is a user in S103.

First, the web page processing unit 411 displays a sensor selection screen on the user terminal 3, and a user selects the type of a sensor (S23). As in the case of a sensor vendor in FIG. 32, when the user performs an operation to select a sensor on the guidance screen in S10 of FIG. 31, the web page processing unit 411 transmits web page information of the sensor selection screen for selecting a sensor to the user terminal 3 to display the sensor selection screen on the web browser 300*a*. Then, when the user selects the type of a sensor on the sensor selection screen, the sensor registration and update unit 418 or the circuit setting unit 412 identifies the selected type of a sensor as the type of a sensor to be registered or to be simulated.

Then, the web page processing unit 411 determines whether the user has performed an operation to register a sensor or select a sensor to be simulated on the sensor selection screen (S24). Because the user is permissible to register and update a user's original sensor (custom sensor) only, the process after S25 is performed in response to the user's operation and the user's original sensor and the bias circuit are registered.

When the user has selected registration of a sensor in S24, the web page processing unit 411 displays a sensor characteristics screen on the user terminal 3, and the user enters the characteristics of a sensor (S25). When the user performs an operation to register a sensor on the sensor selection screen in S23, the web page processing unit 411 transmits web page information of the sensor characteristics screen for setting the characteristics of a sensor to the user terminal 3 to display the sensor characteristics screen on the web browser 300*a*. Then, when the user sets the characteristics of the sensor on the sensor characteristics screen, the sensor registration and update unit 418 stores the set characteristics information of the sensor into the sensor database 421. Further, the sensor registration and update unit 418 stores the type of the sensor selected in S23 into the sensor database 421.

Note that the sensor information and the like registered by the user may be stored in the storage unit 420 of the web simulator 4 or in the storage unit 310*a* of the user terminal 3. In other words, the sensor database 421, the sensor bias circuit database 422, the circuit information storage unit 426 and the like may be included in the storage unit 310*a* of the user terminal. 3 in order to store data to be used by the user only.

Then, the web page processing unit 411 displays a bias circuit selection screen on the user terminal 3, and the user selects a bias circuit (S26). When the user performs an operation to set a bias circuit on the sensor characteristics screen in S25, the web page processing unit 411 transmits web page information of the bias circuit selection screen to the user terminal 3 to display the bias circuit selection screen on the web browser 300*a*. As in S14 in FIG. 32, the web page processing unit 411 refers to the registration bias circuit data 422*a* of the sensor bias circuit database 422, extracts a plurality of bias circuits suitable for the type of the sensor selected in S23, and displays them on the bias circuit selection screen. When the user selects a bias circuit among the plurality of bias circuits displayed on the bias circuit selection screen, the sensor registration and update unit 418 stores the selected bias circuit into the simulation bias circuit data 422*b* of the sensor bias circuit database 422. In the simulation bias circuit data 422*b*, only one sensor and one bias circuit can be associated with each other.

Then, the sensor registration and update unit 418 registers the information about the sensor in the sensor database 422 and the sensor bias circuit database 422 (S27). When the bias circuit is input on the bias circuit selection screen in S26, the sensor registration and update unit 418 registers the information of the sensor type and characteristics set in S23 to S26 in the sensor database 421 and registers the information of the bias circuit in the sensor bias circuit database 422. Note that those information about the sensor may be registered in the database each time the information is input in S23 to S26 or may be registered all together in the database in S27. Note that the information about the sensor registered by the user may be stored in the storage unit 310*a* of the user terminal 3.

On the other hand, when the user has selected a target of simulation in S24, the web page processing unit 411 displays a sensor list screen on the user terminal 3, and the user selects a sensor (S28). When the user performs an operation to select a target of simulation on the sensor selection screen in S23, the web page processing unit 411 transmits web page information of the sensor list screen to the user terminal 3 to display the sensor list screen on the web browser 300*a*. The web page processing unit 411 refers to the sensor database 421 and extracts the sensor which corresponds to the type of the sensor selected in S23 and displays the extracted sensor on the sensor list screen. Then, the user selects a sensor to be a target of simulation from the sensor list. The circuit setting unit 412 stores the selected sensor as a circuit to be simulated into the user circuit setting file 426*c* of the circuit information storage unit 426.

Then, the web page processing unit 411 displays a sensor characteristics setting (reference) screen on the user terminal 3 (S29). When the user performs an operation to refer to the sensor characteristics on the sensor list screen in S28, the web page processing unit 411 transmits web page information of the sensor characteristics screen for referring to the sensor to the user terminal 3 to display the sensor characteristics screen on the web browser 300*a*. On the sensor characteristics reference screen, the user refers to the characteristics of the sensor and checks the characteristics of the sensor to be simulated.

Then, the web page processing unit 411 displays a bias circuit selection screen on the user terminal 3, and the user selects a bias circuit (S30). When the user performs an operation to set a bias circuit on the sensor characteristics setting (reference) screen in S29, the web page processing unit 411 transmits web page information of the bias circuit selection screen to the user terminal 3 to display the bias circuit selection screen on the web browser 300*a*. The web page processing unit 411 refers to the registration bias circuit data 422*a* of the sensor bias circuit database 422, extracts bias circuits suitable for a specific sensor, and displays them on the bias circuit selection screen. When the user selects a bias circuit among the plurality of bias circuits displayed on the bias circuit selection screen, the circuit setting unit 412 stores the selected bias circuit as a circuit to be simulated into the user circuit setting file 426*c* of the circuit information storage unit 426.

Figure 34:
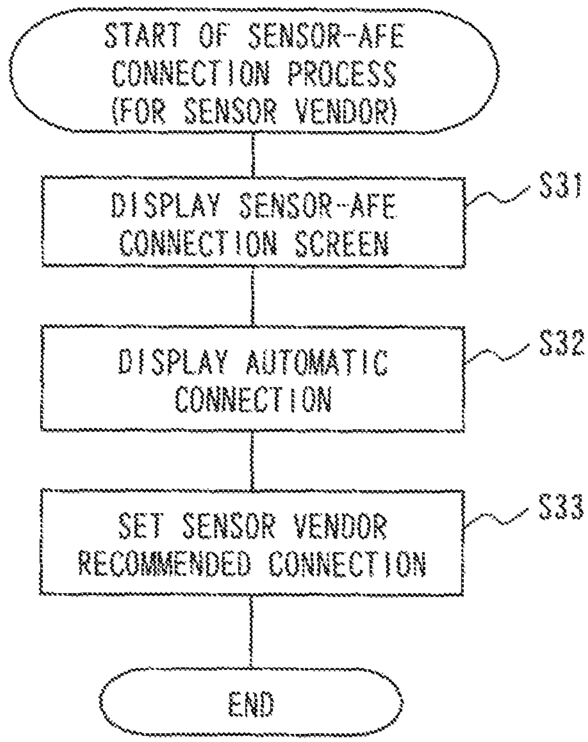
FIG. 34 is a flowchart showing a simulation method of the web simulator according to the first embodiment.

FIG. 34 shows the sensor-AFE connection process according to this embodiment, which corresponds to the process of S107 in FIG. 31, and particularly shows the process for a sensor vendor. In other words, this process is performed when the account is a sensor vendor in S107.

First, the web page processing unit 411 displays a sensor-AFE connection screen on the sensor vendor terminal 5 (S31). When the sensor vendor performs an operation to connect the sensor with the semiconductor device 1 on the AFE selection screen in S105 of FIG. 31, the web page processing unit 411 transmits web page information of the sensor-AFE connection screen for connecting the sensor with the semiconductor device 1 by the sensor vendor to the sensor vendor terminal 5 to display the sensor-AFE connection screen on the web browser 300*b*. The web page processing unit 411 displays the output terminals of the selected sensor and bias circuit and the input terminal of the selected semiconductor device 1 (the AFE unit 100), so that the sensor vendor can select connections of the sensor and the bias circuit with the semiconductor device 1. When the account is a sensor vendor, a plurality of bias circuits can be selected for one sensor, and therefore the screen is displayed so that connections can be set for each of the plurality of bias circuits.

Further, the web page processing unit 411 displays the connections for automatic connection on the sensor-AFE connection screen of the sensor vendor terminal 5 (S32). The web page processing unit 411 displays the connections by referring to the default circuit setting file 426*a* of the circuit information storage unit 426 so as to connect the sensor and the bias circuit with the semiconductor device 1 by the connections determined in S106 of FIG. 31 as the default connection state of automatic connection. The web page processing unit 411 displays the connections for automatic connection for each of the plurality of bias circuits.

Further, the circuit setting unit 412 sets and registers sensor vendor recommended connection in accordance with an operation of the sense vendor (S33). The sensor vendor sets recommended connection that is recommended to a user on the sensor-AFE connection screen. When the sensor vendor selects the connections of the sensor and the bias circuit with the semiconductor device 1, the circuit setting unit 412 (the connections setting unit 412*d*) stores the selected connections as sensor vendor recommended connection into the vendor circuit setting file 426*b* of the circuit information storage unit 426. The connections for sensor vendor recommended connection are set for each of the plurality of bias circuits and stored into a plurality of vendor circuit setting files 426*b* of the circuit information storage unit 426.

Figure 35:
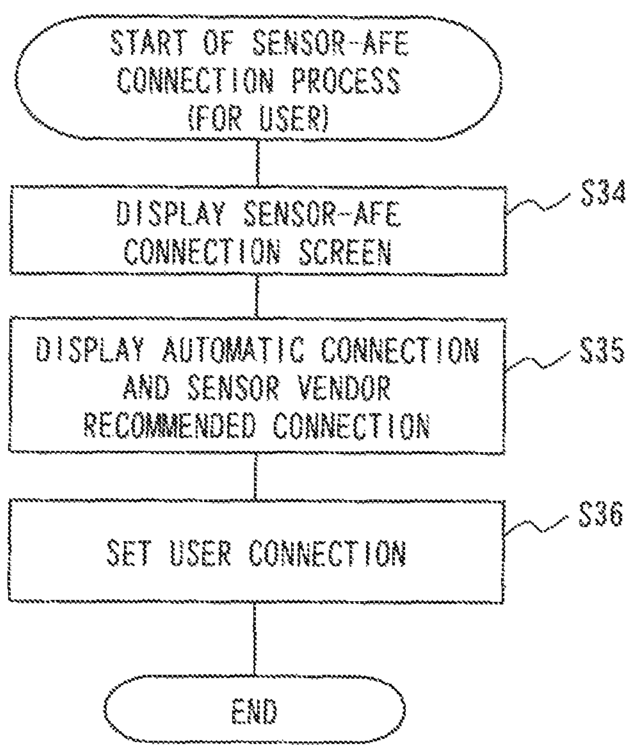
FIG. 35 is a flowchart showing a simulation method of the web simulator according to the first embodiment.

FIG. 35 shows the sensor-AFE connection process according to this embodiment, which corresponds to the process of S107 in FIG. 31, and particularly shows the process for a user. In other words, this process is performed when the account is a user in S107.

First, the web page processing unit 411 displays a sensor-AFE connection screen on the user terminal 3 (S34). When the user performs an operation to connect the sensor with the semiconductor device 1 on the AFE selection screen in S105 of FIG. 31, the web page processing unit 411 transmits web page information of the sensor-AFE connection screen for connecting the sensor with the semiconductor device 1 by the user to the user terminal 3 to display the sensor-AFE connection screen on the web browser 300*a*. The web page processing unit 411 displays the output terminals of the selected sensor and bias circuit and the input terminal of the selected semiconductor device 1 (the AFE unit 100), so that the user can select connections of the sensor and the bias circuit with the semiconductor device 1. When the account is the user, one bias circuit can be selected for one sensor, and therefore the screen is displayed so that connections can be set for one bias circuit.

Further, the web page processing unit 411 displays the connections for automatic connection and sensor vendor recommended connection on the sensor-AFE connection screen of the user terminal 3 (S35). The web page processing unit 411 displays the connections by referring to the default circuit setting file 426*a* of the circuit information storage unit 426 so as to connect the sensor and the bias circuit with the semiconductor device 1 by the connections determined in S106 of FIG. 31 as the default connection state of automatic connection. Further, the web page processing unit 411 displays the connections by referring to the vendor circuit setting file 426*b* of the circuit information storage unit 426 so as to connect the sensor and the bias circuit with the semiconductor device 1 by the connections selected by the sensor vendor in S33 of FIG. 34 as the connection state of sensor vendor recommended connection. The web page processing unit 411 displays the connections for automatic connection and sensor vendor recommended connection for one bias circuit.

Further, the circuit setting unit 412 configures a circuit to be simulated in user connection connected by a user in accordance with the user's operation (S36). When the user selects the connections of the sensor and the bias circuit with the semiconductor device 1 on the sensor-AFE connection screen, the circuit setting unit 412 (the connections setting unit 412*d*) stores the selected connections as connections of a circuit to be simulated into the user circuit setting file 426*c* of the circuit information storage unit 426. One connections is set for one bias circuit and stored into one user circuit setting file 426*c* of the circuit information storage unit 426.

Figure 36:
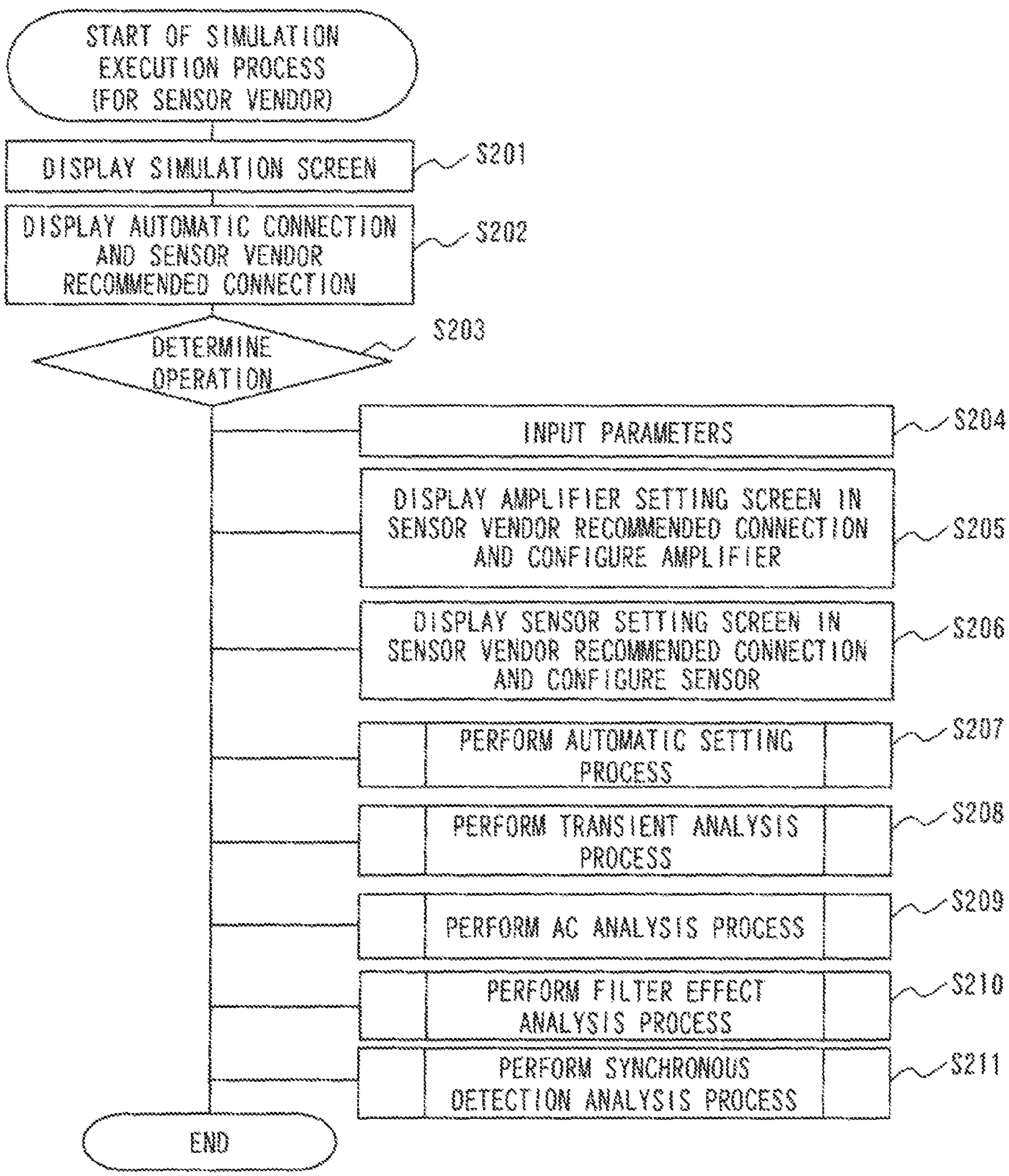
FIG. 36 is a flowchart showing a simulation method of the web simulator according to the first embodiment.

FIG. 36 shows the simulation execution process according to this embodiment, which corresponds to the process of S109 in FIG. 31, and particularly shows the process for a sensor vendor. In other words, this process is performed when the account is a sensor vendor in S109.

First, the web page processing unit 411 displays a simulation screen on the sensor vendor terminal 5 (S201). When the simulation execution process is started in S109 of FIG. 31, the web page processing unit 411 transmits web page information of the simulation screen for performing simulation to the sensor vendor terminal 5 to display the simulation screen on the web browser 300*b*.

Further, the web page processing unit 411 displays connections for automatic connection and vendor recommended connection on the simulation screen of the sensor vendor terminal 5 (S202). As in the sensor-AFE connection screen displayed in FIG. 34, the web page processing unit 411 displays the connections by referring to the default circuit setting file 426*a* of the circuit information storage unit 426 so as to connect the sensor and the bias circuit with the semiconductor device 1 by the connections determined in S106 of FIG. 31 as the default connection state of automatic connection. Further, the web page processing unit 411 displays the connections by referring to the vendor circuit setting file 426*b* of the circuit information storage unit 426 so as to connect the sensor and the bias circuit with the semiconductor device 1 by the connections selected by the sensor vendor in S33 of FIG. 34 as the connection state of sensor vendor recommended connection. The web page processing unit 411 displays the connections for automatic connection and sensor vendor recommended connection for each of the plurality of bias circuits corresponding to the sensor.

The following processes in S204 to S211 are performed in accordance with the operation of the sensor vendor on the simulation screen in S201 and S202 (S203). Those processes are performed repeatedly while the simulation screen is displayed.

When the sensor vendor performs an operation to input parameters on the simulation screen, the web page processing unit 411 displays a screen to enter parameters on the sensor vendor terminal 5, and the sensor vendor enters parameters required for simulation (S204). When the sensor vendor clicks on a parameter entry button for entering parameters or the like on the simulation screen, the web page processing unit 411 transmits web page information of the parameter input screen to the sensor vendor terminal 5 to display the parameter input screen on the web browser 300*b*. The web page processing unit 411 displays the parameters and the default value that are already stored in the parameter storage unit 427 on the parameter input screen. When the sensor vendor enters and determines parameters on the parameter input screen, the parameter setting unit 413 stores the entered parameters into the parameter storage unit 427.

When the sensor vendor performs an operation for setting of the configurable amplifier 110 on the simulation screen, the web page processing unit 411 displays an amplifier setting screen on the sensor vendor terminal 5, and the sensor vendor configures the configurable amplifier 110 (S205). In this configuration, the configuration and characteristics of the sensor vendor recommended connection are set. When the sensor vendor clicks on an icon of the amplifier or the like in the state where automatic connection or sensor vendor recommended connection is displayed on the simulation screen, the web page processing unit 411 transmits web page information of an amplifier setting screen for setting the details of the configurable amplifier 110 to the sensor vendor terminal 5 to display the amplifier setting screen on the web browser 300*b*. The web page processing unit 411 displays the circuit configuration and circuit characteristics of the amplifier that are already set in the default circuit setting file 426*a* or the vendor circuit setting file 426*b* of the circuit information storage unit 426 on the amplifier setting screen. When the sensor vendor sets and determines the configuration and characteristics of the configurable amplifier 110 on the amplifier setting screen for vendor recommended connection, the circuit setting unit 412 sets the configuration and characteristics of the configurable amplifier 110 in the vendor circuit setting file 426*b* of the circuit information storage unit 426.

When the sensor vendor performs an operation for setting of the sensor on the simulation screen, the web page processing unit 411 displays a sensor setting screen on the sensor vendor terminal 5, and the sensor vendor configures the sensor (S206). In this configuration, the configuration and characteristics of the sensor vendor recommended connection are set. When the sensor vendor clicks on a sensor setting button or the like in the state where automatic connection or vendor recommended connection is displayed on the simulation screen, the web page processing unit 411 transmits web page information of a sensor setting screen to the sensor vendor terminal 5 to display the sensor setting screen on the web browser 300*b*. The web page processing unit 411 displays the information of the sensor that is already set in the default circuit setting file 426*a* or the vendor circuit setting file 426*b* of the circuit information storage unit 426 on the sensor setting screen. When the sensor vendor sets and determines the information of the sensor on the sensor setting screen for the vendor recommended connection, the circuit setting unit 412 sets the sensor circuit information in the vendor circuit setting file 426*b* of the circuit information storage unit 426.

When the sensor vendor performs an operation for automatic setting on the simulation screen, an automatic setting process is performed (S207), when the sensor vendor performs an operation for transient analysis, a transient analysis process is performed (S208), when the sensor vendor performs an operation for AC analysis, an AC analysis process is performed (S209), when the sensor vendor performs an operation for filter effect analysis, a filter effect analysis process is performed (S210), and when the sensor vendor performs an operation for synchronous detection analysis, a synchronous detection analysis process is performed (S211). The details of those processes are described later.

Figure 37:
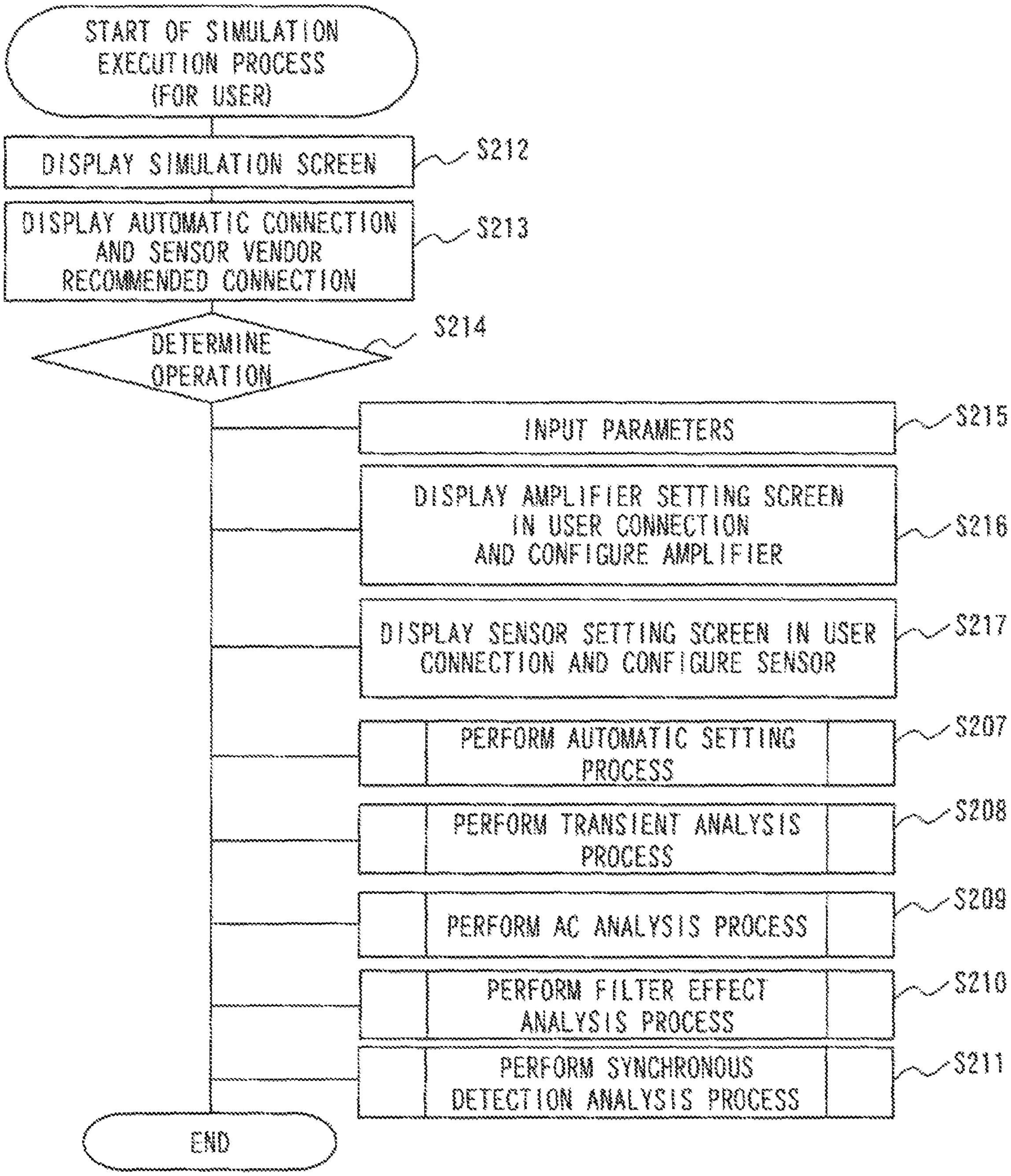
FIG. 37 is a flowchart showing a simulation method of the web simulator according to the first embodiment.

FIG. 37 shows a simulation execution process according to this embodiment, which corresponds to the process of S109 in FIG. 31, and particularly shows the process for a user. In other words, this process is performed when the account is a user in S109.

First, the web page processing unit 411 displays a simulation screen on the user terminal 3 (S212). When the simulation execution process is started in S109 of FIG. 31, the web page processing unit 411 transmits web page information of the simulation screen for performing simulation to the user terminal 3 to display the simulation screen on the web browser 300*a* as in S201 of FIG. 36.

Further, the web page processing unit 411 displays connections for automatic connection and vendor recommended connection on the simulation screen of the user terminal 3 (S213). As in S202 of FIG. 36, the web page processing unit 411 connects the sensor and the bias circuit with the semiconductor device 1 and displays them by referring to the default circuit setting file 426*a* of the circuit information storage unit 426 as the default connection state of automatic connection. Further, as in S202 of FIG. 36, the web page processing unit 411 connects the sensor and the bias circuit with the semiconductor device 1 and displays them by referring to the vendor circuit setting file 426*b* of the circuit information storage unit 426 as the connection state of sensor vendor recommended connection. The web page processing unit 411 displays the connections fox automatic connection and sensor vendor recommended connection for one bias circuit corresponding to the sensor.

The following processes in S215 to S217 and S207 to S211 are performed in accordance with the operation of the user on the simulation screen in S212 and S213 (S214). Those processes are performed repeatedly while the simulation screen is displayed.

When the user performs an operation to input parameters on the simulation screen, the web page processing unit 411 displays a screen to enter parameters on the user terminal 3, and the user enters parameters required for simulation (S215). As in S204 of FIG. 36, the web page processing unit 411 transmits web page information of the parameter input screen to the user terminal 3 to display the parameter input screen on the web browser 300*a*. When the user enters and determines parameters on the parameter input screen, the parameter setting unit 413 stores the entered parameters into the parameter storage unit 427.

When the user performs an operation for setting of the configurable amplifier 110 on the simulation screen, the web page processing unit 411 displays an amplifier setting screen on the user terminal 3, and the user configures the configurable amplifier 110 (S216). In this configuration, the configuration and characteristics of user connection for a circuit to be simulated are set. As in S205 of FIG. 36, the web page processing unit 411 transmits web page information of an amplifier setting screen for setting the details of the configurable amplifier 110 to the user terminal 3 to display the amplifier setting screen on the web browser 300*a*. When the user sets and determines the configuration and characteristics of the configurable amplifier 110 on the amplifier setting screen for automatic connection or vendor recommended connection, the circuit setting unit 412 sets the configuration an characteristics of the configurable amplifier 110 in the user circuit setting file 426*c* of the circuit information storage unit 426.

When the user performs an operation for setting of the sensor on the simulation screen, the web page processing unit 411 displays a sensor setting screen on the user terminal 3, and the user configures the sensor (S217). In this configuration, the configuration and characteristics of user connection for a circuit to be simulated are set. As in S206 of FIG. 36, the web page processing unit 411 transmits web page information of a sensor setting screen to the user terminal 3 to display the sensor setting screen on the web browser 300*a*. When the user sets and determines the information of the sensor on the amplifier setting screen for automatic connection or vendor recommended connection, the circuit setting unit 412 sets the sensor circuit information in the user circuit setting file 426*c* of the circuit information storage unit 426.

As in FIG. 36, when the user performs an operation for automatic setting on the simulation screen, an automatic setting process is performed (S207), when the user performs an operation for transient analysis, a transient analysis process is performed (S208), when the user performs an operation for AC analysis, an AC analysis process is performed (S209), when the user performs an operation for filter effect analysis, a filter effect analysis process is performed (S210), and when the user performs an operation for synchronous detection analysis, a synchronous detection analysis process is performed (S211). The details of those processes are described below.

Figure 38:
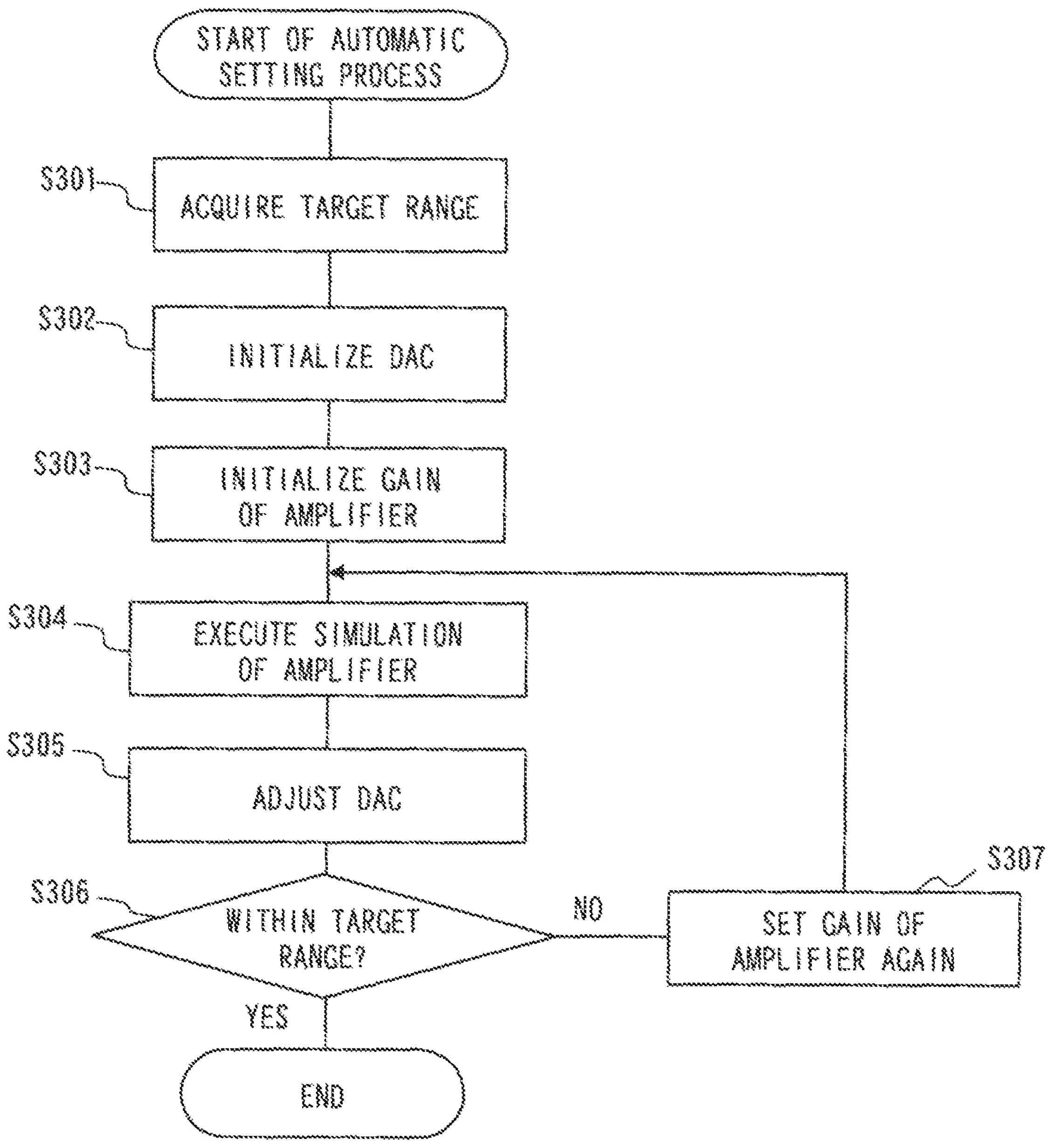
FIG. 38 is a flowchart showing a simulation method of the web simulator according to the first embodiment.

FIG. 38 shows the automatic setting process according to this embodiment, which corresponds to the process in S108 of FIG. 31 and S207 of FIG. 37. The automatic setting process is started when a user or a sensor vendor clicks on an automatic setting button on the simulation screen, for example.

First, the automatic setting unit 451 acquires a target range of the configurable amplifier 110 for which automatic setting is to be made (S301). The automatic setting unit 451 acquires a target range (dynamic range) in which the output operation of the configurable amplifier 110 in the semiconductor device 1 is possible by referring to the AFE database 424.

Next, the automatic setting unit 451 initializes the DAC that is connected to the input of the configurable amplifier 110 (S302) and initializes the gain of the configurable amplifier 110 (S303). The automatic setting unit 451 initializes the output voltage of the DAC so that the input signal of the configurable amplifier 110 becomes a center value (median). Further, the automatic setting unit 451 initializes the gain of the configurable amplifier 110 to a given value.

Then, the automatic setting unit 451 executes simulation of the configurable amplifier 110 (S304). The automatic setting unit 451 simulates the operation of the configurable amplifier 110 by setting the output signal of the sensor, the output voltage of the DAC and the gain of the configurable amplifier 110 as simulation conditions. For example, the automatic setting unit 451 calculates the output signal of the configurable amplifier 110 when the minimum value, the maximum value or the center value of the sensor output signal is input to the configurable amplifier 110.

Then, the automatic setting unit 451 adjusts the output voltage of the DAC (S305). The automatic setting unit 451 adjusts the output voltage of the DAC so that the center value of the output voltage of the configurable amplifier 110 becomes the center value of the power supply voltage. The automatic setting unit 451 compares the center value of the output voltage of the configurable amplifier 110 with the center value of the power supply voltage and increases or decreases the output voltage of the DAC in accordance with a result of the comparison.

Then, the automatic setting unit 451 determines whether the simulation result is within the target range of the configurable amplifier 110 (S306). The automatic setting unit 451 compares the minimum value and the maximum value of the output signal of the configurable amplifier 110 by simulation with the target range. The automatic setting unit 451 compares the output signal of the configurable amplifier 110 when the input signal is the minimum value with the minimum value of the target range and determines that it is outside the range when the simulation result is smaller than the minimum value of the target range and determines that it is within the range when the simulation result is larger than the minimum value of the target range. Further, the automatic setting unit 451 compares the output signal of the configurable amplifier 110 when the input signal is the maximum value with the maximum value of the target range and determines that it is outside the range when the simulation result is larger than the maximum value of the target range and determines that it is within the range when the simulation result is smaller than the maximum value of the target range.

When the simulation result is outside the target range of the configurable amplifier 110, the automatic setting unit 451 sets the gain of the amplifier again (S307). For example, the automatic setting unit 451 increases the gain of the amplifier when the minimum value of the output signal of the configurable amplifier 110 is smaller than the minimum value of the target range and decreases the gain of the amplifier when the maximum value of the output signal of the configurable amplifier 110 is larger than the maximum value of the target range. Then, the automatic setting unit 451 executes simulation of the configurable amplifier 110 (S304), adjusts the DAC (S305) and makes determination about the target range (S306) again.

When the simulation result is within the target range of the configurable amplifier 110, the automatic setting unit 451 ends the automatic setting process because the appropriate gain and offset are set. Information about the gain of the configurable amplifier 110 and the setting of the DAC in this step are stored into the circuit setting file of the circuit information storage unit 426.

Figure 39:
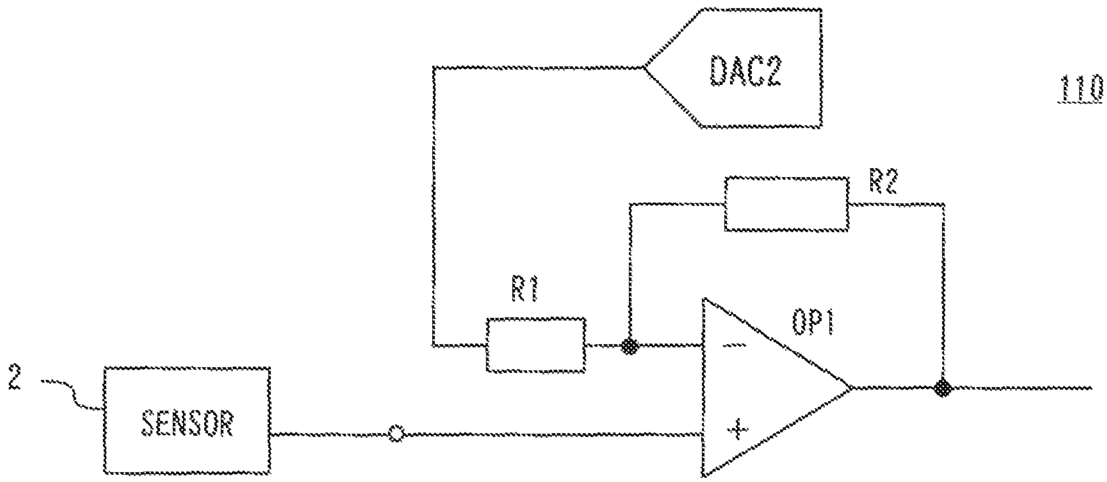
FIG. 39 is a circuit diagram to explain a simulation method of the web simulator according to the first embodiment.

A specific example of the automatic setting process is described hereinafter with reference to FIGS. 39 and 40. FIG. 39 shows an example in the case where a non-inverting amplifier is configured using one DAC in the configurable amplifier 110, which is the same circuit configuration as in FIG. 13. Specifically, in the configurable amplifier 110 of FIG. 39, a DAC 2 is connected to the inverting input terminal of an operational amplifier OP1 through a resistor R1, the output terminal and the inverting input terminal of the operational amplifier OP1 are feedback connected through a resistor R2, and the sensor 2 is connected to the non-inverting input terminal of the operational amplifier OP1.

In the case of automatically setting the configurable amplifier 110 of FIG. 39, the output voltage of the DAC 2 is set to the center value of the output voltage (Vin±x) of the sensor (S302), and then the gain of the operational amplifier OP1 is set to an arbitrary value (S303).

Next, the output voltage of the DAC 2 is adjusted, performing simulation of the operation of the operational amplifier OP1 (S304 and S305). The output voltage of the DAC 2 is adjusted so that the output voltage of the operational amplifier OP1 becomes the center value (Vcc/2) of Vcc.

After that, it is determined whether the output voltage of the operational amplifier OP1 is within the target range of the configurable amplifier 110, where the target range is Vcc/2±0.8V to Vcc/2±1V, for example (S306). When the output voltage of the operational amplifier OP1 is within the target range, the automatic setting process ends, and when it is outside the target range, the resetting of the gain of the operational amplifier OP (S307) and the adjustment of the DAC (S305) are repeated until it falls into the target range.

Figure 40:
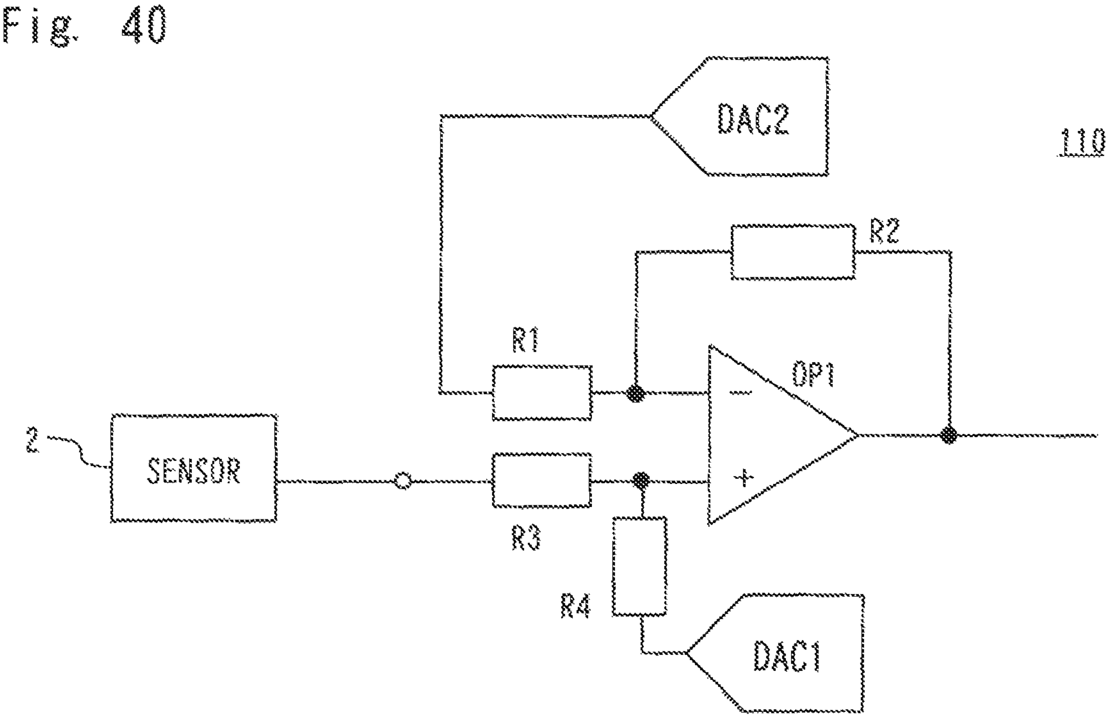
FIG. 40 is a circuit diagram to explain a simulation method of the web simulator according to the first embodiment.

FIG. 40 shows an example in the case where a differential amplifier is configured using two DACs in the configurable amplifier 110, which is the same circuit configuration as in FIG. 10. Specifically, in the configurable amplifier 110 of FIG. 40, a DAC 2 is connected to the inverting input terminal of an operational amplifier OP1 through a resistor R1, the output terminal and the inverting input terminal of the operational amplifier OP1 are feedback connected through a resistor R2, and the sensor 2 and a DAC 1 are connected to the non-inverting input terminal of the operational amplifier OP1 through a resistor R3 and a resistor R4, respectively.

In the case of automatically setting the configurable amplifier 110 of FIG. 40, the output voltage of the DAC 1 is set to the center value (Vcc/2=2.5V) of VCC, and the output voltage of the DAC 2 is set to the center value of the output voltage (Vin±x) of the sensor (S302). Then, the gain of the operational amplifier OP1 is set to an arbitrary value (S303).

Next, the output voltage of the DAC 1 is adjusted, performing simulation of the operation of the operational amplifier OP1 (S304 and S305). The output voltage of the DAC 1 is adjusted so that the output voltage of the operational amplifier OP1 becomes the center value (Vcc/2) of Vcc.

After that, it is determined whether the output voltage of the operational amplifier OP1 is within the target range of the configurable amplifier 110, where the target range is Vcc/2±0.8V to Vcc/2±1V, for example (S306). When the output voltage of the operational amplifier OP1 is within the target range, the automatic setting process ends, and when it is outside the target range, the resetting of the gain of the operational amplifier OP1 (S307) and the adjustment of the DAC (S305) are repeated until it falls into the target range.

Figure 41:
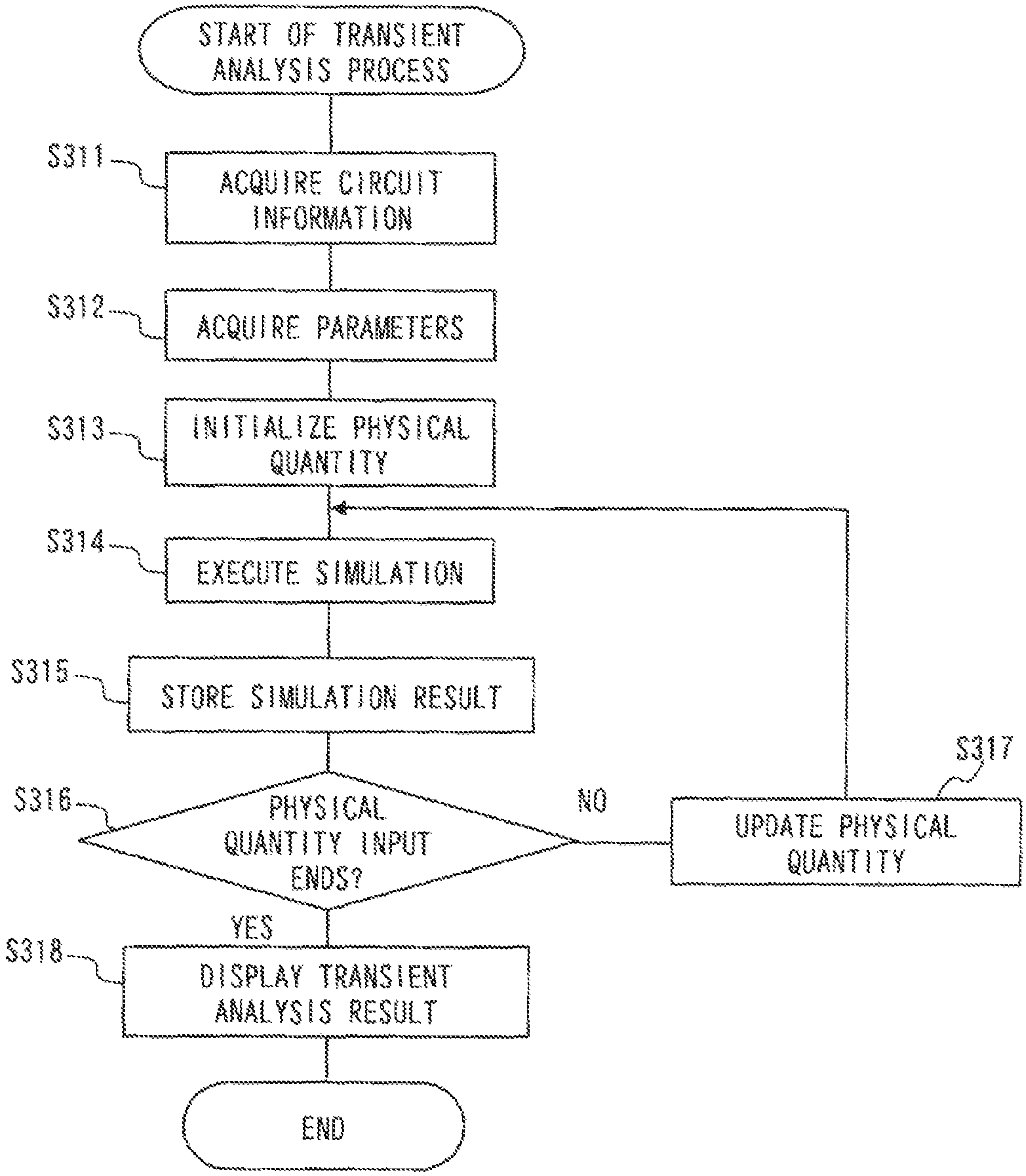
FIG. 41 is a flowchart showing a simulation method of the web simulator according to the first embodiment.

FIG. 41 shows the transient analysis process according to this embodiment, which corresponds to the process in S208 of FIGS. 36 and 37. The transient analysis process is started when a user or a sensor vendor clicks on a transient analysis button on the simulation screen, for example.

First, the transient analysis unit 452 acquires circuit information of a circuit to be simulated (S311). The transient analysis unit 452 refers to the circuit information storage unit 426 and acquires the circuit configuration and the connections of the sensor and the bias circuit and the semiconductor device 1 (the AFE unit 100).

Next, the transient analysis unit 452 acquires parameters for performing simulation (S312). The transient analysis unit 452 refers to the parameter storage unit 427 and acquires an input pattern of a physical quantity to be input to the sensor and parameters of the circuit to be simulated.

Then, the transient analysis unit 452 initializes a physical quantity to be input to the sensor (S313). The transient analysis unit 452 sets a physical quantity to be input first by the input pattern of the physical quantity to be input to the sensor. Because the physical quantity is input in time series, time information is initialized as well.

Then, the transient analysis unit 452 executes simulation of the semiconductor device 1 (the AFE unit 100) (S314). The physical quantity conversion unit 450 calculates the output signal of the sensor corresponding to the input physical quantity, and the transient analysis unit 452 simulates the operation of the semiconductor device 1 using the output signal of the sensor, the gain of the amplifier and the like as simulation conditions.

Then, the transient analysis unit 452 stores a result of the simulation (S315). The transient analysis unit 452 stores the output signal of each circuit in the semiconductor device 1 in association with the current time information into the result information storage unit 428 as the result of the simulation.

Then, the transient analysis unit 452 determines whether the input pattern of the physical quantity ends (S316). The transient analysis unit 452 determines whether the input of the physical quantity ends by comparing the current time information with the latest time when the input pattern of the physical quantity ends.

When the input pattern of the physical quantity does not end, the transient analysis unit 452 updates the physical quantity to be input (S317). The transient analysis unit 452 advances the time information to the next time and sets a physical quantity corresponding to the time from the input pattern. With the updated physical quantity, the transient analysis unit 452 executes simulation (S314) and stores a result (S315), and repeats this process until the input pattern of the physical quantity ends.

When the input pattern of the physical quantity ends, the transient analysis unit 452 displays a result of the simulation (S318) and ends the transient analysis process. The transient analysis unit 452 refers to the result information storage unit 428 and displays a waveform of a signal generated by arranging and plotting the stored simulation results in time series on the simulation screen.

Figure 42:
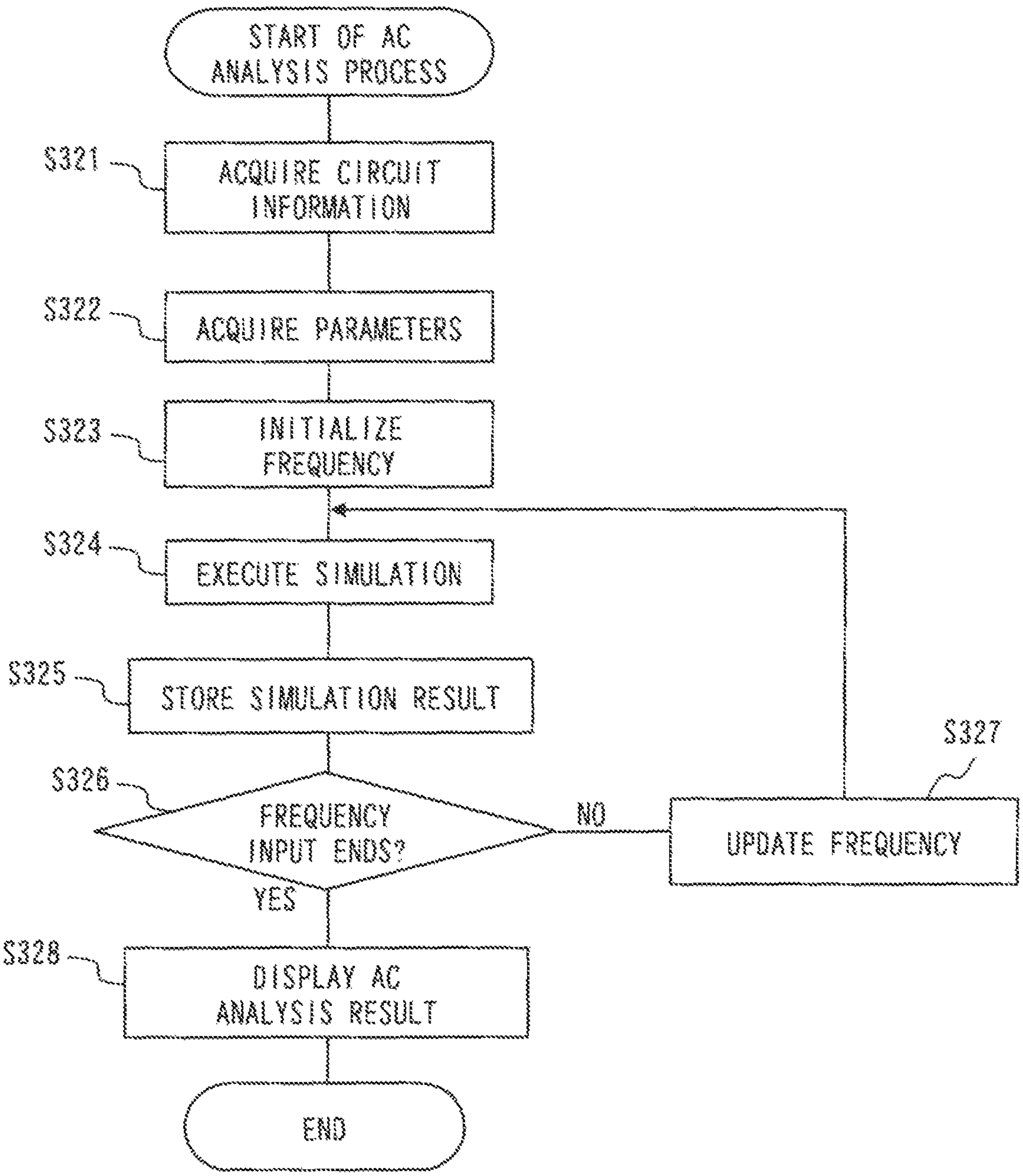
FIG. 42 is a flowchart showing a simulation method of the web simulator according to the first embodiment.

FIG. 42 shows the AC analysis process according to this embodiment, which corresponds to the process in S209 of FIGS. 36 and 37. The AC analysis process is started when a user clicks on an AC analysis button on the simulation screen, for example.

First, the AC analysis unit 453 acquires circuit information of a circuit to be simulated (S321). The AC analysis unit 453 refers to the circuit information storage unit 426 and acquires the circuit configuration and the connections of the sensor and the bias circuit and the semiconductor device 1 (the AFE unit 100).

Next, the AC analysis unit 453 acquires parameters for performing simulation (S322). The AC analysis unit 453 refers to the parameter storage unit 427 and acquires an input pattern of a physical quantity to be input to the sensor and parameters of the circuit to be simulated.

Then, the AC analysis unit 453 sets the value of a physical quantity to be input to the sensor. The AC analysis unit 453 then initializes a frequency for performing AC analysis (S323). The AC analysis unit 453 sets the initial value of the frequency for AC analysis to the minimum value or the maximum value.

Then, the AC analysis unit 453 executes simulation of the semiconductor device 1 (the AFE unit 100) (S324). The physical quantity conversion unit 450 calculates the output signal of the sensor corresponding to the input physical quantity, and the AC analysis unit 453 simulates the operation of the semiconductor device 1 using the output signal of the sensor, the gain of the amplifier and the like as simulation conditions.

Then, the AC analysis unit 453 stores a result of the simulation (S325). The AC analysis unit 453 stores the output signal of each circuit in the semiconductor device 1 in association with the current frequency information into the result information storage unit 428 as the result of the simulation.

Then, the AC analysis unit 453 determines whether the frequency for AC analysis ends (S326). The AC analysis unit 453 determines whether the frequency for AC analysis ends by comparing the current frequency information for AC analysis with the maximum value or the minimum value of frequency information for AC analysis.

When the frequency for AC analysis does not end, the AC analysis unit 453 updates the frequency (S327). The AC analysis unit 453 updates the frequency information to the next frequency, and executes simulation (S324) and stores a result (S325) with the updated frequency, and repeats this process until the frequency ends.

When the frequency for AC analysis ends, the AC analysis unit 453 displays a result of the simulation (S328) and ends the AC analysis process. The AC analysis unit 453 refers to the result information storage unit 428 and displays a waveform of a signal generated by arranging and plotting the stored simulation results in order of frequency on the simulation screen.

Figure 43:
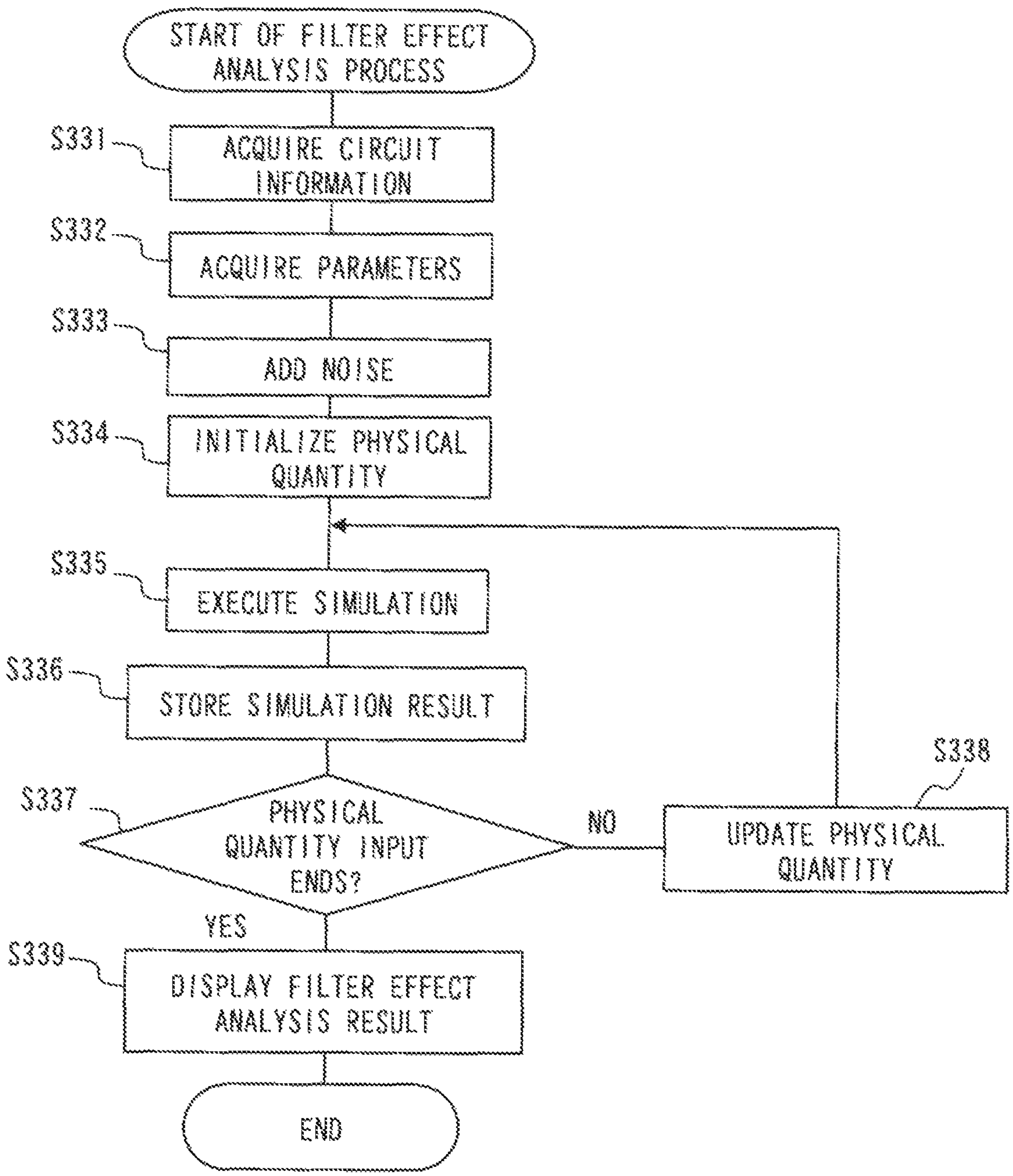
FIG. 43 is a flowchart showing a simulation method of the web simulator according to the first embodiment.

FIG. 43 shows the filter effect analysis process according to this embodiment, which corresponds to the process in S210 of FIGS. 36 and 37. The filter effect analysis process is started when a user clicks on a filter effect button on the simulation screen, for example.

First, the filter effect analysis unit 454 acquires circuit information of a circuit to be simulated (S331). The filter effect analysis unit 454 refers to the circuit information storage unit 426 and acquires the circuit configuration and the connections of the sensor and the bias circuit and the semiconductor device 1 (the AFE unit 100).

Next, the filter effect analysis unit 454 acquires parameters for performing simulation (S332). The filter effect analysis unit 454 refers to the parameter storage unit 427 and acquires an input pattern of a physical quantity to be input to the sensor and parameters of the circuit to be simulated.

Then, the filter effect analysis unit 454 adds noise to the input pattern of the physical quantity (S333). The filter effect analysis unit 454 generates a noise pattern for simulating the filter effect and adds noise to the input pattern of the physical quantity to be input to the sensor.

Then, the filter effect analysis unit 454 initializes a physical quantity to be input to the sensor (S334). The filter effect analysis unit 454 sets a physical quantity to be input first by the input pattern of the physical quantity to which noise has been added. Because the physical quantity is input in time series, time information is initialized as well.

Then, the filter effect analysis unit 454 executes simulation of the semiconductor device 1 (the AFE unit 100) (S335). The physical quantity conversion unit 450 calculates the output signal of the sensor corresponding to the input physical quantity, and the filter effect analysis unit 454 simulates the operation of the semiconductor device 1 using the output signal of the sensor, the gain of the amplifier and the like as simulation conditions.

Then, the filter effect analysis unit 454 stores a result of the simulation (S336). The filter effect analysis unit 454 stores the output signal of each circuit in the semiconductor device 1 in association with the current time information into the result information storage unit 428 as the result of the simulation.

Then, the filter effect analysis unit 454 determines whether the input pattern of the physical quantity ends (S337). The filter effect analysis unit 454 determines whether the input pattern of the physical quantity ends by comparing the current time information with the latest time when the input pattern of the physical quantity to which noise has been added ends.

When the input pattern of the physical quantity does not end, the filter effect analysis unit 454 updates the physical quantity (S338). The filter effect analysis unit 454 advances the time information to the next time and sets a physical quantity corresponding to the time from the input pattern with noise. With the updated physical quantity, the filter effect analysis unit 454 executes simulation (S335) and stores a result (S336), and repeats this process until the input pattern of the physical quantity ends.

When the input pattern of the physical quantity ends, the filter effect analysis unit 454 displays a result of the simulation (S339) and ends the filter effect analysis process. The filter effect analysis unit 454 refers to the result information storage unit 428 and displays a waveform of a signal generated by arranging and plotting the stored simulation results in time series on the simulation screen.

Figure 44:
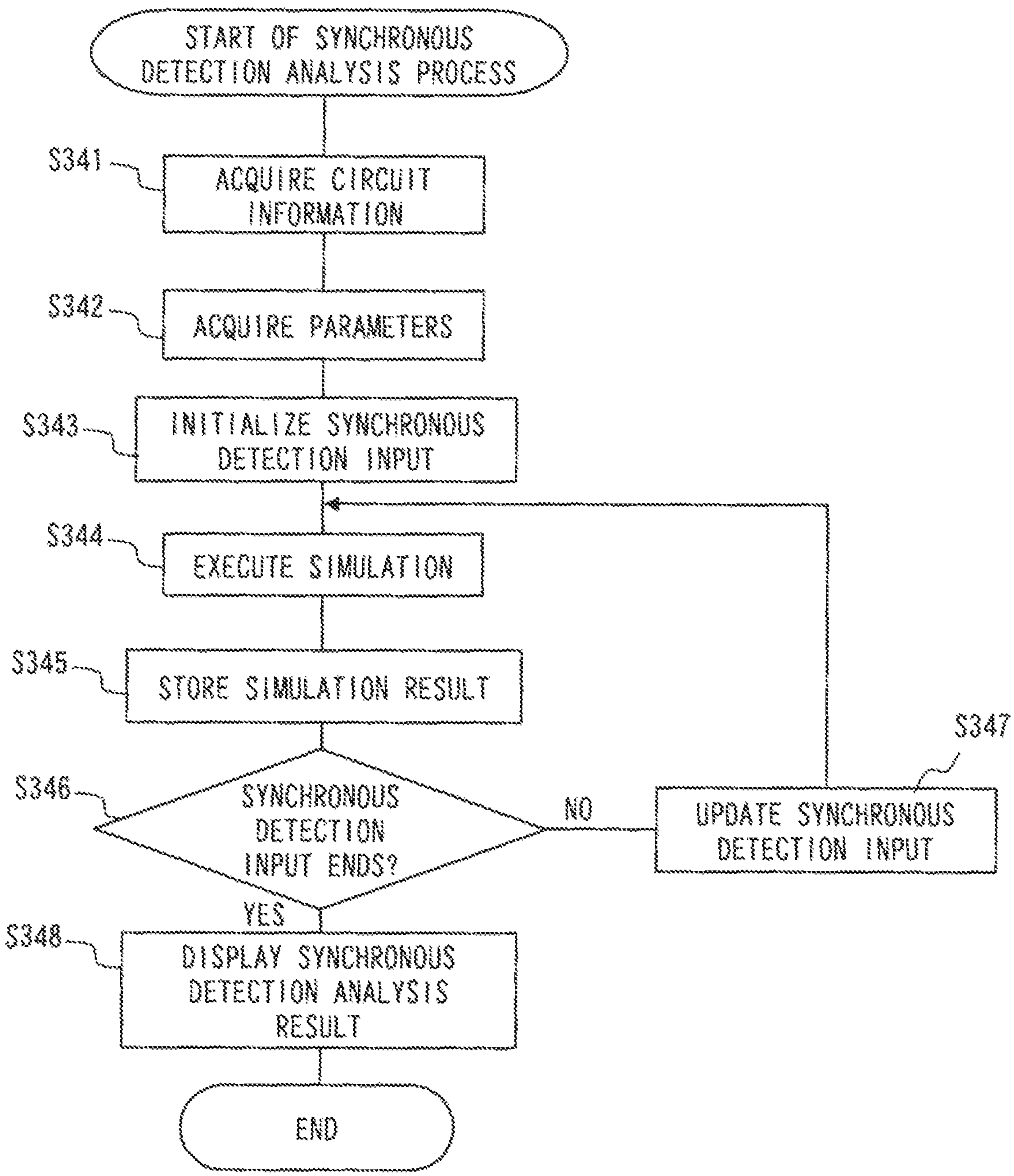
FIG. 44 is a flowchart showing a simulation method of the web simulator according to the first embodiment.

FIG. 44 shows the synchronous detection analysis process according to this embodiment, which corresponds to the process in S211 of FIGS. 36 and 37. The synchronous detection analysis process is started when a user clicks on a synchronous detection button on the simulation screen, for example.

First, the synchronous detection analysis unit 455 acquires circuit information of a circuit to be simulated (S341). The synchronous detection analysis unit 455 refers to the circuit information storage unit 426 and acquires the circuit configuration and the connections of the sensor and the bias circuit and the semiconductor device 1 (the AFE unit 100).

Next, the synchronous detection analysis unit 455 acquires parameters for performing simulation (S342). The synchronous detection analysis unit 455 refers to the parameter storage unit 427 and acquires an input pattern of a physical quantity to be input to the sensor and parameters of the circuit to be simulated.

Then, the synchronous detection analysis unit 455 initializes a synchronous detection pattern to be input (S343). The synchronous detection analysis unit 455 sets a physical quantity to be input first by the input pattern of the physical quantity to be input to the sensor. Further, the synchronous detection analysis unit 455 initializes a synchronous clock CLK_SYNCH to be input for synchronous detection as the synchronous detection pattern.

Then, the synchronous detection analysis unit 455 executes simulation of the semiconductor device 1 (the AFE unit 100) (S344). The physical quantity conversion unit 450 calculates the output signal of the sensor corresponding to the input physical quantity, and the synchronous detection analysis unit 455 simulates the operation of the semiconductor device 1 using the output signal of the sensor, the gain of the amplifier and the like as simulation conditions.

Then, the synchronous detection analysis unit 455 stores a result of the simulation (S345). The synchronous detection analysis unit 455 stores the output signal of each circuit in the semiconductor device 1 in association with the current time information into the result information storage unit 428 as the result of the simulation.

Then, the synchronous detection analysis unit 455 determines whether the input pattern of the physical quantity or the synchronous detection pattern ends (S346). The synchronous detection analysis unit 455 determines whether the input of the physical quantity or the synchronous detection ends by comparing the current time information with the latest time when the input pattern of the physical quantity or the synchronous detection pattern ends.

When the input of the physical quantity or the synchronous detection does not end, the synchronous detection analysis unit 455 updates the physical quantity and synchronous detection input (S347). The synchronous detection analysis unit 455 advances the time information to the next time and sets a physical quantity corresponding to the time from the input pattern and sets a synchronous clock corresponding to the time from the synchronous detection pattern. With the updated physical quantity and synchronous clock, the synchronous detection analysis unit 455 executes simulation (S344) and stores a result (S345), and repeats this process until the physical quantity or synchronous detection input ends.

When the input of the physical quantity or the synchronous detection ends, the synchronous detection analysis unit 455 displays a result of the simulation (S348) and ends the synchronous detection analysis process. The synchronous detection analysis unit 455 refers to the result information storage unit 428 and displays a waveform of a signal generated by arranging and plotting the stored simulation results in time series on the simulation screen.

A specific operation example of the simulation system according to this embodiment is described hereinbelow with reference to examples of screens that are displayed on the user terminal 3 or the sensor vendor terminal 5. Note that each of the screen examples is a screen that is displayed as an interface of a user or a sensor vendor for a simulation process according to this embodiment, and each screen display is implemented mainly as a result that the web page processing unit 411 of the web simulator 4 or the like transmits web page information for displaying the screen to the user terminal 3 or the sensor vendor terminal 5.

Hereinafter, (operation example 1) operation example of registration of sensor information by a sensor vendor, (operation example 2) operation example of update of sensor information by a sensor vendor, (operation example 3) operation example of recommended connection setting and simulation by a sensor vendor, (operation example 4) operation example of registration of sensor information by a user, and (operation example 5) operation example of simulation by a user are sequentially described.

Operation Example 1

Operation Example of Registration of Sensor Information by a Sensor Vendor

Figure 45:
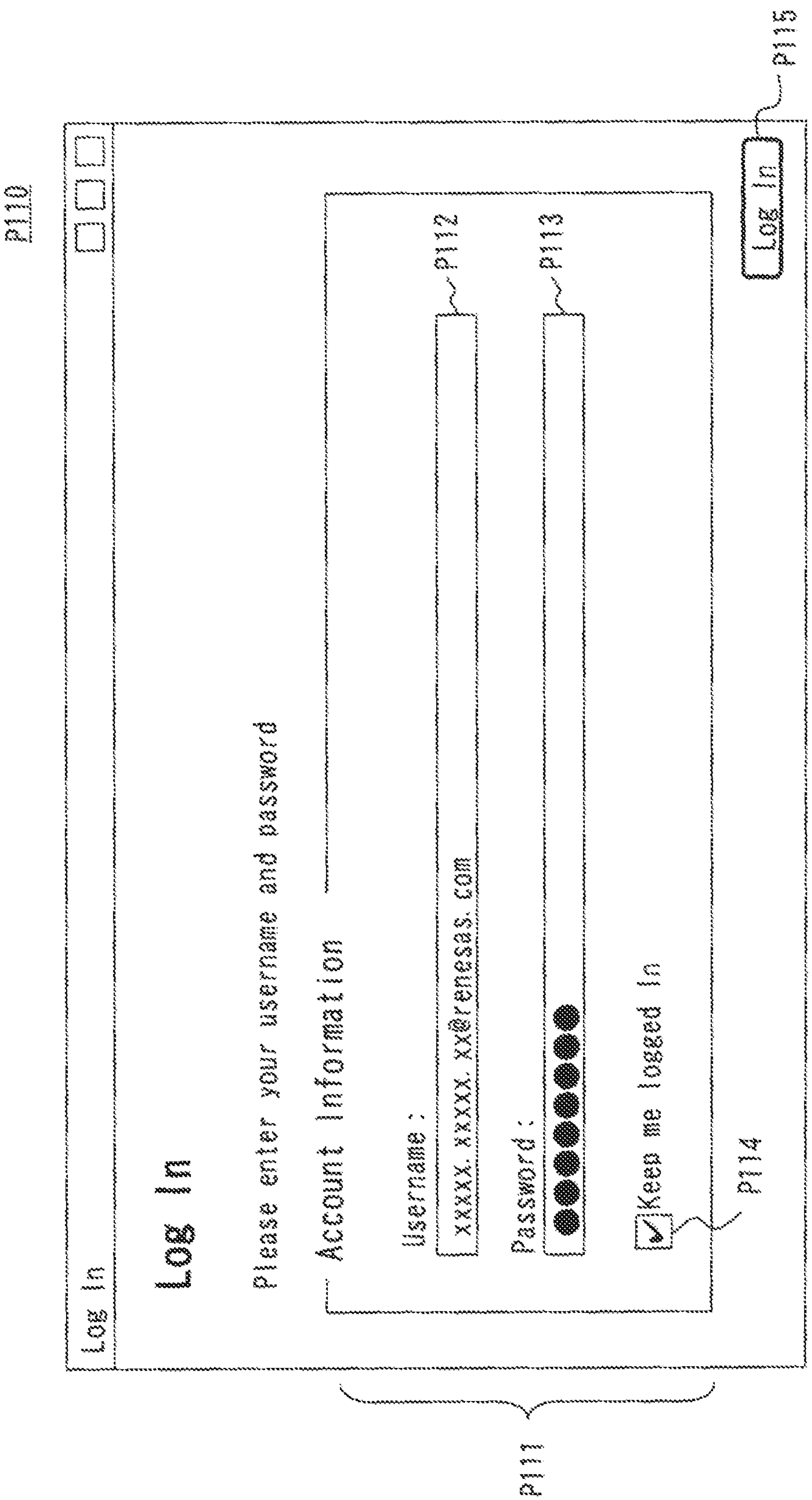
FIG. 45 is a display image diagram of a display screen used in a simulation method of the web simulator according to the first embodiment.

First, the web simulator 4 displays a login screen on the sensor vendor terminal 5 (S101 in FIG. 31). FIG. 45 shows a display example of the login screen. As shown in FIG. 45, a login screen P110 is displayed in the whole window of the web browser 300*b*. On the login screen P110, an account information entry area P111 and a "log in" button P115 are displayed. In the account information entry area P111, a user name entry box P112 to enter an account name (a user name to be entered by a user or a sensor vendor name to be entered by a sensor vendor), a password entry box P113 to enter a password, and a "keep me logged in" checkbox P114 to set to keep a logged in state are displayed.

When a sensor vendor enters an account name (account ID) in the user name entry box P112 and enters a password in the password entry box P113 and then clicks on the "log in" button P115, account authentication is done in the web simulator 4, and further access authorization is determined.

Figure 46:
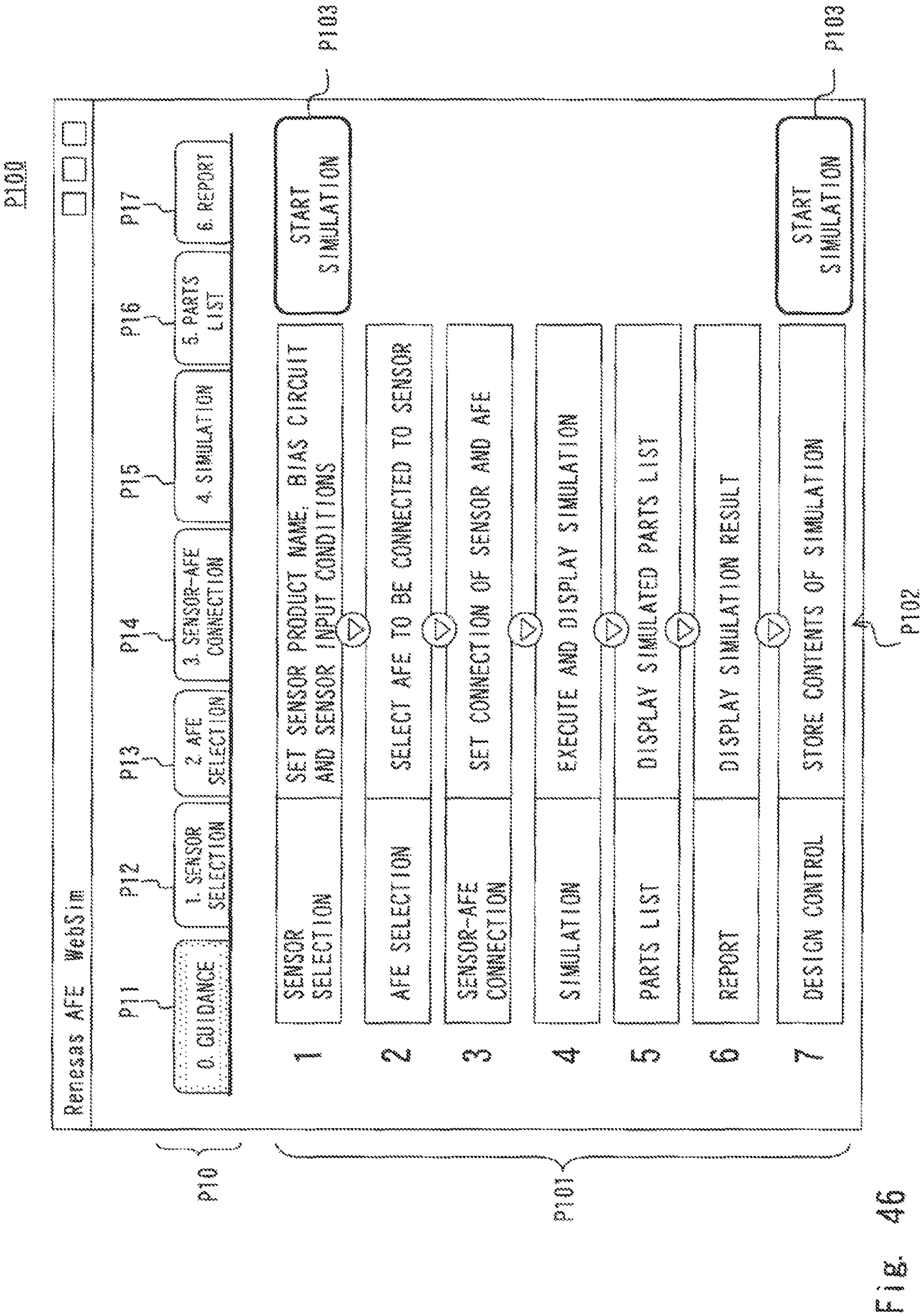
FIG. 46 is a display image diagram of a display screen used in a simulation method of the web simulator according to the first embodiment.

When account authentication is successful, the web simulator 4 displays a guidance screen on the sensor vendor terminal 5 (S102 in FIG. 31). FIG. 46 shows a display example of the guidance screen. As shown in FIG. 46, a web simulator screen P100 is displayed in the whole window of the web browser 300*b*, and each screen for a process required for simulation is displayed inside the web simulator screen P100.

The web simulator screen P100 has a tab display area P10 that is displayed commonly to all screens in its upper part. In the tab display area P10, tabs P11 to P17 to select a screen display are displayed. Because the tab display area P10 is displayed commonly to all screens, any screen can be switched to a screen display desired by a user or a sensor vendor.

For example, a guidance screen is displayed by clicking on the "guidance" tab P11, a sensor selection state screen is displayed by clicking on the "sensor selection" tab P12, an AFE selection screen is displayed by clicking on the "AFE selection" tab P13, a sensor-AFE connection screen is displayed by clicking on the "sensor-AFE connection" tab P14, a simulation screen is displayed by clicking on the "simulation" tab P15, a parts list display screen is displayed by clicking on the "parts list" tab P16, and a report screen is displayed by clicking on the "report" tab P17.

As shown in FIG. 46, when the login is successful or the "guidance" tab P11 is selected, a guidance screen P101 is displayed at substantially the center of the web simulator screen P100.

On the guidance screen P101, a flowchart image P102 showing the flow of usage of the web simulator is displayed so that a user or a sensor vendor can see how to use the web simulator at a glance, and a "start simulation" button P103 is displayed. For example, the flowchart image P102 in guidance display corresponds to the operation of the web simulator described with reference to FIG. 31 and further corresponds to each of the screens displayed in the tabs P11 to P17.

In each step of the flowchart image P102 that is displayed on the guidance screen P101, an icon (not shown) or an outline description is displayed so that a user or a sensor vendor can gain an understanding of the contents. For example, in "sensor selection" in Step 1, a description saying to set a sensor product name, a bias circuit and sensor input conditions is displayed. In "AFE selection" in Step 2, a description saying to select the AFE (the semiconductor device 1) to be connected to the sensor is displayed. In "sensor-AFE connection" in Step 3, a description saying to set connection of the sensor and the AFE (the semiconductor device 1) is displayed. In "simulation" in Step 4, a description saying to execute and display simulation is displayed. In "parts list" in Step 5, a description saying to display a simulated parts list is displayed. In "report" in Step 6, a description saying to display a simulation result is displayed. In "design control" in Step 7, a description saying to store the contents of simulation is displayed.

Further, when the "start simulation" button P103 is clicked on, a screen required to start simulation is displayed. For example, a sensor selection screen for selecting a sensor is displayed as the start of simulation.

Figure 47:
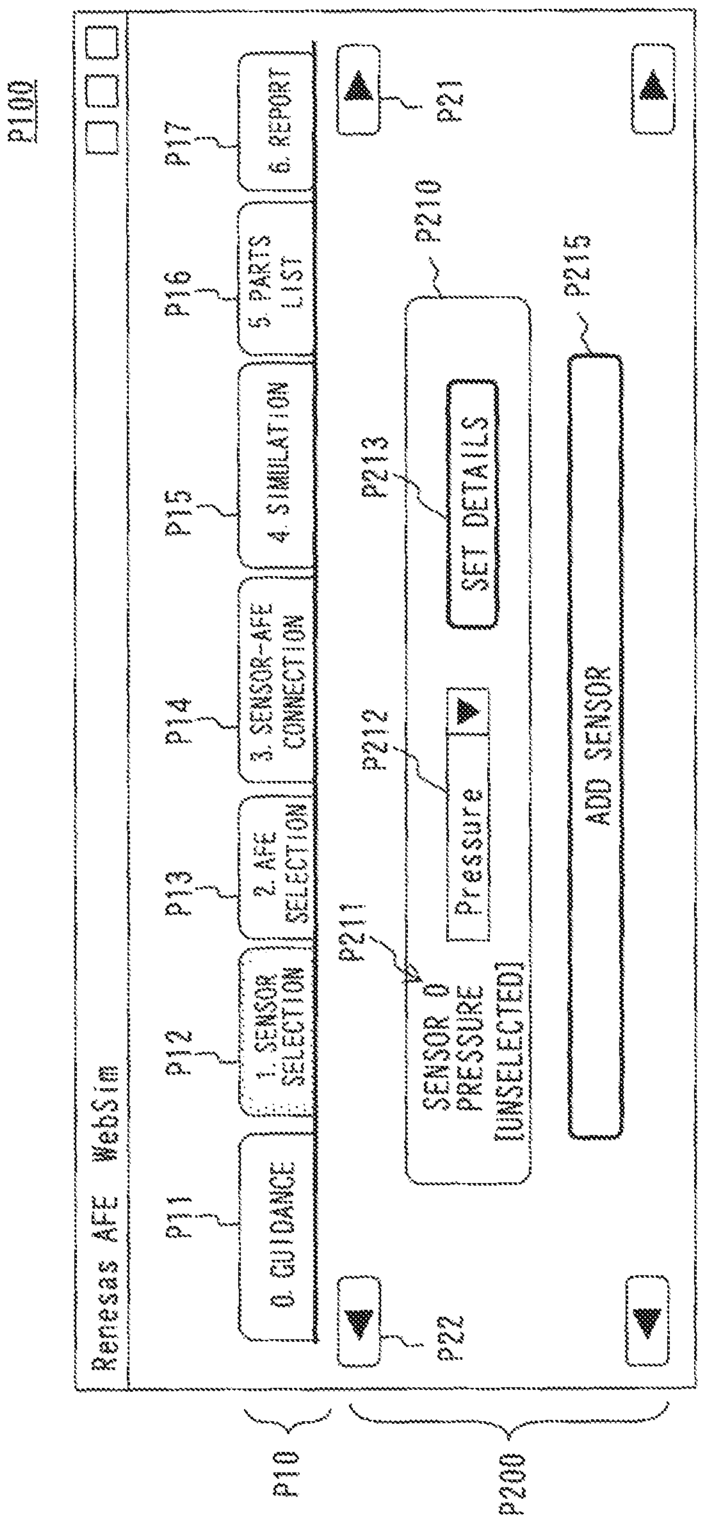
FIG. 47 is a display image diagram of a display screen used in a simulation method of the web simulator according to the first embodiment.

Then, the web simulator 4 displays the sensor selection screen on the sensor vendor terminal 5 (S11 in FIG. 32). FIG. 47 shows a display example of the sensor selection screen. As shown in FIG. 47, when the "start simulation" button P103 is clicked on or the "sensor selection" tab P12 is selected, a sensor selection screen P200 is displayed at substantially the center of the web simulator screen P100.

In the screen of FIG. 47 and the other screens, two forward buttons P22 are displayed at the top and bottom at the far right of the web simulator screen P100, and two back buttons P22 are displayed at the top and bottom at the far left of the web simulator screen P100. The next operation screen is displayed when the forward button P21 is clicked on, and the previous operation screen is displayed when the back button P22 is clicked on. For example, in the case where the sensor selection screen P200 is displayed, the AFE selection screen is displayed when the forward button P21 is clicked on, and the guidance screen is displayed when the back button P22 is clicked on.

As shown in FIG. 47, the current sensor selection state is displayed on the sensor selection screen P200. On the sensor selection screen P200, a sensor selection frame P210 showing the selection state of each sensor is displayed. In a sensor name display area P211 of the sensor selection frame P210, the currently selected sensor type and sensor name are displayed. In FIG. 47, "unselected" is displayed as the sensor name because no sensor is selected yet.

A sensor type pulldown menu P212 in the sensor selection frame P210 displays a plurality of sensor types in a pulldown list, and a user selects a sensor type from the pulldown list. A "set details" button P213 is a button to display a sensor details screen for setting the details of a sensor. On the sensor details screen, detailed settings are made on the sensor of the type selected in the pulldown menu P212.

An "add sensor" button P215 is displayed down below the sensor selection frame P210. The "add sensor" button P215 is a button to add and select a sensor. Each time the "add sensor" button P215 is clicked on, display of the sensor selection frame P210 is added.

Figure 48:
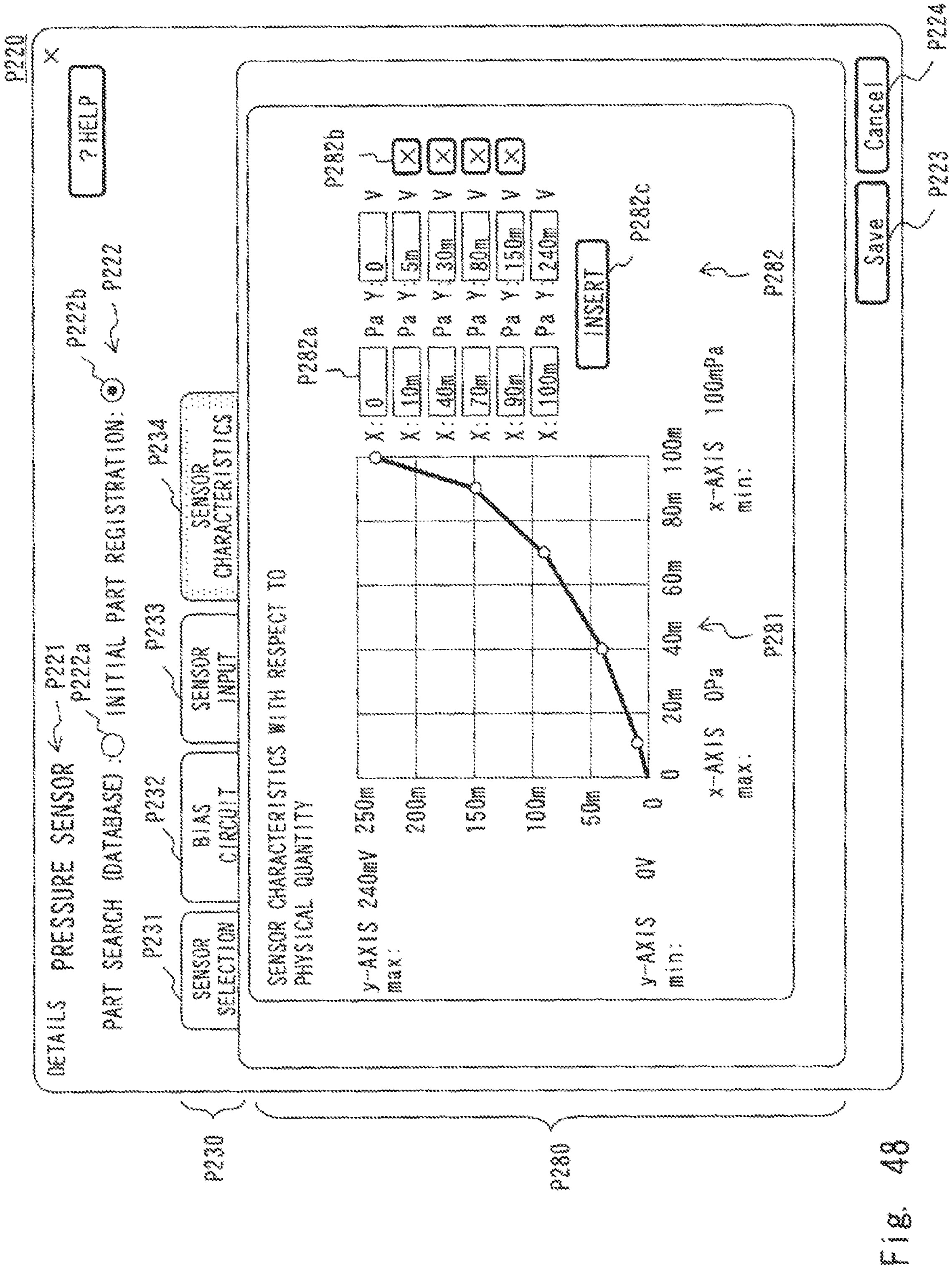
FIG. 48 is a display image diagram of a display screen used in a simulation method of the web simulator according to the first embodiment.

Then, the web simulator 4 displays a sensor details screen and a sensor characteristics screen on the sensor vendor terminal 5 (S12 and S13 in FIG. 32). FIG. 48 shows a display example of a sensor details screen P220 and a sensor characteristics screen P280 that are displayed to set the details of the sensor from the sensor selection screen P200 in FIG. 47. In this example, a sensor is selected using two screens: the sensor selection screen P200 as shown in FIG. 47 and the sensor details screen P220 as shown in FIG. 48, and the two screens can be regarded as the sensor selection screen.

As shown in FIG. 48, the sensor details screen P220 is a pop-up screen that is independent of the web simulator screen P100. The sensor details screen P220 is displayed in a pop-up window when the "set details" button P213 is clicked on the sensor selection screen P200 in FIG. 47.

The sensor details screen P220 has a sensor type display area P221, a part search/registration selection area P222, and a tab display area P230 in its upper part as displays common to all screens, and a "save" button P223 and "cancel" button P224 are displayed in its lower right corner.

In the sensor type display area P221, the sensor type that is selected in the sensor type pulldown menu P212 on the sensor selection screen P200 is displayed. In FIG. 48, a pressure sensor is displayed as the selected sensor type.

In the part search/registration selection area P222, a "part search" radio button P222*a* to search for a sensor among those registered the sensor database 421 and an "initial part registration" radio button P222*b* for a sensor vendor to register a sensor for the first time in the sensor database 421 are displayed. Either one of the "part search" radio button P222*a* or the "initial part registration" radio button P222*b* can be selected.

In the tab display area P230, tabs P231 to P234 to select a screen display are displayed. For example, a sensor list screen (sensor details selection screen) is displayed by clicking on a "sensor selection" tab P231, a bias circuit selection screen is displayed by clicking on a "bias circuit" tab P232, a physical quantity input screen is displayed by clicking on a "sensor input" tab P233, and a sensor characteristics screen is displayed by clicking on a "sensor characteristics" tab P234.

By clicking on the "save" button P223, the settings made in each screen of the sensor details screen P220 are stored in the web simulator 4. Specifically, information of the sensor and the bias circuit are stored into the sensor database 421 and the sensor bias circuit database 422.

When the "set details" button P213 is clicked on the sensor selection screen P200, and the "initial part registration" radio button P222*b* is selected in the part search/registration selection area P222 or the "sensor characteristics" tab P234 is selected, the sensor characteristics screen P280 is displayed within the sensor details screen P220. On the sensor characteristics screen P280, a characteristics graph P281 and a characteristics plot entry area P282 are displayed. Characteristics are set by clicking on or dragging each plot of the graph in the characteristics graph P281. Further, in the characteristics plot entry area P282, a plot is added by an insert button P282*c*, and characteristics are set by entering a numeric value to a coordinate box P282*a* of each plot. A plot can be deleted by a plot delete button P282*b*. For example, when the access authorization of the account is permissible to register and update the sensor database 421, the sensor characteristics screen P280 is displayed and enabled, and the characteristics of a sensor to be registered can be entered.

The example of FIG. 48 is a display example in the case where a pressure sensor is selected as the sensor. In the characteristics graph P281, the characteristics of an output voltage with respect to a detected pressure are displayed, where the x-axis is the detected pressure and the y-axis is the output voltage. The coordinates of six plots are set in the characteristics plot entry area P282, and the characteristics of the plots are displayed in the characteristics graph P281. When the "save" button P223 is clicked on in this state, the characteristics of the sensor are registered in the sensor database 421.

Figure 49:
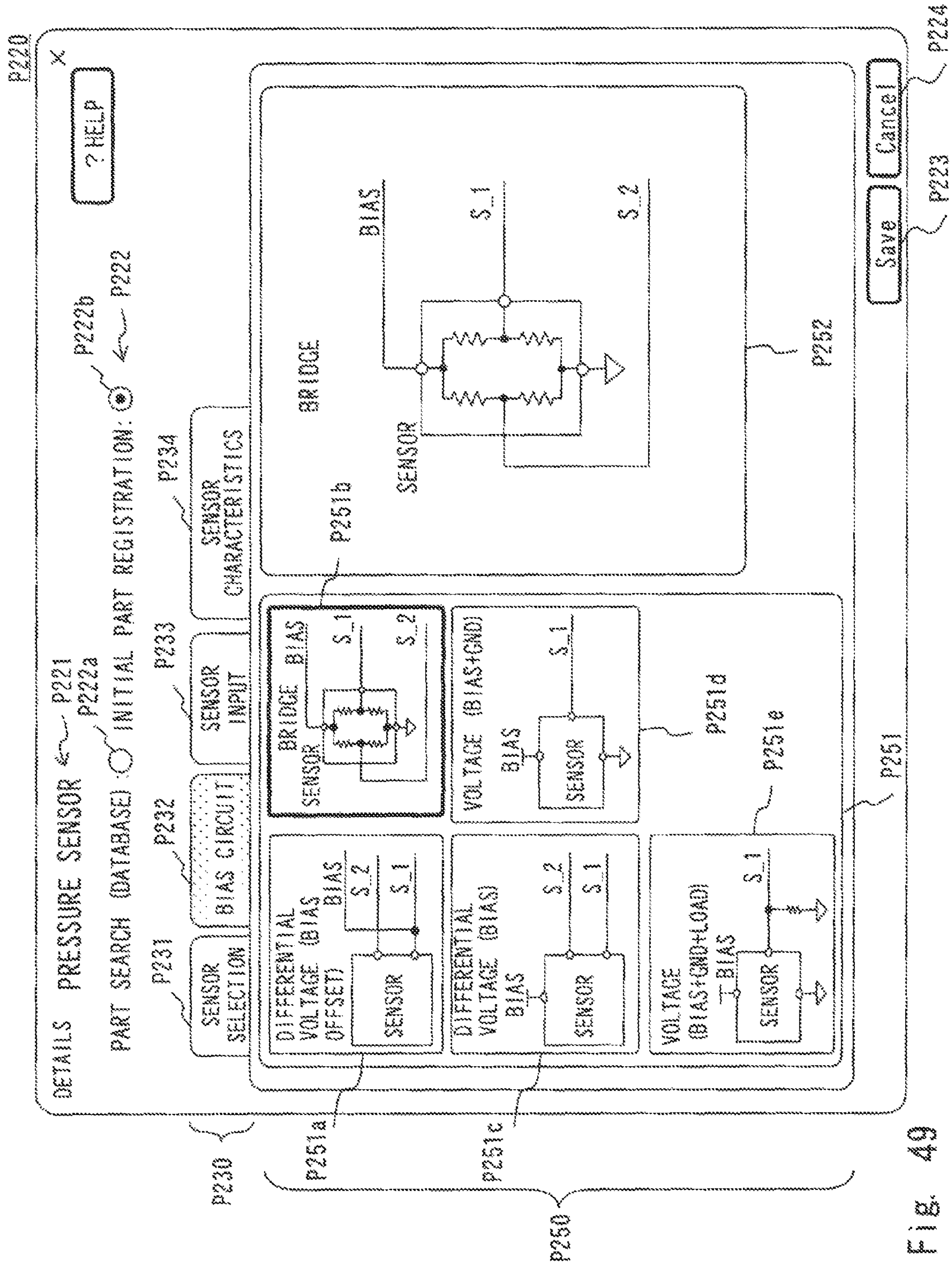
FIG. 49 is a display image diagram of a display screen used in a simulation method of the web simulator according to the first embodiment.

Then, the web simulator 4 displays a bias circuit selection screen on the sensor vendor terminal 5 (214 in FIG. 32). FIG. 49 shows a display example of the bias circuit selection screen. As shown in FIG. 49, when the "bias circuit" tab P232 is selected on the sensor details screen P220, a bias circuit selection screen P250 is displayed. On the bias circuit selection screen P250, the bias circuits suitable for the selected sensor are displayed as described in S14. By displaying bias circuits in accordance with the sensor, it is possible to select the most suitable bias circuit with a simple operation. For example, when the access authorization of the account is permissible to register and update the sensor bias circuit database 422 and select and update the sensor bias circuit database 422, the bias circuit selection screen P250 is displayed and enabled, and a bias circuit can be selected.

On the bias circuit selection screen P250, a circuit list P251 and a selected circuit P252 are displayed. The circuit images of all bias circuits that can be used for the sensor are displayed in the circuit list P251, and the circuit image of a bias circuit selected by a sensor vendor (user) from the circuit list P251 is displayed in the selected circuit P252. The sensor vendor can select a plurality of bias circuits from the circuit list P251.

FIG. 49 shows a display example of the bias circuit selection screen P250 in the case where a pressure sensor is selected as the sensor, and bias circuits P251*a* to P251*e* are displayed as bias circuits suitable for the pressure sensor. When a sensor vendor (user) selects the bias circuit P251*b*, the same circuit image as the bias circuit P251*b* is displayed in the selected circuit P252.

Figure 50:
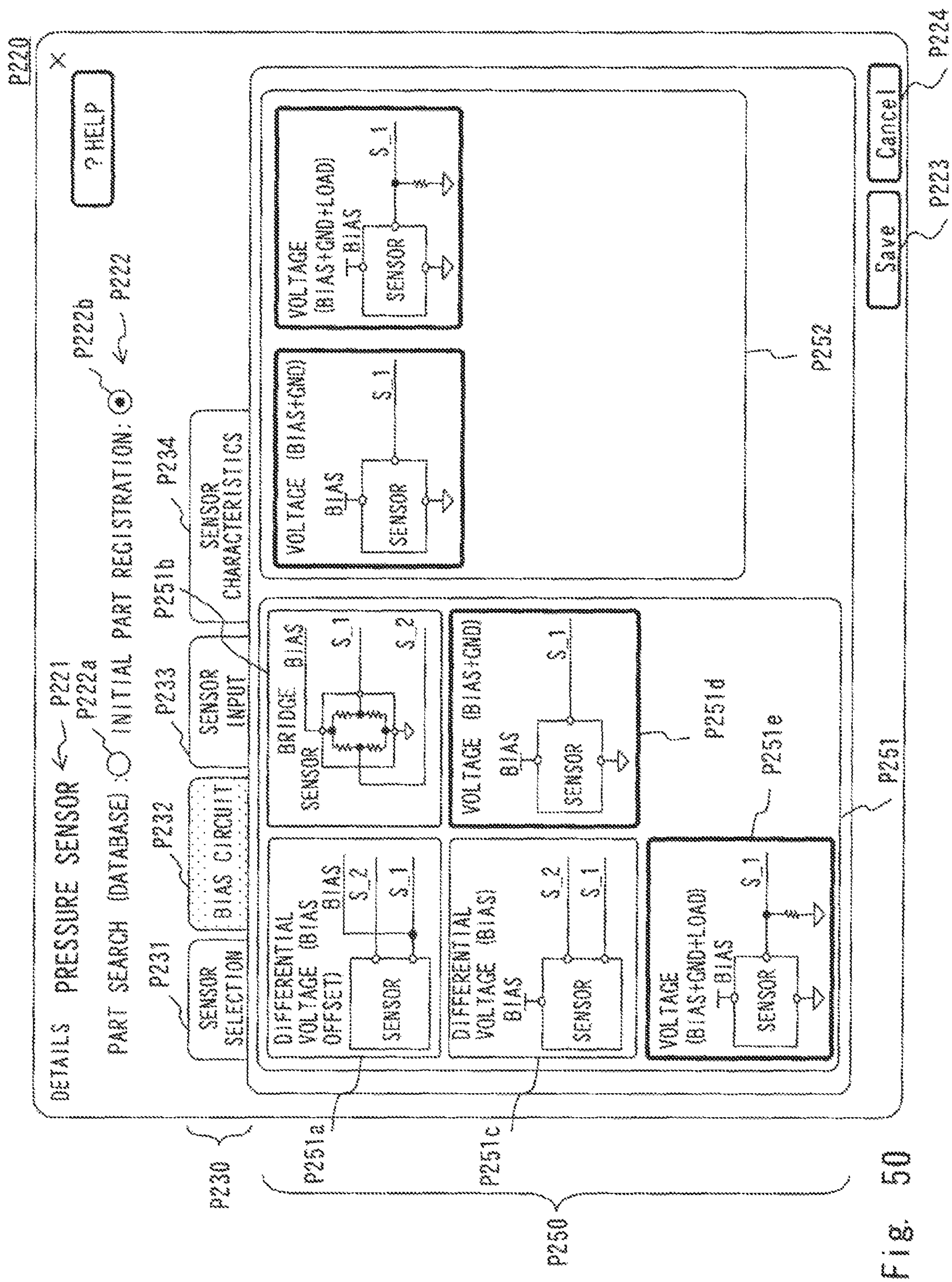
FIG. 50 is a display image diagram of a display screen used in a simulation method of the web simulator according to the first embodiment.

FIG. 50 shows an example where a sensor vendor selects two bias circuits in the bias circuit selection screen P250 of FIG. 49. In the case where a sensor vendor sets bias circuits, a plurality of bias circuits are selected in accordance with the sensor to select all bias circuits that can be actually connected to the sensor. The bias circuits P251*a* to P251*e* are displayed in the circuit list P251, and the sensor vendor selects the bias circuits P251*d* and P251*e*, and then the same circuit images as the bias circuits P251*d* and P251*e* are displayed in the selected circuit P252. When the "save" button P223 is clicked on in this state, the selected bias circuits are stored in the simulation bias circuit data 422*b* of the sensor bias circuit database 422.

Figure 51:
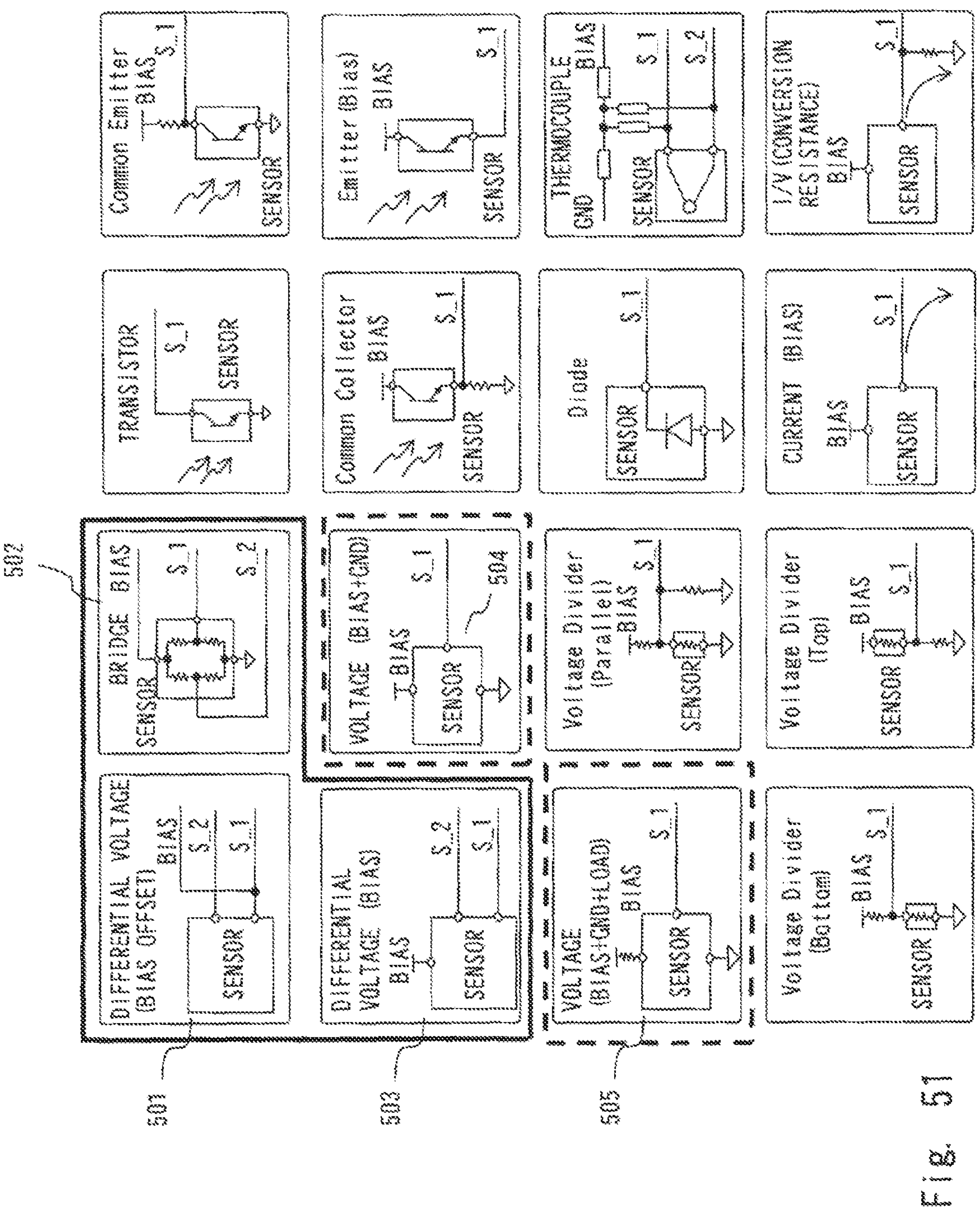
FIG. 51 is an explanatory diagram to explain a simulation method of the web simulator according to the first embodiment.
Figure 52:
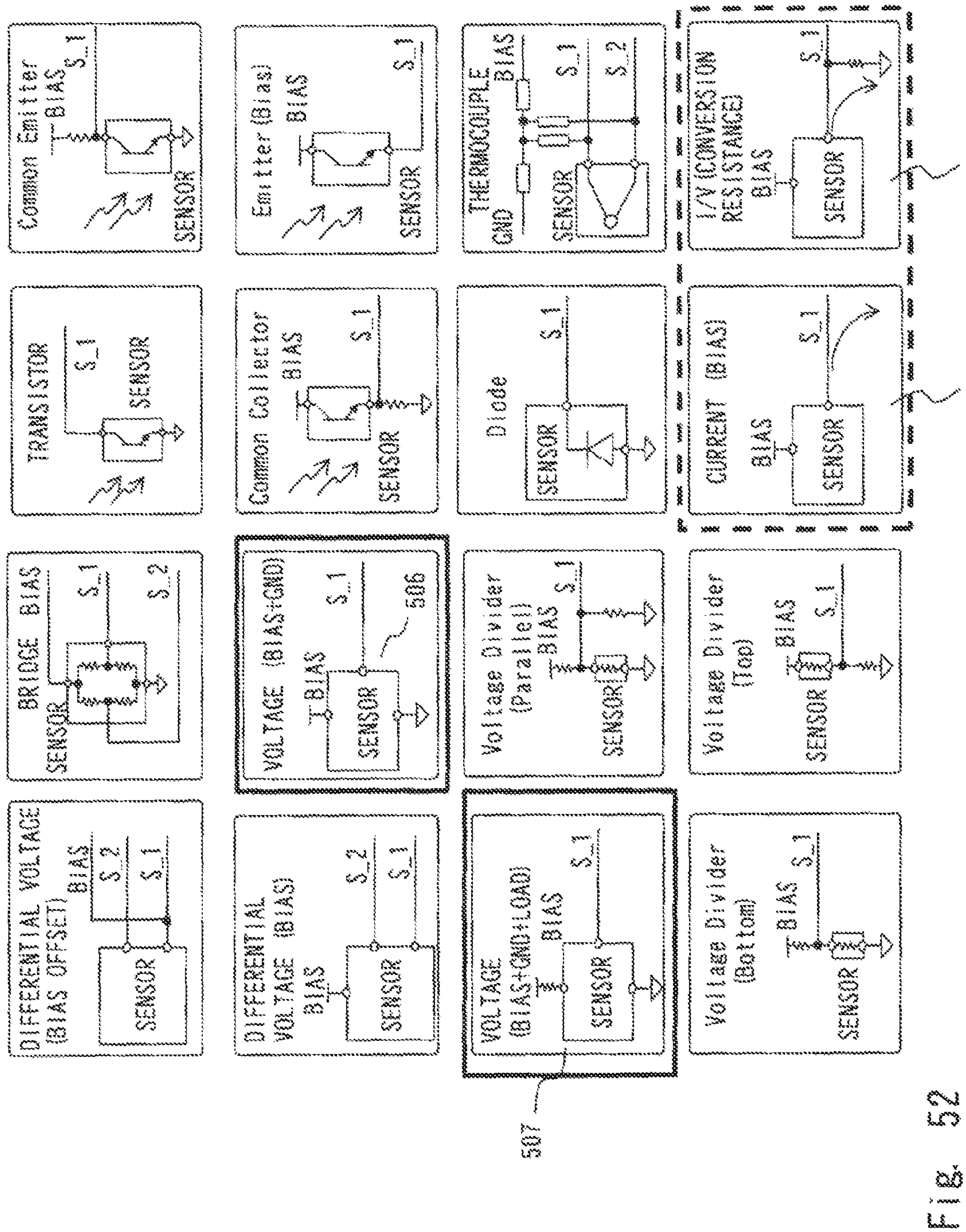
FIG. 52 is an explanatory diagram to explain a simulation method of the web simulator according to the first embodiment.
Figure 53:
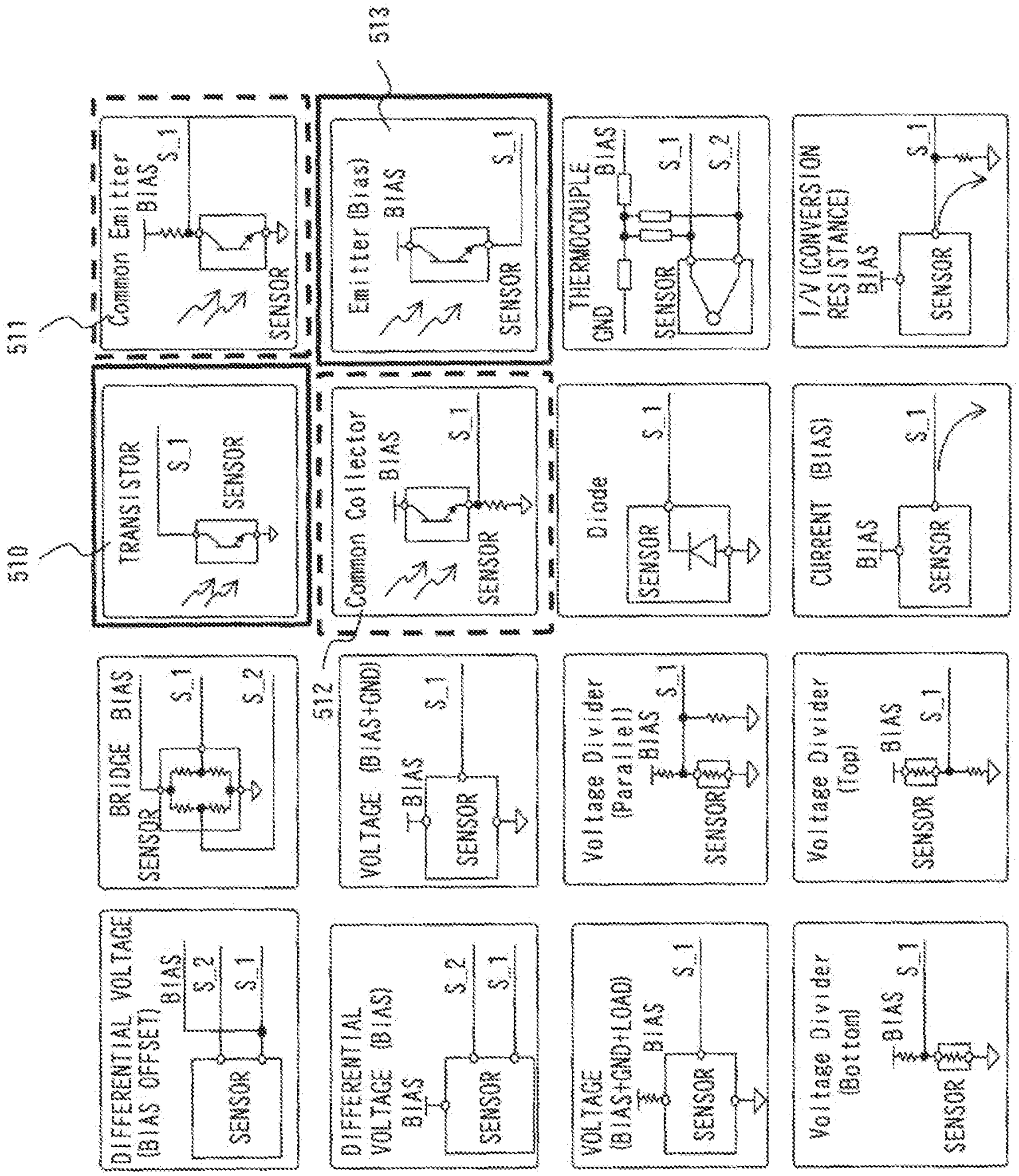
FIG. 53 is an explanatory diagram to explain a simulation method of the web simulator according to the first embodiment.

FIGS. 51 to 53 show examples of a method of extracting bias circuits suitable for a sensor that are to be displayed on the bias circuit selection screen P250. For example, sixteen types of bias circuits are prepared in the sensor bias circuit database 422 as shown in FIGS. 51 to 53, and bias circuits are extracted from them in accordance with the type of a sensor. In the sensor bias circuit database 422, each of the bias circuits is associated with the type of a sensor, and a bias circuit is specified in accordance with the type of a sensor. By displaying bias circuits in accordance with the type of a sensor and allowing a sensor vendor to make a selection among them, it is possible to set the most suitable bias circuit in a simple and accurate way. Note that, although bias circuits to be displayed are selected in accordance with the type of a sensor in this example, bias circuits may be selected in accordance with other sensor information. For example, bias circuits may be selected in accordance with the output format of a sensor such as a differential output, a voltage output or a current output, or bias circuits may be selected in accordance with the type of a sensor and the output format of a sensor. For example, if each of the bias circuits is associated with the output format of a sensor in the sensor bias circuit database 422, a bias circuit can be specified in accordance with the output format of a sensor. In the case of displaying bias circuits in accordance with the output format of a sensor and allowing a sensor vendor to make a selection among them also, it is possible to set the most suitable bias circuit in a simple and accurate way, just like the case of displaying bias circuits in accordance with the type of a sensor.

FIG. 51 shows an example of extracting bias circuits suitable for a pressure sensor. There are two types of pressure sensors: "differential voltage output type" and "voltage output type", and thus bias circuits that can be connected to those sensors, which are five bias circuits in this example, are extracted to allow a sensor vendor to make a selection among them. Bias circuits 501 and 503 for differential voltage and a bridge bias circuit 502 can be connected to the differential voltage output type pressure sensor, and bias circuits 504 and 505 for voltage output can be connected to the voltage output type pressure sensor, and those bias circuits are extracted.

For example, the pressure sensor and the bias circuits 501 to 505 are associated in the registration bias circuit data 422*a* of the sensor bias circuit database 422, and bias circuits corresponding to the pressure sensor are extracted and displayed by referring to the registration bias circuit data 422*a*.

A sensor vendor selects the "differential voltage output type" or "voltage output type" bias circuits from the displayed bias circuits 501 to 505 according to the output format of a sensor to be registered and then registers them in the simulation bias circuit data 422*b* of the sensor bias circuit database 422 as bias circuits to be used for simulation by a user. A user selects one bias circuit to be used for simulation from the plurality of "differential voltage output type" or "voltage output type" bias circuits registered by the sensor vendor.

FIG. 52 shows an example of extracting bias circuits suitable for a temperature sensor. There are two types of pressure sensors: "voltage output type" and "current output type", and thus bias circuits that can be connected to those sensors, which are four bias circuits in this example, are extracted to allow a sensor vendor to make a selection among them. Bias circuits 506 and 507 for voltage output can be connected to the voltage output type temperature sensor, and bias circuits 508 and 509 for current output can be connected to the current output type temperature sensor, and those bias circuits are extracted.

For example, the temperature sensor and the bias circuits 506 to 509 are associated in the registration bias circuit data 422*a* of the sensor bias circuit database 422, and bias circuits corresponding to the temperature sensor are extracted and displayed by referring to the registration bias circuit data 422*a*.

A sensor vendor selects the "voltage output type" or "current output type" bias circuits from the displayed bias circuits 506 to 509 according to the output format of a sensor to be registered and then registers them in the simulation bias circuit data 422*b* of the sensor bias circuit database 422 as bias circuits to be used for simulation by a user. A user selects one bias circuit to be used for simulation from the plurality of "voltage output type" or "current output type" bias circuits registered by the sensor vendor.

FIG. 53 shows an example of extracting bias circuits suitable for a phototransistor. There are two types of phototransistors: "voltage output type" and "current output type", and thus bias circuits that can be connected to those sensors, which are four bias circuits in this example, are extracted to allow a sensor vendor to make a selection among them. Bias circuits 511 and 512 for voltage output can be connected to the voltage output type phototransistor, and bias circuits 510 and 513 for current output can be connected to the current output type temperature sensor, and those bias circuits are extracted.

For example, the phototransistor and the bias circuits 510 to 513 are associated in the registration bias circuit data 422*a* of the sensor bias circuit database 422, and bias circuits corresponding to the phototransistor are extracted and displayed by referring to the registration bias circuit data 422*a*.

A sensor vendor selects the "voltage output type" or "current output type" bias circuits from the displayed bias circuits 510 to 513 according to the output format of a sensor to be registered and then registers them in the simulation bias circuit data 422*b* of the sensor bias circuit database 422 as bias circuits to be used for simulation by a user. A user selects one bias circuit to be used for simulation from the plurality of "voltage output type" or "current output type" bias circuits registered by the sensor vendor.

Figure 54:
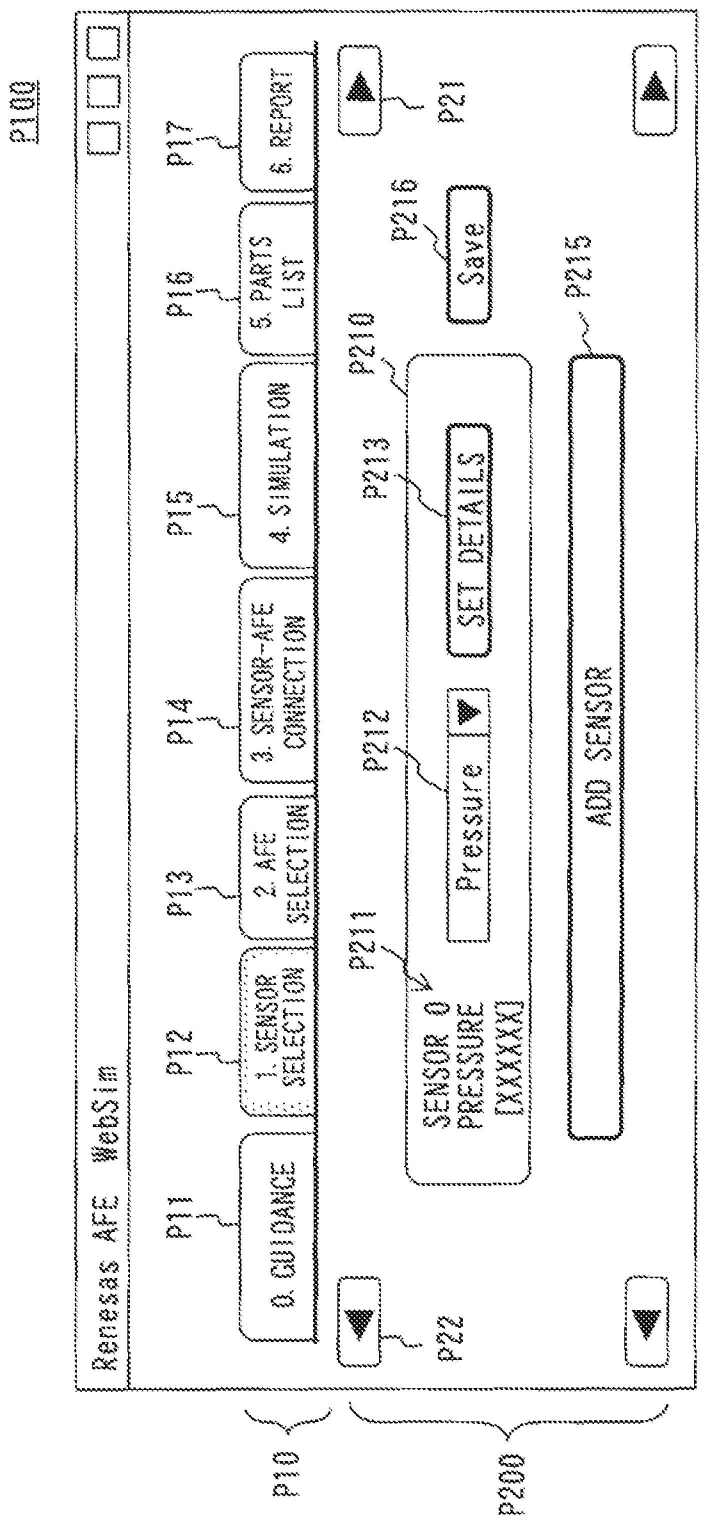
FIG. 54 is a display image diagram of a display screen used in a simulation method of the web simulator according to the first embodiment.

Then, the web simulator 4 displays a sensor name input screen on the sensor vendor terminal 5 (S15 in FIG. 32). FIG. 54 shows a display example of the sensor name input screen. In this example, the sensor selection screen P200 that is the same as the one in FIG. 47 is used as the sensor name input screen. When the characteristics of a sensor and a bias circuit are set, a default sensor name ("XXXXXX" etc.) is displayed in the sensor name display area P211 of the sensor selection frame P210. For example, when the sensor name in the sensor name display area P211 is clicked on, an input mode is enabled, and a sensor name is input.

Further, a "save" button P216 is displayed on the sensor selection screen P200, and when the "save" button is clicked on, the type, characteristics and name of a sensor are registered in the sensor database 421, and a bias circuit is registered in the sensor bias circuit database 422 (S16 in FIG. 32). In this step, a sensor vendor corresponding to the account ID is registered in association with the sensor and the bias circuit. In other words, only the sensor and the bias circuit of the currently accessing sensor vendor can be registered.

Figure 55:
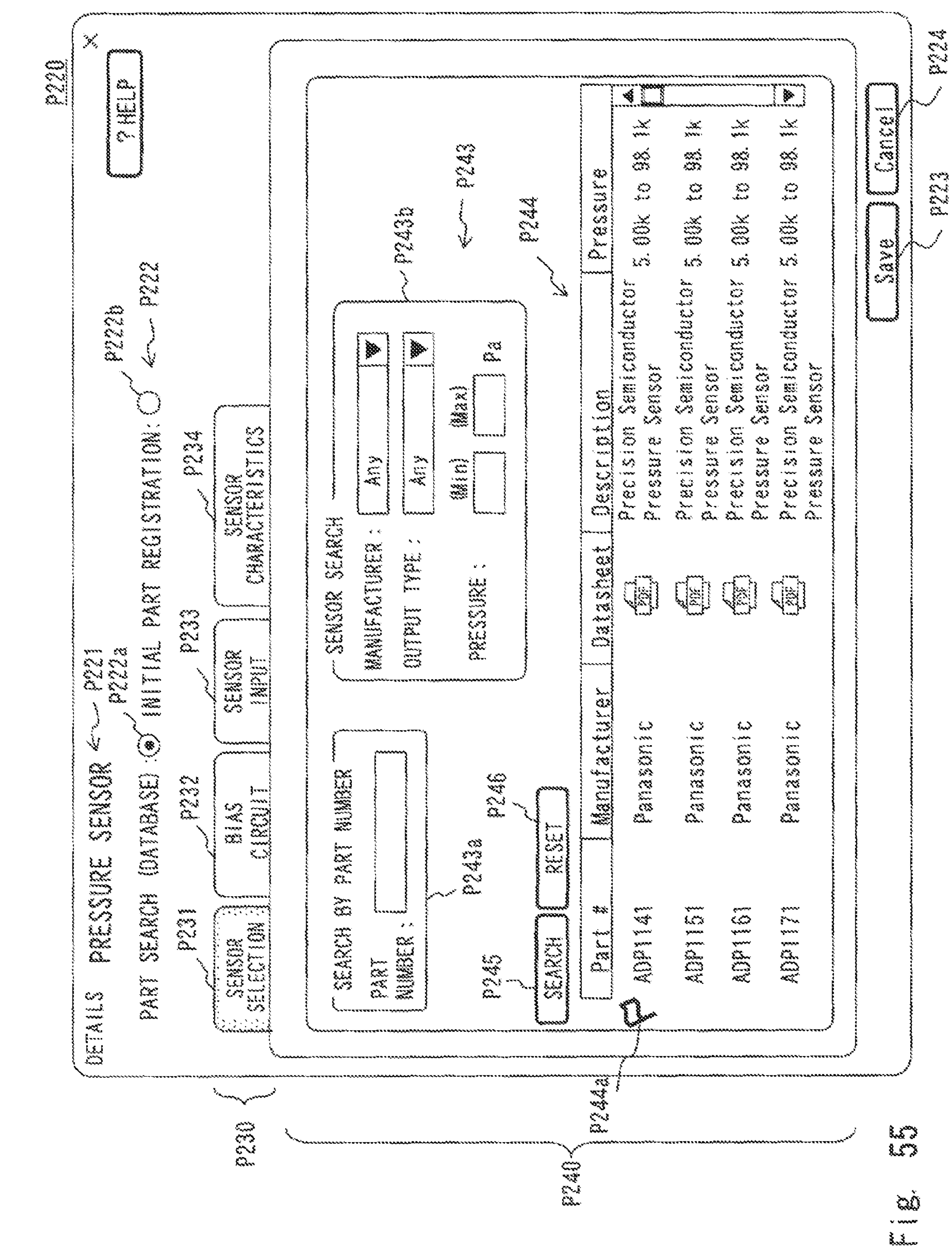
FIG. 55 is a display image diagram of a display screen used in a simulation method of the web simulator according to the first embodiment.

Then, the web simulator 4 displays a sensor list screen with a flag on the sensor vendor terminal 5 (S17 in FIG. 32). FIG. 55 shows a display example of the sensor list screen P240. As shown in FIG. 55, when the "set details" button P213 is clicked on the sensor selection screen P200, and the "part search" radio button P222*a* is selected in the part search/registration selection area P222 or the "sensor selection" tab P231 is selected, the sensor list screen (sensor details selection screen) P240 is displayed in the sensor details screen P220.

In the upper part of the sensor list screen P240, sensor narrowing criteria P243 and a sensor list P244 are displayed. As the narrowing criteria P243, a "search by part number" area P243*a* and a "sensor search" area P243*b* are displayed.

In the "search by part number" area P243*a*, the part number of a sensor to be searched for is entered in a "part number" entry box. In the "sensor search" area P243*b*, narrowing criteria in accordance with the sensor type are displayed. In the example of FIG. 55, because the sensor type is a pressure sensor, a "manufacturer" pulldown menu, an "output type" pulldown menu, and a "pressure" entry box are displayed.

In the "manufacturer" pulldown menu, a manufacturer name can be specified to make a search among sensors of a specific manufacturer, or "any" can be specified to make a search among sensors of all manufacturers. In the "output type" pulldown menu, a current output type or a voltage output type can be specified to make a search among sensors of a specific output type, or "any" can be specified to make a search among sensors of all output types. In the "pressure" entry box, the minimum value and the maximum value of a pressure that can be detected by the pressure sensor are set to make a search for a sensor using the characteristics of the pressure sensor.

Between the narrowing criteria P243 and the sensor list P244, a "search" button P245 and a "reset" button P246 are displayed. When the "search" button P245 is clicked on, the sensor database is searched using the criteria set in the sensor narrowing criteria P243, and a search result is displayed in the sensor list P244. When the "reset" button P246 is clicked on, the narrowing criteria (search criteria) set in the narrowing criteria P243 are reset to an initial state in which nothing is set for screen display.

In the sensor list P244, a list of sensors that match the criteria set in the narrowing criteria P243 is displayed. In the case where a part number is set in the "search by part number" area P243*a*, sensors whose sensor type is a pressure sensor and that correspond to the set part number are displayed from the sensor database 421. In the case where a manufacturer, an output type and a pressure are set in the "sensor search" area P243*b*, sensors whose sensor type is a pressure sensor and that correspond to the set manufacturer, output type and pressure are displayed from the sensor database 421. All sensors that have been already registered by the currently operating sensor vendor are displayed in this example.

In the sensor list P244, information about different sensors is displayed in a plurality of fields for each sensor type. In the example of FIG. 55, because the sensor type is a pressure sensor, a part number (Part #), a manufacturer (Manufacturer), a datasheet (Datasheet), a detailed description (Description), and pressure characteristics (Pressure) are displayed for each sensor. A PDF icon is displayed in the datasheet field, and a PDF file of a datasheet is displayed when the PDF icon is clicked on. A type such as a precision sensor or a silicon sensor is displayed in the description field, and the minimum value and the maximum value of a detection pressure are displayed in the pressure field.

By specifying a sensor type or narrowing criteria and displaying the sensor list P244, it is possible to select a desired sensor with a simple operation.

Further, a flag mark P244*a* indicating the state of a data flag described in S17 is displayed in the sensor list P244. In FIG. 55, the flag mark P244*a* indicating initial registration is displayed on the left of the pressure sensor registered by the sensor vendor. By displaying the flag mark, it is possible to see which sensor is registered (updated) at a glance. Note that, instead of using the flag mark, the applicable sensor may be displayed in a different color or the like so as to identify the initially registered (updated) sensor. The sensor may be registered by clicking on the "save" button P223 after confirming the flag mark P244*a*. Registration of the sensor information by the sensor vendor is thereby completed.

Operation Example 2

Operation Example of Update of Sensor Information by a Sensor Vendor

Just like the operation example 1 in which a sensor vendor registers sensor information, the web simulator 4 displays the login screen P110 of FIG. 45 (S101 in FIG. 31), displays the guidance screen P101 of FIG. 46 (S102 in FIG. 31), and displays the sensor selection screen P200 of FIG. 47 (S11 in FIG. 32), respectively on the sensor vendor terminal 5.

Figure 56:
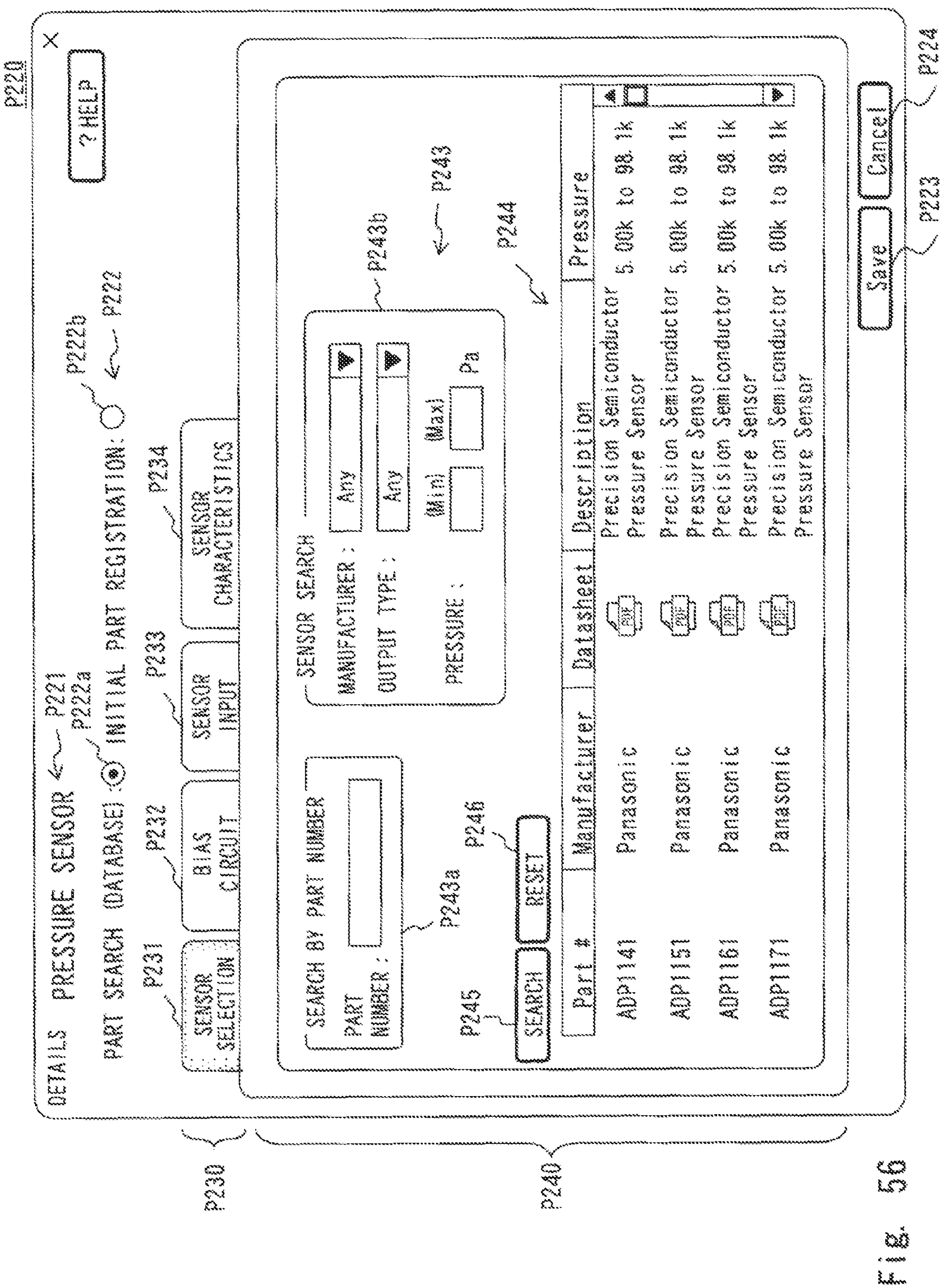
FIG. 56 is a display image diagram of a display screen used in a simulation method of the web simulator according to the first embodiment.

Next, the web simulator 4 displays a sensor list screen on the sensor vendor terminal 5 (S12 and S18 in FIG. 32). FIG. 56 shows a display example of the sensor list screen P240. In this case, the flag mark P244*a* indicating a flag is not displayed because it is before registration (update). The sensor list screen P240 of FIG. 56 shows the same screen display as that of FIG. 55 when the sensor vendor registers the sensor information. Specifically, when the "set details" button P213 is clicked on the sensor selection screen P200, and the "part search" radio button P222*a* is selected in the part search/registration selection area P222 or the "sensor selection." tab P231 is selected, the sensor list screen P240 is displayed within the sensor details screen P220.

The sensor list P244 is displayed according to the narrowing criteria P243 in the "search by part number" area P243*a* and the "sensor search" area P243*b*. As described above in S18, only the sensors for which access authorization that permits update is granted, which are the sensors registered by the currently operating sensor vendor (the sensors of the same vendor), are displayed in the sensor list P244. Because only the sensors that can be updated are displayed in the sensor list, selection is made easier, and wrong selection of a sensor from another sensor vendor can be avoided. Then, the sensor vendor clicks on and selects a sensor to be updated from the sensor list P244.

Figure 57:
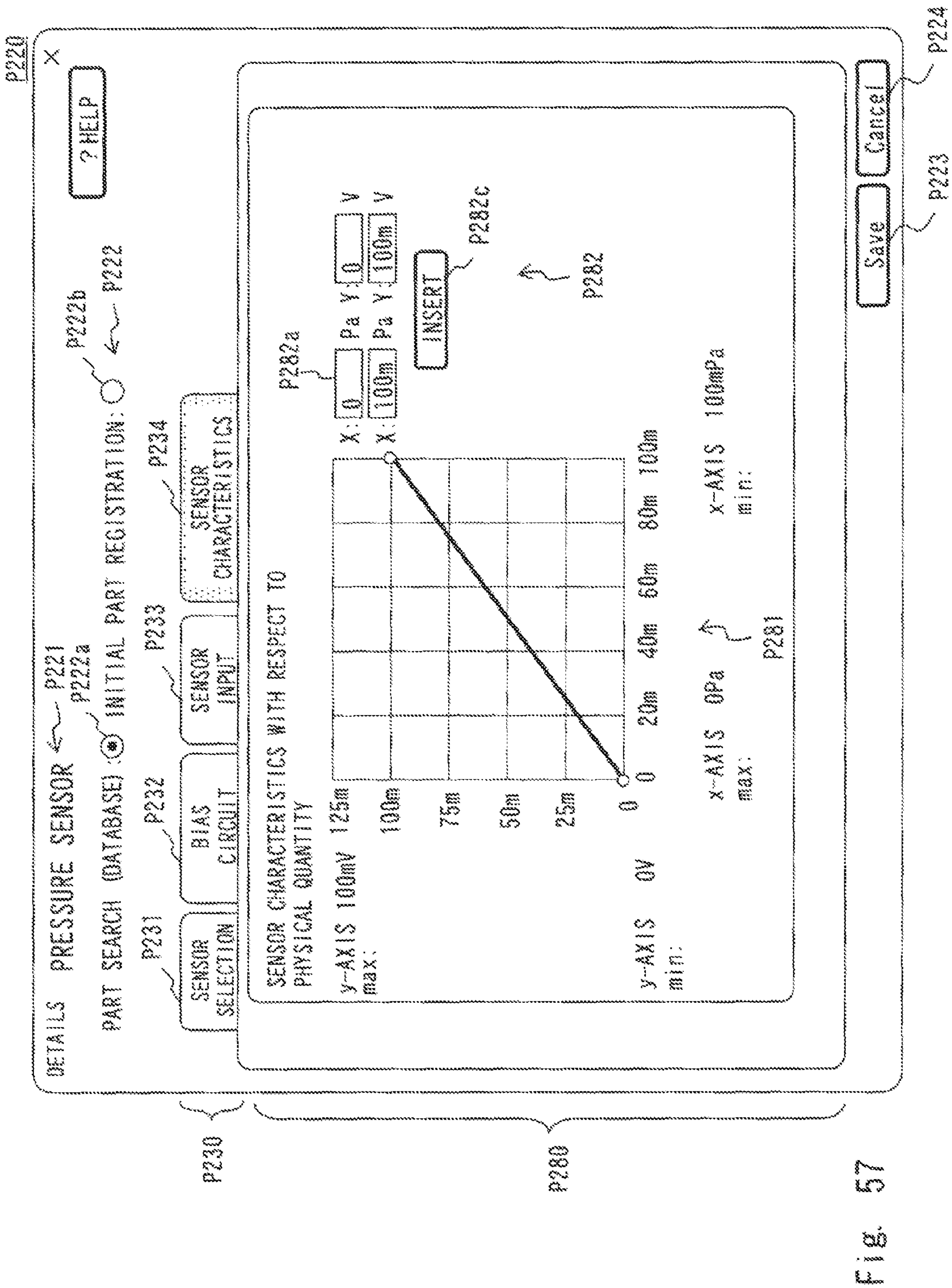
FIG. 57 is a display image diagram of a display screen used in a simulation method of the web simulator according to the first embodiment.

Then, the web simulator 4 displays a sensor characteristics screen on the sensor vendor terminal 5 (S19 in FIG. 32). FIG. 57 shows a display example of the sensor characteristics screen P280. The sensor characteristics screen P280 of FIG. 57 shows the same screen display as the sensor characteristics screen P280 of FIG. 48 when the sensor vendor registers the sensor information. The sensor characteristics screen P280 is displayed when a sensor is selected in the sensor list screen P240 and the "sensor characteristics" tab P234 is selected. For example, when the access authorization of the account is permissible to register and update the sensor database 421, the sensor characteristics screen P280 is displayed and enabled, and the characteristics of the sensor to be updated can be entered.

First, the characteristics of the sensor registered in the sensor database 421 are displayed in the characteristics graph P281 and the characteristics plot entry area P282. Then, the sensor vendor changes the characteristics by modifying a plot of the characteristics graph P281 or entering a plot in the characteristics plot entry area P282. In the example of FIG. 57, because there are only two plot points, a plot is added by clicking on the insert button P282*c*, and a numeric value is entered in the coordinate box P282*a* to thereby make change to the characteristics as shown in FIG. 48. When the "save" button P223 is clicked on in this state, the characteristics of the sensor are registered in the sensor database 421.

Figure 58:
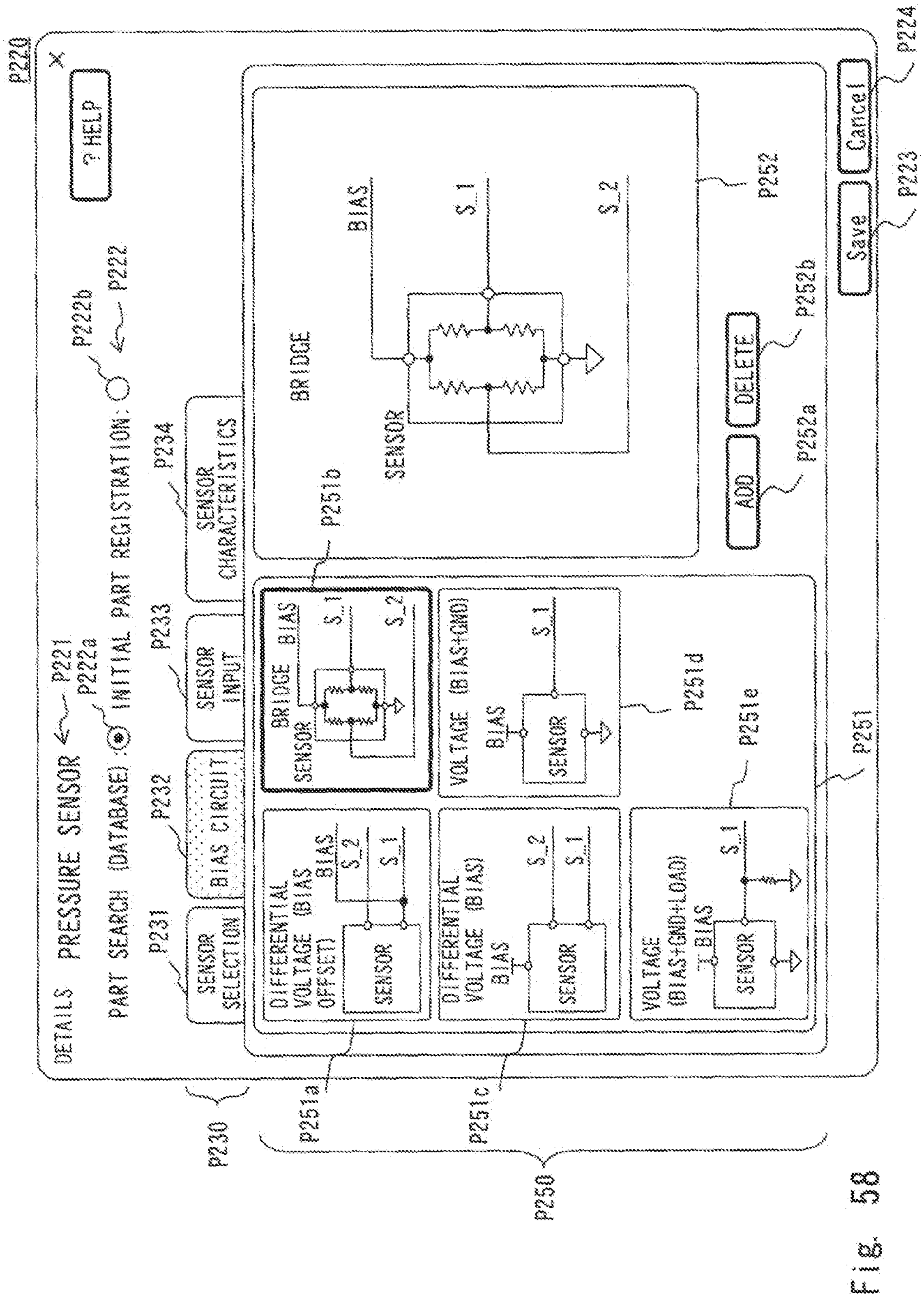
FIG. 58 is a display image diagram of a display screen used in a simulation method of the web simulator according to the first embodiment.

Then, the web simulator 4 displays a bias circuit selection screen on the sensor vendor terminal 5 (S20 in FIG. 32). FIG. 58 shows a display example of the bias circuit selection screen. The bias circuit selection screen P250 of FIG. 58 is the same as the bias circuit selection screen P250 of FIG. 49 when the sensor vendor registers the sensor information, and "add" button P252*a* and "delete" button P252*b* for adding and deleting a bias circuit are displayed in addition. The bias circuit selection screen P250 is displayed when a sensor is selected in the sensor list screen P240 and the "bias circuit" tab P232 is selected. For example, when the access authorization of the account is permissible to register and update the sensor bias circuit database 422 and select and update the sensor bias circuit database 422, the bias circuit selection screen P250 is displayed and enabled, and a bias circuit can be selected.

First, for the selected sensor, the bias circuits registered in the simulation bias circuit data 422*b* of the sensor bias circuit database 422 are displayed in the selected circuit P252, and the bias circuits that can be selected according to the type of a sensor are displayed in the circuit list P251. Note that, when it is desired to select another bias circuit, not limited to a sensor type, all bias circuits may be displayed. When adding a bias circuit, a bias circuit to be added is selected in the circuit list P251, and the "add" button P252*a* is clicked on, and then the circuit image of the selected bias circuit is displayed in the selected circuit P252. When deleting a bias circuit, a bias circuit to be deleted is selected in the selected circuit P252 or the circuit list P251, and the "delete" button P252*b* is clicked on, and then the circuit image of the selected bias circuit is deleted from the selected circuit P252. When the "save" button P223 is clicked on in this state, the simulation bias circuit data 422*b* of the sensor bias circuit database 422 is updated with the bias circuits after addition or deletion (S21 in FIG. 32).

Then, the web simulator 4 displays a sensor list screen with a flag on the sensor vendor terminal 5 (S22 in FIG. 32). Just like FIG. 55 when the sensor vendor registers the sensor information, the "part search" radio button P222*a* is selected in the part search/registration selection area P222 or the "sensor selection" tab P231 is selected, the sensor list screen P240 is displayed within the sensor details screen P220.

Further, the flag mark P244*a* indicating the state of a data flag described in S22 is displayed in the sensor list P244. As in FIG. 55, the flag mark P244*a* is displayed on the left of the pressure sensor updated by the sensor vendor in order to indicate that update is done. Note that a flag mark when the sensor is initially registered and a flag mark when the sensor registered information is updated may be different from each other. For example, the sensor vendor may select a flag mark for initial registration or a flag mark for update by clicking on the flag mark P244*a*. The sensor may be registered by clicking on the "save" button P223 after confirming the flag mark P244*a*. Update of the sensor information by the sensor vendor is thereby completed.

Operation Example 3

Operation Example of Recommended Connection Setting and Simulation by a Sensor Vendor In the operation example 3, simulation is performed by connecting the sensor and the bias circuit registered or updated by the sensor vendor in the above-described operation example 1 or the operation example 2 to the semiconductor device 1. Because the sensor vendor performs simulation, it is possible to see the registered content of the sensor and the bias circuit and see the registered content of the sensor vendor recommended connection. As in FIGS. 48 to 50 showing the operation example 1, the characteristics of the sensor and the bias circuit are registered on the sensor details screen P220. Further, as in FIGS. 57 to 58 showing the operation example 2, the characteristics of the sensor and the bias circuit are updated on the sensor details screen P220.

Figure 59:
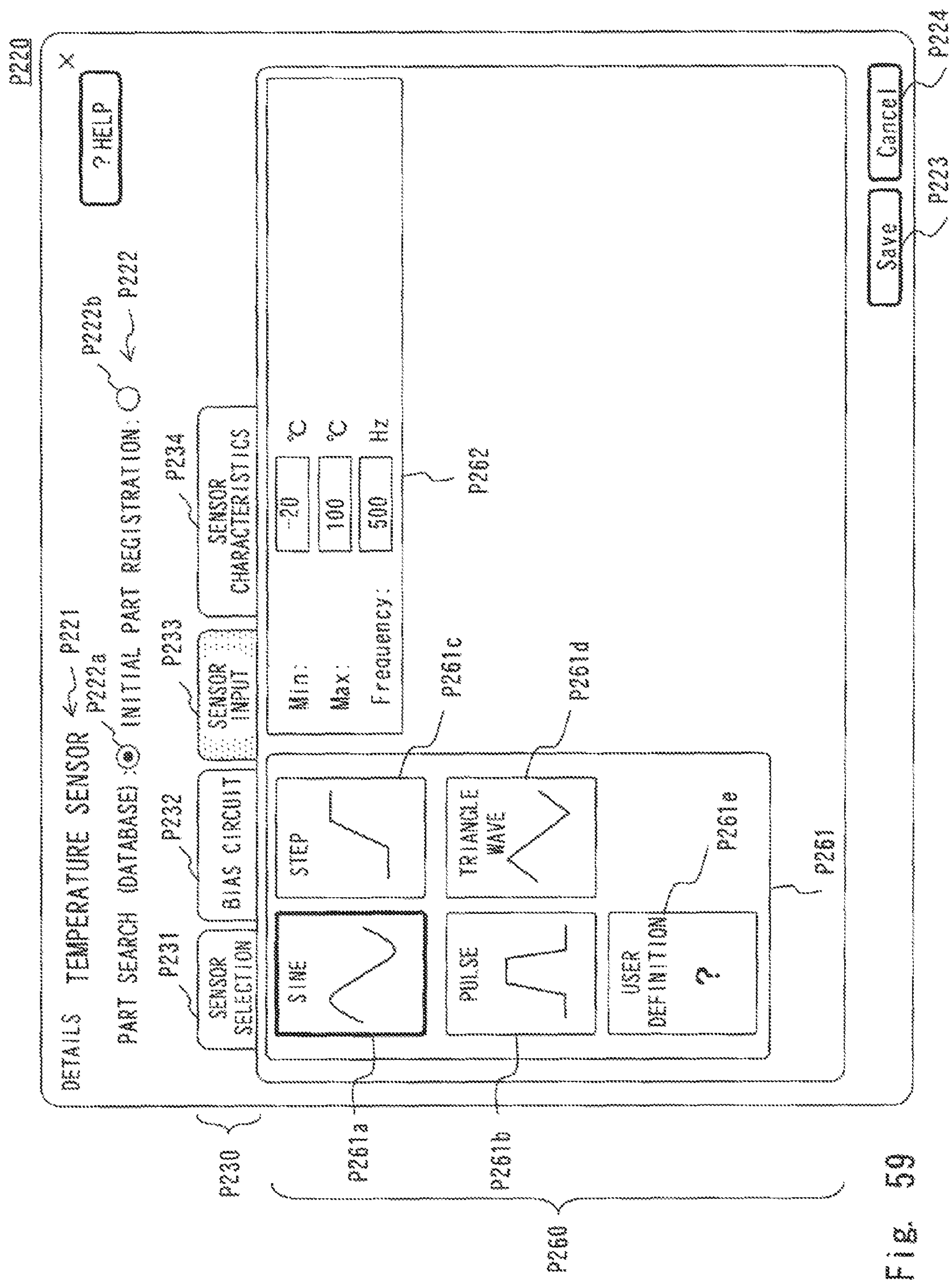
FIG. 59 is a display image diagram of a display screen used in a simulation method of the web simulator according to the first embodiment.

After that, the web simulator 4 displays a physical quantity input screen on the sensor vendor terminal 5 (S104 in FIG. 31). FIG. 59 shows a display example of the physical quantity input screen. As shown in FIG. 59, when the "sensor input" tab P233 is selected on the sensor details screen P220, the physical quantity input screen P260 is displayed within the sensor details screen P220. Note that, although input and setting of a physical quantity are made on the sensor details screen in this example, input and setting of a physical quantity may be made on another screen such as the simulation screen because the setting needs to be done at least before simulation is executed.

On the physical quantity input screen P260, an input pattern list P261 and an input parameter area P262 are displayed. Patterns that can be selected as an input pattern of a physical quantity are displayed in the input pattern list P261, and parameters to set the selected input pattern in details are displayed in the input parameter area P262. As described in S104 of FIG. 31, the set input pattern and parameters are stored in the parameter storage unit 427.

In the input pattern list P261, a pattern can be selected from specified input patterns P261*a* to P261*d* and a "user-defined" pattern P261*e* which is an arbitrary input pattern defined by a user (sensor vendor). As a specified input pattern, a "sine" pattern P261*a* that is a sine wave, a "pulse" pattern P261*b* that is a square wave, a "step" pattern P261*c* that is a step response waveform, or a "triangle wave" pattern P261*d* that is a triangle wave can be selected.

Figure 60:
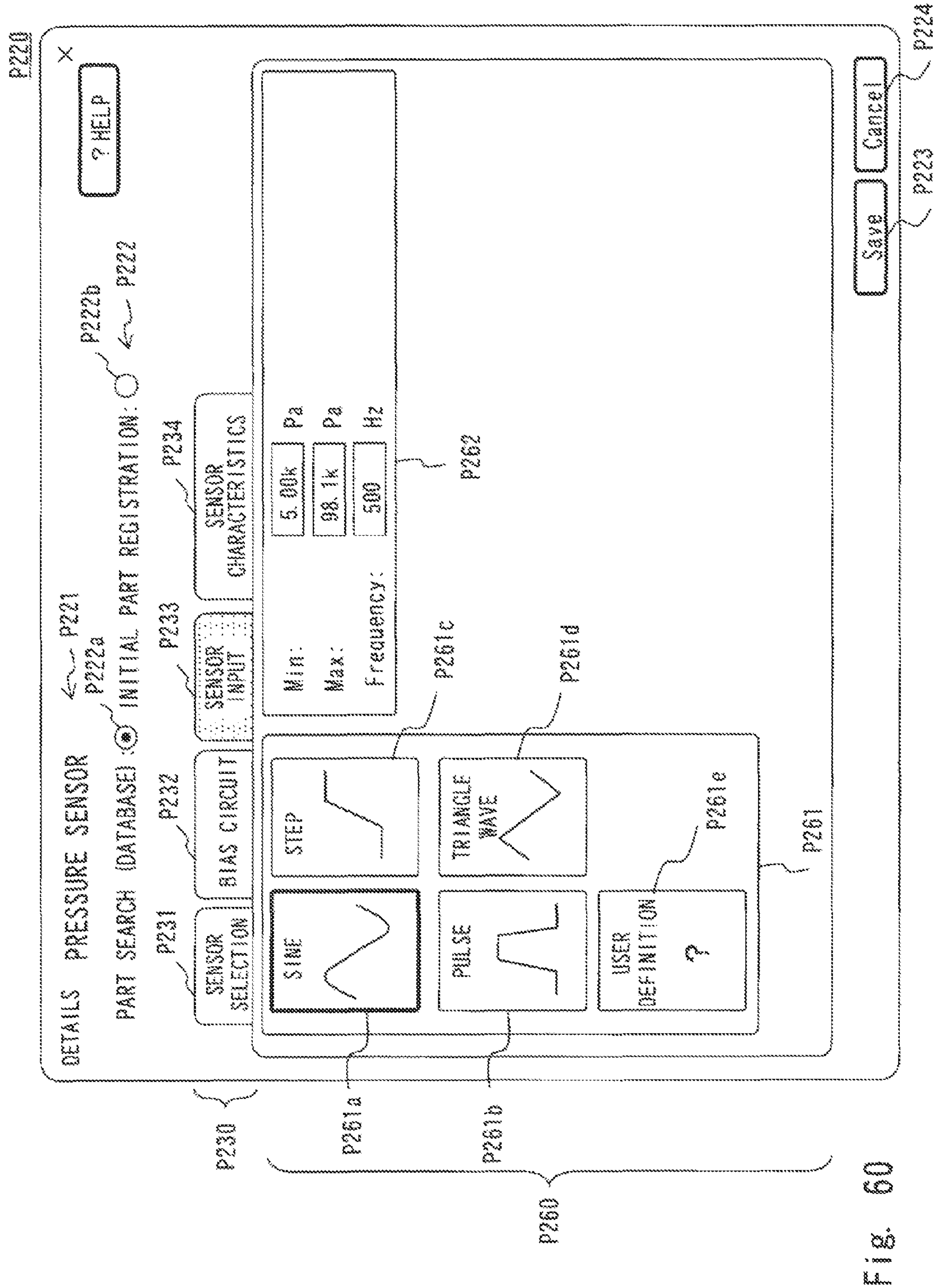
FIG. 60 is a display image diagram of a display screen used in a simulation method of the web simulator according to the first embodiment.

In the input parameter area P262, parameters in accordance with the pattern selected in the input pattern list P261 and the sensor selected in the sensor selection screen (registered or updated sensor) are displayed. In the example of FIG. 59, a temperature sensor is selected as the sensor, and the "sine" pattern P261*a* that is a sine wave is selected as the input pattern. Because it is a sine wave input pattern, entry boxes of the minimum value, the maximum value and the frequency are displayed as the input parameters in the input parameter area P262, and because the sensor is a temperature sensor, the unit of the minimum value and the maximum value is FIG. 60 shows another example of the physical quantity input screen P260 of FIG. 59. In the example of FIG. 60, a pressure sensor is selected as the sensor, and the "sine" pattern P261*a* that is a sine wave is selected as the input pattern. Because it is a sine wave input pattern, entry boxes of the minimum value, the maximum value and the frequency are displayed as the input parameters in the input parameter area P262, and because the sensor is a pressure sensor, the unit of the minimum value and the maximum value is "Pa".

Figure 61:
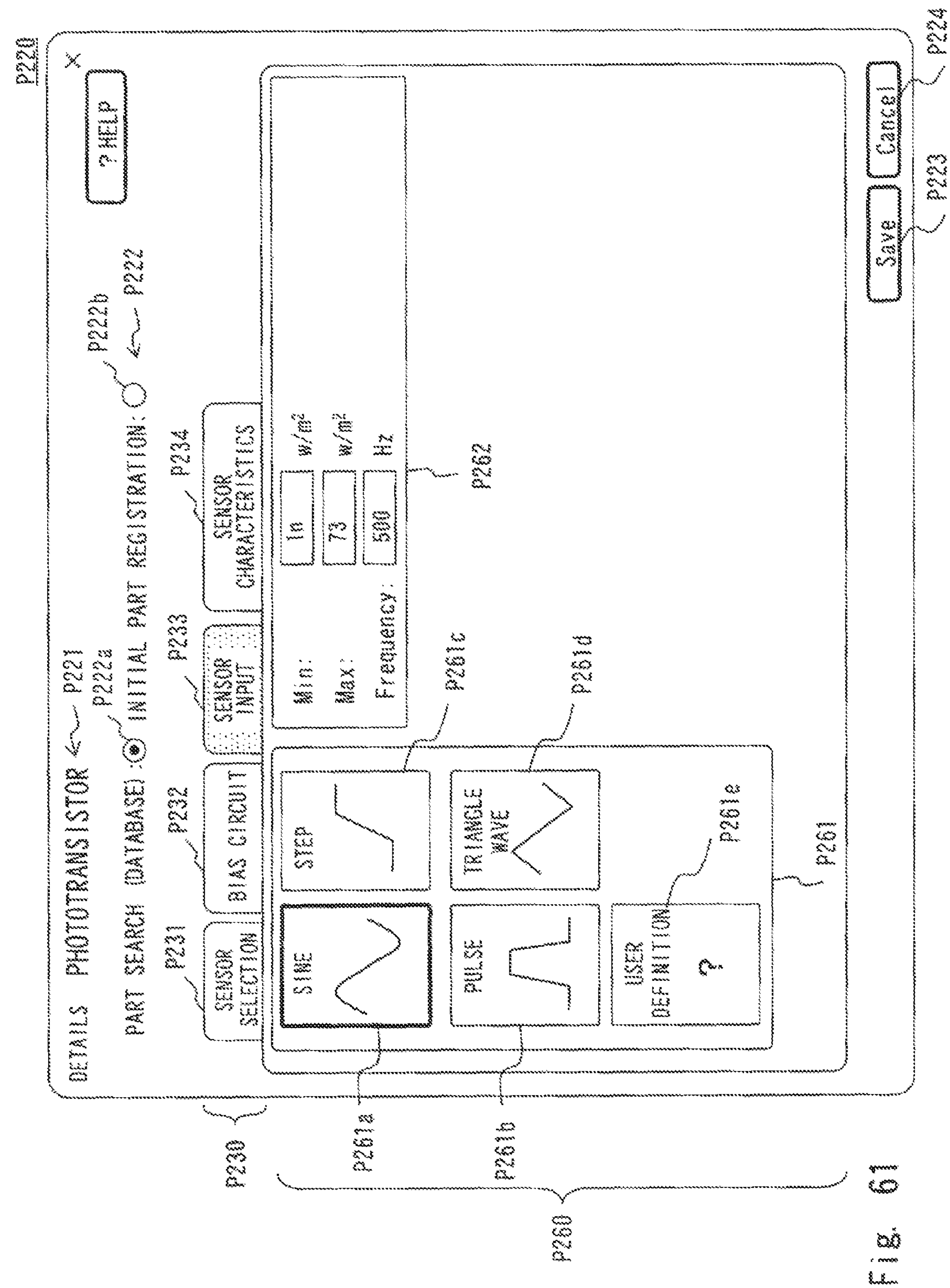
FIG. 61 is a display image diagram of a display screen used in a simulation method of the web simulator according to the first embodiment.

FIG. 61 shows another example of the physical quantity input screen P260 of FIG. 59. In the example of FIG. 61, a phototransistor is selected as the sensor, and the "sine" pattern P261*a* that is a sine wave is selected as the input pattern. Because it is a sine wave input pattern, entry boxes of the minimum value, the maximum value and the frequency are displayed as the input parameters in the input parameter area P262, and because the sensor is a phototransistor, the unit of the minimum value and the maximum value is "$w/m^2$".

Further, in the input parameter area P262, input parameters in accordance with the selected input pattern are display and set, thereby accurately specifying each input waveform pattern. For example, in the case where the input pattern is a sine wave, the minimum value, the maximum value and the frequency are set as described above. In the case where the input pattern is a square wave, the minimum value, the maximum value, the rate of rise and the rate of fall are set. In the case where the input pattern is a triangle wave, the minimum value, the maximum value and the frequency are set. In the case where the input pattern is a step response, the minimum value, the maximum value, the timing of rise and the timing of fall are set. Further, in the minimum value and the maximum value of input parameters, values in accordance with the characteristics of the selected sensor are displayed as default values. In other words, the minimum value and the maximum value which the sensor can detect are acquired and displayed by referring to the sensor information registered in the sensor database 421. This eliminates the need for a user (sensor vendor) to check the characteristics of the sensor and avoid specifying the input range exceeding the capacity of the sensor.

By displaying a plurality of input waveforms on the physical quantity input screen P260 and selecting a physical quantity to be input to the sensor according to a specified input waveform pattern, it is possible to easily analyze various characteristics of the analog circuit. As an example, the characteristics of input waveforms that can be selected in FIGS. 59 to 61 are described hereinbelow.

Figure 62A:
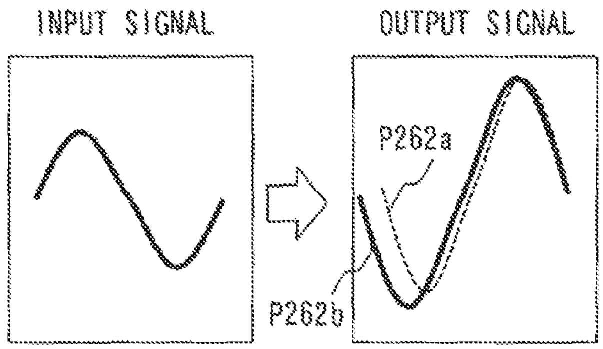
FIG. 62A is an input/output waveform chart to explain a simulation method of the web simulator according to the first embodiment.

FIG. 62A shows an input signal and an output signal in the case of simulating the operation of the analog circuit (the semiconductor device 1) with a sine wave input pattern. In the case of a sine wave, by comparing a common mode signal P262*a* that is in-phase with the input signal and an output signal P262*b* that is a result of the simulation, it is possible to optimally perform the overall check about the presence or absence of a distortion, a phase difference and the like. Further, it is possible to check whether the output signal waveform is clipped or not. By displaying the waveform superimposed on the output signal on the simulation result display screen as shown in FIG. 62A, a user (sensor vendor) can check the frequency characteristics at a glance.

In other words, with use of the sine wave input pattern, a user can easily check the frequency characteristics at the selected frequency and can thereby set the configuration and the characteristics of the configurable amplifier 110 appropriately in accordance with a result of the checking.

Further, the simulation execution unit 415 may detect a phase difference and the like using a result of the simulation and automatically set the configuration and the characteristics of the configurable amplifier 110 in accordance with a result of the detection. The simulation execution unit 415 performs simulation of the configurable amplifier 110 when a sine wave input pattern is input, and sets the number of stages of the configurable amplifier 110 in accordance with the frequency characteristics of a result of the simulation. In the case where appropriate amplification performance cannot be attained at a required frequency, the simulation execution unit 415 configures the configurable amplifier 110 with a multi-stage amplifier architecture. For example, in the case where amplification performance of 30 dB is required at a sine wave frequency of 100 MHz, there is a case where the amplification performance is not attained with the configurable amplifier 110 with one stage. In this case, desired frequency characteristics can be obtained by configuring the configurable amplifier 110 as having two stages in which AMP1 (15 dB) and AMP2 (15 dB) are connected.

Figure 62B:
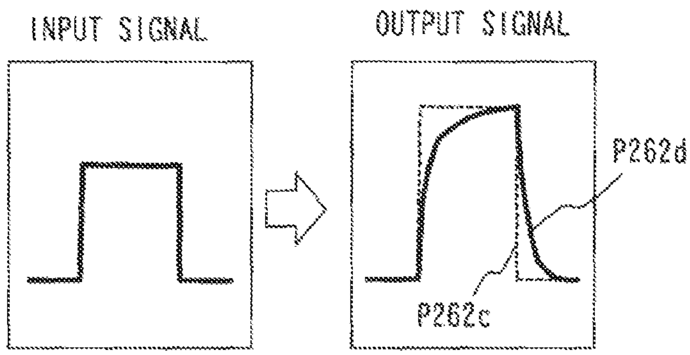
FIG. 62B is an input/output waveform chart to explain a simulation method of the web simulator according to the first embodiment.

FIG. 62B shows an input signal and an output signal in the case of simulating the operation of the analog circuit (the semiconductor device 1) with a square wave input pattern. In the case of a square wave, by comparing a common mode signal P262*c* that is in-phase with the input signal and an output signal P262*d* that is a result of the simulation, it is possible to optimally check the response performance. By displaying the waveform superimposed on the output signal on a simulation result display screen as shown in FIG. 62B, a user (sensor vendor) can check the response performance at a glance.

In other words, with use of the square wave input pattern, a user (sensor vendor) can easily check the response performance and can thereby set the configuration and the characteristics of the configurable amplifier 110 appropriately in accordance with a result of the checking.

Further, the simulation execution unit 415 may detect a signal distortion, delay and the like using a result of the simulation and automatically set the configuration and the characteristics of the configurable amplifier 110 in accordance with a result of the detection. The simulation execution unit 415 performs simulation of the configurable amplifier 110 when a sine wave input pattern is input, and sets the operation mode of the configurable amplifier 110 in accordance with the response characteristics of a simulation result. In the case where the response is not sufficient and the rise characteristics are distorted, the simulation execution unit 415 changes the operation mode of the configurable amplifier 110. Because the operation mode trades-off the current consumption, the optimum operation mode is selected by checking the response performance with a square wave. For example, in the case where the configurable amplifier 110 is initially set to low-speed mode and the response performance is not attained, desired response characteristics can be obtained by changing the configurable amplifier 110 to middle-speed mode or high-speed mode.

Figure 62C:
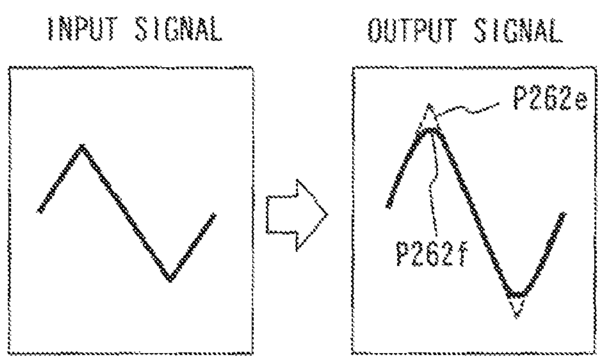
FIG. 62C is an input/output waveform chart to explain a simulation method of the web simulator according to the first embodiment.

FIG. 62C shows an input signal and an output signal in the case of simulating the operation of the analog circuit (the semiconductor device 1) with a triangle wave input pattern. In the case of a triangle wave, by comparing a common mode signal P262*e* that is in-phase with the input signal and an output signal P262*f* that is a result of the simulation, it is possible to optimally check clipping outside the power supply range. By displaying the waveform superimposed on the output signal on a simulation result display screen as shown in FIG. 62C, a user (sensor vendor) can check clipping at a glance.

In other words, with use of the triangle wave input pattern, it is possible to check whether the offset and gain of the amplifier are correct or not. A user (sensor vendor) can easily check the clipping state of the output signal and can thereby set the configuration and the characteristics of the configurable amplifier 110 appropriately in accordance with a result of the checking.

Further, the simulation execution unit 415 may detect clipping at the minimum value and the maximum value of a signal using a result of the simulation and automatically set the configuration and the characteristics of the configurable amplifier 110 in accordance with a result of the detection. The simulation execution unit 415 performs simulation of the configurable amplifier 110 when a triangle wave input pattern is input, and sets the offset or gain of the configurable amplifier 110 in accordance with the clipping state of a result of the simulation. In the case where clipping is occurring at the top or bottom of the output signal waveform, the simulation execution unit 415 changes the offset amount of the amplifier and can thereby obtain the output signal within a desired range. In the case where clipping is occurring at both of the top and bottom of the output signal waveform, the simulation execution unit 415 reduces the gain of the amplifier because the degree of amplification of the configurable amplifier 110 is too high and can thereby obtain the output signal within a desired range.

Figure 62D:
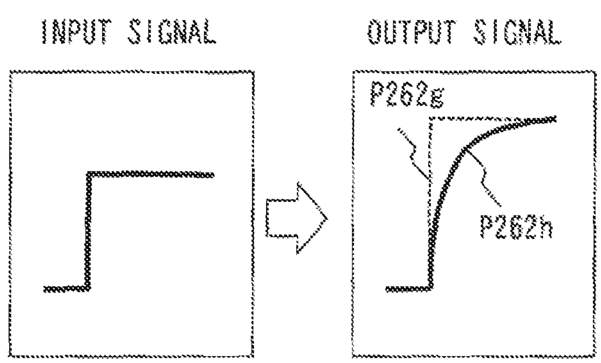
FIG. 62D is an input/output waveform chart to explain a simulation method of the web simulator according to the first embodiment.

FIG. 62D shows an input signal and an output signal in the case of simulating the operation of the analog circuit (the semiconductor device 1) with a step response waveform input pattern. In the case of a step response waveform, by comparing a common mode signal P262*g* that is in-phase with the input signal and an output signal P262*h* that is a result of the simulation, it is possible to optimally check the response performance. By displaying the waveform superimposed on the output signal on a simulation result display screen as shown in FIG. 62D, a user (sensor vendor) can check the response performance at a glance.

Specifically, with use of the step response waveform input pattern, it is possible to check the response characteristics simply without the need to consider a pulse width, though the rising edge and the falling edge cannot be checked at the same time as in the case of a square wave. Further, with the step response waveform, it can be used to check a response immediately after power-on. With use of the step response waveform input pattern, a user (sensor vendor) can easily check the response performance and can thereby set the configuration and the characteristics of the configurable amplifier 110 appropriately in accordance with a result of the checking. Further, the simulation execution unit 415 may detect a signal distortion, delay and the like using a result of the simulation and automatically set the configuration and the characteristics of the configurable amplifier 110 in accordance with a result of the detection.

Figure 63:
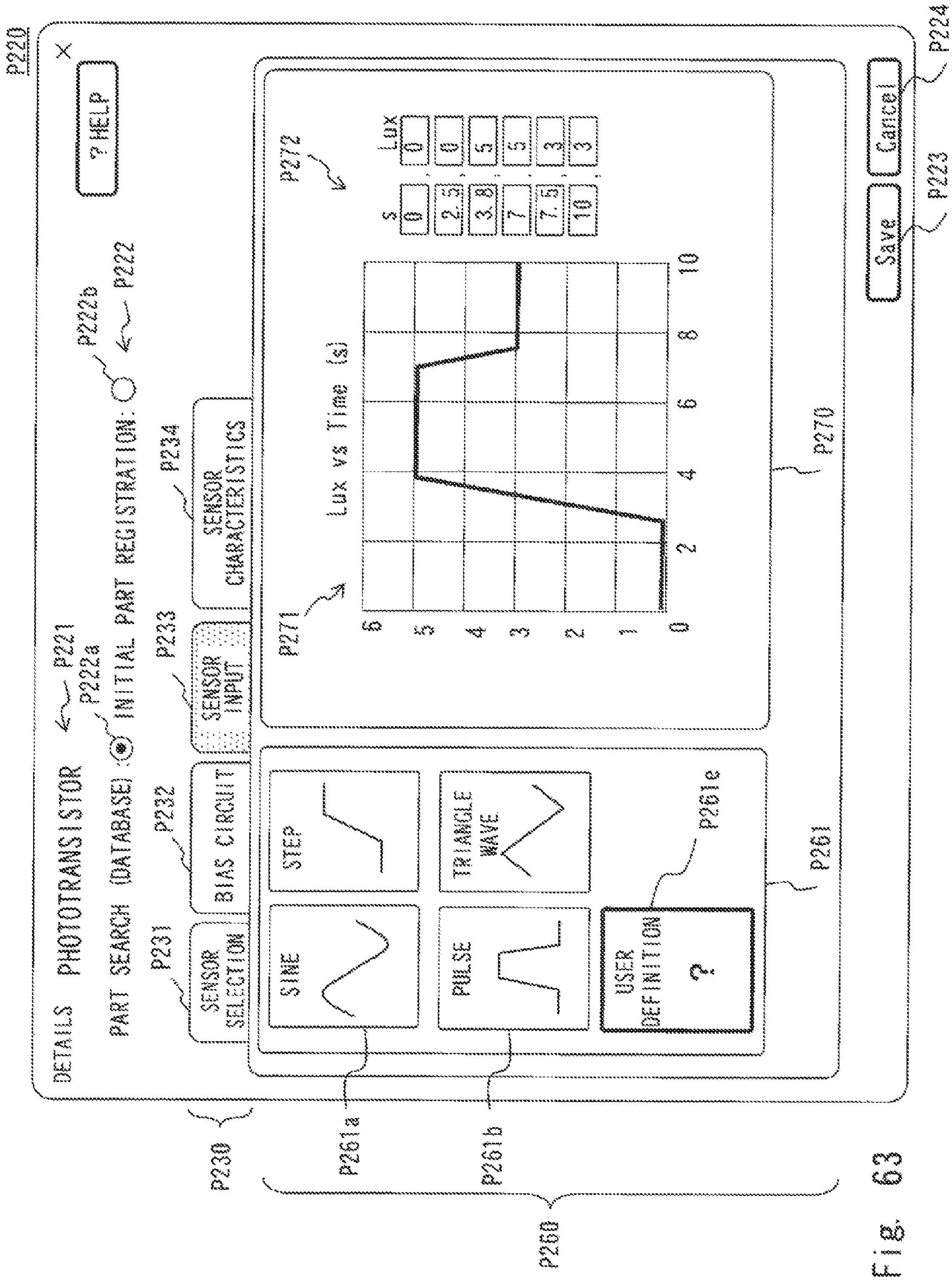
FIG. 63 is a display image diagram of a display screen used in a simulation method of the web simulator according to the first embodiment.

FIG. 63 shows a display example in the case where the "user-defined" pattern P261*e* is selected on the physical quantity input screen P260 of FIG. 59. As shown in FIG. 63, when the "user-defined" pattern P261*e* is selected, a user definition entry area P270 is displayed in place of the input parameter area P262 of FIG. 59 on the physical quantity input screen P260.

On the user definition entry area P270, an input pattern graph P271 and a plot entry area P272 corresponding to the selected sensor are displayed. In the input pattern graph P271, an input pattern is set by clicking or dragging each plot of the graph. In the plot entry area P272, numeric values for plots of the graph are entered to set an input pattern. Note that a plot in the input pattern graph may be arbitrarily added using a plot insert (add) button or the like (not shown).

Figure 64:
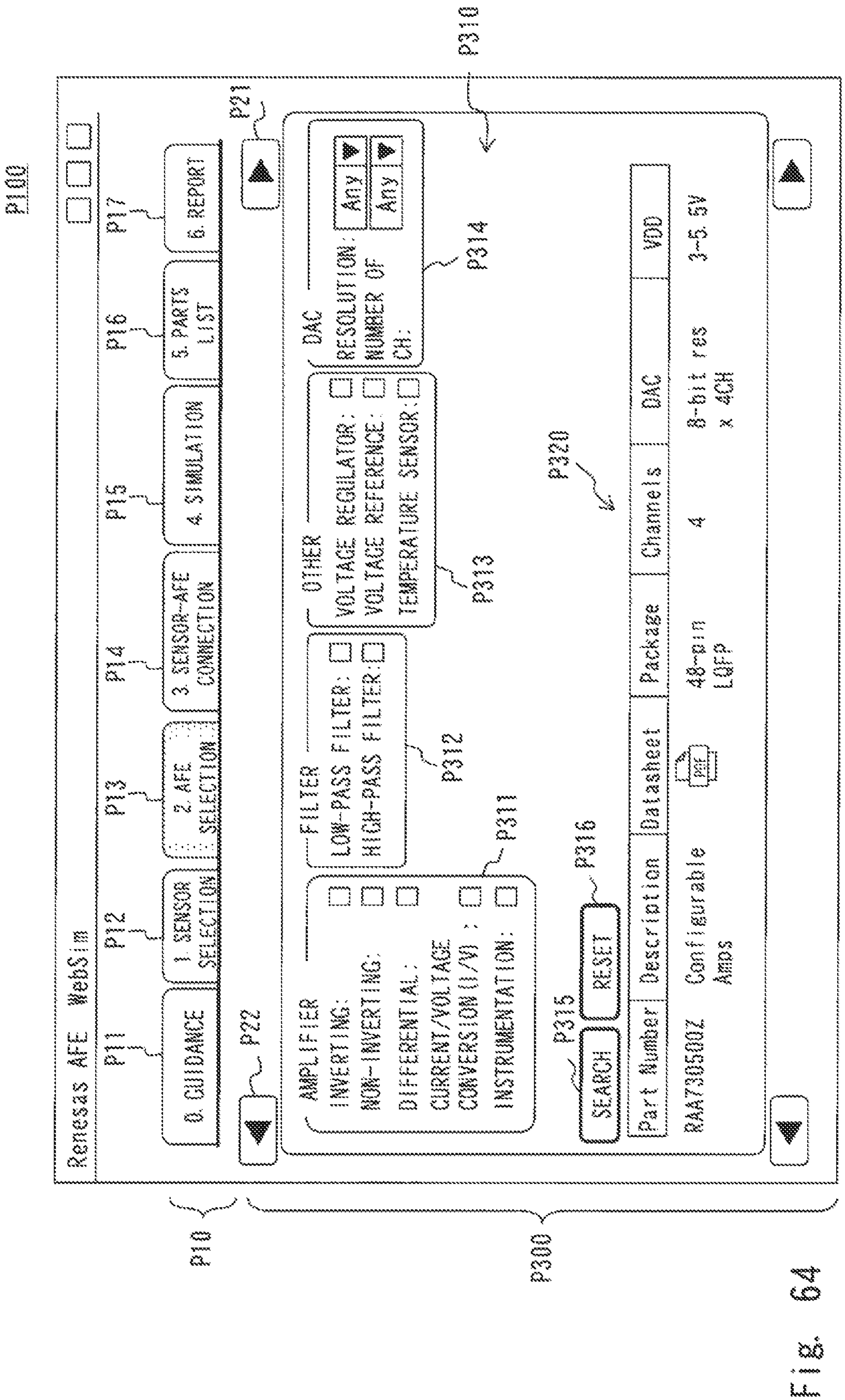
FIG. 64 is a display image diagram of a display screen used in a simulation method of the web simulator according to the first embodiment.

Then, the web simulator 4 displays an AFE selection screen on the sensor vendor terminal 5 (S105 in FIG. 31). FIG. 64 shows a display example of the AFE selection screen. As shown in FIG. 64, when the "AFE selection" tab P13 is selected on the web simulator screen P100, the AFE selection screen P300 is displayed.

On the AFE selection screen P300, AFE narrowing criteria P310 is displayed in the upper part, and an AFE list P320 is displayed in the lower part. In the AFE narrowing criteria P310, conditions for further narrowing down the semiconductor devices 1 specified by the selected sensor and the bias circuit are displayed.

In FIG. 64, an "amplifier" area P311, a "filter" area P312, an "other" area P313, and a "DAC" area P314 are displayed as the AFE narrowing criteria P310. In the "amplifier" area P311, an "inverting" checkbox to set an inverting amplifier as search criteria, a "non-inverting" checkbox to set a non-inverting amplifier as search criteria, a "differential" checkbox to set a differential amplifier as search criteria, an "IV" checkbox to set an IV amplifier as search criteria, and an "instrumentation" checkbox to set an instrumentation amplifier as search criteria are displayed. In the "amplifier" area P311, a checkbox corresponding to search criteria is clicked on to place a checkmark in order to search for the semiconductor device 1 by the configuration of the configurable amplifier 110.

In the "filter" area P312, a "low-pass filter" checkbox to set a low-pass filter as search criteria and a "high-pass filter" checkbox to set a high-pass filter as search criteria are displayed. In the "filter" area P312, a checkbox corresponding to search criteria is clicked on to place a checkmark in order to search for the semiconductor device 1 by the configuration of the filter.

In the "other" area P313, a "voltage regulator" to set a voltage regulator (the variable regulator 150) as search criteria, a "voltage reference" to set a voltage reference as search criteria, and a "temperature sensor" to set a temperature sensor as search criteria are displayed. In the "other" area P313, a checkbox corresponding to search criteria is clicked on to place a checkmark in order to search for the semiconductor device 1 by the configuration of the voltage regulator or the like.

In the "DAC" area P31, a DAC "resolution" pulldown menu and a "number of Ch" pulldown menu are displayed. In the "resolution" pulldown menu, the number of bits is specified to search for the semiconductor device 1 with a resolution of a specified bit, or "any" is specified to search for the semiconductor device 1 with all resolutions. In the "number of Ch" pulldown menu, the number of Ch is specified to search for the semiconductor device 1 with a specified number of Ch, or "any" is specified to search for the semiconductor device 1 with any number of Ch.

Between the narrowing criteria P310 and the AFE list P320, a "search" button P315 and a "reset" button P316 are displayed. By clicking on the "search" button P315, the AFE database is searched with the criteria set in the narrowing criteria P310, and a search result is displayed in the AFE list P320. By clicking on the "reset" button P316, the narrowing criteria (search criteria) set in the narrowing criteria P310 are reset to the initial state where nothing is set for screen display.

In the AFE list P320, a list of the semiconductor devices 1 that are suitable for the selected (registered/updated) sensor and bias circuit and that match the narrowing criteria set in the narrowing criteria P310 is displayed. As described in S106 of FIG. 31, when the sensor and the bias circuit are selected (registered or updated), the semiconductor devices 1 that can be connected to the sensor are determined. The semiconductor devices 1 that can be connected to the sensor and that match the set narrowing criteria are displayed from the AFE database 424.

In the AFE list P320, information about different semiconductor devices 1 is displayed in a plurality of fields. In FIG. 64, a part number (Part Number), a description (Description), a datasheet (Datasheet), a package type (Package), the number of channels (Channels), a DAC configuration (DAC), and a power supply voltage (VDD) are displayed for each semiconductor device 1. A PDF icon is displayed in the datasheet field, and a PDF file of a datasheet is displayed when the PDF icon is clicked on.

By displaying the semiconductor devices 1 that are suitable for the sensor and the bias circuit and that match the narrowing criteria in the AFE list P320, it is possible to select a desired semiconductor device 1 with a simple operation. Based on the displayed information, a user (sensor vendor) clicks on the semiconductor device 1 to be used and selects it from the AFE list P320. As in S105 of FIG. 31, when the semiconductor devices 1 is selected from the AFE list P320, the circuit information of the semiconductor device 1 is stored in the circuit setting file of the circuit information storage unit 426.

Figure 65:
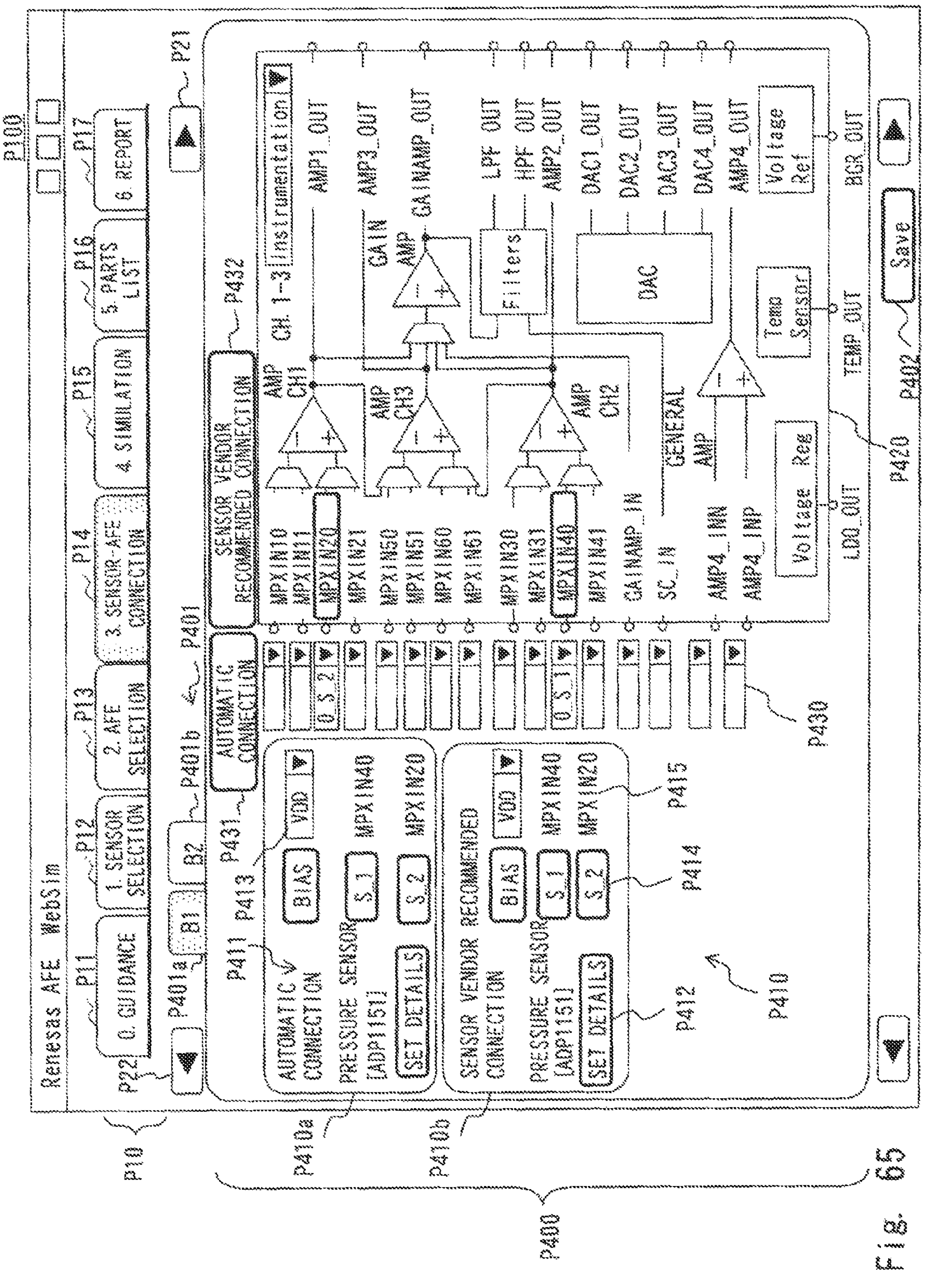
FIG. 65 is a display image diagram of a display screen used in a simulation method of the web simulator according to the first embodiment.

Then, the web simulator 4 displays a sensor-AFE connection screen on the sensor vendor terminal 5 (S31 of FIG. 34). FIG. 65 shows a display example of the sensor-AFE connection screen. As shown in FIG. 65, when the "sensor-AFE connection" tab P14 is selected on the web simulator screen P100, the sensor-AFE connection screen P400 is displayed.

The sensor-AFE connection screen P400 has a bias circuit selection area P401 in its upper part. In the bias circuit selection area P401, tabs for selecting the bias circuit set by the sensor vendor on the bias circuit selection screen P250 are displayed. In FIG. 65, a "bias circuit B1" tab 401*a* and a "bias circuit B2" tab 401*b* are displayed. When the "bias circuit B1" tab 401*a* is clicked on, the configuration that connects the sensor and the bias circuit B1 with the semiconductor device 1 is displayed on the sensor-AFE connection screen P400, and connections of the circuit including the bias circuit B1 can be set. Further, when the "bias circuit B2" tab 401*b* is clicked on, the configuration that connects the sensor and the bias circuit B2 with the semiconductor device 1 is displayed on the sensor-AFE connection screen P400, and connections of the circuit including the bias circuit B2 can be set.

On the sensor-AFE connection screen P400, a connection selection frame P410 to select between automatic connection and sensor vendor recommended connection is displayed in its left part. In this example, a connection selection frame P410*a* indicating the connection state of the sensor and the bias circuit connected by automatic connection and a connection selection frame P410*b* indicating the connection state of the sensor and the bias circuit connected by sensor vendor recommended connection are displayed. In the connection selection frame P410, just like the sensor selection frame P210 of FIG. 47, the selected sensor type and part number are displayed in a sensor name display area P411, and a "set details" button P412 is displayed.

Further, in the connection selection frame P410, information of a bias circuit is displayed. A bias pulldown menu P413 to set a bias is displayed in the connection selection frame P410. In the bias pulldown menu P413, a list of bias supply methods is displayed in accordance with the selected bias circuit, and a supply method such as VDD or GND can be selected, for example. Further, in the connection selection frame P410, an output signal display P414 that displays an output signal in accordance with the selected bias circuit and an input terminal display P415 that displays an input terminal of the semiconductor device 1 are displayed corresponding to the connections.

On the sensor-AFE connection screen P400, a semiconductor device image P420 that shows the image of the circuit configuration of the semiconductor device 1 is displayed on the right of the connection selection frame P410, and an input terminal pulldown menu P430 is displayed at the position corresponding to each input terminal of the semiconductor device image P420.

In the semiconductor device image P420, connections between the input and output terminals of the semiconductor device 1 and the internal circuits of the semiconductor device 1 are displayed. The semiconductor device image P420 is displayed corresponding to the actual connections of the semiconductor device 1 as described in FIG. 3.

In the input terminal pulldown menu P430, the output signals of the sensor and the bias circuit connected to the respective input terminal are displayed. The output signal of the sensor can be selected by clicking on the input terminal pulldown menu P430, or the connections can be set by dragging the icon of the sensor output signal display P414 to the pulldown menu P430.

Above the input terminal pulldown menu P430, an "automatic connection" button P431 to automatically connect the sensor and the semiconductor device 1 and a "sensor vendor recommended connection" button P432 to set sensor vendor recommended connection are displayed.

As described in S106 of FIG. 31, when the sensor and the bias circuit are selected (registered/updated), the configuration and connections of the configurable amplifier 110 are determined, and the connections determined in S106 are automatically displayed as default on the sensor-AFE connection screen P400. When the "automatic connection" button P431 is clicked on, the default connections are displayed. Further, in the case where the settings of the sensor are changed by the "set details" button P412 in the connection selection frame P410, when the "automatic connection" button P431 is clicked on, the sensor and the semiconductor device 1 are newly connected automatically, corresponding to the sensor with the changed settings.

When the "sensor vendor recommended connection" button P432 is clicked on, a sensor vendor can set the sensor vendor recommended connection. For example, the connections between the sensor and the semiconductor device 1 are selected by the input terminal pulldown menu P430. The line or character indicating the connection may be displayed with a different color between the case of displaying the automatic connection and the case of displaying the sensor vendor recommended connection. A "save" button P402 is displayed on the lower right of the sensor-AFE connection screen P400, and when the "save" button P402 is clicked on, the selected connections are stored in the vendor circuit setting file 426*b* of the circuit information storage unit 426 as described in S33 of FIG. 34.

The connections in the example of FIG. 65 are described. In the connection selection frame P410*a* for automatic connection, it has two-output by selection of the pressure sensor and the bias circuit, and the two-output and the individual amplifier of the configurable amplifier 110 are automatically connected. To be specific, an output signal (output terminal) S_1 of the pressure sensor is connected to an input terminal MPXIN40 of the semiconductor device 1, and an output signal (output terminal) S_2 of the pressure sensor is connected to an input terminal MPXIN20 of the semiconductor device 1. In the semiconductor device 1, MPKIN40 is connected to a non-inverting input terminal of CH2 AMP (the individual amplifier AMP2 of the configurable amplifier 110), and MPXIN20 is connected to a non-inverting input terminal of CH1 AMP (the individual amplifier AMP1 of the configurable amplifier 110). CH1 to CH3 form an instrumentation amplifier (Instrumentation), and the output signals S_1 and S_2 of the pressure sensor are amplified by the instrumentation amplifier and output from an output terminal AMP3_OUT. Further, the same connections are made for vendor recommended connection as well in this example.

Figure 66:
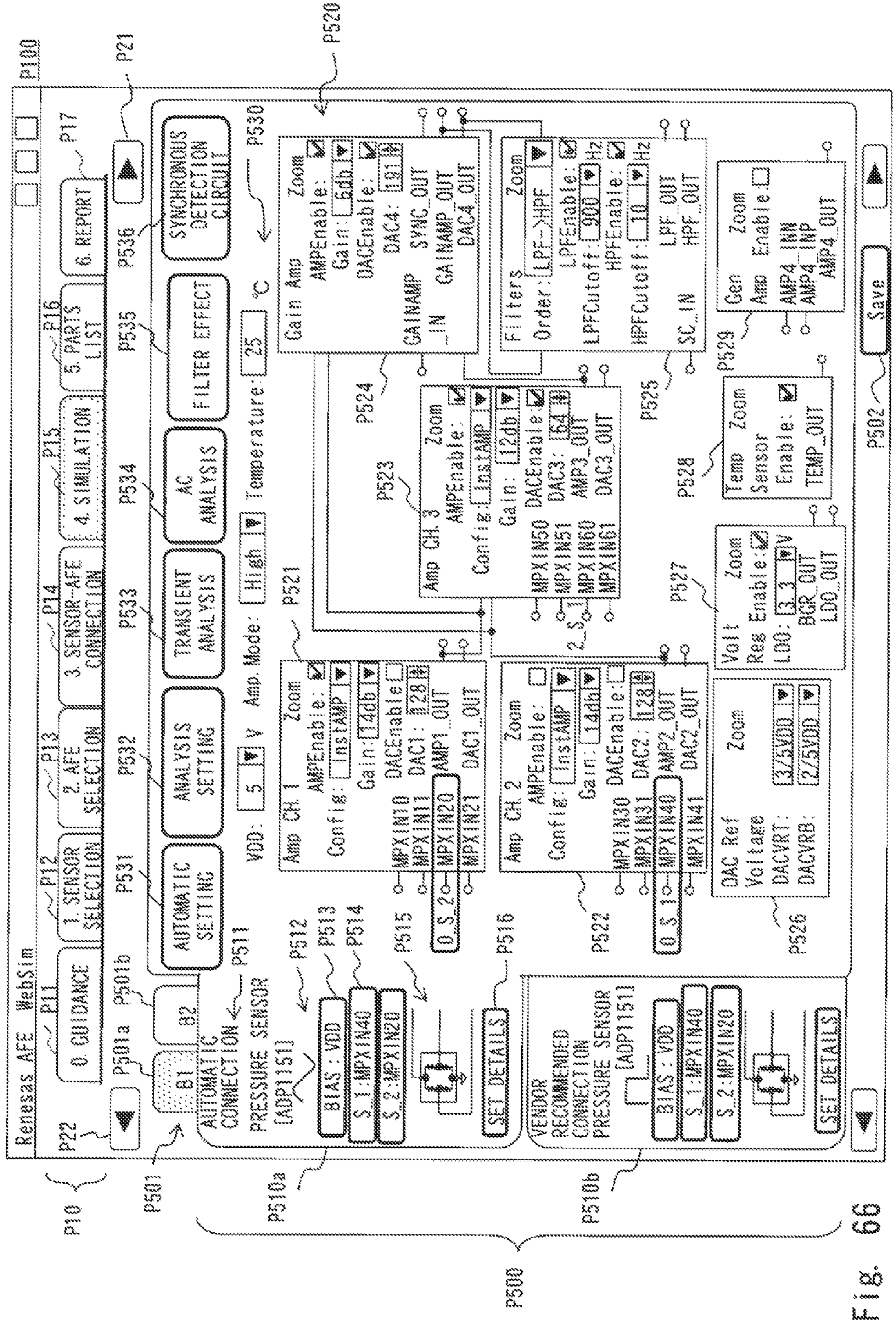
FIG. 66 is a display image diagram of a display screen used in a simulation method of the web simulator according to the first embodiment.

Then, the web simulator 4 displays a simulation screen on the sensor vendor terminal 5 (S201 of FIG. 36). FIG. 66 shows a display example of the simulation screen. As shown in FIG. 66, when the "simulation" tab P15 is selected on the web simulator screen P100, the simulation screen P500 is displayed. The simulation screen P500 can perform display for various settings of simulation and display of a simulation result, and FIG. 66 shows the state before simulation is executed.

The simulation screen P500 has a bias circuit selection area P501 on its upper left part. In the bias circuit selection area P501, tabs for selecting the bias circuit set by the sensor vendor on the bias circuit selection screen P250 are displayed, just like the bias circuit selection area P401 of the sensor-AFE connection screen P400 shown in FIG. 65. In FIG. 66, a "bias circuit B1" tab 501*a* and a "bias circuit 32" tab 501*b* are displayed. When the "bias circuit B1" tab 501*a* is clicked on, the configuration that connects the sensor and the bias circuit B1 with the semiconductor device 1 is displayed on the simulation screen P500, and setting and simulation of the circuit including the bias circuit B1 can be performed. Further, when the "bias circuit B2" tab 501*b* is clicked on, the configuration that connects the sensor and the bias circuit B2 with the semiconductor device 1 is displayed on the simulation screen P500, and setting and simulation of the circuit including the bias circuit B2 can be performed.

On the simulation screen P500, a connection selection frame (tab) P510 to select between automatic connection and sensor vendor recommended connection is displayed in its left part. In this example, a connection selection frame (automatic connection tab) P510*a* indicating the connection state of the sensor and the bias circuit connected by automatic connection and a connection selection frame (sensor vendor recommended connection tab) P510*b* indicating the connection state of the sensor and the bias circuit connected by sensor vendor recommended connection are displayed.

In the connection selection frame P510, just like the sensor selection frame P410 of FIG. 65, the selected sensor type and part number are displayed in a sensor name display area P511, and a bias supply method P513, connections P514 between an output signal and an input terminal, and a "set details" button P516 are displayed. Further, in the connection selection frame P510, an input waveform image P512 indicating the image of the set physical quantity input pattern and a bias circuit image P515 indicating the circuit image of the set bias circuit are displayed.

On the simulation screen P500, a semiconductor device setting area P520 to set each circuit of the semiconductor device 1 is displayed on the right of the connection selection frame P510. In the semiconductor device setting area P520, a circuit block corresponding to the configuration of the semiconductor device 1 is displayed.

Individual amplifier blocks P521 to P523 display a setting menu to set individual amplifiers AMP1 to AMP3 in CH1 to CH3 of the configurable amplifier 110 of the semiconductor device 1. In the individual amplifier blocks P521 to P523, the on/off of the amplifier is set by an "AMP Enable" checkbox, the configuration of the amplifier is set by a "Config" pulldown menu, the gain of the amplifier is set by a "Gain" pulldown menu, the on/off of the DAC is set by a "DAC Enable" checkbox, and the output voltage of the DAC is set by a "DAC" pulldown menu.

For example, in the "Config" pulldown menu, when "Differential" is selected, the configuration of the amplifier becomes a differential amplifier; when "Inverting" is selected, the configuration of the amplifier becomes an inverting amplifier; when "Non-Inverting" is selected, the configuration of the amplifier becomes a non-inverting amplifier; and when "I/V" is selected, the configuration of the amplifier becomes an I/V amplifier. In this example, "InstAMP" (instrumentation amplifier) is selected. Further, as described in the automatic setting process in FIG. 38, the gain and the offset of the amplifier are automatically set in accordance with the selected amplifier and bias circuit. In the individual amplifier blocks P521 to P523, the gain and the DAC output voltage set by the automatic setting process are displayed as default.

Figure 67:
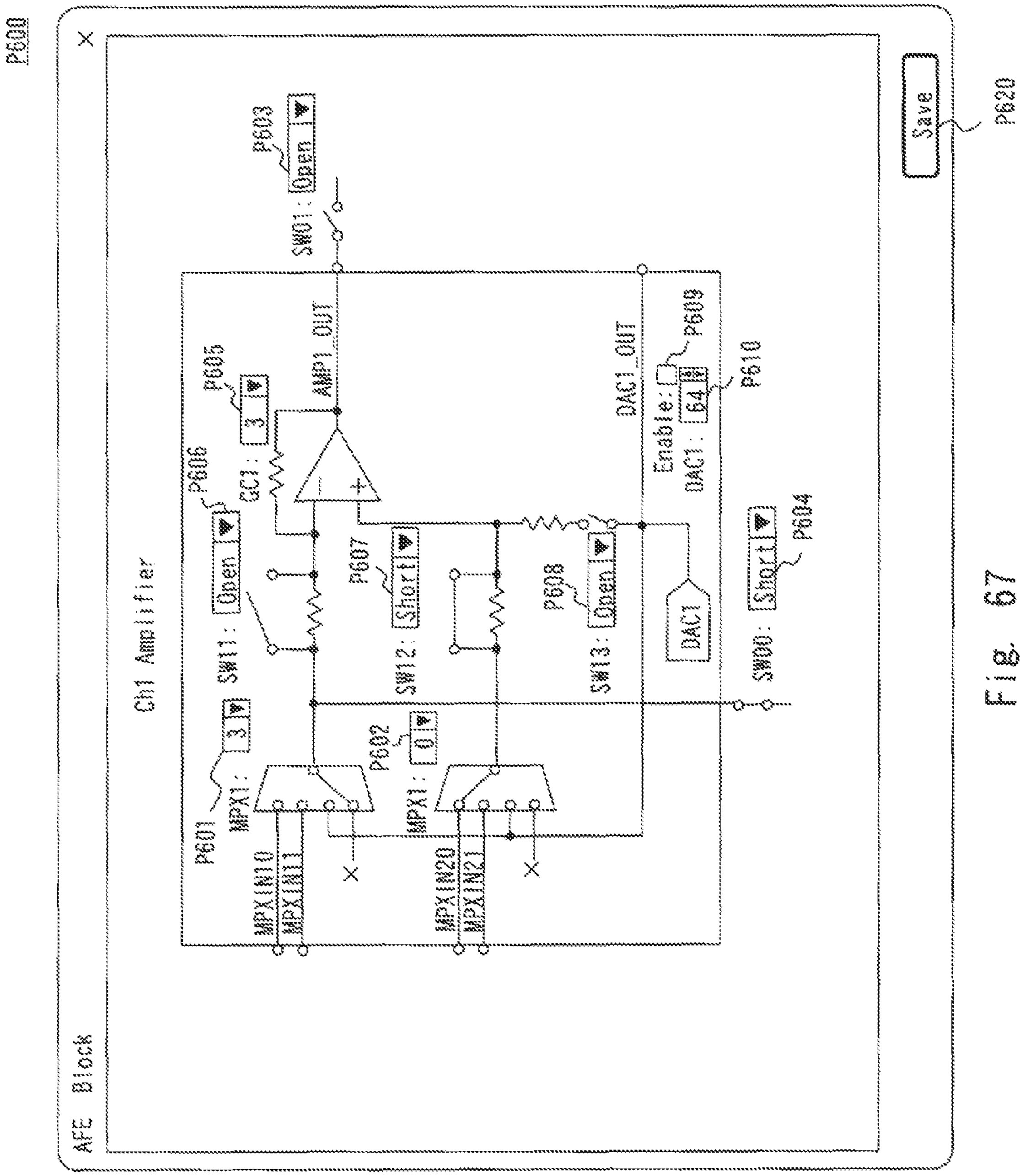
FIG. 67 is a display image diagram of a display screen used in a simulation method of the web simulator according to the first embodiment.

Further, when "Zoom" in the individual amplifier blocks P521 to P523 is clicked on, various settings can be made by reference to the block diagram of the amplifier. Specifically, an amplifier setting screen P600 is displayed in a pop-up window and set as shown in FIG. 67. On the amplifier setting screen P600, the same circuit image as that of the actual amplifier of the semiconductor device 1 is displayed, and, for example, the circuit configuration of the amplifier shown in FIG. 8 is displayed.

On the amplifier setting screen P600, terminals to which the input terminal and the output terminal of the amplifier are connected are set by pulldown menus P601 to P604, the gain of the amplifier is set by a pulldown menu P605, the presence or absence of input resistance and the connection of the DAC are set by pulldown menus P606 to P608, and the on/off and the output voltage of the DAC are set by a checkbox P609 and a pulldown menu P610. On the lower right of the amplifier setting screen P600, a "save" button P620 is displayed, and when the "save" button P620 is clicked on, the set configuration and characteristics of the amplifier are stored in the vendor circuit setting file 426*b* of the circuit information storage unit 426 as described in S206 of FIG. 36.

A gain amplifier block P524 of FIG. 66 displays a setting menu to configure the gain amplifier 120 of the semiconductor device 1. In the gain amplifier block P524, the amplifier is configured just like the individual amplifier blocks P521 to P523. In the gain amplifier block P524, the on/off of the amplifier is set by an "AMP Enable" checkbox, the gain of the amplifier is set by a "Gain" pulldown menu, the on/off of the DAC is set by a "DAC Enable" checkbox, and the output voltage of the DAC is set by a "DAC" pulldown menu.

A filter block P525 displays a setting menu to configure the low-pass filter 130 and the high-pass filter 140 of the semiconductor device 1. In the filter block P525, the sequence of passing through the filter circuit is set by an "Order" pulldown menu, the on/off of the low-pass filter is set by a "LPF Enable" checkbox, the cutoff frequency of the low-pass filter is set by a "LPF Cutoff" pulldown menu, the on/off of the high-pass filter is set by a "HPF Enable" checkbox, and the cutoff frequency of the high-pass filter is set by a "HPF Cutoff" pulldown menu.

For example, in the "Order" pulldown menu, when "LPF" is selected, a configuration that passes through only the low-pass filter is enabled, when "HPF" is selected, a configuration that passes through only the high-pass filter is enabled, when "LPF→HPF" is selected, a configuration that passes through the low-pass filter and the high-pass filter in this sequence is enabled, and when "HPF→LPF" is selected, a configuration that passes through the high-pass filter and the low-pass titter in this sequence is enabled.

A DAC block P526 displays a setting menu to configure the reference voltage of the DAC connected to each amplifier. In the DAC block P526, the upper limit of the set voltage of the DAC is set by a "DACVRT" pulldown menu, and the lower limit of the set voltage of the DAC is set by a "DACVRB" pulldown menu.

A variable regulator block P527 displays a setting menu to configure the variable regulator 150 of the semiconductor device 1. In the variable regulator block P527, the on/off of the variable regulator is set by an "Enable" checkbox, and the output voltage of the variable regulator is set in a "LDO" pulldown menu.

A temperature sensor block P528 displays a setting menu to configure the temperature sensor 160 of the semiconductor device 1. In the temperature sensor block P528, the on/off of the temperature regulator is set by an "Enable" checkbox. A general-purpose amplifier block P529 displays a setting menu to configure the general-purpose amplifier 170 of the semiconductor device 1. In the general-purpose amplifier block P529, the on/off of the general-purpose regulator is set by an "Enable" checkbox.

On the lower right of the semiconductor device setting area P520, a "save" button P502 is displayed, and when the "save" button P502 is clicked on, the set configuration and characteristics of the amplifier are stored in the vendor circuit setting file 426*b* of the circuit information storage unit 426 as described in S206 of FIG. 36.

In the upper region of the semiconductor device setting area P520, a common setting area P530 for each circuit is displayed. In the common setting area P530, a power supply voltage is set by a "VDD" pulldown menu, an amplifier mode is set by an "Amp Mode" pulldown menu, and the temperature of the semiconductor device 1 is set by a "Temperature" entry box. In the "Amp Mode" pulldown menu, "High" indicating high-speed mode or "Low" indicating low-speed mode is selected as amplifier operation mode.

In the upper part of the common setting area P530, buttons P531 to P536 for executing simulation are displayed. An "automatic setting" button P531 is a button to execute the automatic setting process of FIG. 38. In the case where the settings are changed by the "set details" button P516 in the connection selection frame P510, when the "automatic setting" button P531 is clicked on, the gain and the offset of the amplifier are adjusted in the configuration corresponding to the sensor with the changed settings, and the gain of the amplifier and the DAC output voltage are automatically set.

An "analysis setting" button P532 is a button for entering simulation parameters in S204 of FIG. 36. For example, when the "analysis setting" button P532 is clicked on, a list of settable parameters are displayed in a pop-up window, and each parameter is set. The set parameters are stored in the parameter storage unit 427 as described in S204 of FIG. 36.

A "transient analysis" button P533 is a button for executing the transient analysis process of FIG. 41. When the "transient analysis" button P533 is clicked on, an operation in the case where a physical quantity is input in time series to the semiconductor device 1 is simulated using the set circuit information and parameters as simulation conditions as described in FIG. 41, and a simulation result is displayed on the simulation screen P500.

An "AC analysis" button P534 is a button for executing the AC analysis process of FIG. 42. When the "AC analysis" button P534 is clicked on, an operation in the case where a physical quantity is input for each frequency to the semiconductor device 1 is simulated using the set circuit information and parameters as simulation conditions as described in FIG. 42, and a simulation result is displayed on the simulation screen P500.

A "filter effect" button P535 is a button for executing the filter effect analysis process of FIG. 43. When the "filter effect" button P535 is clicked on, an operation in the case where a physical quantity with noise is input to the semiconductor device 1 is simulated using the set circuit information and parameters as simulation conditions as described in FIG. 43, and a simulation result is displayed on the simulation screen P500.

A "synchronous detection circuit" button P536 is a button for executing the synchronous detection analysis process of FIG. 44. When the "synchronous detection circuit" button P536 is clicked on, an operation in the case where a physical quantity and a synchronous signal are input to the semiconductor device 1 is simulated using the set circuit information and parameters as simulation conditions as described in FIG. 44, and a simulation result is displayed on the simulation screen P500.

Figure 68A:
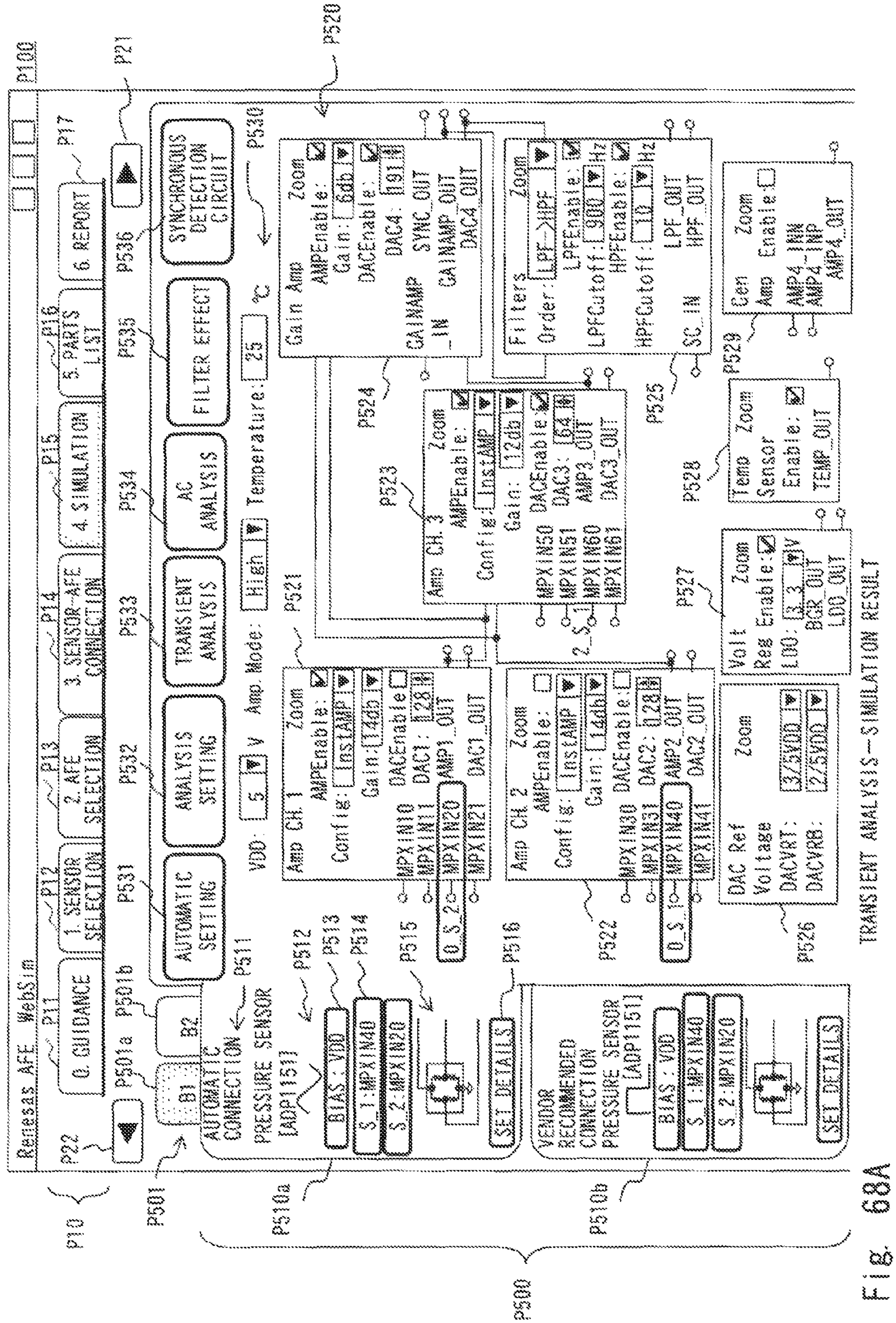
FIG. 68A is a display image diagram of a display screen used in a simulation method of the web simulator according to the first embodiment.
Figure 68B:
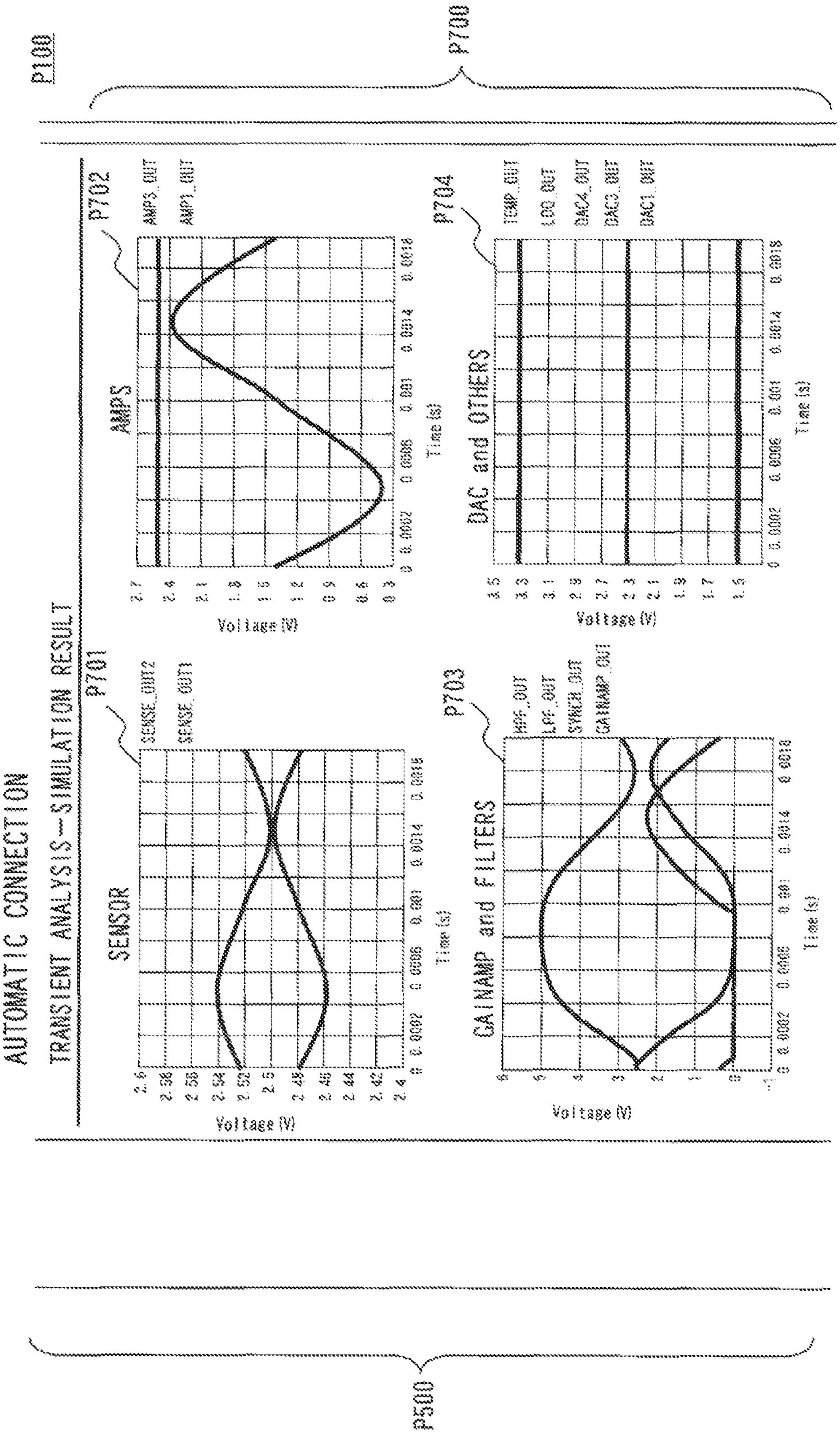
FIG. 68B is a display image diagram of a display screen used in a simulation method of the web simulator according to the first embodiment.
Figure 68C:
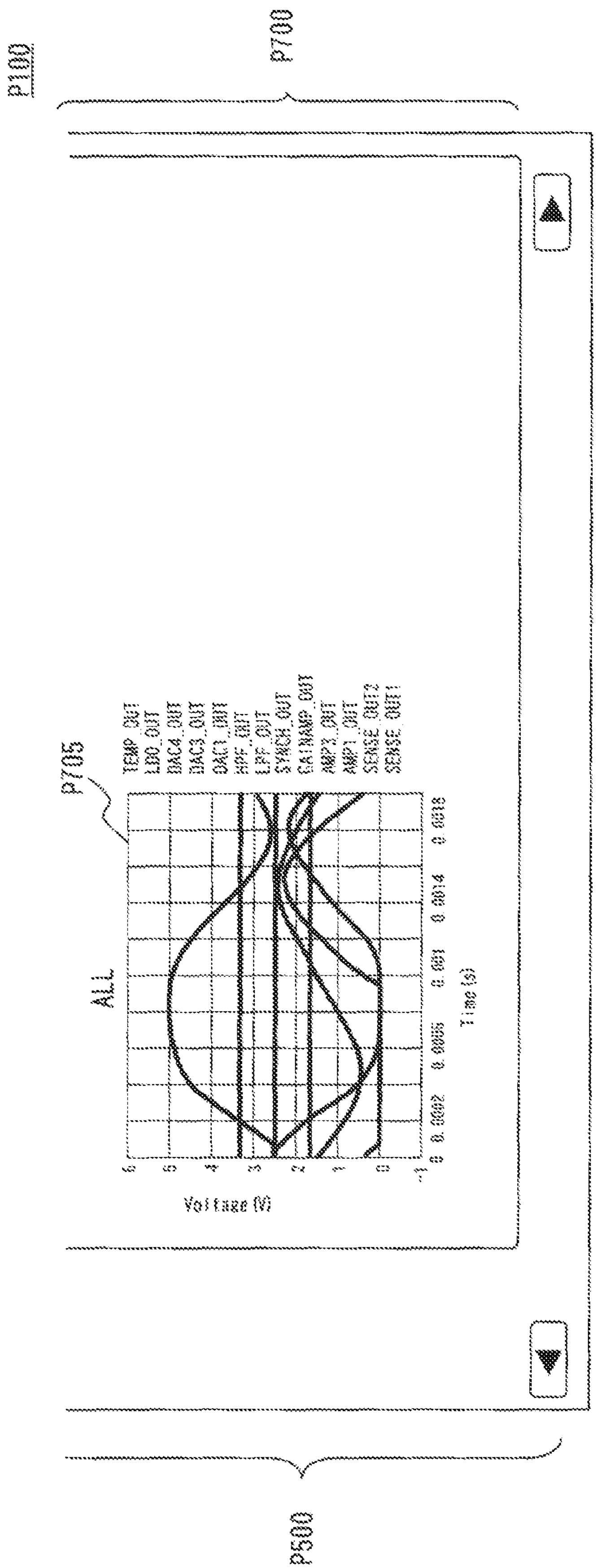
FIG. 68C is a display image diagram of a display screen used in a simulation method of the web simulator according to the first embodiment.

FIGS. 68A to 68C show display examples in the case where a transient analysis result when selecting the connection selection frame P510*a* (automatic connection tab) is displayed additionally on the simulation screen P500 of FIG. 66. Note that FIGS. 68A to 68C show the screen that is displayed continuously by dividing them.

As shown in FIGS. 68A to 68C, when the connection selection frame P510*a* for automatic connection is clicked on the simulation screen P500 of FIG. 66, and the "transient analysis" button P533 is clicked on to execute a transient analysis process, a transient analysis result P700 is displayed below the semiconductor device setting area P520 on the simulation screen P500.

In the transient analysis result P700, the signal waveforms of simulation results are collectively displayed in result graphs P701 to P705. The result graph P701 collectively displays the output signal waveforms of the sensor. For example, the transient analysis result P700 is a simulation result for the automatic connection configuration. In the result graph P701 of FIG. 68B, the output signals SENSE_OUT1 and SENSE_OUT2 of the sensor (the output signals S_1 and S_2 of the sensor) are displayed.

The result graph P702 collectively displays the output signal waveforms of the amplifier. In the result graph P702 of FIG. 68B, AMP3_OUT and AMP1_OUT (the output signals of the amplifier in CH3 and CH1) are displayed.

The result graph P703 collectively displays the output signal waveforms of the gain amplifier and the filter. In the result graph P703 of FIG. 68B, HPF_OUT (the output signal of the high-pass filter), LPF_OUT (the output signal of the low-pass filter), SYNCH_OUT (the output signal of the synchronous detection circuit), GAINAMP_OUT (the output signal of the gain amplifier) are displayed.

The result graph P704 collectively displays the output signal waveforms of the DAC and others. In the result graph P704 of FIG. 68B, TEMP_OUT (the output signal of the temperature sensor), LDO_OUT (the output signal of the voltage regulator), DAC4_OUT, DAC3_OUT and DAC1_OUT (the output signal of the DAC4, DAC3 and DAC1) are displayed.

The result graph P705 collectively displays all of the output signal waveforms. In the result graph P705 of FIG. 68C, TEMP_OUT, LDO_OUT, DAC4_OUT, DAC3_OUT, DAC1_OUT, HPF_OUT, LPF_OUT, SYNCH_OUT, GAINAMP_OUT, AMP3_OUT, AMP1_OUT, SENSE_OUT2, SENSE_OUT1 that are displayed in the result graphs P701 to P704 are displayed.

Figure 69A:
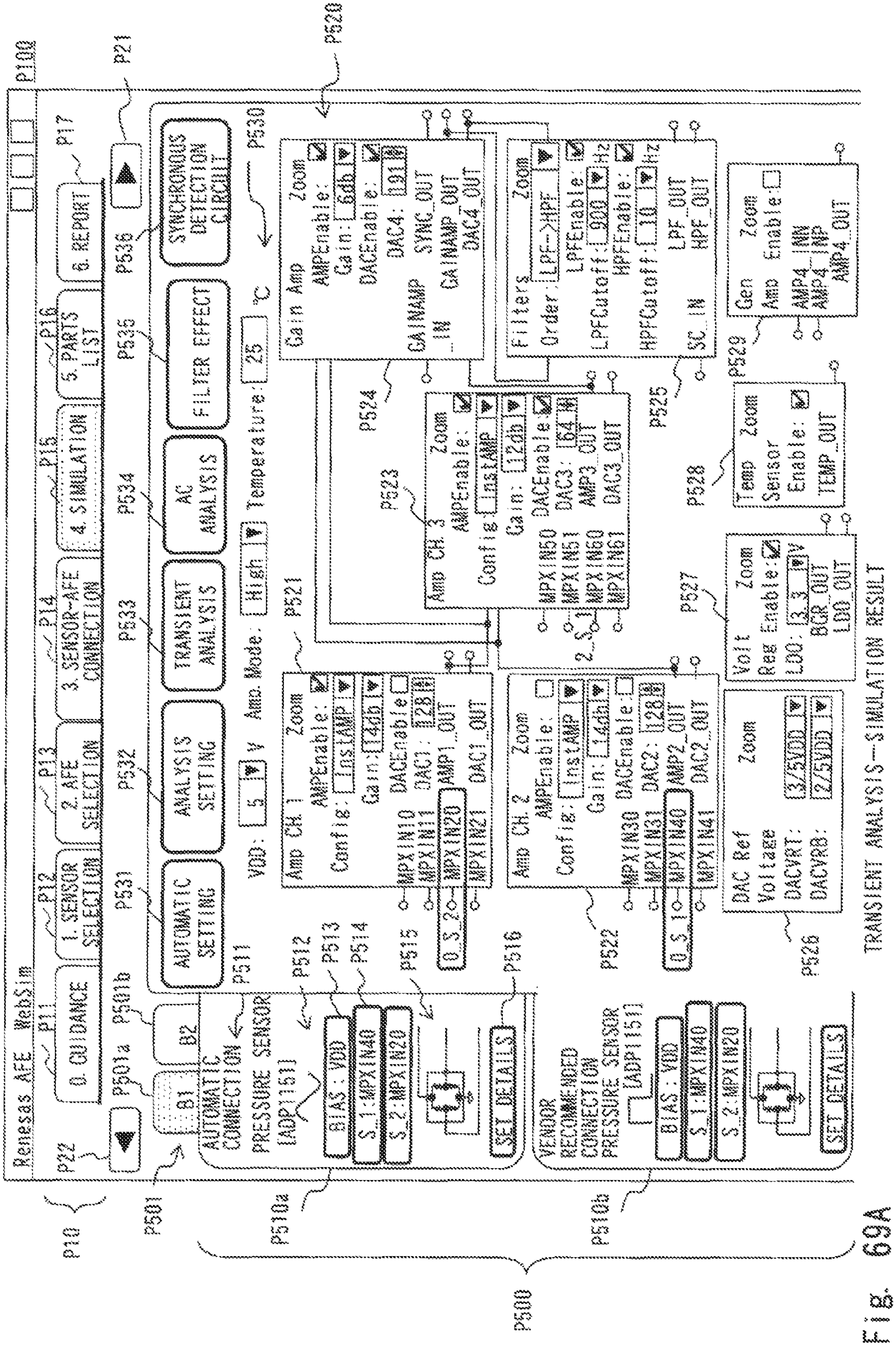
FIG. 69A is a display image diagram of a display screen used in a simulation method of the web simulator according to the first embodiment.
Figure 69B:
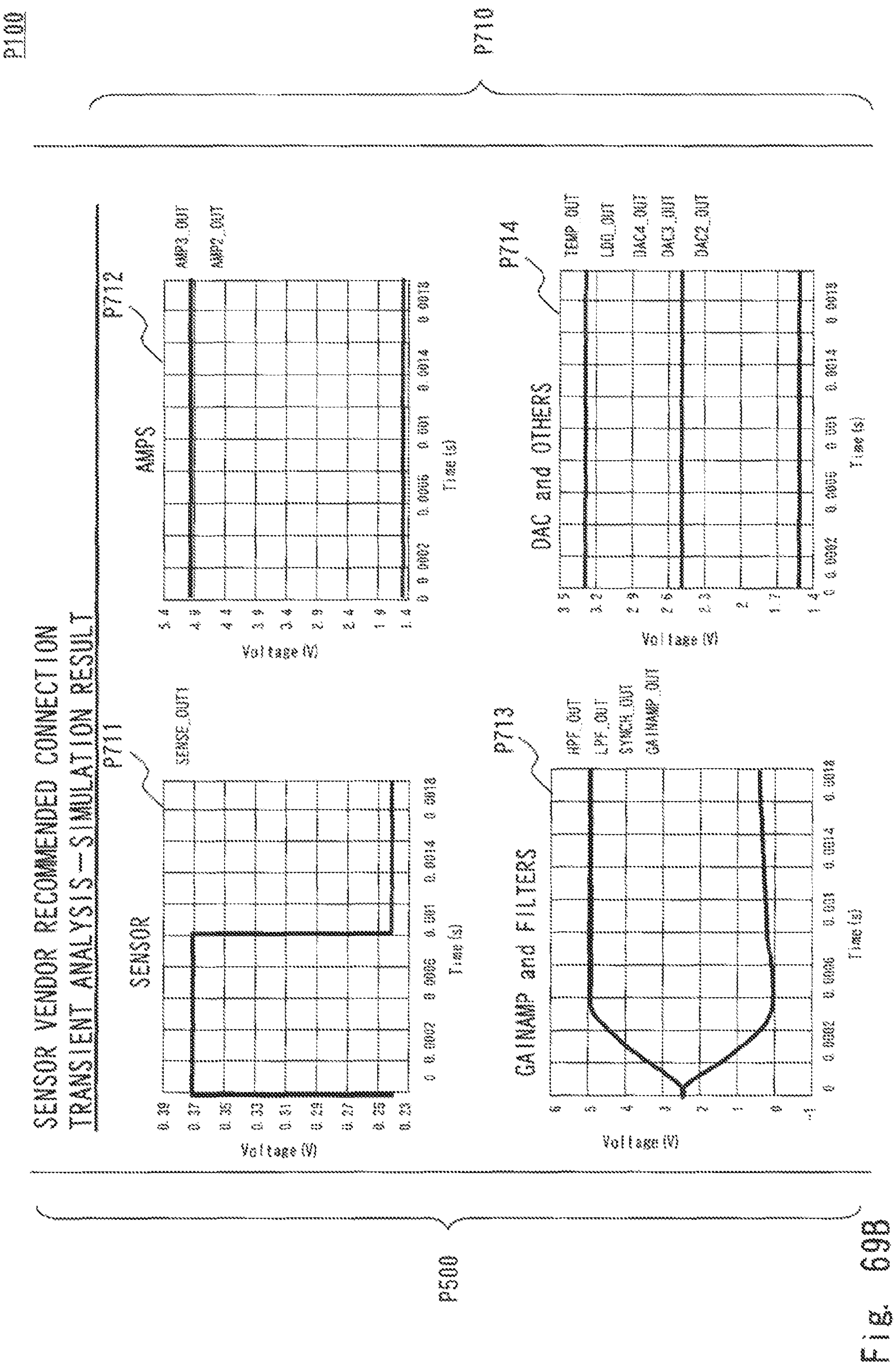
FIG. 69B is a display image diagram of a display screen used in a simulation method of the web simulator according to the first embodiment.
Figure 69C:
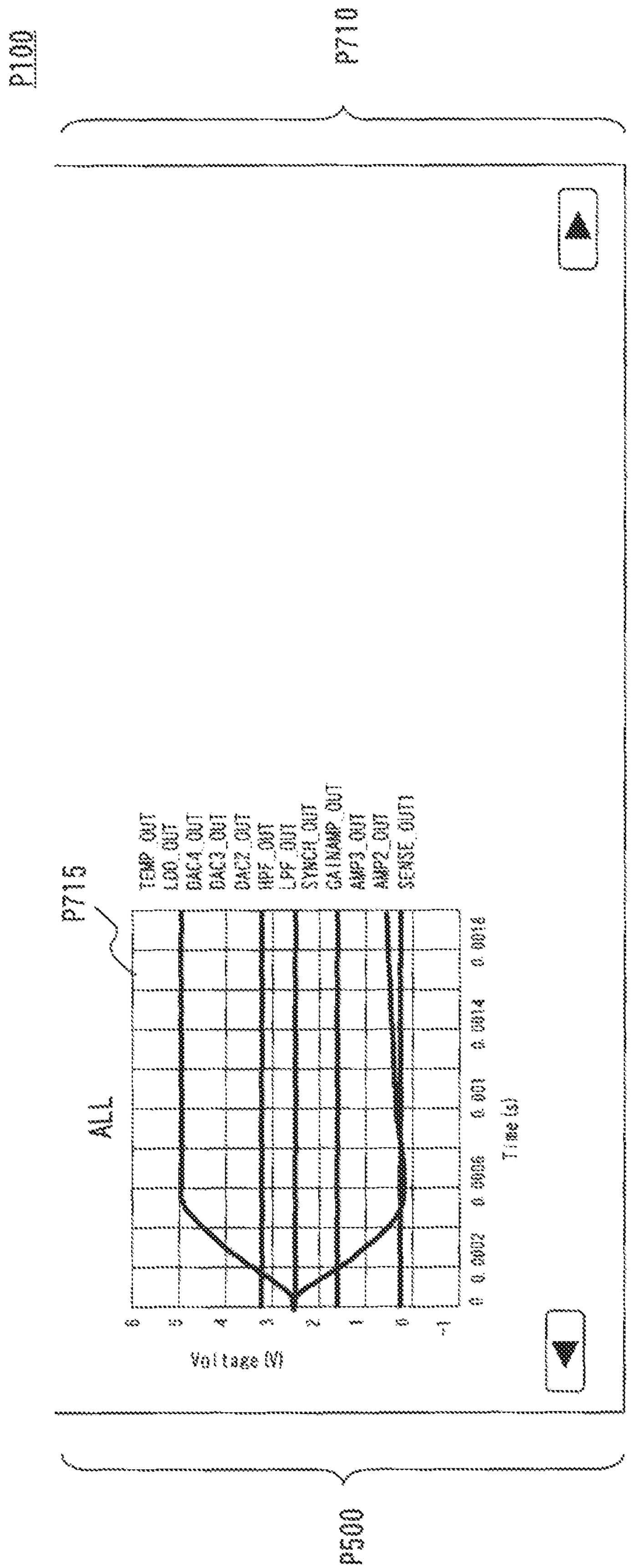
FIG. 69C is a display image diagram of a display screen used in a simulation method of the web simulator according to the first embodiment.

FIGS. 69A to 69C show display examples in the case where a transient analysis result when selecting the connection selection frame P510*b* (sensor vendor recommended connection tab) is displayed additionally on the simulation screen P500 of FIG. 66. Note that FIGS. 69A to 69C show the screen that is displayed continuously by dividing them.

As shown in FIGS. 69A to 69C, when the connection selection frame P510*b* for sensor vendor recommended connection is clicked on the simulation screen P500 of FIG. 66 or FIGS. 68A to 68C, and the "transient analysis" button P533 is clicked on to execute a transient analysis process, a transient analysis result P710 is displayed below the semiconductor device setting area P520 on the simulation screen P500.

In the transient analysis result P710, the signal waveforms of simulation results are collectively displayed in result graphs P711 to P715, as in the transient analysis result P700. For example, the transient analysis result P700 is a simulation result for the automatic connection configuration, and the transient analysis result P710 is a simulation result for the sensor vendor recommended connection configuration.

In the result graph P711 of FIG. 69B, the output signal SENSE_OUT1 of the sensor is displayed. In the result graph P712 of FIG. 63B, AMP3_OUT and AMP2_OUT are displayed. In the result graph P713 of FIG. 69B, HPF_OUT, LPF_OUT, SYNCH_OUT, GAINAMP_OUT are displayed. In the result graph P714 of FIG. 69B, TEMP_OUT, LDO_OUT, DAC4_OUT, DAC3_OUT and DAC2_OUT are displayed. In the result graph P715 of FIG. 69C, TEMP_OUT, LDO_OUT, DAC4_OUT, DAC3_OUT, DAC2_OUT, HPF_OUT, LPF_OUT, SYNCH_OUT, GAINAMP_OUT, AMP3_OUT, AMP2_OUT, SENSE_OUT1 that are displayed in the result graphs P711 to P714 are displayed.

Figure 70:
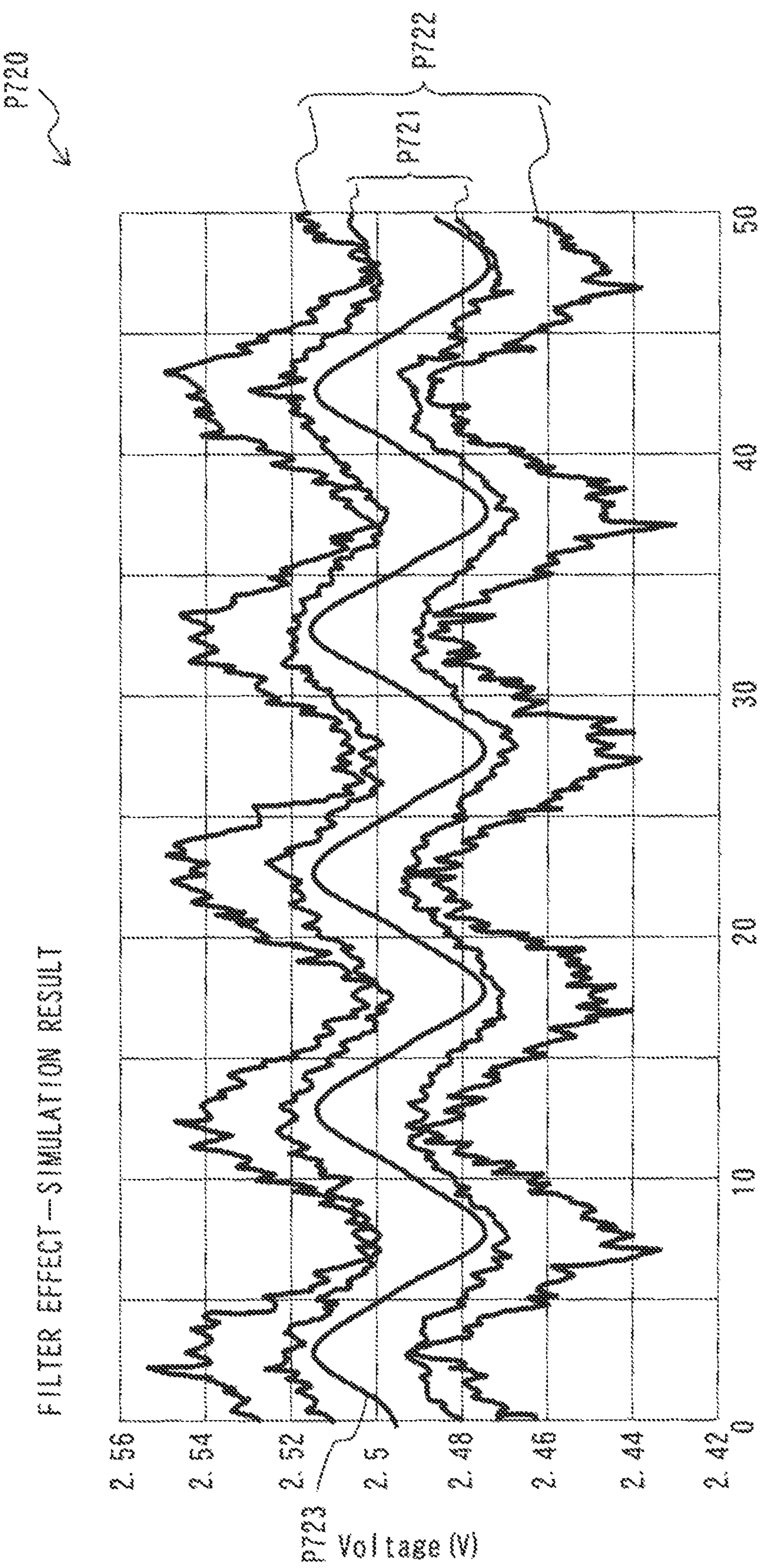
FIG. 70 is a display image diagram of a display screen used in a simulation method of the web simulator according to the first embodiment.

FIG. 70 shows a display example of a result graph displayed as a result of the filter effect analysis process of FIG. 43. When the "filter effect" button P535 is clicked on and the filter effect analysis process is executed, a filter effect result screen is displayed below the simulation screen P500. On the filter effect result screen, a plurality of result graphs are displayed as in the case of a transient analysis result, and a result graph P720 of FIG. 70 is displayed as one of those result graphs.

In the result graph P720, a sensor output signal P721 with noise, an amplifier output signal P722 generated by amplifying the sensor output signal P721 using an amplifier, and a filter output signal P723 generated by removing noise from the amplifier output signal P722 using a filter are displayed collectively (superimposed on one another). By displaying the sensor output signal P721 and the amplifier output signal P722 before applying the filter and the filter output signal P723 after applying the filter superimposed on one another, it is possible to easily compare the waveforms before and after the filter and to see the filter effect at a glance.

According to related art, the filter effect is seen using the frequency characteristics where the horizontal axis is a frequency axis, and thus the filter effect has not been easily visible. On the other hand, because the filter effect is displayed as shown in FIG. 70 in this embodiment, a user can immediately see the filter effect, and user-friendliness is enhanced.

Figure 71:
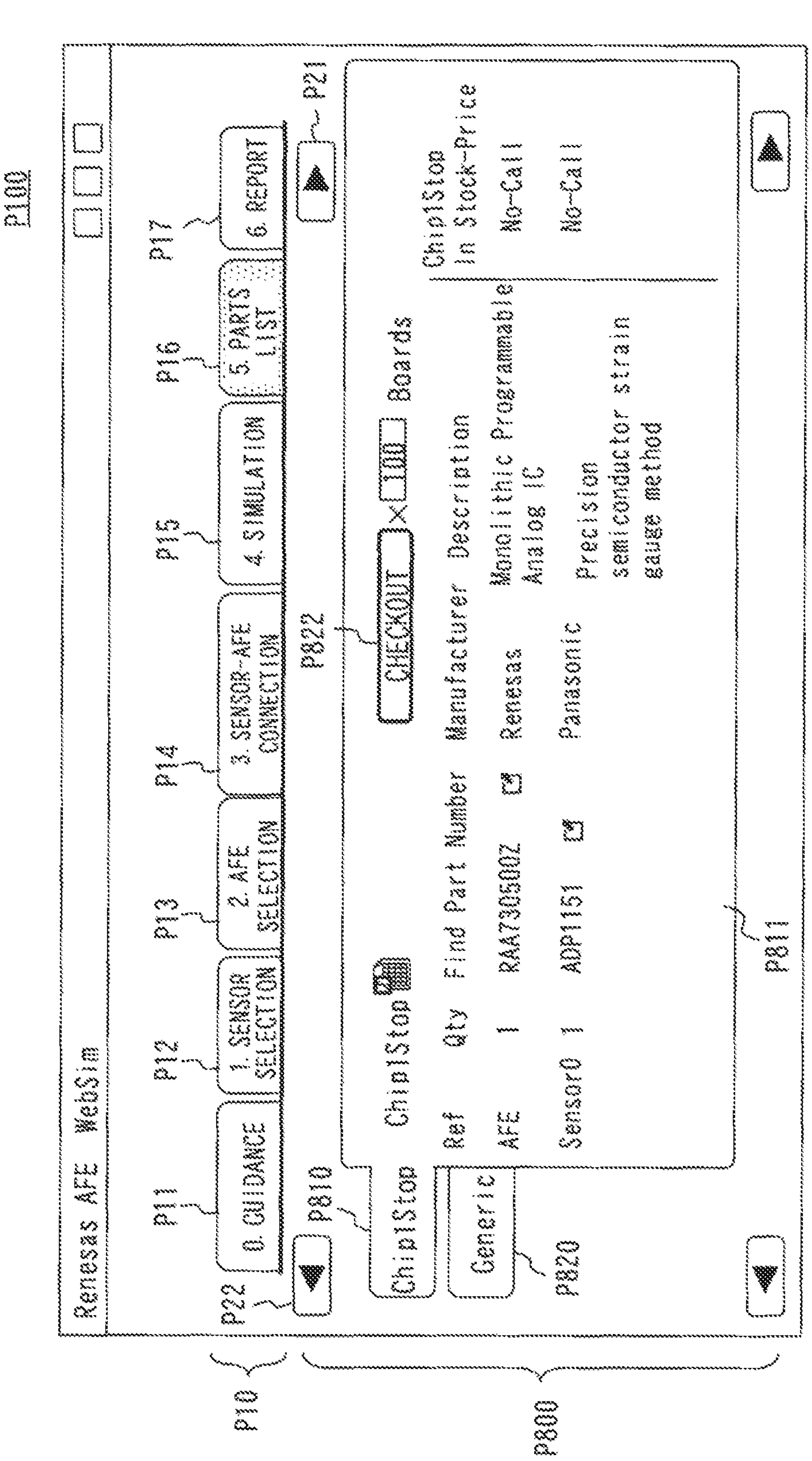
FIG. 71 is a display image diagram of a display screen used in a simulation method of the web simulator according to the first embodiment.

Then, the web simulator 4 displays a parts list screen on the sensor vendor terminal 5 (S110 of FIG. 31). FIG. 71 shows a display example of the parts list screen. As shown in FIG. 71, when the "parts list" tab P16 is selected on the web simulator screen P100, a parts list screen P800 is displayed.

On the parts list screen P800, tabs P810 and P820 for selecting a place from which a part is to be purchased are displayed. When a "Chip1Stop" tab P810 is selected, a parts list P811 is displayed. In the parts list P811, a list of sensors registered/updated by a sensor vendor and the semiconductor devices 1 selected by simulation is displayed. In the parts list P811, information about different parts is displayed in a plurality of fields. In FIG. 71, a part number (Ref), a part quantity (Qty), a part number (Find Part Number), a manufacturer (Manufacturer), a description (Description), and a price (In Stock-Price) are displayed for each of parts. A part can be purchased by clicking on a "CHECKOUT" button P822.

Then, the web simulator 4 displays a report screen on the sensor vendor terminal 5 (S112 of FIG. 31). FIGS. 72A to 72F show display examples of the report screen. Note that FIGS. 72A to 72F show the screen that is displayed continuously by dividing them. As shown in FIGS. 72A to 72F, when the "report" tab P17 is selected on the web simulator screen P100, a report screen P900 is displayed.

Figure 72A:
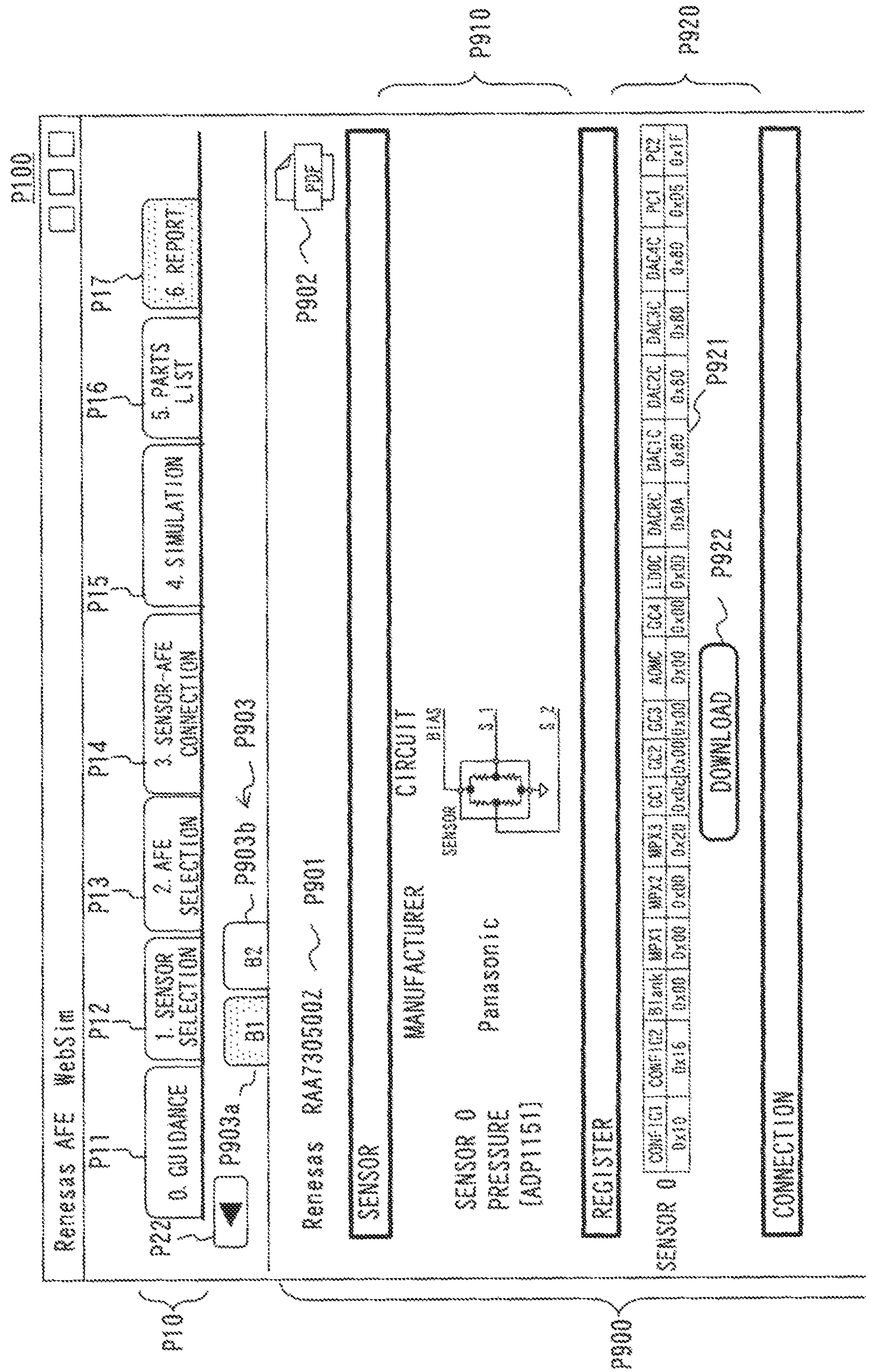
FIG. 72A is a display image diagram of a display screen used in a simulation method of the web simulator according to the first embodiment.
Figure 72B:
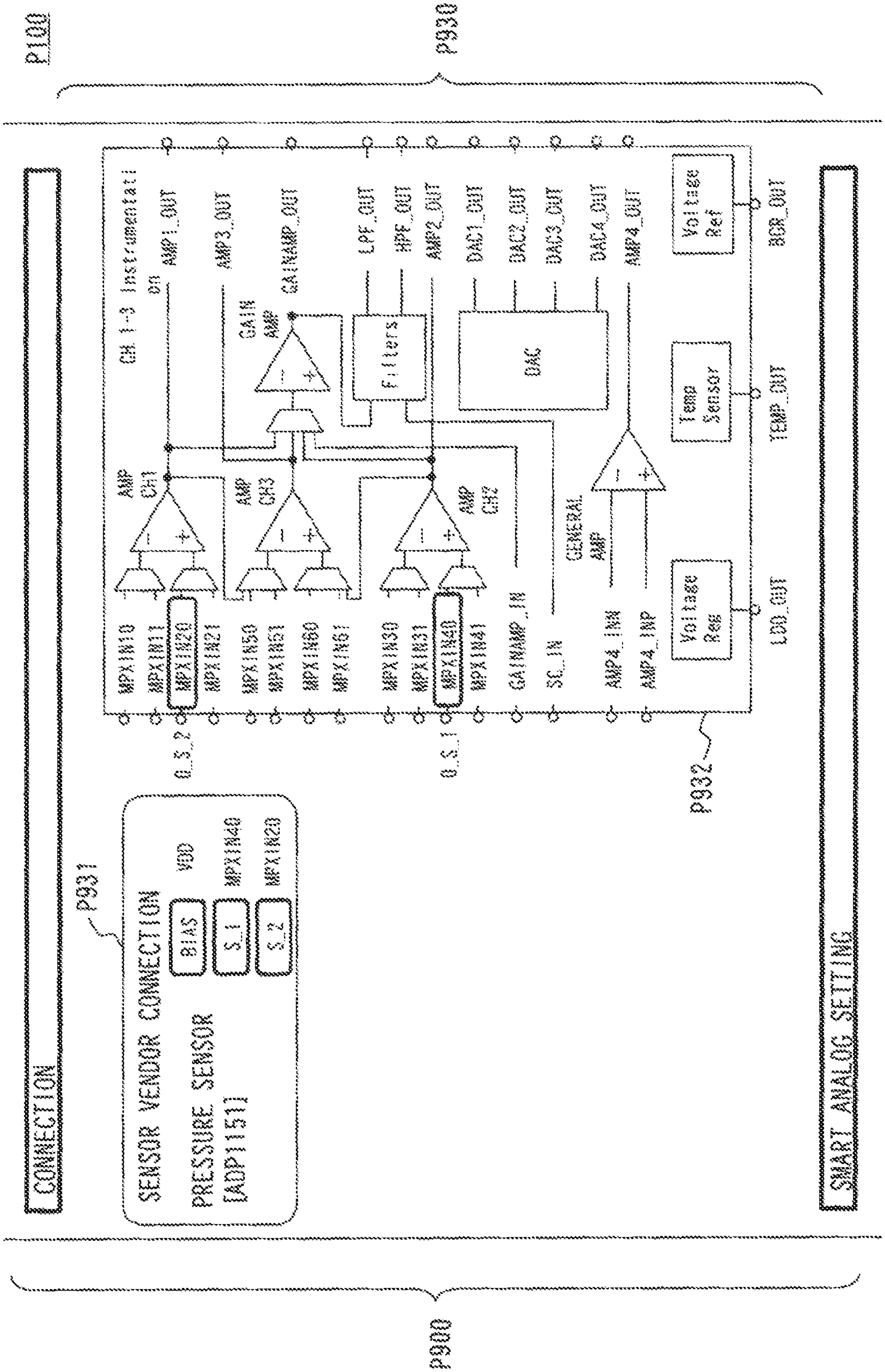
FIG. 72B is a display image diagram of a display screen used in a simulation method of the web simulator according to the first embodiment.
Figure 72C:
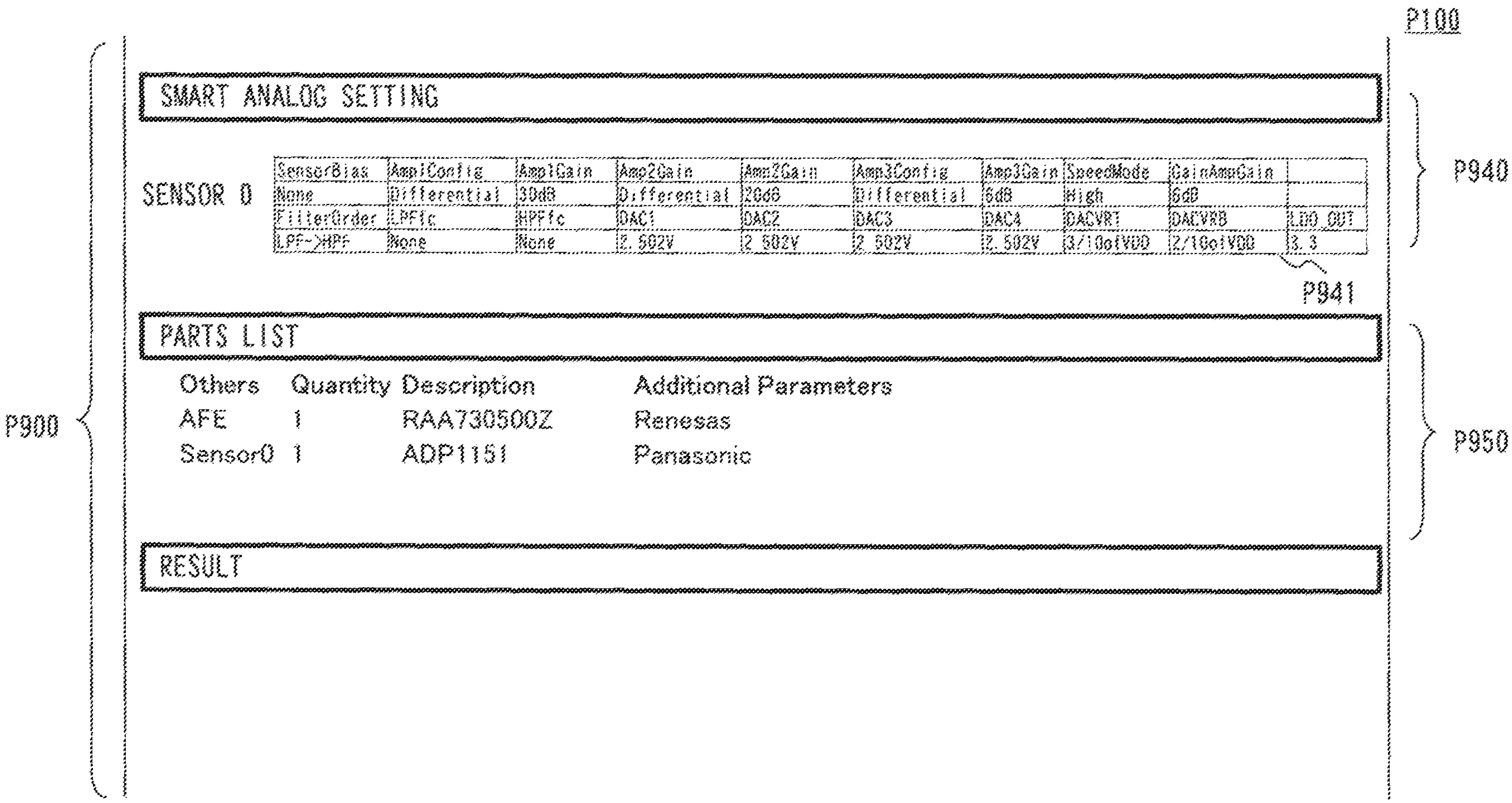
FIG. 72C is a display image diagram of a display screen used in a simulation method of the web simulator according to the first embodiment.

The report screen P900 has a bias circuit selection area P903 in its upper part. In the bias circuit selection area P903, tabs for selecting the bias circuit set by the sensor vendor on the bias circuit selection screen P250 are displayed. In FIG. 72A, a "bias circuit B1" tab P903*a* and a "bias circuit B2" tab P903*b* are displayed. When the "bias circuit B1" tab P903*a* is clicked on, a simulation result or the like for the configuration that connects the sensor and the bias circuit B1 with the semiconductor device 1 is displayed on the report screen P900. Further, when the "bias circuit B2" tab P903*b* is clicked on, a simulation result or the like for the configuration that connects the sensor and the bias circuit B2 with the semiconductor device 1 is displayed on the report screen P900.

On the report screen P900, a semiconductor device identification area P901 for identifying the semiconductor device used in the simulation is displayed below the bias circuit selection area P903. In the semiconductor device identification area P901, the part number of the semiconductor device 1 which is selected on the AFE selection screen and on which simulation is performed is displayed. In the example of FIG. 72A, the part number "RAA730500Z" of the selected semiconductor device 1 is displayed in the semiconductor device identification area P901.

Further, on the right of the semiconductor device identification area P901, a PDF icon P902 is displayed. When the PDF icon P902 is clicked on, a PDF file generated by saving the whole report screen P900 as a file in PDF format is downloaded to the sensor vendor terminal 5 (the user terminal 3). Specifically, all of the semiconductor device identification area P901, a sensor display area P910, a register display area P920, a connections display area P930, a smart analog display area P940, a parts list display area P950 and a result display area P960 displayed on the report screen P900 are contained in one PDF file and downloaded.

On the report screen P900, the sensor display area P910 is displayed below the semiconductor device identification area P901. In the sensor display area P910, the sensor type, the part number and the manufacturer of the sensor which has been registered/updated by the sensor vendor on the sensor selection screen and for which simulation has been performed are displayed, and further the bias circuit which has been registered/updated by the sensor vendor on the bias circuit selection screen and for which simulation has been performed is displayed for each sensor. In the example of FIG. 72A, the pressure sensor and the bias circuit that have been registered/updated by the sensor vendor are displayed in the sensor display area P910.

On the report screen P900, the register display area P920 is displayed below the sensor display area P910. In the register display area P920, register information P921 and a "download" button P922 are displayed for each sensor. When the "download" button P922 is clicked on, the register information displayed in the register information P921 is downloaded to the sensor vendor terminal 5 (the user terminal 3).

In the register information P921, register information corresponding to the configuration of the semiconductor device 1 which has been set on the simulation screen and for which simulation has been performed is displayed. The register information to be set to the register 181 of the semiconductor device 1 is generated based on the circuit information and parameters set as described in S111 of FIG. 31. Note that register information for automatic connection and register information for vendor recommended connection may be displayed.

On the report screen P900, the connections display area P930 is displayed below the register display area P920. In the connections display area P930, connections between the sensor and the semiconductor device 1 by the sensor vendor recommended connection which has been set by the sensor vendor on the sensor-AFE connection screen and for which simulation has been performed are displayed. In the connections display area P930, a connection selection frame P931 and a semiconductor device image P932 are displayed as in the sensor-AFE connection screen P400. Note that connections for automatic connection and connections for vendor recommended connection may be displayed.

On the report screen P900, the smart analog (semiconductor device) display area P940 is displayed below the connections display area P930. In the smart analog display area P940, setting information P941 of the semiconductor device 1 is displayed for each sensor.

In the setting information P941, setting information corresponding to the configuration of the semiconductor device 1 which has been set on the simulation screen and for which simulation has been performed is displayed. In the setting information P941, the set values of the parameters of the semiconductor device 1 that have been set on the simulation screen are displayed. Further, the setting information P941 and the register information P921 displayed in the above-described register display area correspond to each other, and the content set in the register information P921 can be seen in the setting information P941 as well. Note that setting information for automatic connection and setting information for vendor recommended connection may be displayed.

On the report screen P900, the parts list display area P950 is displayed below the smart analog display area P940. In the parts list display area P950, a parts list of the semiconductor device 1 and the sensor used in simulation is displayed just like the parts list screen. In the parts list display area P950, a part name (Others), a part quantity (Quantity), a part number (Description) and a manufacturer (Additional Parameters) are displayed as in the parts list screen P800.

Figure 72D:
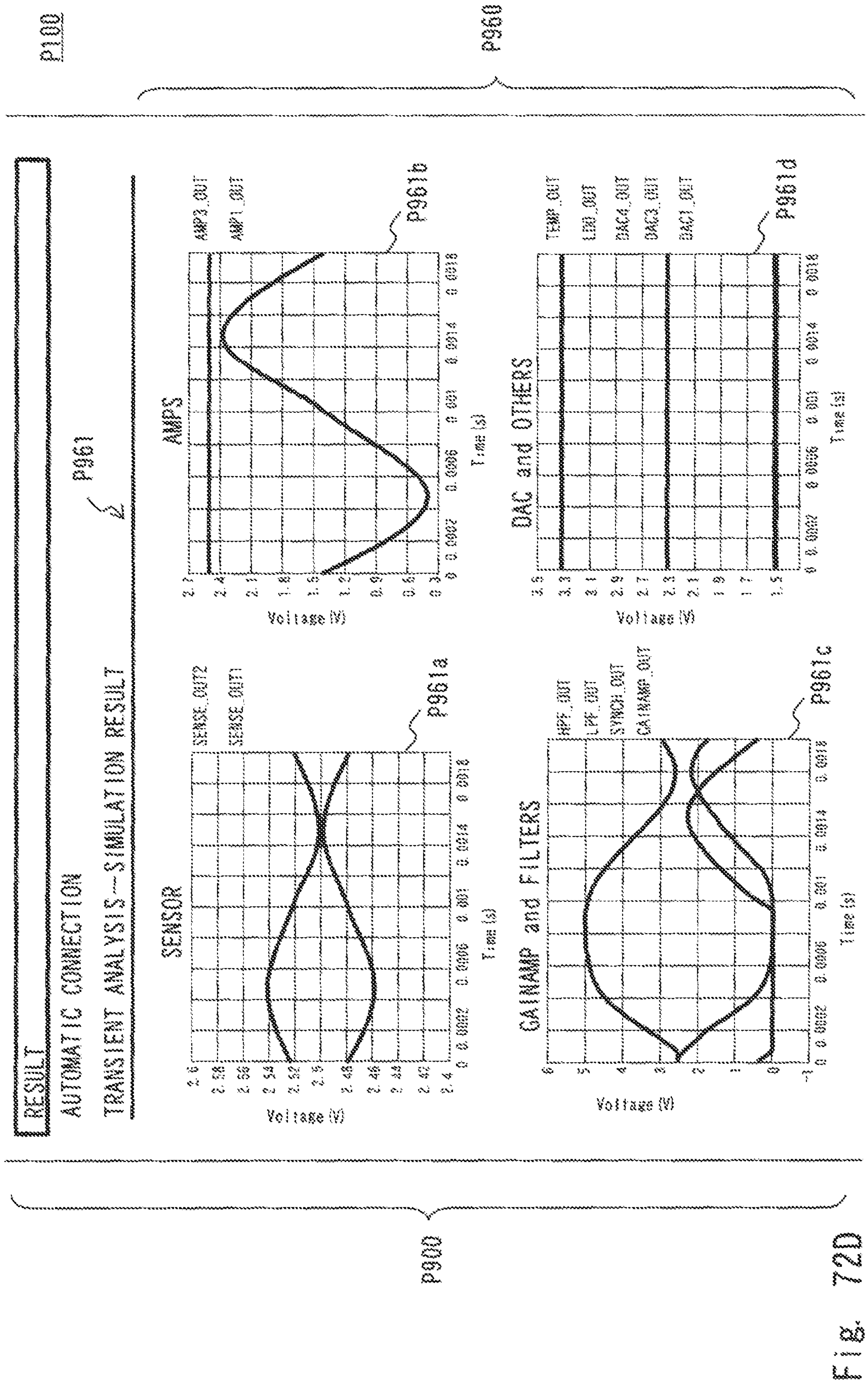
FIG. 72D is a display image diagram of a display screen used in a simulation method of the web simulator according to the first embodiment.
Figure 72E:
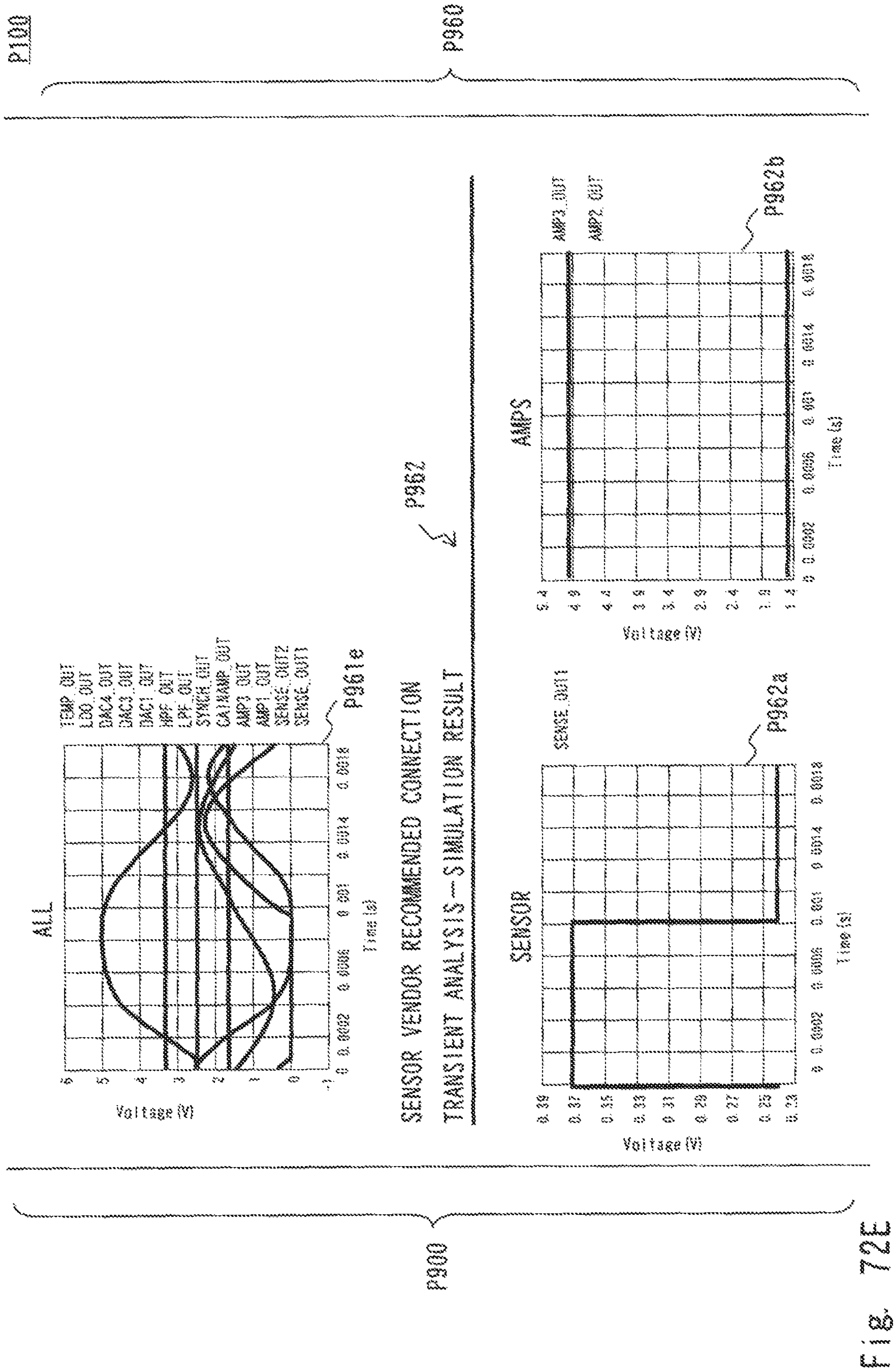
FIG. 72E is a display image diagram of a display screen used in a simulation method of the web simulator according to the first embodiment.
Figure 72F:
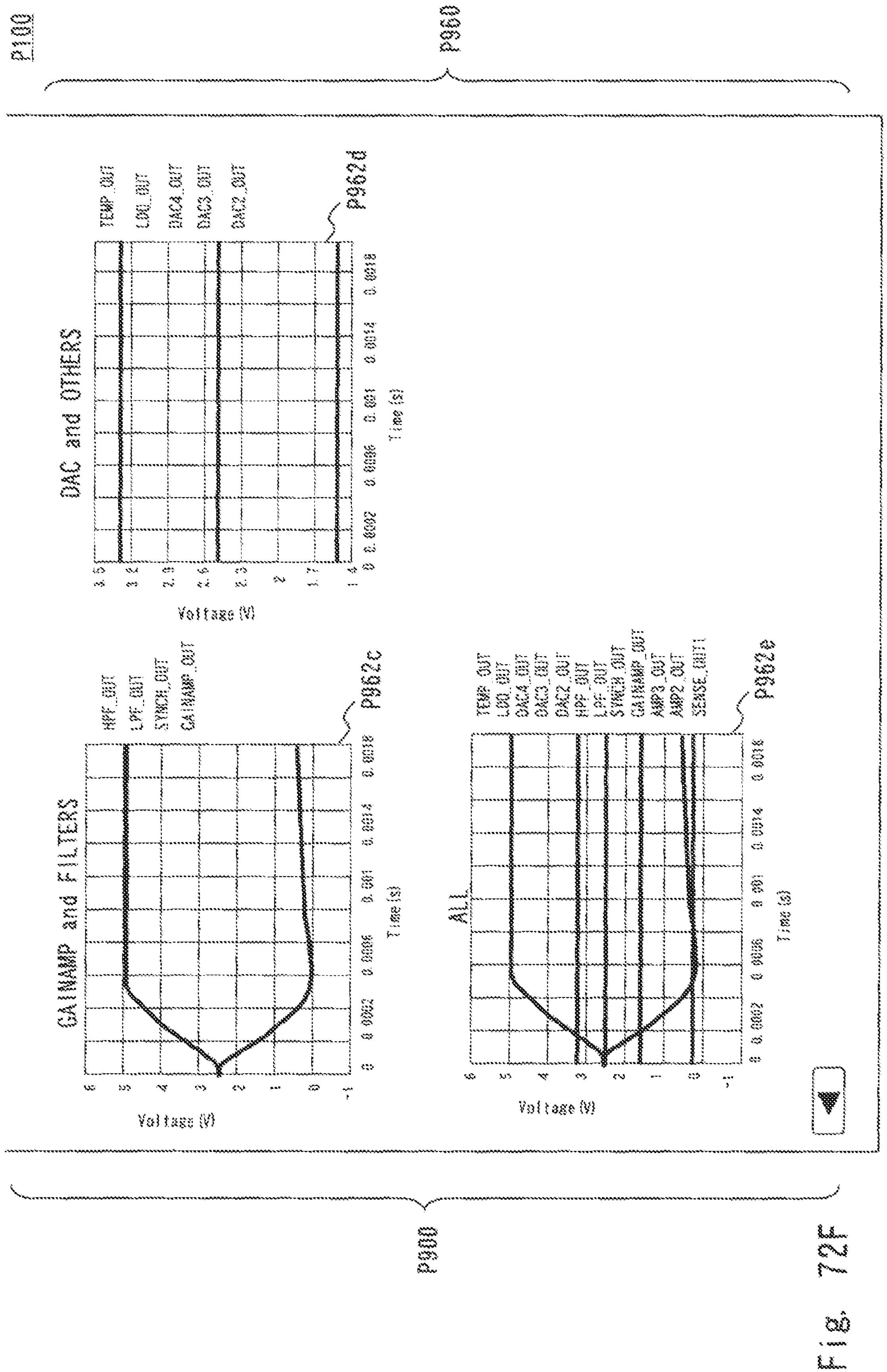
FIG. 72F is a display image diagram of a display screen used in a simulation method of the web simulator according to the first embodiment.

On the report screen P900, the result display area P960 is displayed below the parts list display area P950. In the result display area P960, a simulation result that is displayed as a result of performing simulation on the simulation screen is displayed. In FIGS. 72D to 72F, a transient analysis result P961 by automatic connection and a transient analysis result P962 by sensor vendor recommended connection are displayed as in FIGS. 68B to 68C and FIGS. 69B to 69C. In the transient analysis result P961, result graphs P961*a* to P961*e* are displayed just like the result graphs P701 to P705 in FIGS. 68B to 68C, and, in the transient analysis result P962, result graphs P962*a* to P962*e* are displayed just like the result graphs P711 to P715 in FIGS. 69B to 69C. The simulation operation by the sensor vendor thereby ends.

Operation Example 4

Operation Example of Registration of Sensor Information by a User

First, the web simulator 4 displays a login screen on the user terminal 3 (S101 in FIG. 31). The login screen P110, which is similar to the one shown in FIG. 45, is displayed on the user terminal 3, and a user enters an account name and a password. When authentication of the account is successful, the web simulator 4 displays the guidance screen, which is similar to the one shown in FIG. 46, on the user terminal 3 (S102 in FIG. 31). The web simulator 4 then displays the sensor selection screen, which is similar to the one shown in FIG. 47, on the user terminal 3 (S23 in FIG. 33), and the user selects a sensor type.

Figure 73:
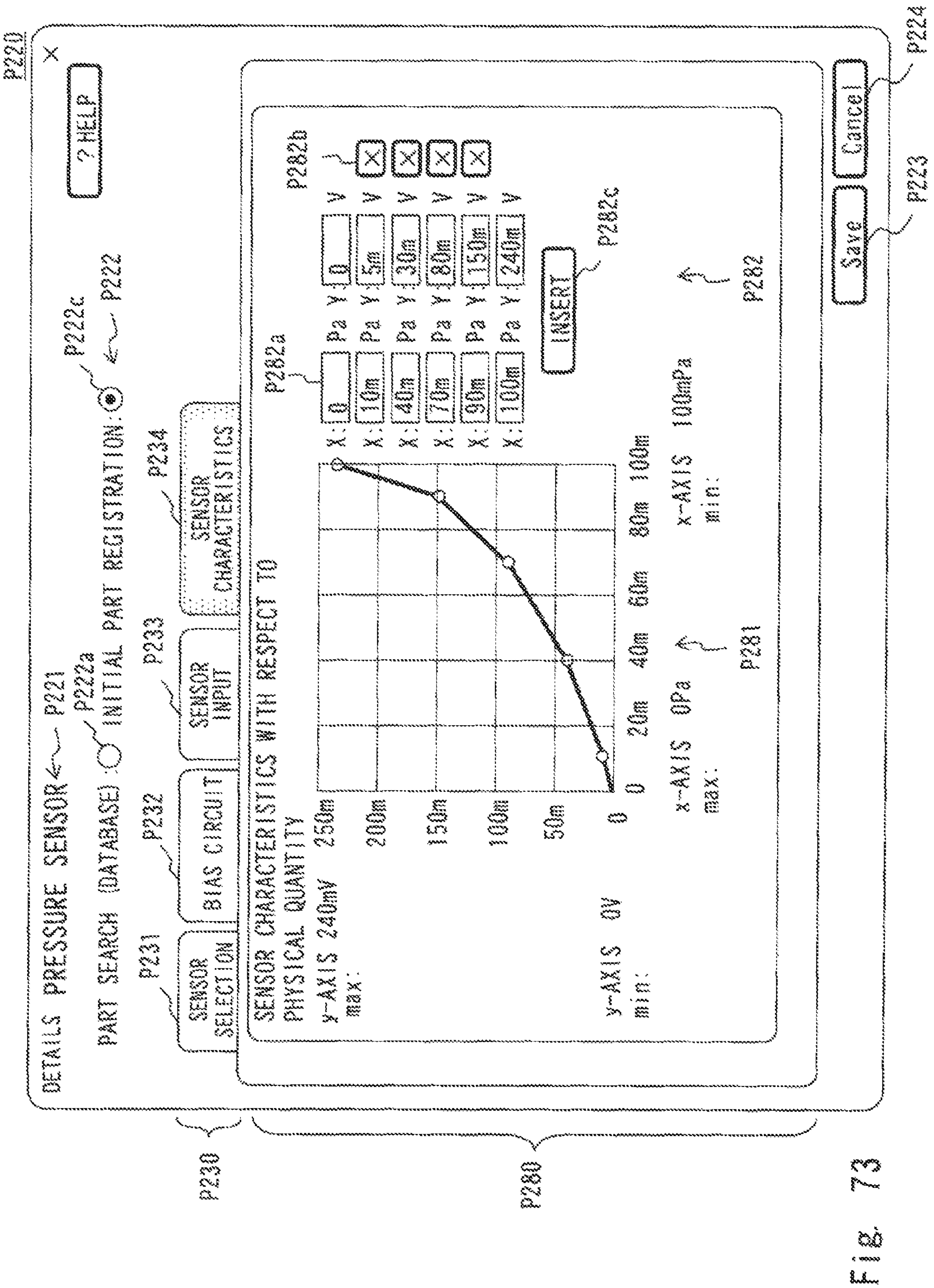
FIG. 73 is a display image diagram of a display screen used in a simulation method of the web simulator according to the first embodiment.

Next, the web simulator 4 displays the sensor characteristics screen on the user terminal 3 (S24 and S25 in FIG. 33). FIG. 73 shows a display example of the sensor characteristics screen. The sensor characteristics screen P280 of FIG. 73 shows the same screen display as that of FIG. 48 when a sensor vendor registers the sensor information, and an "unregistered/custom part" radio button P222*c* for a user to register a sensor in the sensor database 421 is displayed in place of the "initial part registration" radio button P222*b* in the part search/registration selection area P222.

When the "set details" button P21.3 is clicked on the sensor selection screen P200 of FIG. 47, and the "unregistered/custom part" radio button P222*c* is selected in the part search/registration selection area P222 or the "sensor selection" tab P231 tab is selected, the sensor characteristics screen P280 is displayed within the sensor details screen P220. Because the user is permissible to register and update the user's original sensor only, the characteristics of the user's original sensor can be input on the sensor characteristics screen P280.

On the sensor characteristics screen P280, the characteristics graph P281 and the characteristics plot entry area P282 are displayed as in FIG. 48, and the user sets the characteristics. When the "save" button P223 is clicked on in the set state, the characteristics of the sensor are registered in the sensor database 421. At this time, the user of the account ID is registered in association with the sensor.

Figure 74:
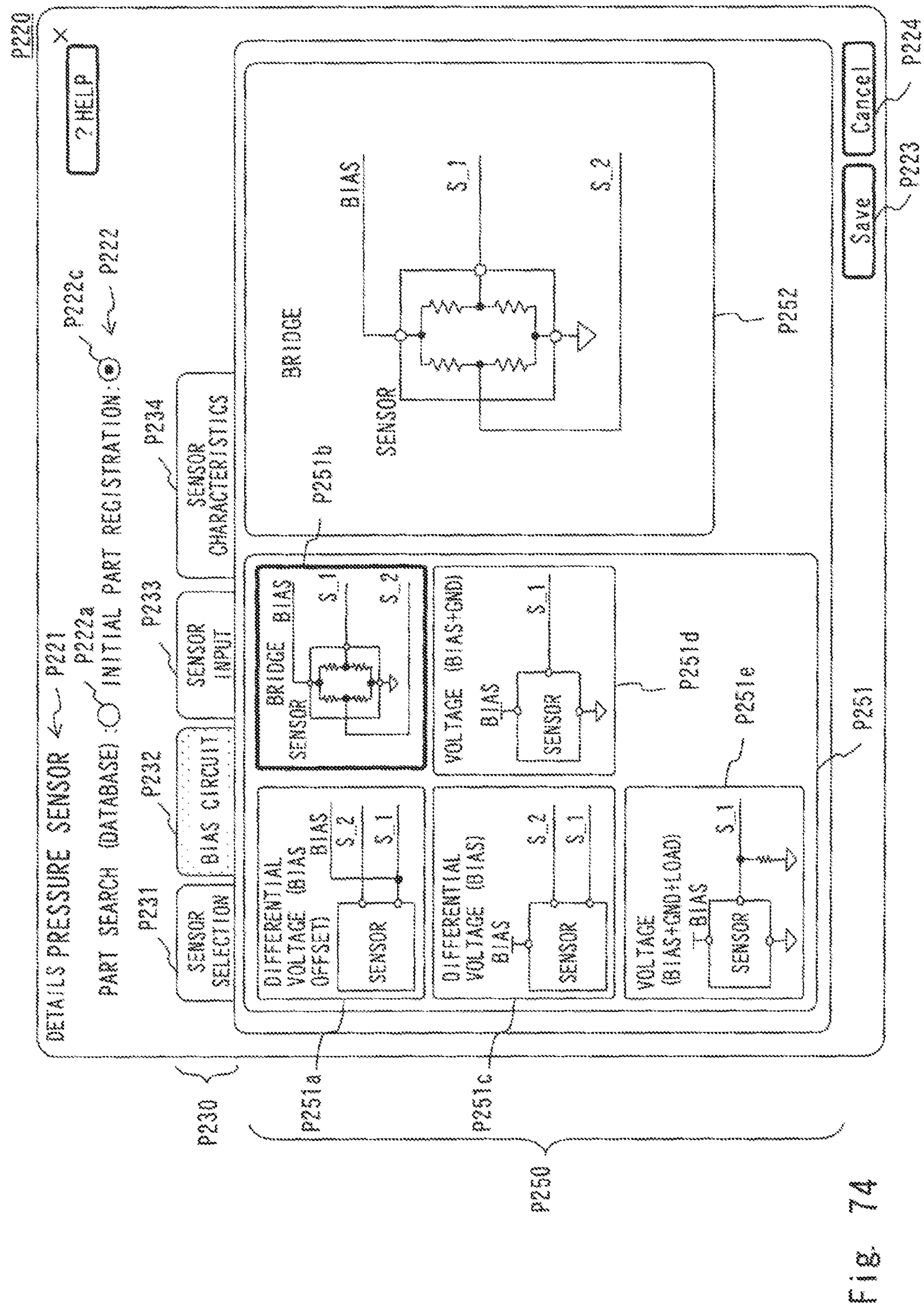
FIG. 74 is a display image diagram of a display screen used in a simulation method of the web simulator according to the first embodiment.

Then, the web simulator 4 displays the bias circuit selection screen on the user terminal 3 (S26 in FIG. 33). FIG. 74 shows a display example of the bias circuit selection screen. The bias circuit selection screen P250 of FIG. 74 shows the same screen display as that of FIG. 49 when a sensor vendor registers the sensor information, and an "unregistered/custom part" radio button P222*c* for a user to register a sensor in the sensor database 421 is displayed in place of the "initial part registration" radio button P222*b* in the part search/registration selection area P222. In this example, the "unregistered/custom part" radio button P222*c* is selected.

On the bias circuit selection screen P250 of FIG. 74, the bias circuits corresponding to the sensor type and suitable for the selected sensor are displayed in the circuit list P251 as described in S26. Note that, when it is desired to select another bias circuit, not limited to the sensor type, all bias circuits may be displayed. In the case where a user sets a bias circuit, the user can select only one bias circuit to be registered from the circuit list P251 in order to select a circuit for simulation.

In the example of FIG. 74, the bias circuits P251*a* to P251*e* are displayed in the circuit list P251, and a user selects the bias circuit P251*b*, and then the same circuit image as the bias circuit P251*b* is displayed in the selected circuit P252. When the "save" button P223 is clicked on in this state, the selected bias circuit is stored in the simulation bias circuit data 422*b* of the sensor bias circuit database 422 (S27 in FIG. 33). At this time, the user of the account ID is registered in association with the bias circuit.

Figure 75:
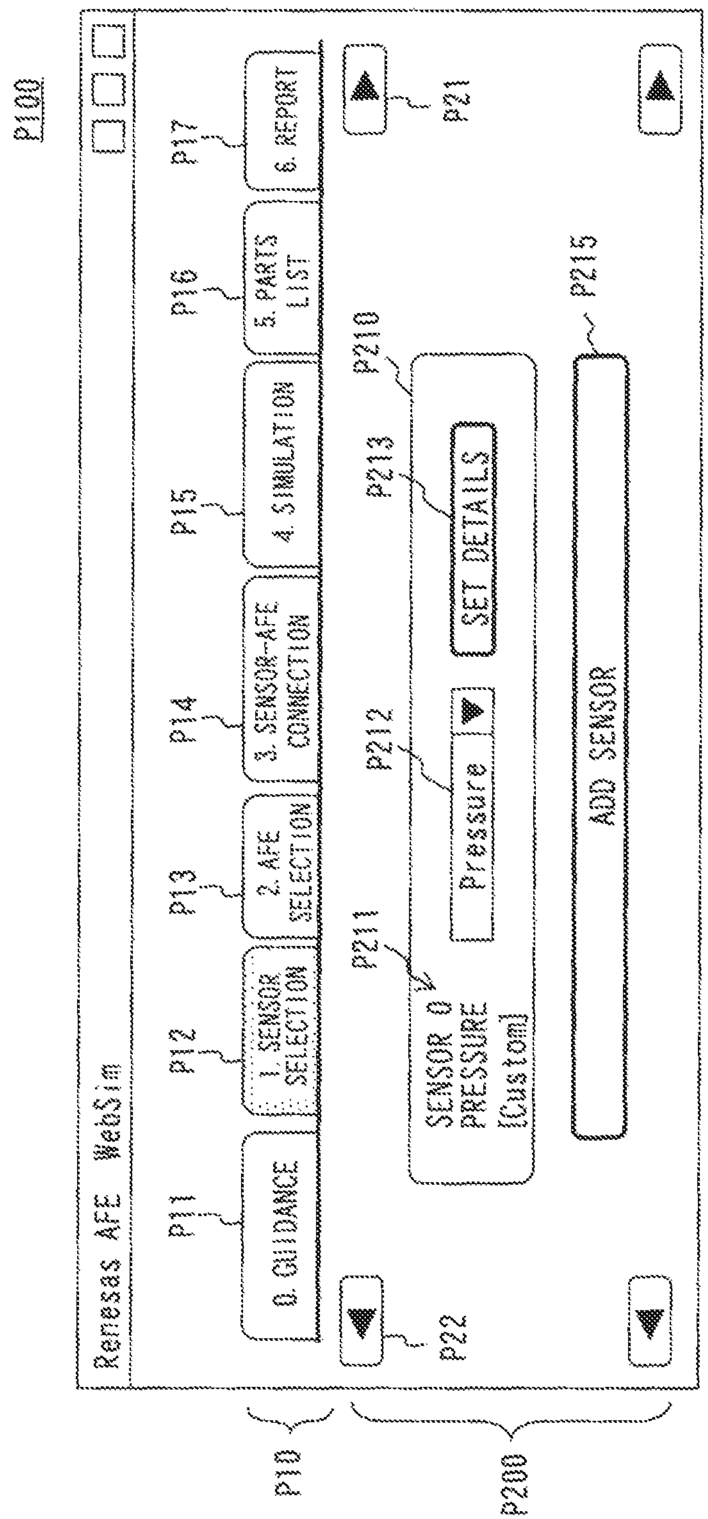
FIG. 75 is a display image diagram of a display screen used in a simulation method of the web simulator according to the first embodiment.

FIG. 75 shows a display example of the sensor selection screen P200 after the user has registered the sensor. As shown in FIG. 75, when the user sets and registers the characteristics of the sensor and the bias circuit, a predetermined registered name ("Custom" etc.) is displayed in the sensor name display area P211 of the sensor selection frame P210. Note that a user may edit the sensor name as in FIG. 54 when a sensor vendor registers the sensor information.

Operation Example 5

Operation Example of Simulation by a User

In the operation example 5, a user performs simulation by connecting the sensor and the bias circuit registered or updated by the sensor vendor in the above-described operation example 1 or the operation example 2, or the sensor and the bias circuit registered by the user in the above-described operation example 4 to the semiconductor device 1. Just like the operation example 4, the web simulator 4 displays the login screen P110 of FIG. 45 (S101 in FIG. 31), displays the guidance screen P101 of FIG. 46 (S102 in FIG. 31), and displays the sensor selection screen P200 of FIG. 47 (S23 in FIG. 33), respectively on the user terminal 3.

Figure 76:
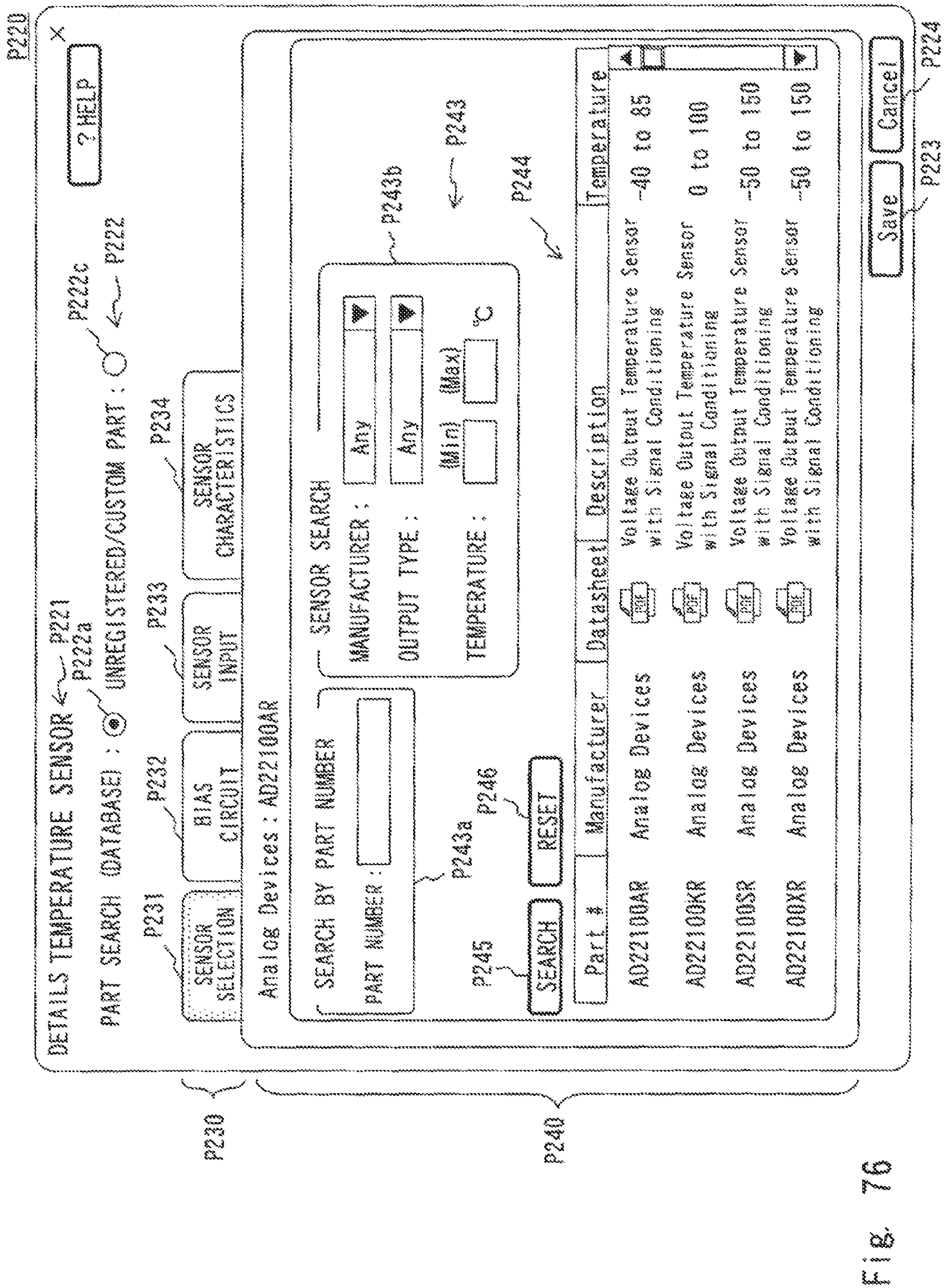
FIG. 76 is a display image diagram of a display screen used in a simulation method of the web simulator according to the first embodiment.

Then, the web simulator 4 displays the sensor list screen P240 on the user terminal 3 (S24 and S28 in FIG. 33). FIG. 76 shows a display example of the sensor list screen P240. The sensor list screen P240 of FIG. 76 shows the same screen display as that of FIG. 55 or 56 when a sensor vendor registers the sensor information. Specifically, when the "set details" button P213 is clicked on the sensor selection screen P200, and the "part search" radio button P222*a* is selected in the part search/registration selection area P222 or the "sensor selection" tab P231 is selected, the sensor list screen P240 is displayed within the sensor details screen P220.

The sensor list P244 is displayed according to the narrowing criteria P243 in the "search by part number" area P243*a* and the "sensor search" area P243*b*. As described above in S28, all of the sensors of the sensor type selected by the user are displayed on the sensor list P244.

While FIGS. 55 and 56 show display examples in the case of selecting a pressure sensor as the sensor type, FIG. 76 shows a display example in the case of selecting a temperature sensor as the sensor type. In FIG. 76, the temperature sensor is displayed in the sensor type display area P221, and narrowing criteria (search criteria) in accordance with the temperature sensor are displayed in the "sensor search" area P243*b*. In FIG. 76, a "manufacturer" pulldown menu, an "output type" pulldown menu, and a "temperature" entry box are displayed. In the "temperature" entry box, the minimum value and the maximum value of a temperature that can be detected by the temperature sensor are set to make a search for a sensor using the characteristics of the temperature sensor.

In the sensor list P244, a part number (Part #), a manufacturer, a datasheet, a detailed description (Description), and temperature characteristics (Temperature) are displayed for each sensor, corresponding to the temperature sensor. In the detailed description field, the output type such as a voltage output or a current output is displayed, and in the temperature characteristics field, the minimum value and the maximum value of a detection temperature are displayed.

For other sensors as well, display and search in accordance with the sensor type are performed on the sensor list screen P240 in the same manner as shown in FIG. 76. For example, in the case where the sensor type is a phototransistor, a dark current ID, a peak sensitivity wavelength λp, a detection range and the like are displayed in the narrowing criteria (search criteria) or the sensor list display field to be used for search.

The user clicks to select a sensor to be used from the sensor list P244 based on the displayed information. When the user selects a sensor from the sensor list P244, the circuit information of the sensor is stored in the user circuit setting file 426*c* of the circuit information storage unit 426.

Figure 77:
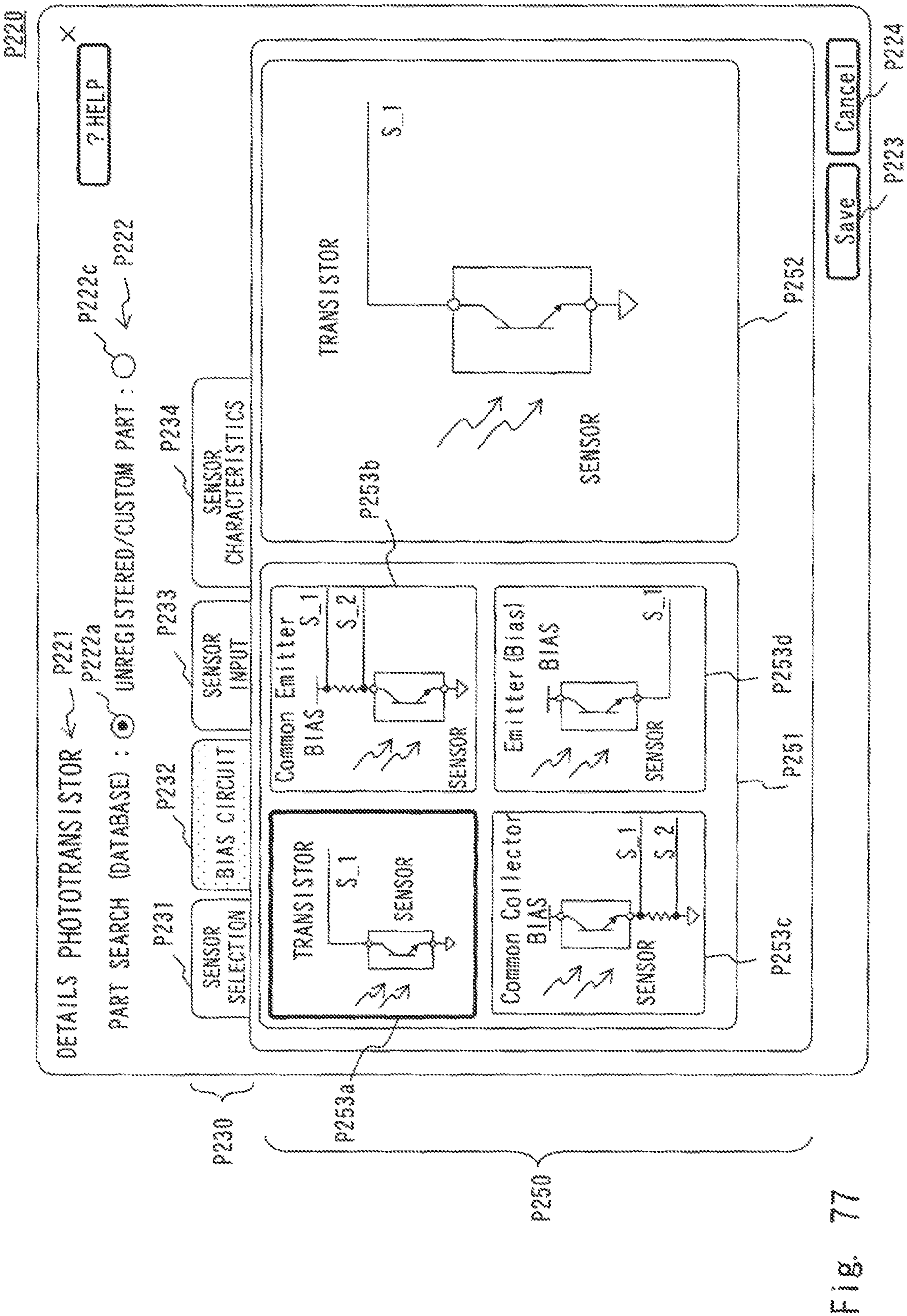
FIG. 77 is a display image diagram of a display screen used in a simulation method of the web simulator according to the first embodiment.

Then, the web simulator 4 displays the bias circuit selection screen on the user terminal 3 (S30 in FIG. 33). FIG. 77 shows a display example of the bias circuit selection screen. The bias circuit selection screen P250 of FIG. 77 shows the same screen display as that of FIG. 74 when a user registers the sensor information. On the bias circuit selection screen P250, the bias circuits registered by a sensor vendor and suitable for the selected sensor are displayed as described in S30 of FIG. 33. By displaying the bias circuits in accordance with the sensor, it is possible to select the most suitable bias circuit with a simple operation.

On the bias circuit selection screen P250, the circuit list P251 and the selected circuit P252 are displayed. The circuit images of all bias circuits that can be used for the sensor are displayed in the circuit list P251, and the circuit image of a bias circuit selected by a user in the circuit list P251 is displayed in the selected circuit P252.

FIG. 77 shows a display example of the bias circuit selection screen P250 in the case where a phototransistor is selected as the sensor, and bias circuits P253*a* to P253*d* are displayed in the circuit list P251 as bias circuits suitable for the phototransistor. It shows a display example in the case where a sensor vendor has registered the bias circuits P253*a* to P253*d* in the simulation bias circuit data 422*b*. A user selects the bias circuit P253*a*, and the same circuit image as the bias circuit P253*a* is displayed in the selected circuit P252. The circuit information of the selected bias circuit is stored in the user circuit setting file 426*c* of the circuit information storage unit 426 as described in S30 of FIG. 33.

By displaying a plurality of bias circuits in accordance with the sensor on the bias circuit selection screen P250, the most suitable bias circuit can be selected according to the application and the environment in which the sensor is used. As one example, the characteristics of each of the bias circuits that can be selected in FIG. 77 are described. The bias circuits P253*b* and P253*c* are bias circuits that are suitable when connecting a current output sensor converted into voltage output, and the bias circuits P253*a* and P253*d* are bias circuits that are suitable when connecting a current output sensor as current output without conversion.

The bias circuit P253*c* is a circuit that supplies a bias to the current output sensor with a common collector. In the bias circuit P253*c*, a bias power is supplied to the collector of the phototransistor, and the emitter is grounded through a resistor. Both ends of the resistor connected to the emitter are the sensor output terminals, which are connected to the input terminal of the semiconductor device 1. Because the bias circuit P253*c* is shown as an example that supplies a bias from an external power supply and produces a voltage based on illuminance, it is preferred to use a non-inverting amplifier as the configuration of the configurable amplifier 110 that is connected to the sensor. Accordingly, when the bias circuit P253*c* is selected, the configuration of the configurable amplifier 110 is automatically set to a non-inverting amplifier, so that the bias circuit P253*c* and the non-inverting amplifier are connected to each other. Because the bias circuit P253*c* outputs a signal with a low voltage at low illuminance level, it is the most suitable for an application with low illuminance level.

The bias circuit P253*b* is a circuit that supplies a bias to the current output sensor with a common emitter. In the bias circuit P253*b*, the emitter of the phototransistor is grounded, and the collector is connected to a bias power supply through a resistor. Both ends of the resistor connected to the collector serve as the sensor output terminals, which are connected to the input terminal of the semiconductor device 1. Because the bias circuit P253*b* is shown an example that supplies a bias from an external power supply and produces a voltage based on illuminance, it is preferred to use a non-inverting amplifier as the configuration of the configurable amplifier 110 that is connected to the sensor. Accordingly, when the bias circuit P253*b* is selected, the configuration of the configurable amplifier 110 is automatically set to a non-inverting amplifier, so that the bias circuit P253*b* and the non-inverting amplifier are connected to each other. Because the bias circuit P253*b* outputs a signal with a low voltage at high illuminance level, it is the most suitable for an application with high illuminance level.

The bias circuit P253*a* is a circuit that supplies a bias to the collector for the current output sensor. In the bias circuit P253*a*, the collector of the phototransistor serves as the sensor output terminal, which is connected to the input terminal of the semiconductor device 1, and the emitter is grounded. Because the bias circuit P253*a* is shown as an example that does not supply a bias externally and produces a current based on illuminance, it is preferred to use an IV amplifier as the configuration of the configurable amplifier 110 that is connected to the sensor. Accordingly, when the bias circuit P253*a* is selected, the configuration of the configurable amplifier 110 is automatically set to an IV amplifier, so that the bias circuit P253*a* and the IV amplifier are connected to each other. In the bias circuit P253*a*, the output of the operational amplifier of the configurable amplifier 110 at low illuminance level substantially equals the reference voltage of the operational amplifier, and the voltage of the operational amplifier increases with an increase in illuminance level. Thus, the bias circuit P253*a* is the most suitable for an application with low illuminance level.

The bias circuit P253*d* is a circuit that supplies a bias to the collector of the phototransistor, and the emitter serves as the sensor output terminal, which is connected to the input terminal of the semiconductor device 1. Because the bias circuit P253*d* is shown as an example that does not supply a bias externally and produces a current based on illuminance, it is preferred to use an IV amplifier as the configuration of the configurable amplifier 110 that is connected to the sensor. Accordingly, when the bias circuit P253*d* is selected, the configuration of the configurable amplifier 110 is automatically set to an IV amplifier, so that the bias circuit P253*d* and the IV amplifier are connected to each other. In the bias circuit P253*d*, the voltage of the operational amplifier of the configurable amplifier 110 at low illuminance level substantially equals the reference voltage of the operational amplifier, and the voltage of the operational amplifier decreases with an increase in illuminance level. Thus, the bias circuit P253*d* is the most suitable for an application with high illuminance level.

Figure 78:
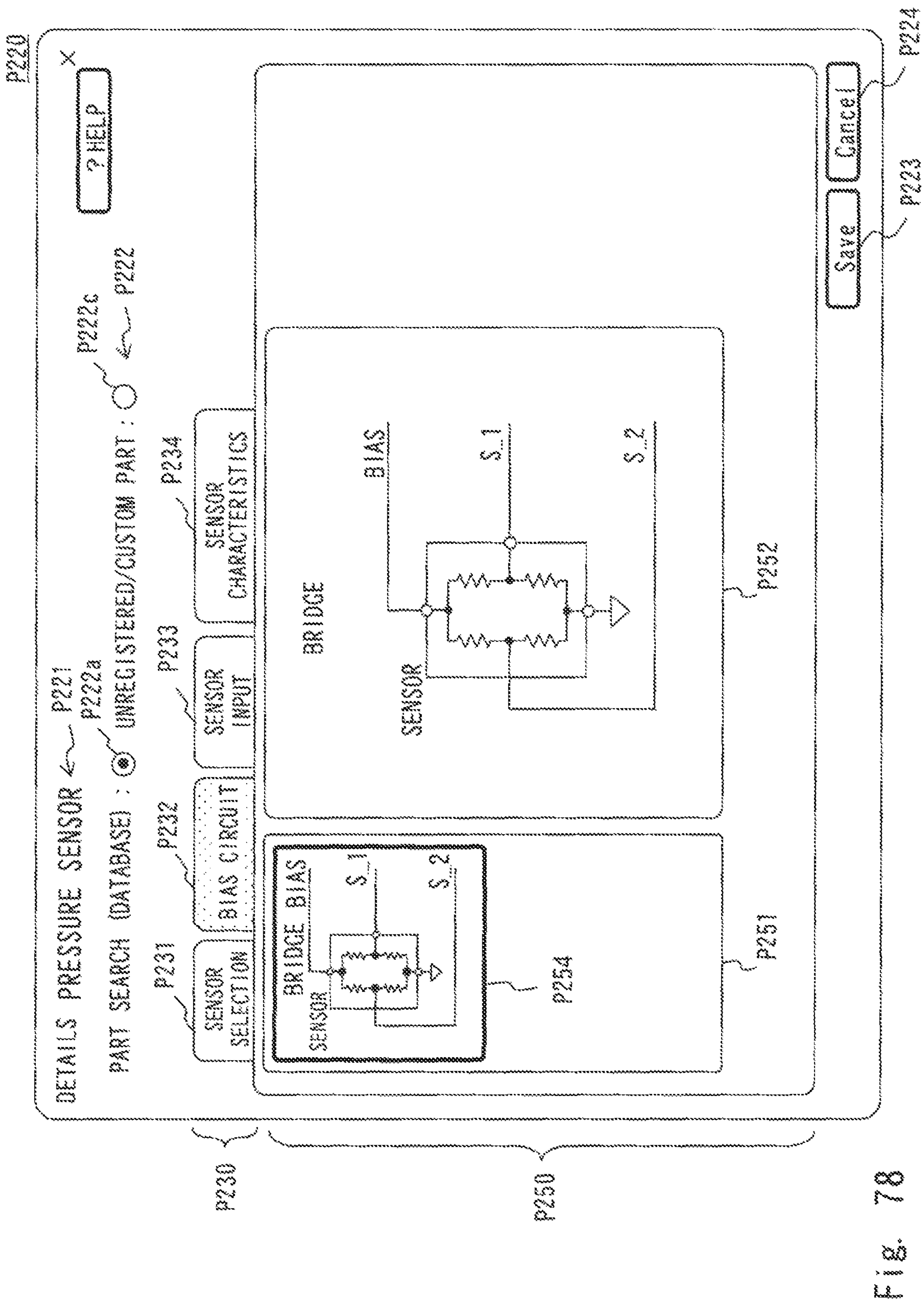
FIG. 78 is a display image diagram of a display screen used in a simulation method of the web simulator according to the first embodiment.

FIG. 78 shows another example of the bias circuit selection screen P250 of FIG. 77. FIG. 78 shows a display example in the case where a Wheatstone bridge-type pressure sensor is selected as the sensor, and one bias circuit P254 is displayed in the circuit list P251 as a bias circuit suitable for the pressure sensor. Thus, it is a display example in the case where a sensor vendor registers the bias circuit P254 in the simulation bias circuit data 422*b*. Because only one bias circuit P254 is displayed in the circuit list P251, the bias circuit P254 is displayed in the selected circuit P252.

Figure 79:
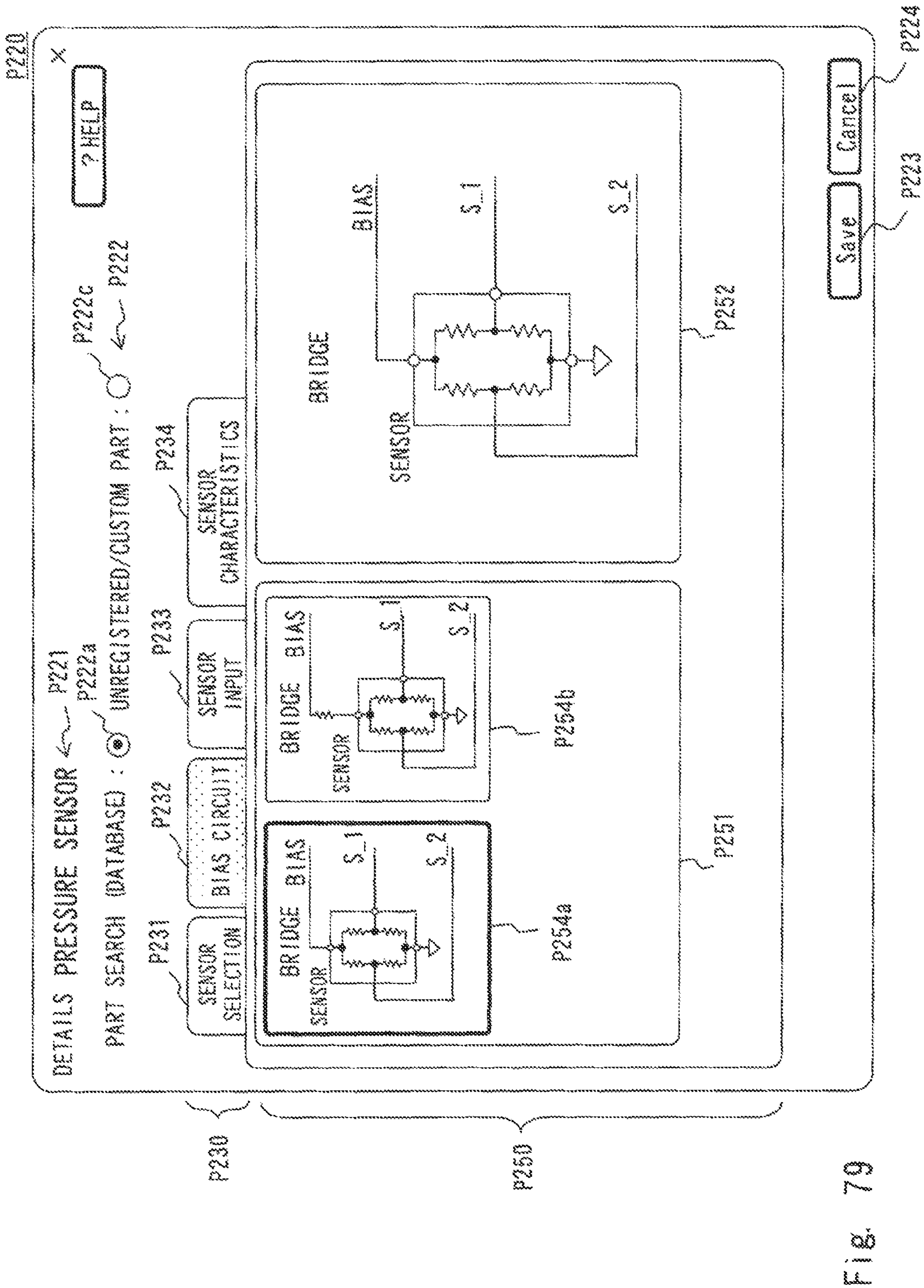
FIG. 79 is a display image diagram of a display screen used in a simulation method of the web simulator according to the first embodiment.

Further, as shown in FIG. 79, another bias circuit may be displayed and selected in addition to the bias circuit P254 of FIG. 78. In the example of FIG. 79, the bias circuits P254*a* and P254*b* are displayed in the circuit list P251 as a bias circuit for a Wheatstone bridge-type pressure sensor, and the selected bias circuit 2254*a* is displayed in the selected circuit 2252 on the bias circuit selection screen P250. Thus, it is a display example in the case where a sensor vendor registers the bias circuits P254*a* and P254*b* in the simulation bias circuit data 422*b*.

The bias circuit P254*a* is a circuit that directly supplies a bias power to the voltage output type pressure sensor. In the bias circuit P254*a*, a bias power is supplied to the upper end of a Wheatstone bridge, which is a pressure sensor, the lower end of the Wheatstone bridge is grounded, and the right and left ends of the Wheatstone bridge serve as the sensor output terminals, which are connected to the input terminal of the semiconductor device 1. Because the bias circuit 254*a* is shown as an example that supplies a bias from an external power supply and produces a voltage based on pressure, it is preferred to use an instrumentation amplifier as the configuration of the configurable amplifier 110 that is connected to the sensor. Accordingly, when the bias circuit P254*a* is selected, the configuration of the configurable amplifier 110 is automatically set to an instrumentation amplifier, so that the bias circuit P254*a* and the instrumentation amplifier are connected to each other.

The bias circuit P254*b* is a circuit that supplies a bias power to the voltage output type pressure sensor through a resistor. In the bias circuit P254*b*, a bias power is supplied to the upper end of a Wheatstone bridge, which is a pressure sensor, through the resistor, the lower end of the Wheatstone bridge is grounded, and the right and left ends of the Wheatstone bridge serve as the sensor output terminals, which are connected to the input terminal of the semiconductor device 1. Because the bias circuit P254*b* is shown as an example that supplies a bias from an external power supply and produces a voltage based on pressure, it is preferred to use an instrumentation amplifier as the configuration of the configurable amplifier 110 that is connected to the sensor. Accordingly, when the bias circuit P2540 is selected, the configuration of the configurable amplifier 110 is automatically set to an instrumentation amplifier, so that the bias circuit P254*b* and the instrumentation amplifier are connected to each other.

Figure 80:
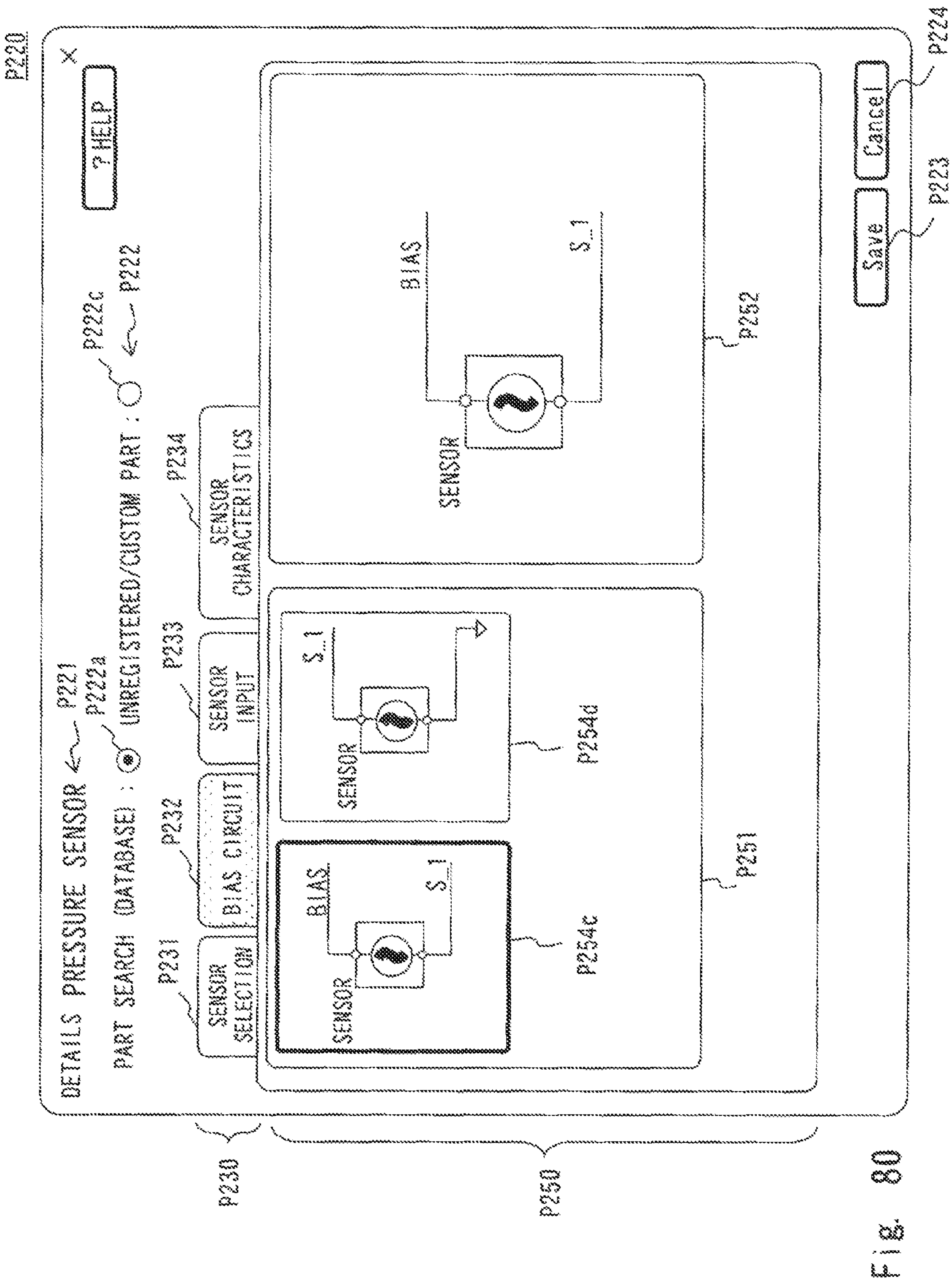
FIG. 80 is a display image diagram of a display screen used in a simulation method of the web simulator according to the first embodiment.

FIG. 80 shows another example of the bias circuit selection screen P250 of FIG. 77. FIG. 80 shows a display example in the case where a current transducer-type pressure sensor is selected as the sensor, and bias circuits 254*c* and P254*d* are displayed in the circuit list P251 as a bias circuit suitable for the pressure sensor. Thus, it is a display example in the case where a sensor vendor registers the bias circuits P254*c* and P254*d* in the simulation bias circuit data 422*b*. The selected bias circuit P254*c* is displayed in the selected circuit P252.

The bias circuit P254*c* is a circuit that produces a current as a detection signal from the current output pressure sensor. In the bias circuit P254*c*, a bias power is supplied to one end of the pressure sensor, and the other end of the pressure sensor serves as the sensor output terminal, which is connected to the input terminal of the semiconductor device 1. Because the bias circuit P254*c* is shown as an example that does not supply a bias externally and produces a current as an output signal, it is preferred to use an IV amplifier as the configuration of the configurable amplifier 110 that is connected to the sensor. Accordingly, when the bias circuit P254*c* is selected, the configuration of the configurable amplifier 110 is automatically set to an IV amplifier, so that the bias circuit P254*c* and the IV amplifier are connected to each other.

The bias circuit P254*d* is a circuit that draws a current as a detection signal into the current output pressure sensor. In the bias circuit P254*d*, one end of the pressure sensor serves as the sensor output terminal, which is connected to the input terminal of the semiconductor device 1, and the other end is grounded. Because the bias circuit P254*d* is shown as an example that does not supply a bias externally and produces a current as an output signal, it is preferred to use an IV amplifier as the configuration of the configurable amplifier 110 that is connected to the sensor. Accordingly, when the bias circuit P254*d* is selected, the configuration of the configurable amplifier 110 is automatically set to an IV amplifier, so that the bias circuit P254*d* and the IV amplifier are connected to each other.

Figure 81:
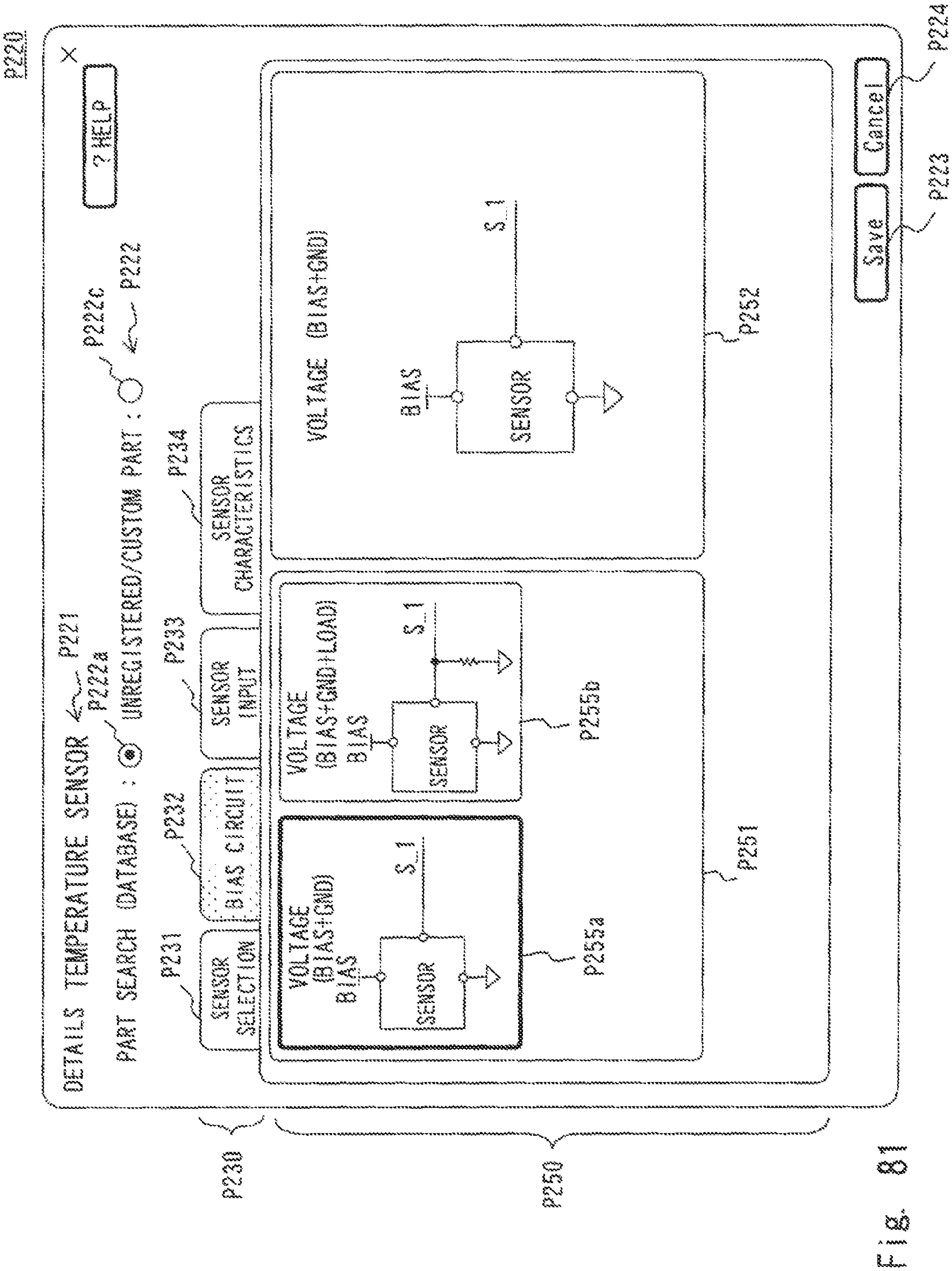
FIG. 81 is a display image diagram of a display screen used in a simulation method of the web simulator according to the first embodiment.

FIG. 81 shows another example of the bias circuit selection screen P250 of FIG. 77. FIG. 81 shows a display example in the case where a temperature sensor is selected as the sensor, and bias circuits P255*a* and P255*b* are displayed in the circuit list P251 as a bias circuit suitable for the temperature sensor. Thus, it is a display example in the case where a sensor vendor registers the bias circuits P255*a* and P255*b* in the simulation bias circuit data 422*b*. The selected bias circuit P255*b* is displayed in the selected circuit P252.

The bias circuit P255*a* is a circuit that supplies a bias power to the voltage output temperature sensor and directly outputs an output signal. In the bias circuit P255*a*, a bias power is supplied to one end of the temperature sensor, the other end is grounded, and the output terminal is connected only to the input terminal of the semiconductor device 1. For example, because the bias circuit P255*a* is shown as an example that supplies a bias from an external power supply and produces a voltage based on temperature, it is preferred to use a non-inverting amplifier as the configuration of the configurable amplifier 110 that is connected to the sensor. Accordingly, when the bias circuit P255*a* is selected, the configuration of the configurable amplifier 110 is automatically set to a non-inverting amplifier, so that the bias circuit P255*a* and the non-inverting amplifier are connected to each other.

The bias circuit P255*b* is a circuit that supplies a bias power to the voltage output temperature sensor and outputs an output signal through a grounding resistor. In the bias circuit P255*b*, a bias power is supplied to one end of the temperature sensor, the other end is grounded, and the output terminal is connected to the grounding resistor and to the input terminal of the semiconductor device 1. For example, because the bias circuit P255*b* is shown as an example that supplies a bias from an external power supply and produces a voltage based on temperature, it is preferred to use a non-inverting amplifier as the configuration of the configurable amplifier 110 that is connected to the sensor. Accordingly, when the bias circuit P255*b* is selected, the configuration of the configurable amplifier 110 is automatically set to a non-inverting amplifier, so that the bias circuit P255*b* and the non-inverting amplifier are connected to each other. Further, the bias circuit P255*b* can be used also for a current output temperature sensor, and it is used when converting current output to a voltage using the grounding resistor.

After that, the web simulator 4 displays a physical quantity input screen on the user terminal 3 (S104 in FIG. 31). The user terminal 3 displays the physical quantity input screen P260 which is similar to the one in FIG. 59 when a sensor vendor performs simulation, and the user sets a physical quantity input pattern and parameters.

Figure 82:
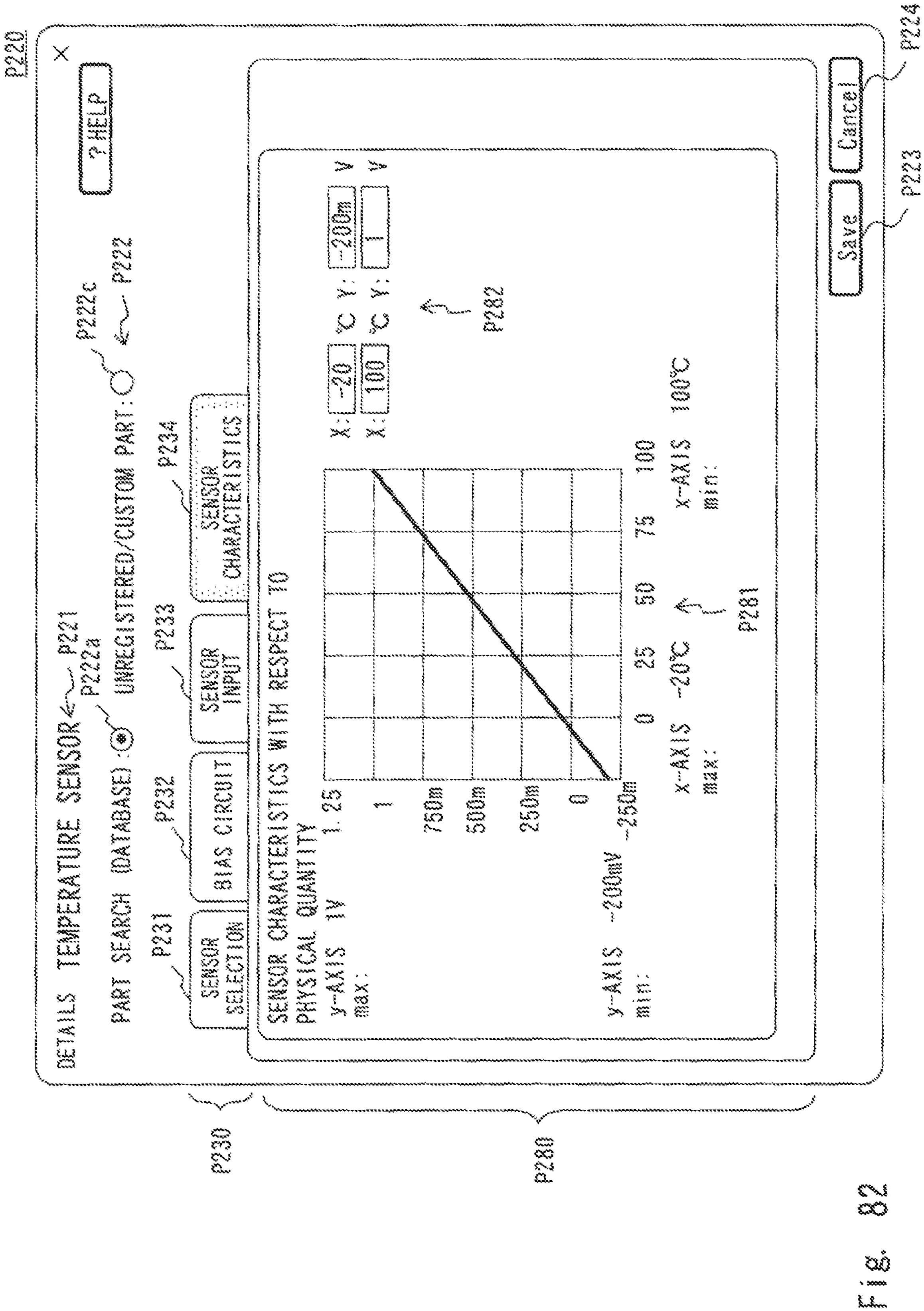
FIG. 82 is a display image diagram of a display screen used in a simulation method of the web simulator according to the first embodiment.

Further, the web simulator 4 displays the sensor characteristics screen P280 on the user terminal 3. FIG. 82 shows a display example of the sensor characteristics screen P280. The sensor characteristics screen P280 shows the same screen display as that of FIG. 48 when a user registers the sensor information, and it is displayed when the "sensor characteristics" tab P234 is selected. Input and output characteristics with respect to the physical quantity of the sensor are displayed in the characteristics graph P281, the operable range is displayed in the characteristics plot entry area P282. By the sensor characteristics screen P280, the user can see the characteristics of the sensor to be used.

The example of FIG. 82 shows a display example in the case where a temperature sensor is selected as the sensor. In the characteristics graph P281, the characteristics of an output voltage with respect to a detected temperature are displayed, where the x-axis is the detected temperature and the y-axis is the output voltage. The same temperature range and the output voltage range as the display range of the characteristics graph P281 are displayed in the characteristics plot entry area P282.

Figure 83:
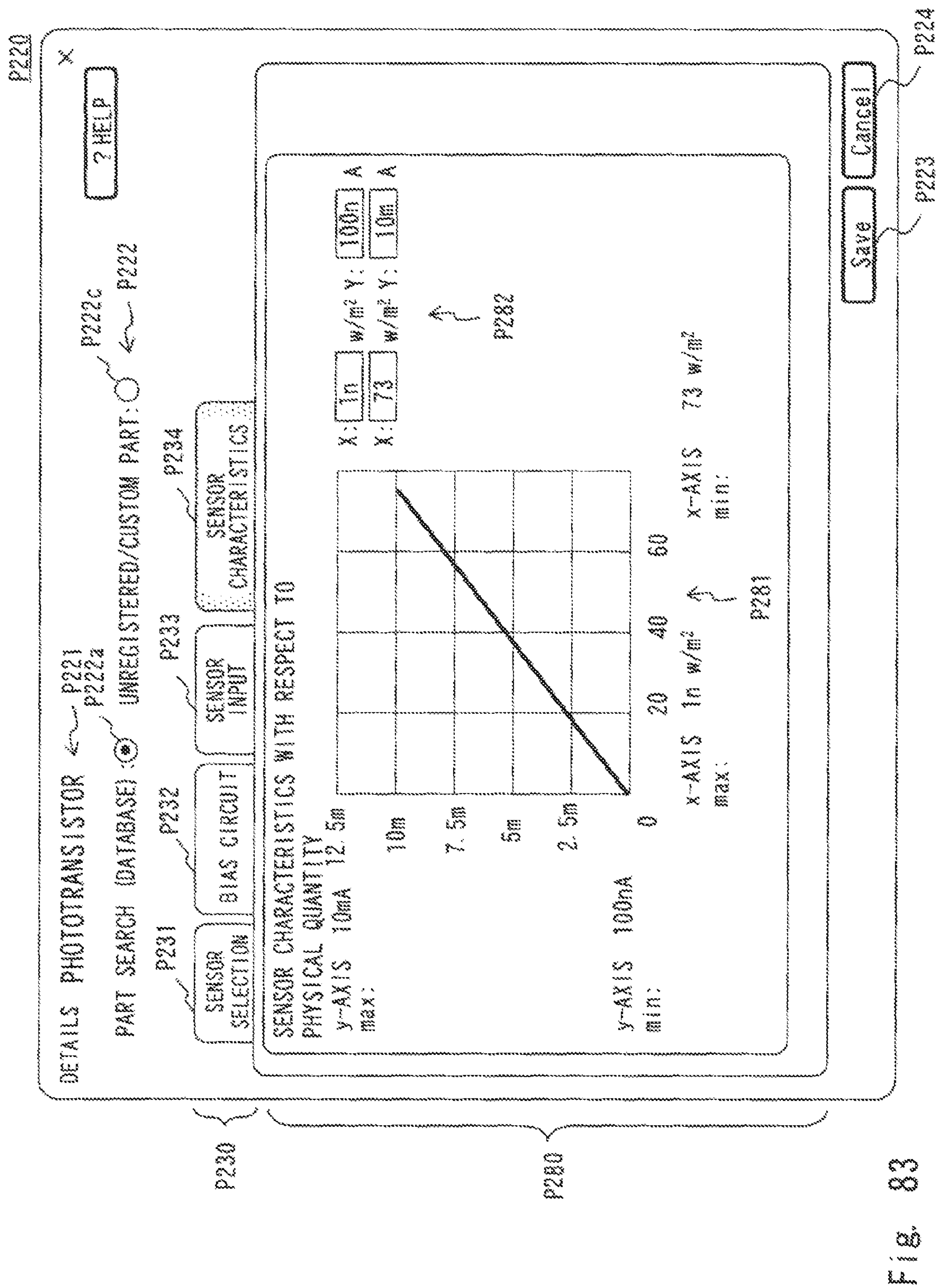
FIG. 83 is a display image diagram of a display screen used in a simulation method of the web simulator according to the first embodiment.

FIG. 83 shows another example of the sensor characteristics screen P283 of FIG. 82. FIG. 83 shows a display example in the case where a phototransistor is selected as the sensor. In the characteristics graph P281, the characteristics of an output current with respect to a detected illuminance are displayed, where the x-axis is the detected illuminance and the y-axis is the output current. The same illuminance range and the output current range as the display range of the characteristics graph P281 are displayed in the characteristics plot entry area P282.

Then, the web simulator 4 displays the AFE selection screen on the user terminal 3 (S105 in FIG. 31). The user terminal 3 displays the AFE selection screen P300 which is similar to the one in FIG. 64 when a sensor vendor performs simulation, and the user selects the semiconductor device 1 from the AFE list.

Figure 84:
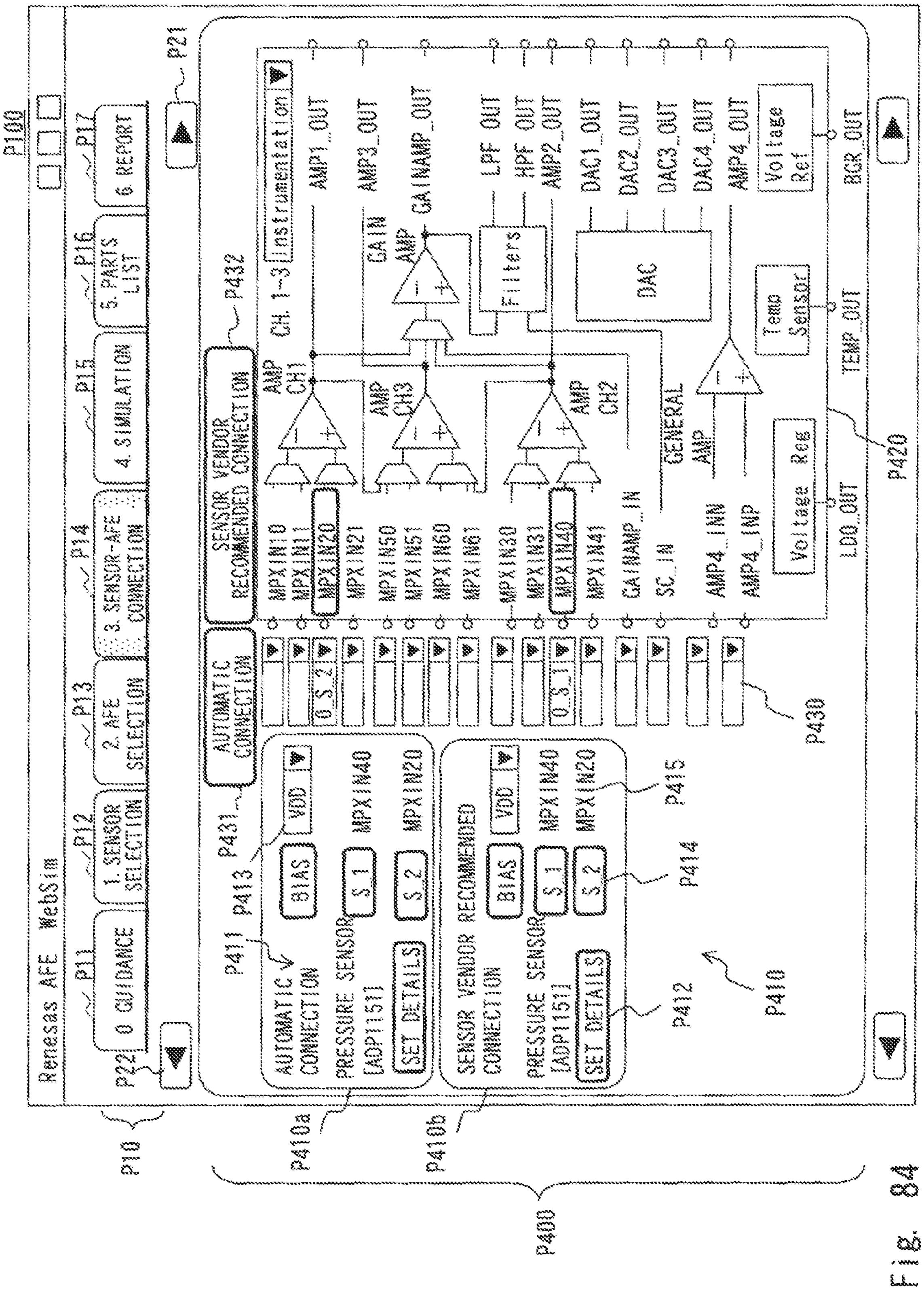
FIG. 84 is a display image diagram of a display screen used in a simulation method of the web simulator according to the first embodiment.

Then, the web simulator 4 displays the sensor-AFE connection screen on the user terminal 3 (S34 in FIG. 35). FIG. 84 shows a display example of the sensor-AFE connection screen. The sensor-AFE connection screen P400 in FIG. 84 shows the same screen display as that of FIG. 65 when the sensor vendor performs simulation, though it is different from FIG. 65 in not having the bias circuit selection area P401 and the "save" button P402.

As in FIG. 65, on the sensor-AFE connection screen P400 of FIG. 84, the "automatic connection" button P431, the "sensor vendor recommended connection" button P432, the connection selection frame P410*a* for automatic connection, and the connection selection frame P410*b* for sensor vendor recommended connection are displayed.

When the user clicks on the "automatic connection" button P431, the sensor and the bias circuit in the connection selection frame P410*a* for automatic connection and the semiconductor device image P420 are connected by the default automatic connection based on the default circuit setting file 426*a* in the circuit information storage unit 426. When the user clicks on the "sensor vendor recommended connection" button P432, the sensor and the bias circuit in the connection selection frame P410*b* for sensor vendor recommended connection and the semiconductor device image P420 are connected by the connection set by the sensor vendor based on the vendor circuit setting file 426*b* in the circuit information storage unit 426.

Further, in the state where connections of the automatic connection or the sensor vendor recommended connection is displayed, the user can select connections between the sensor and the semiconductor device 1 using the input terminal pulldown menu P430. When the user selects connections, the selected connections are set to the user circuit setting file 426*c* of the circuit information storage unit 426 as described in S36 of FIG. 35.

Figure 85:
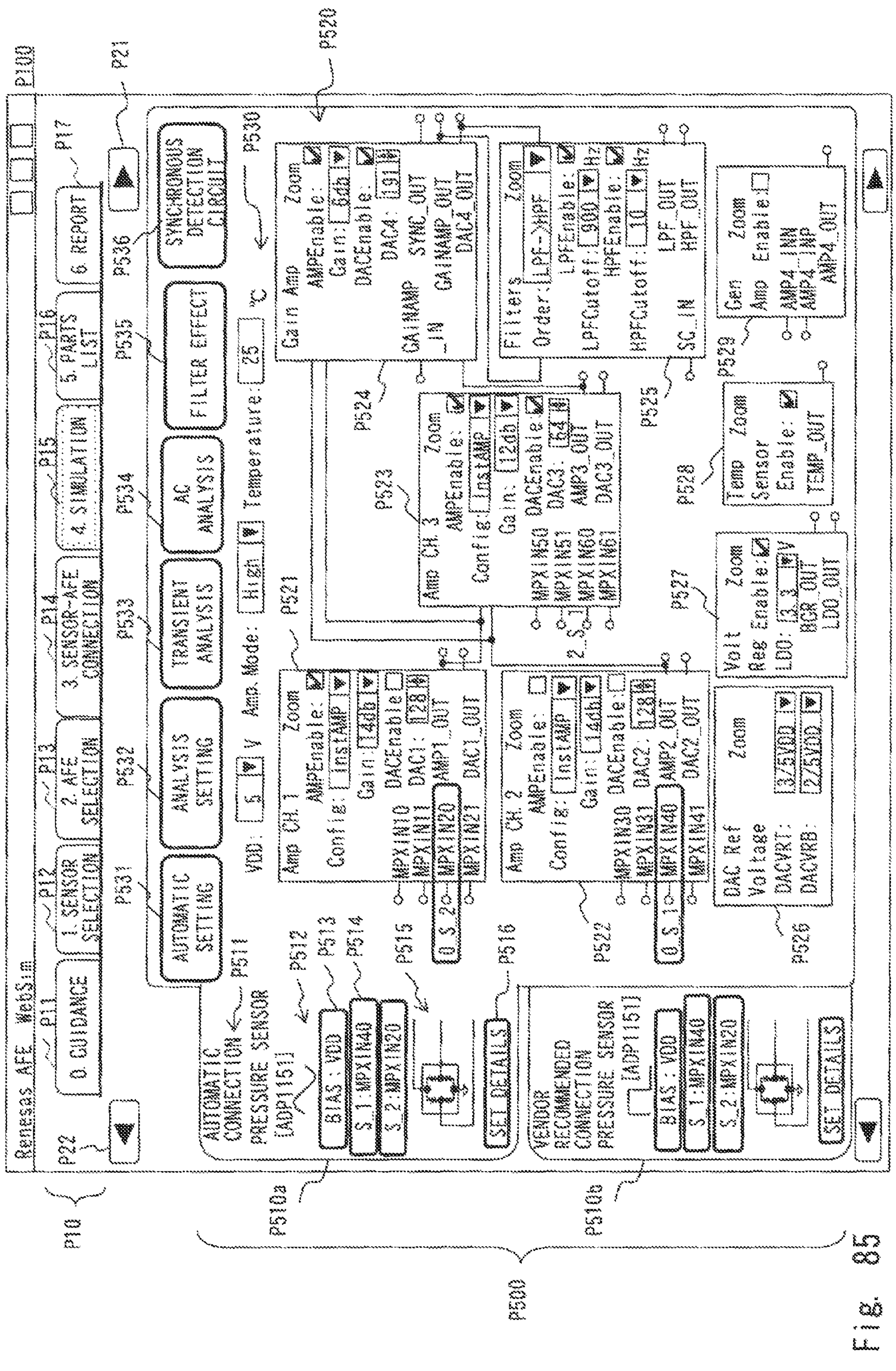
FIG. 85 is a display image diagram of a display screen used in a simulation method of the web simulator according to the first embodiment.

Then, the web simulator 4 displays the simulation screen on the user terminal 3 (S212 in FIG. 37). FIG. 85 shows a display example of the simulation screen. The simulation screen P500 in FIG. 85 shows the same screen display as that of FIG. 66 when the sensor vendor performs simulation, though it is different from FIG. 66 in not having the bias circuit selection area P501 and the "save" button P502.

As in FIG. 66, on the simulation screen P500 of FIG. 85, the connection selection frame P510*a* for automatic connection and the connection selection frame P510*b* for sensor vendor recommended connection are displayed. When the user selects the connection selection frame P510*a* for automatic connection, the circuit blocks of the semiconductor device setting area P520 are displayed in the state where they are set to default values based on the default circuit setting file 426*a* in the circuit information storage unit 426. When the user selects the connection selection frame P510*b* for sensor vendor recommended connection, the circuit blocks of the semiconductor device setting area P520 are displayed in the state where they are set to the set values of the sensor vendor recommended connection based on the vendor circuit setting file 426*b* in the circuit information storage unit 426. Further, the user can change the set value of each circuit block in the state where the set values of the automatic connection or the sensor vendor recommended connection are displayed. When the user changes the set value, the set parameter is set to the user circuit setting file 426*c* in the circuit information storage unit 426 as described in S216 of FIG. 37.

Then, when the "transient analysis" button P533, the "AC analysis" button P534, the "filter effect" button P535 or the "synchronous detection circuit" button P536 is clicked on, simulation is executed in the set configuration, and a result of the simulation is displayed on the simulation screen P500. The result of the simulation is displayed below the semiconductor device setting area P520 as in FIGS. 68A to 68C and FIGS. 69A to 69C.

Then, the web simulator 4 displays the parts list screen on the user terminal 3 (S110 in FIG. 31). The user terminal 3 displays the parts list screen P800 which is similar to the one in FIG. 71 when the sensor vendor performs simulation, and a list of the sensor and the semiconductor device 1 selected by the user and on which simulation is performed is displayed.

Then, the web simulator 4 displays the report screen on the user terminal 3 (S112 in FIG. 31). The user terminal 3 displays the report screen P900 which is the same as the one in FIG. 72A to FIG. 72F when a sensor vendor performs simulation. Note that, because the user can select only one bias circuit, the bias circuit selection area P903 is not displayed.

On the report screen P900, the semiconductor device 1 selected by the user on the AFE selection screen is displayed in the semiconductor device identification area P901. In the sensor display area P910, the sensor selected by the user on the sensor selection screen and the bias circuit selected by the user on the bias circuit selection screen are displayed. In the register display area P920, the connections display area P930 and the smart analog display area P943, information about the configuration and the characteristics set by the user on the sensor-AFE connection screen and the simulation screen is displayed. In the parts list display area P950, a list of the sensor and the semiconductor device 1 selected by the user and on which simulation is performed is displayed. In the result display area P960, a result of the simulation according to the user setting is displayed. The simulation operation by the user thereby ends.

As describe above, according to this embodiment, the operation of the semiconductor device 1 with variable circuit configuration and circuit characteristics is simulated by the web simulator. Because simulation is executed on the web simulator, the environment for simulation is not needed in the user terminal (sensor vendor terminal), and a user (sensor vendor) can readily perform simulation. Because simulation is performed for the same analog circuit (AFE) as the semiconductor device 1 with variable circuit configuration and circuit characteristics, it is possible to perform simulation for analog circuits having various configurations and characteristics with a simple operation by a user (sensor vendor).

Particularly, in this embodiment, a sensor vendor, in addition to a user and a system administrator, can access the web simulator. The sensor vendor can access the web simulator and register/update information of a sensor or a bias circuit in the database (the sensor database, the sensor bias circuit database) within the range of the granted access authorization. It is thereby possible to register/update only information of the sensor related to the sensor vendor that makes access in the database and prevent registration/update of incorrect sensor information. Thus, the user can accurately perform simulation using this information.

According to related art, only a simulator developer has registered/updated/deleted information in the sensor database. In this case, it is significantly difficult for the simulator developer to correctly register a great amount of sensors in the database and manage the registered information. Because the simulator developer desires that the simulator is used by many users rather than registering a great amount of sensors, there has been a problem in managing registration/update/deletion of data in the sensor database. Further, for sensor vendors, if simulation is performed using incorrect sensor information, there is a negative impact on the sales of sensors or the like. Sensor vendors have the most intimate knowledge of sensors and thus desire to provide correct information of the sensors to users so that many users use the sensors correctly. Further, users desire to use a highly reliable simulator in which a great amount of sensors are registered and perform simulation more accurately with the correct information of a sensor. To address this issue, in this embodiment, a sensor vendor different from a simulator developer can register/update/delete the sensor information related to the sensor vendor in the sensor database.

Specifically, in the system according to related art, information of the sensor database has been incorporated merely by reference from general specifications, and it has been difficult to include all of the characteristics of each individual sensor product. Accordingly, it has been necessary to use verification results for an actual sensor in addition in order for a user to judge the validity of a simulation output result. On the other hand, in this embodiment, a sensor vendor can rosier sensors related to itself in the sensor database. It is thus possible to reflect the characteristics of each individual sensor product on the information of the sensor database and to respond to a product release from a sensor vendor in real time, which improves the reliability of a simulation result.

Further, when a sensor vendor registers a sensor, a plurality of bias circuits corresponding to the sensor are automatically displayed for the sensor vendor based on the type of the sensor or the like. The sensor vendor can select a bias circuit most suitable for the sensor among the plurality of displayed bias circuits and register it in the database. In this way, the sensor vendor does not need to make selection among all bias circuits and can select a bias circuit most suitable for the sensor easily and correctly. Further, because a user performs simulation using the bias circuit registered by the sensor vendor, it is possible to perform simulation accurately with the most suitable circuit configuration.

Second Embodiment

A second embodiment is described hereinafter with reference to the drawings. This embodiment is the same as the first embodiment except for the process of displaying the report screen. In this embodiment, the web page processing unit 411 executes the following report display process in S112 of FIG. 31.

Figure 86:
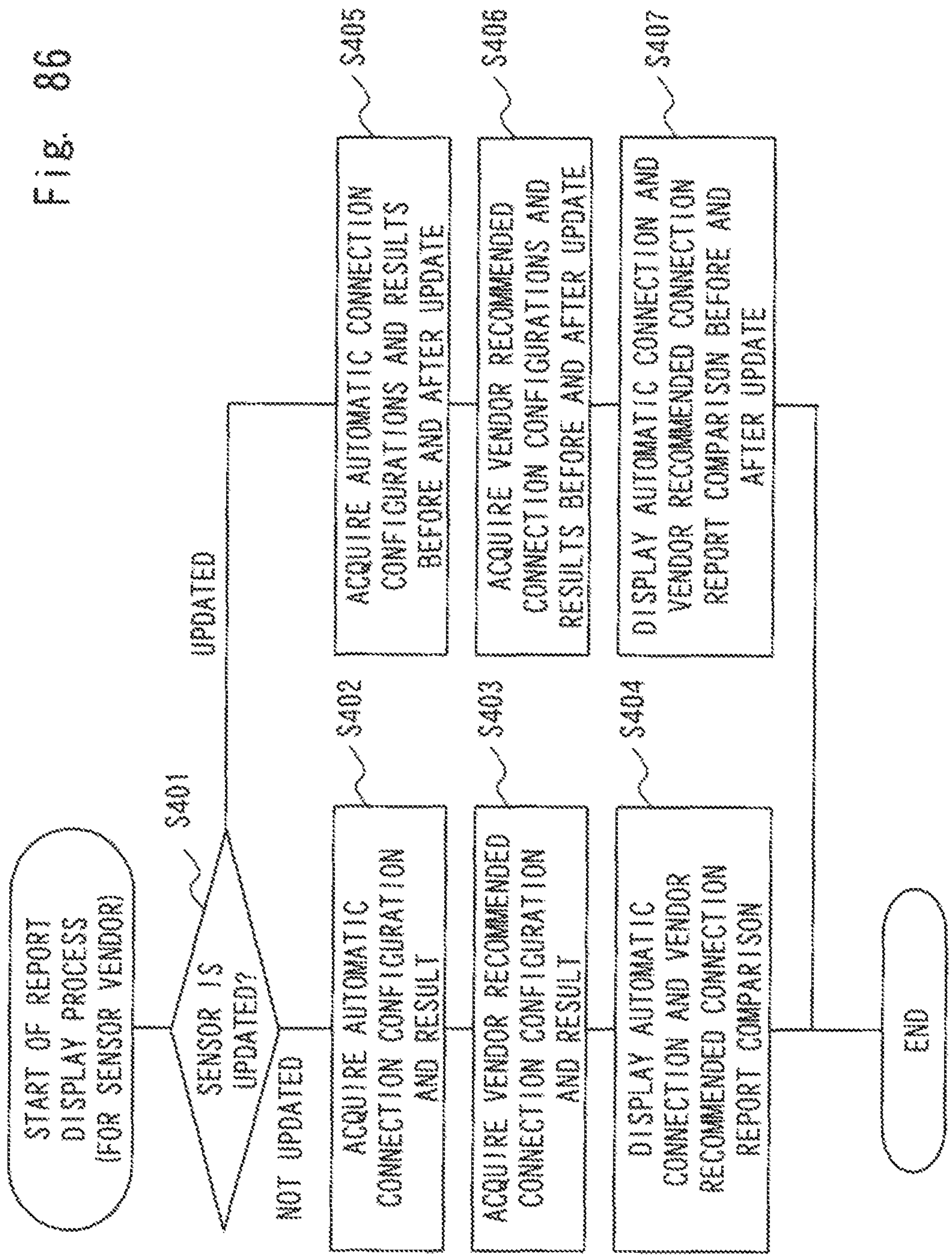
FIG. 86 is a flowchart showing a simulation method of a web simulator according to a second embodiment.

FIG. 86 shows a report display process according to this embodiment, which corresponds to the process of S112 in FIG. 31 and particularly shows processing for a sensor vendor. In other words, this process is executed when the account is a sensor vendor in S112.

First, the web page processing unit 411 determines whether the characteristics of the sensor are updated by a sensor vendor (S401). When a sensor vendor performs an operation to output a simulation result on the simulation screen in S109 or the like, determination is made as to whether the characteristics of the sensor are updated by reference to the sensor database 421 to determine the display content of the report screen.

When the characteristics of the sensor are not updated in S401, the web page processing unit 411 acquires the circuit configuration, the circuit characteristics, the simulation result and the like for automatic connection (S402). The web page processing unit 411 refers to the default circuit setting file 426*a* of the circuit information storage unit 426 and acquires the sensor and the bias circuit, the circuit configuration and the circuit characteristics of the semiconductor device 1 for automatic connection, refers to the result information storage unit 428 and acquires the simulation result for automatic connection, and refers to the register information storage unit 429 and acquires the register information for automatic connection. In the case where a plurality of bias circuits are set for one sensor, the circuit configuration and the circuit characteristics, the simulation result and the register information for automatic connection are acquired for each of the plurality of bias circuits.

Then, the web page processing unit 411 acquires the circuit configuration, the circuit characteristics, the simulation result and the like for vendor recommended connection (S403). The web page processing unit 411 refers to the vendor circuit setting file 426*b* of the circuit information storage unit 426 and acquires the sensor and the bias circuit, the circuit configuration and the circuit characteristics of the semiconductor device 1 for vendor recommended connection, refers to the result information storage unit 428 and acquires the simulation result for vendor recommended connection, and refers to the register information storage unit 429 and acquires the register information for vendor recommended connection. In the case where a plurality of bias circuits are set for one sensor, the circuit configuration and the circuit characteristics, the simulation result and the register information for vendor recommended connection are acquired for each of the plurality of bias circuits.

Then, the web page processing unit 411 displays the report screen that compares the circuit configuration, the circuit characteristics, the simulation result and the like for automatic connection with the circuit configuration, the circuit characteristics, the simulation result and the like for vendor recommended connection on the sensor vendor terminal 5 (S404). The web page processing unit 411 transmits the web page information of the report screen containing the content of S402 and the content of S403 to the sensor vendor terminal 5 to display the report screen on the web browser 300*b*. The web page processing unit 411 displays the sensor and the bias circuit, the circuit configuration and the circuit characteristics of the semiconductor device 1, the simulation result and the register information for the automatic connection acquired in S402 and for the vendor recommended connection acquired in S404 in comparison with each other on the report screen. In the case where a plurality of bias circuits are set for one sensor, the circuit configuration and the circuit characteristics, the simulation result and the register information for the vendor recommended connection are displayed in comparison with each other for each of the plurality of bias circuits.

On the other hand, when the characteristics of the sensor are updated in S401, the web page processing unit 411 acquires the circuit configuration, the circuit characteristics, the simulation result and the like for automatic connection before and after the update (modification) of the characteristics of the sensor (S405). In this embodiment, the configuration, the simulation result and the like before the update of the characteristics of the sensor are stored in the circuit information storage unit 426 and the result information storage unit 428.

The web page processing unit 411 refers to the default circuit setting file 426*a* of the circuit information storage unit 426 and acquires the sensor and the bias circuit, the circuit configuration and the circuit characteristics of the semiconductor device 1 for automatic connection before and after the modification of the characteristics of the sensor, refers to the result information storage unit 428 and acquires the simulation result for automatic connection before and after the modification of the characteristics of the sensor, and refers to the register information storage unit 429 and acquires the register information for automatic connection before and after the modification of the characteristics of the sensor. In the case where a plurality of bias circuits are set for one sensor, the circuit configuration and the circuit characteristics, the simulation result and the register information for automatic connection before and after the modification of the characteristics of the sensor are acquired for each of the plurality of bias circuits.

Then, the web page processing unit 411 acquires the circuit configuration, the circuit characteristics, the simulation result and the like for vendor recommended connection before and after the update (modification) of the characteristics of the sensor (S406). The web page processing unit 411 refers to the vendor circuit setting file 426*b* of the circuit information storage unit 426 and acquires the sensor and the bias circuit, the circuit configuration and the circuit characteristics of the semiconductor device 1 for vendor recommended connection before and after the modification of the characteristics of the sensor, refers to the result information storage unit 428 and acquires the simulation result for vendor recommended connection before and after the modification of the characteristics of the sensor, and refers to the register information storage unit 429 and acquires the register information for vendor recommended connection before and after the modification of the characteristics of the sensor. In the case where a plurality of bias circuits are set for one sensor, the circuit configuration and the circuit characteristics, the simulation result and the register information for vendor recommended connection before and after the modification of the characteristics of the sensor are acquired for each of the plurality of bias circuits.

Then, the web page processing unit 411 displays the report screen that compares the circuit configuration, the circuit characteristics, the simulation result and the like for automatic connection with the circuit configuration, the circuit characteristics, the simulation result and the like for vendor recommended connection before and after the update (modification) of the characteristics of the sensor on the sensor vendor terminal 5 (S407). The web page processing unit 411 transmits the web page information of the report screen containing the content of S405 and the content of S406 to the sensor vendor terminal 5 to display the report screen on the web browser 300*b*. The web page processing unit 411 displays the sensor and the bias circuit, the circuit configuration and the circuit characteristics of the semiconductor device 1, the simulation result and the register information for the automatic connection acquired in S405 and for the vendor recommended connection acquired in S406 before and after the modification of the characteristics of the sensor in comparison with each other on the report screen. In the case where a plurality of bias circuits are set for one sensor, the circuit configuration and the circuit characteristics, the simulation result and the register information for vendor recommended connection before and after the modification of the characteristics of the sensor are displayed in comparison with each other for each of the plurality of bias circuits.

Figure 87:
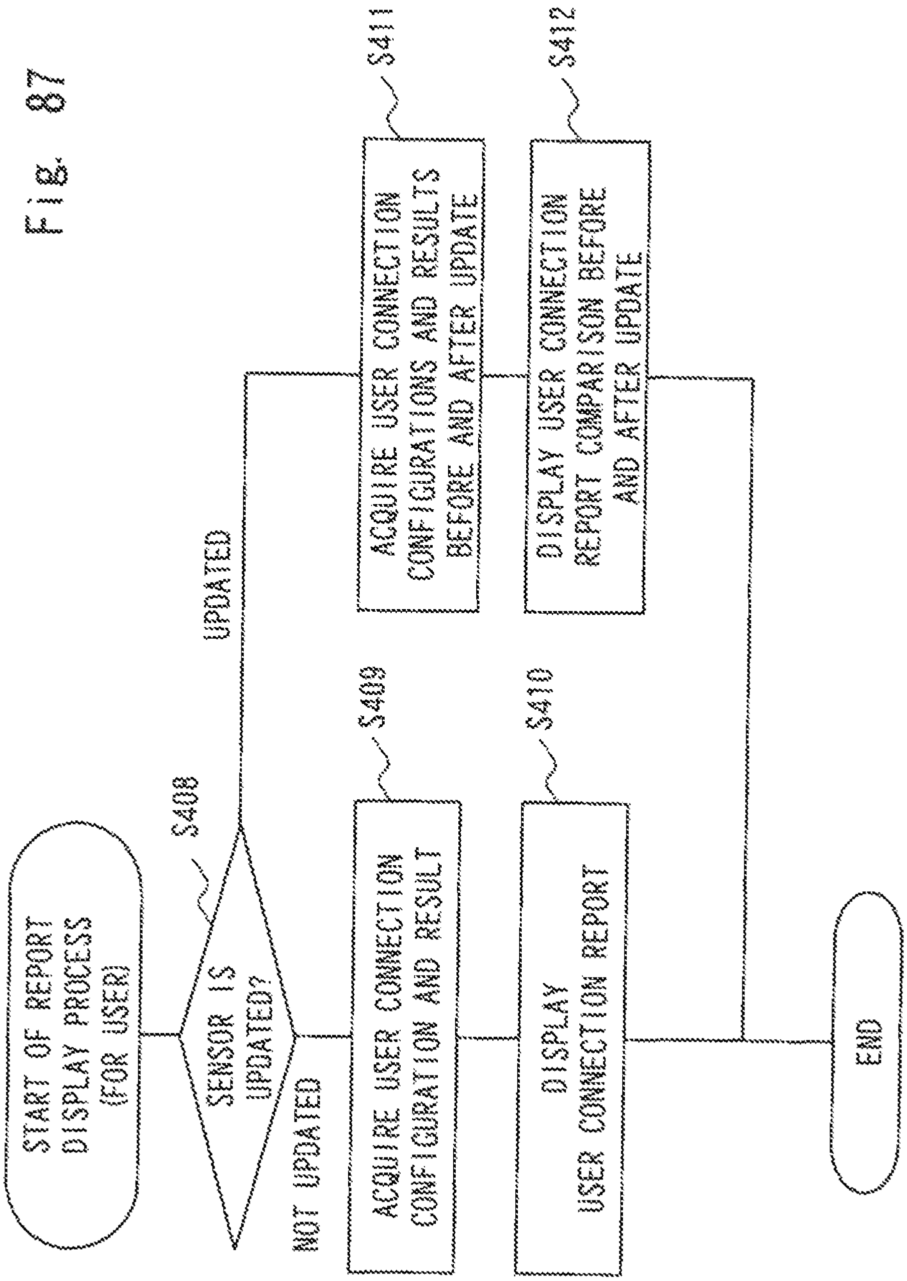
FIG. 87 is a flowchart showing a simulation method of the web simulator according to the second embodiment.

FIG. 87 shows a report display process according to this embodiment, which corresponds to the process of S112 in FIG. 31 and particularly shows processing for a user. In other words, this process is executed when the account is a user in S112.

First, the web page processing unit 411 determines whether the characteristics of the sensor are updated by a user (S408). When a user performs an operation to output a simulation result on the simulation screen in S109 or the like, determination is made as to whether the characteristics of the sensor are updated by reference to the sensor database 421 to determine the display content of the report screen.

When the characteristics of the sensor are not updated in S408, the web page processing unit 411 acquires the circuit configuration and the circuit characteristics for which simulation is performed, the simulation result and the like (S409). The web page processing unit 411 refers to the user circuit setting file 426*c* of the circuit information storage unit 426 and acquires the sensor and the bias circuit, the circuit configuration and the circuit characteristics of the semiconductor device 1, refers to the result information storage unit 428 and acquires the simulation result, and refers to the register information storage unit 429 and acquires the register information.

Then, the web page processing unit 411 displays the report screen that contains the circuit configuration and the circuit characteristics for which simulation is performed, the simulation result and the like on the user terminal 3 (S410). The web page processing unit 411 transmits the web page information of the report screen containing the content of S409 to the user terminal 3 to display the report screen on the web browser 300*a*. The web page processing unit 411 displays the sensor and the bias circuit, the circuit configuration and the circuit characteristics of the semiconductor device 1, the simulation result and the register information acquired in S409 on the report screen.

On the other hand, when the characteristics of the sensor are updated in S408, the web page processing unit 411 acquires the circuit configuration and the circuit characteristics for which simulation is performed, the simulation result and the like before and after the update (modification) of the characteristics of the sensor (S411). In this embodiment, the configuration, the simulation result and the like before the update of the characteristics of the sensor are stored in the circuit information storage unit 426 and the result information storage unit 428.

The web page processing unit 411 refers to the user circuit setting file 426*c* of the circuit information storage unit 426 and acquires the sensor and the bias circuit, the circuit configuration and the circuit characteristics of the semiconductor device 1 before and after the modification of the characteristics of the sensor, refers to the result information storage unit 428 and acquires the simulation result before and after the modification of the characteristics of the sensor, and refers to the register information storage unit 429 and acquires the register information before and after the modification of the characteristics of the sensor.

Then, the web page processing unit 411 displays the report screen that contains the circuit configuration and the circuit characteristics for which simulation is performed, the simulation result and the like before and after the update (modification) of the characteristics of the sensor on the user terminal 3 (S412). The web page processing unit 411 transmits the web page information of the report screen containing the content of 411*i* to the user terminal 3 to display the report screen on the web browser 300*a*. The web page processing unit 411 displays the sensor and the bias circuit, the circuit configuration and the circuit characteristics of the semiconductor device 1, the simulation result and the register information before and after the modification of the characteristics of the sensor in comparison with each other on the report screen. The circuit configuration and the circuit characteristics for which simulation is performed, the simulation result and the register information before and after the modification of the characteristics of the sensor are displayed in comparison with each other.

Figure 88A:
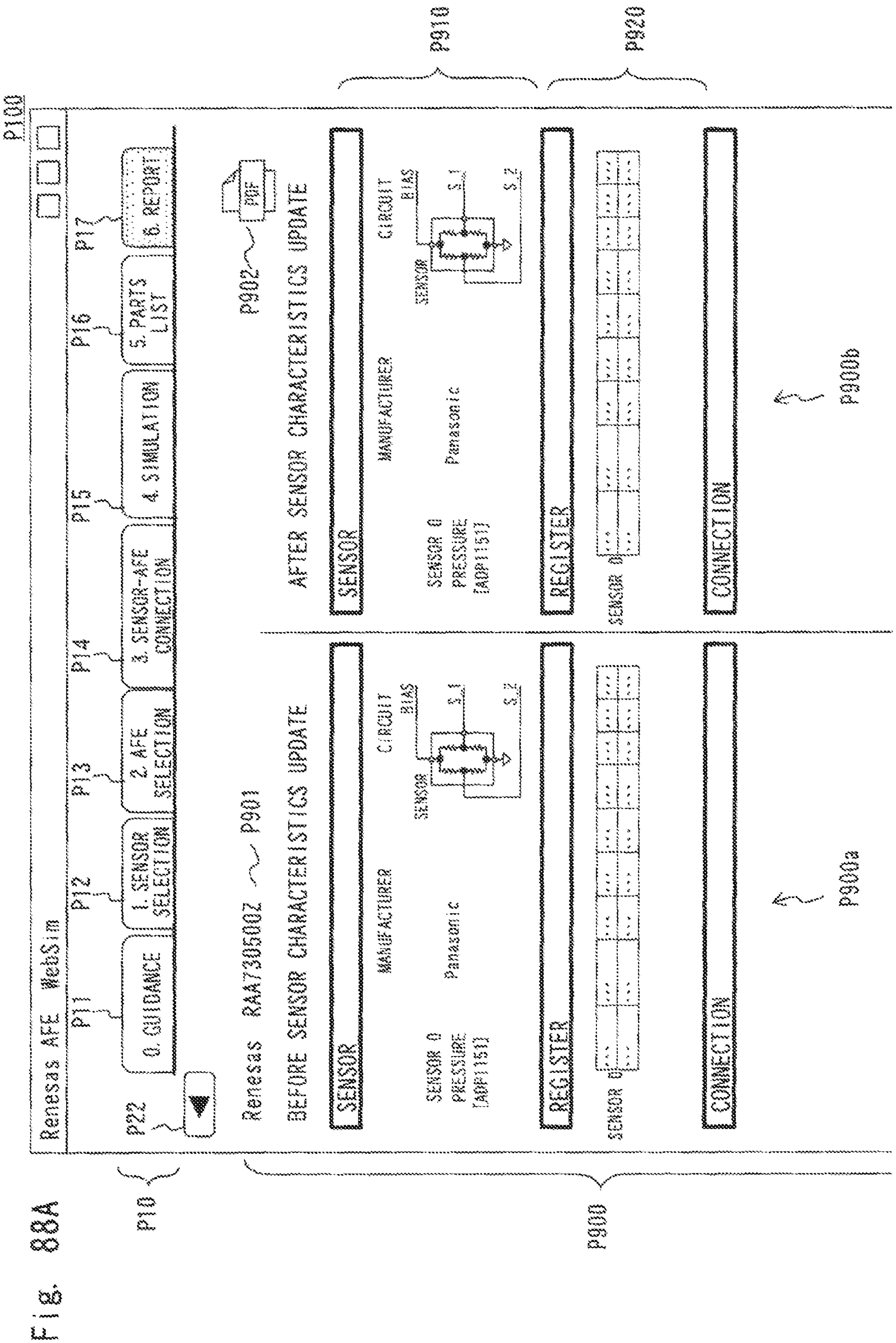
FIG. 88A is a display image diagram of a display screen used in a simulation method of the web simulator according to the second embodiment.
Figure 88B:
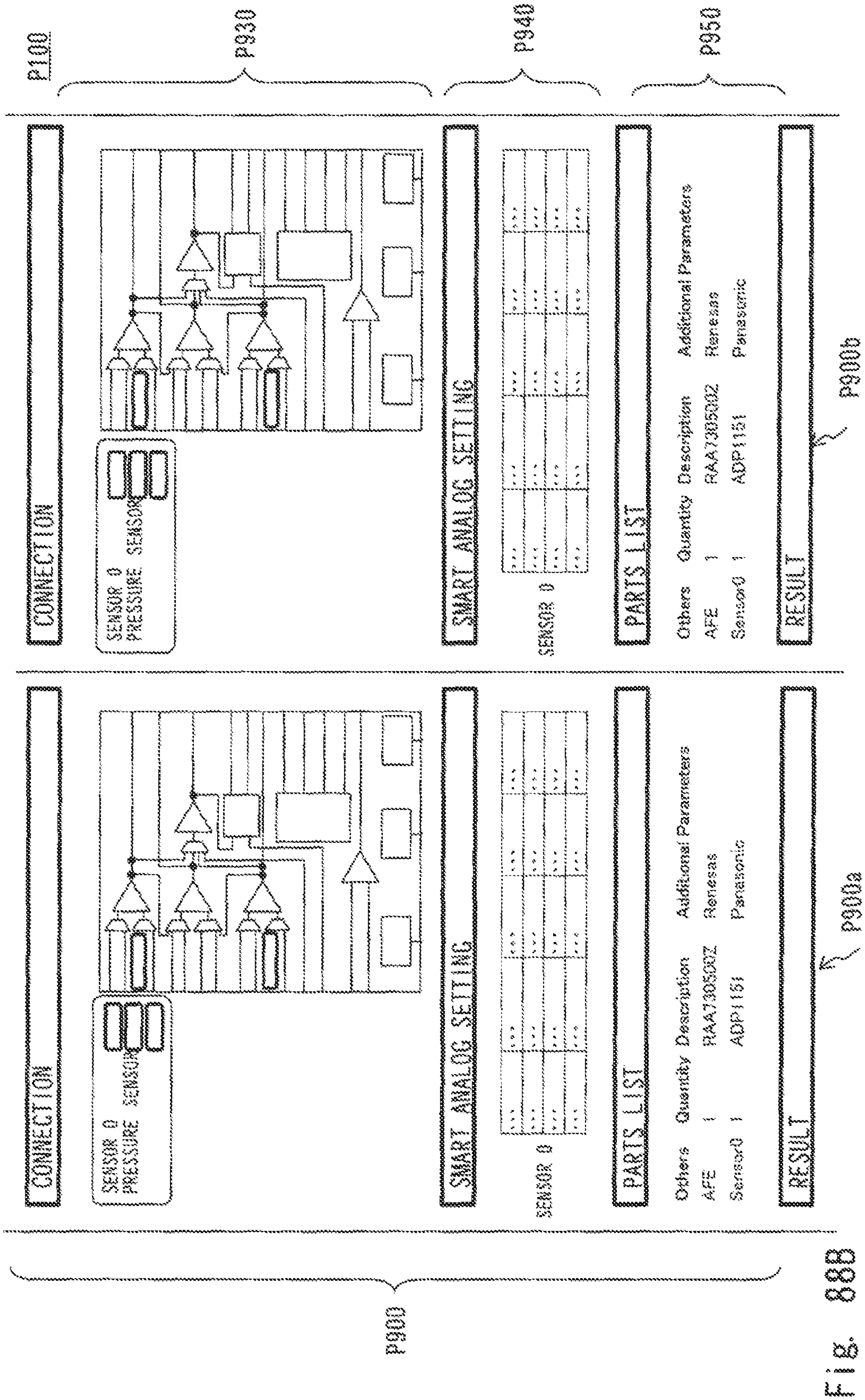
FIG. 88C is a display image diagram of a display screen used in a simulation method of the web simulator according to the second embodiment.
Figure 88C:
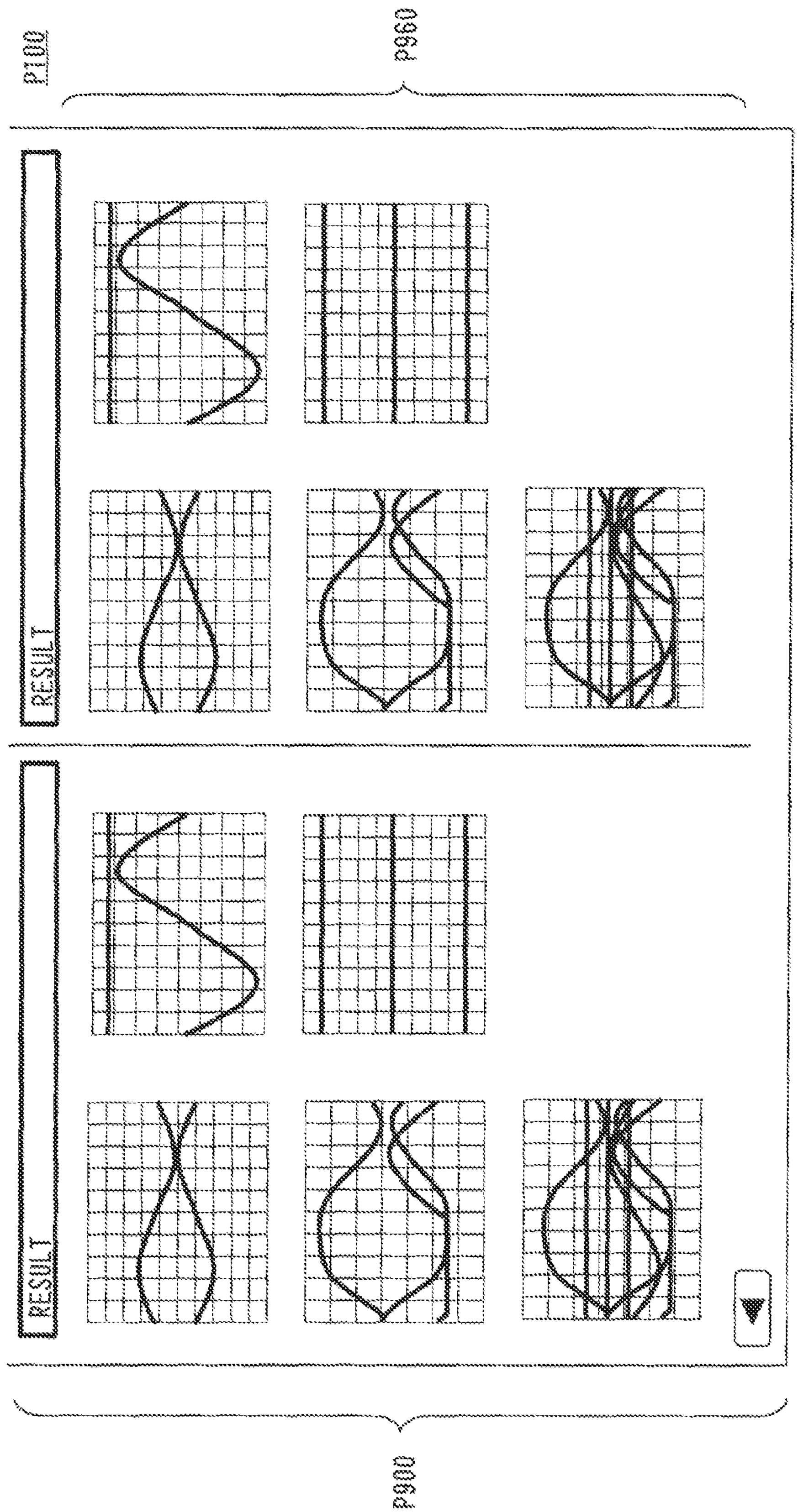

FIGS. 88A to 88C show display examples of the report screen according to this embodiment. FIGS. 88A to 88C are display examples in the case where a sensor vendor updates the characteristics of a sensor, for example. As shown in FIGS. 88A to 88C, the report contents before and after the update of the characteristics of the sensor are displayed side by side on the screen. Note that the screen is displayed in the same manner in the case where a user updates the sensor (custom sensor) registered by the user as well.

A report area P900*a* in the left part of the report screen P900 is an area to display the report content before the update of the characteristics of the sensor, and a report area P900*b* in the right part of the report screen P900 is an area to display the report content after the update of the characteristics of the sensor. In the report areas P900*a* and P900*b*, the sensor display area P910, the register display area P920, the connections display area P930, the smart analog display area P940, the parts list display area P950 and the result display area P960 are displayed, just like in FIGS. 72A to 72D, respectively.

As described above, according to this embodiment, two reports are displayed side by side on the report screen that is displayed by the web simulator. Particularly, the reports before and after update of the characteristics of the sensor and the reports for automatic connection and for vendor recommended connection are displayed. A sensor vendor (user) can thereby easily compare the reports before and after update of the characteristics of the sensor and the reports for automatic connection and for vendor recommended connection. It is thus possible to see a difference in the configuration for which simulation is performed and the simulation result at a glance. Accordingly, the sensor vendor (user) can easily determine whether it is necessary to modify the circuit configuration or the characteristics and thereby appropriately set the sensor, the bias circuit and the semiconductor device to be used for simulation.

Third Embodiment

Figure 89:
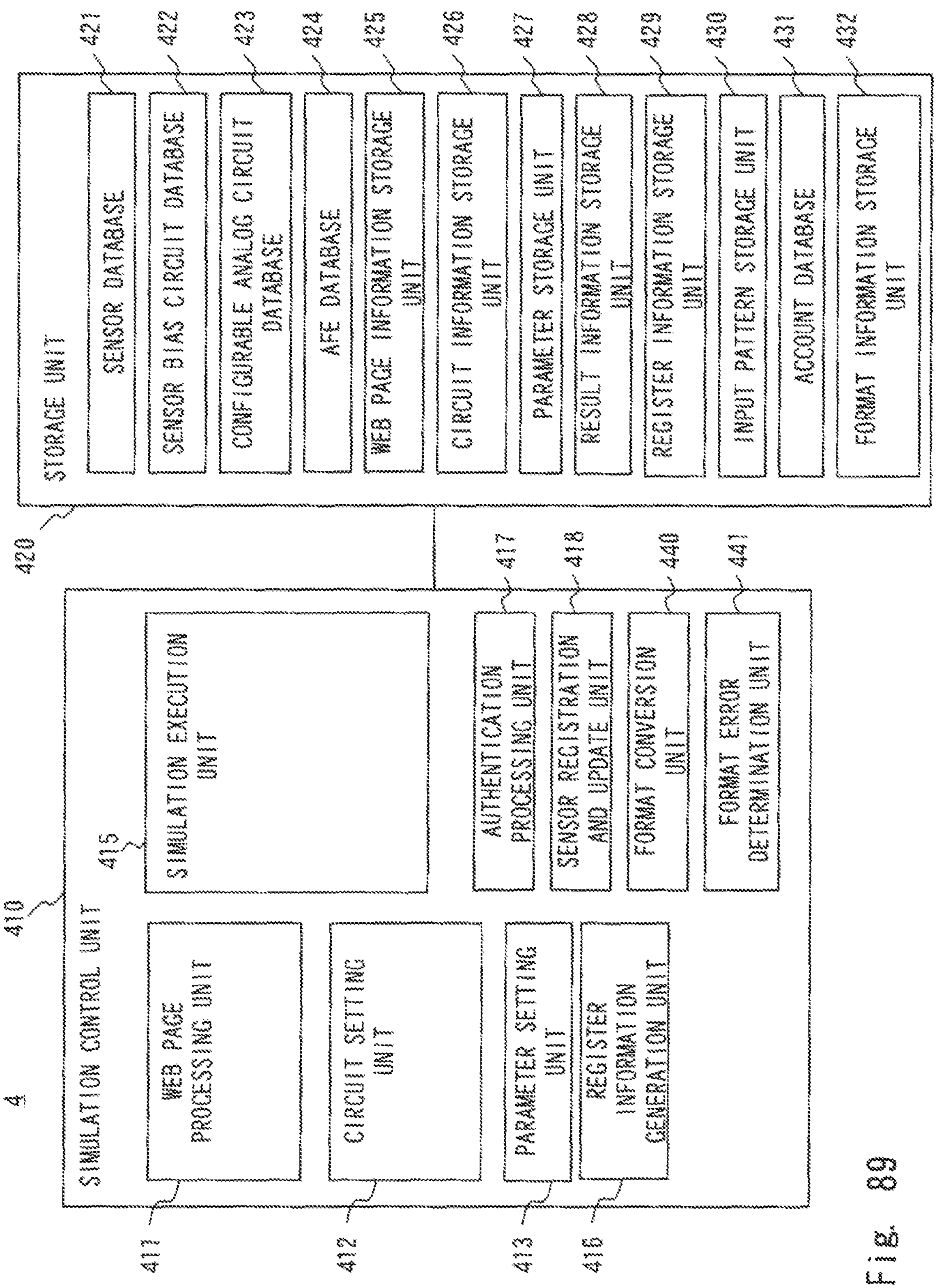
FIG. 89 is a functional block diagram of a web simulator according to a third embodiment.

A third embodiment is described hereinafter with reference to the drawings. FIG. 89 shows the configuration of the web simulator according to this embodiment.

As shown in FIG. 89, the web simulator 4 includes a format conversion unit 440 and a format error determination unit 441 in the simulation control unit 410 and includes a format information storage unit 432 in the storage unit 420, which are different from FIGS. 28A and 28B of the first embodiment.

The format information storage unit 432 stores format information necessary to convert an input sensor database (sensor information) into the format of a simulator sensor database (the sensor database 421) of the web simulator 4. For example, the format information contains analysis data for analyzing the format of the input sensor database, conversion data for converting the format of the input sensor database and the like. The analysis data is a format (template) or the like containing the item (field) of a simulator sensor database. The conversion data is a conversion pattern, a conversion rule and the like of each item in the database.

The format conversion unit (conversion adapter) 440 converts the format of the input sensor database (sensor information) input from a sensor vendor into the format of the simulator sensor database (the sensor database 421) of the web simulator 4. The format conversion unit 440 analyzes the format of the input sensor database based on the analysis data in the format information storage unit 432 and further converts the input sensor database into the format of the simulator sensor database based on the conversion data in the format information storage unit 432.

The format error determination unit 441 determines whether there is an error such as a format error in the input sensor database (sensor information) after the format conversion. The format error determination unit 441 determines the presence or absence of an error for each item of the simulation database.

Figure 90:
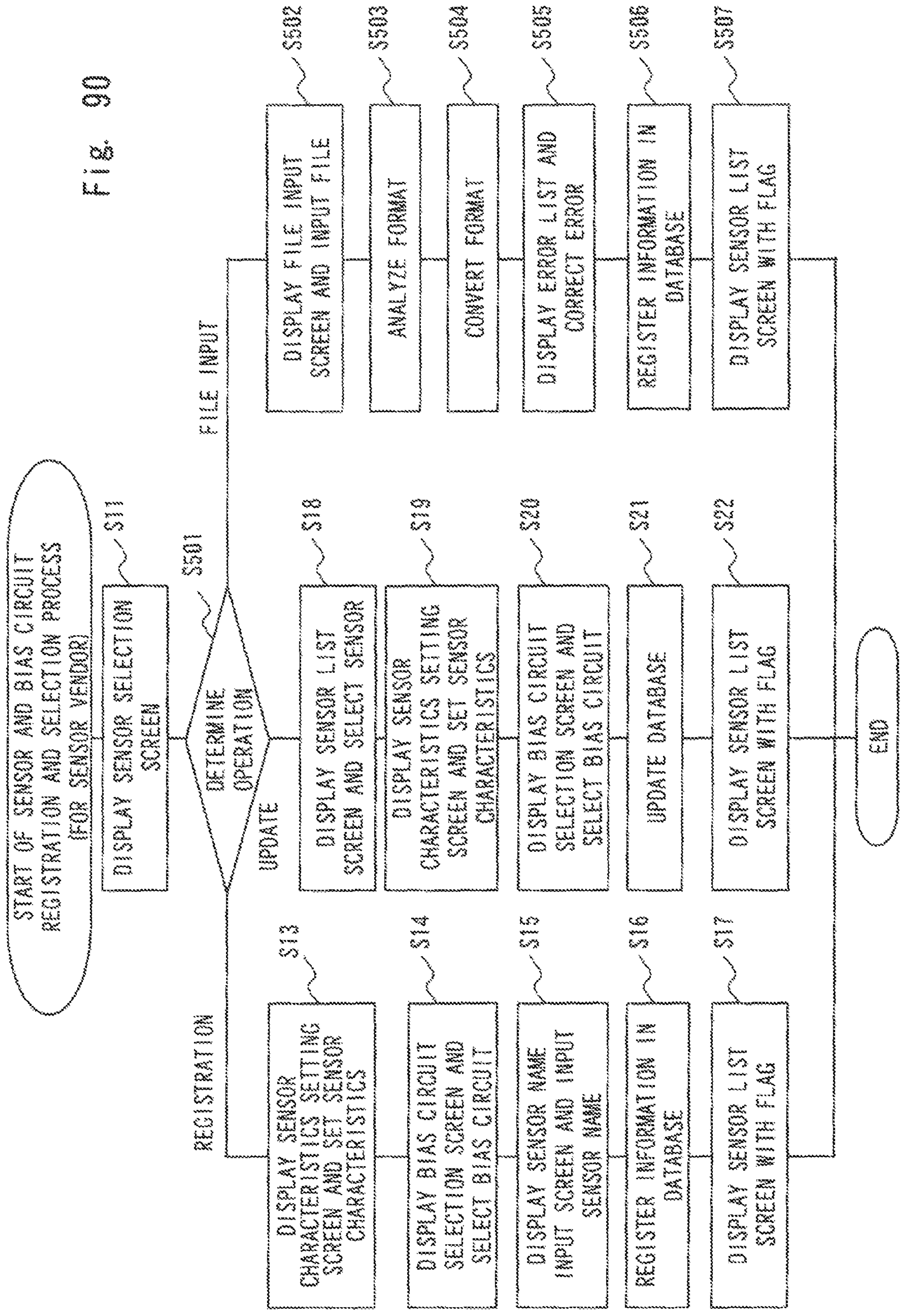
FIG. 90 is a flowchart showing a simulation method of the web simulator according to the third embodiment.

FIG. 90 shows the sensor and bias circuit registration and selection process according to this embodiment, which corresponds to the process of S103 in FIG. 31, and particularly shows the process for a sensor vendor. In other words, this process is performed when the account is a sensor vendor in S103.

First, as in FIG. 32 of the first embodiment, the web page processing unit 411 displays the sensor selection screen on the sensor vendor terminal 5, and a sensor vendor selects the type of a sensor (S11). Next, the web page processing unit 411 determines an operation of the sensor vendor on the sensor selection screen (S501). In this step, it is determined whether the sensor vendor has performed an operation to register or update a sensor or input a file. When the sensor vendor has performed an operation to register or update a sensor in S501, the same process as in FIG. 32 is performed.

When the sensor vendor has performed an operation to input a file in S501, the web page processing unit 411 displays a file input screen on the sensor vendor terminal 5, and the sensor vendor inputs a sensor information file containing sensor information (S502). When the sensor vendor performs an operation to input a file (database) in the determination about an operation (on the sensor selection screen) in S501, the web page processing unit 411 transmits the web page information of the file input screen for inputting a file to the sensor vendor terminal 5 to display the file input screen on the web browser 300*b*. When the sensor vendor inputs a file of an input sensor database containing sensor information on the file input screen, the file of the input sensor database is input (uploaded) from the sensor vendor terminal 5 to the web simulator 4.

Then, the format conversion unit 440 analyzes the format of the input sensor database input from the sensor vendor (S503) and converts the format of the input sensor database based on the format analysis result (S504). The format conversion unit 440 analyzes the format of the input sensor database by reference to the analysis data in the format information storage unit 432. For example, the format conversion unit 440 searches the input sensor database and determines whether it contains a character string of the item contained in the analysis data. The format conversion unit 440 converts the input sensor database into the format of the simulator sensor database based on the format analysis result by referring to the conversion data in the format information storage unit 432. For example, when a character string of the item of the analysis data is contained in the input sensor database, the input sensor database is replaced with the character string defined by the conversion data.

FIGS. 91A and 91B show a format conversion image by the format conversion unit 440. Note that, although a plurality of sensor information is input at a time as the input sensor database in this example, only one sensor information may be input.

As shown in FIG. 91A, when an input sensor database D101 is input, for example, the format conversion unit 440 analyzes the format of the input sensor database D101. The format conversion unit 440 determines whether the items of the input sensor database D101 are arranged horizontally or vertically. In this case, the character strings of items are extracted from the fields arranged horizontally. The format conversion unit 440 compares the extracted items with the items of the analysis data and determines the match/mismatch of the items and the order of the items. The format conversion unit 440 specifies the order of items for the matching items and specifies the character string to be replaced for the mismatching items based on the conversion data.

In a simulation sensor database D103 of FIG. 91A, the items of "No", "sensor type", "manufacturer", "model name", "input range (MIN)", "input range (MAX)", "unit" and "output format" are sequentially arranged horizontally. On the other hand, in the input sensor database D101, the items of "No", "model name", "sensor type", "input range (MIN)", "input range (MAX)" and "output format" are sequentially arranged horizontally. Note that, other necessary information is also stored in the sensor database. For example, the characteristics graph, the number of output terminals, the bias circuits and the like may be stored in the sensor database.

Comparing the input sensor database 101 with the simulation sensor database 103, because the items of "No", "model name", "sensor type", "input range (MIN)", "input range (MAX)" and "output format" in the input sensor database D101 are contained in the simulation sensor database D103, the order of those items is specified. Further, the items of "manufacturer" and "unit" of the simulation sensor database D103 are not contained in the input sensor database D101. In this case, as an example of a conversion pattern, the item of "manufacturer" is acquired from the account of the sensor vendor, and the item of "unit" is acquired by analyzing each character string of the input range.

According the above conversion rule, the input sensor database D101 is converted into the format of the simulation sensor database D103. Specifically, for the matching items, "No" is converted into the first item, "model name" is converted into the fourth item, "sensor type" is converted into the second item, "input range (MIN)" is converted into the fifth item, "input range (MAX)" is converted into the sixth item, and "output format" is converted into the eighth item. Further, for the mismatching items, the account name of the sensor vendor is registered in the item of "manufacturer", and a unit acquired from the character string at the end of the input range is registered in the item of "unit".

In 91B, the format of the simulation sensor database D103 is the same as B89A. In an input sensor database D102, the items of "No", "model name", "sensor type", "output format", "input range (MIN)", "input range (MAX)" and "unit" are sequentially arranged vertically.

Comparing the input sensor database D102 with the simulation sensor database D103, because the items of "No", "model name", "sensor type", "output format", "input range (MIN)", "input range (MAX)" and "unit" in the input sensor database D102 are contained in the simulation sensor database D0103, the order of those items is specified. Further, the item of "manufacturer" is not contained in the input sensor database D0102. As an example of a conversion pattern, the item of "manufacturer" is acquired from the account of the sensor vendor, for example, as in the case of FIG. 91A.

According the above conversion rule, the input sensor database D102 is converted into the format of the simulation sensor database D103. Specifically, for the matching items, the items are arranged horizontally, and "No" is converted into the first item, "model name" is converted into the fourth item, "sensor type" is converted into the second item, "output format" is converted into the eighth item, "input range (MIN)" is converted into the fifth item, "input range (MAX)" is converted into the sixth item, and "unit" is converted into the seventh item. Further, for the mismatching items, the account name of the sensor vendor is registered in the item of "manufacturer".

Then, the format error determination unit 441 determines whether there is an error in the converted input sensor database and displays an error list and corrects an error (S505). The format error determination unit 441 determines the presence or absence of an error to see if there is abnormal data in order to register the input sensor database after the format conversion into the sensor database 421.

For example, it is determined whether the sensor type is a type that is not recognizable by the web simulator 4, whether the input range is outside the allowable range of the web simulator 4, the sensor characteristics are abnormal characteristics due to the number of plots and the variation of plots and the like. When the format error determination unit 441 determines that there is an error, an error list is displayed on the sensor vendor terminal 5, and the sensor vendor corrects data where an error is detected.

Further, the input data may be compared with previously registered data and a part having different information may be determined as an error. For example, in the case where a sensor of the same group as the input sensor is registered, it can be determined that there is an error in information that is largely different from information of the sensor of the same group. Note that the sensor of the same group can be identified by the character string at the head of the model name.

Then, the sensor registration and update unit 418 registers the sensor list (input sensor database) after the error correction in the sensor database 421 and the sensor bias circuit database 422 (S506), and the web page processing unit 411 displays the sensor list screen with a flag on the sensor vendor terminal 5 (S507).

Examples of screens displayed on the sensor vendor terminal 5 in the simulation system according to this embodiment are described hereinbelow.

Figure 92:
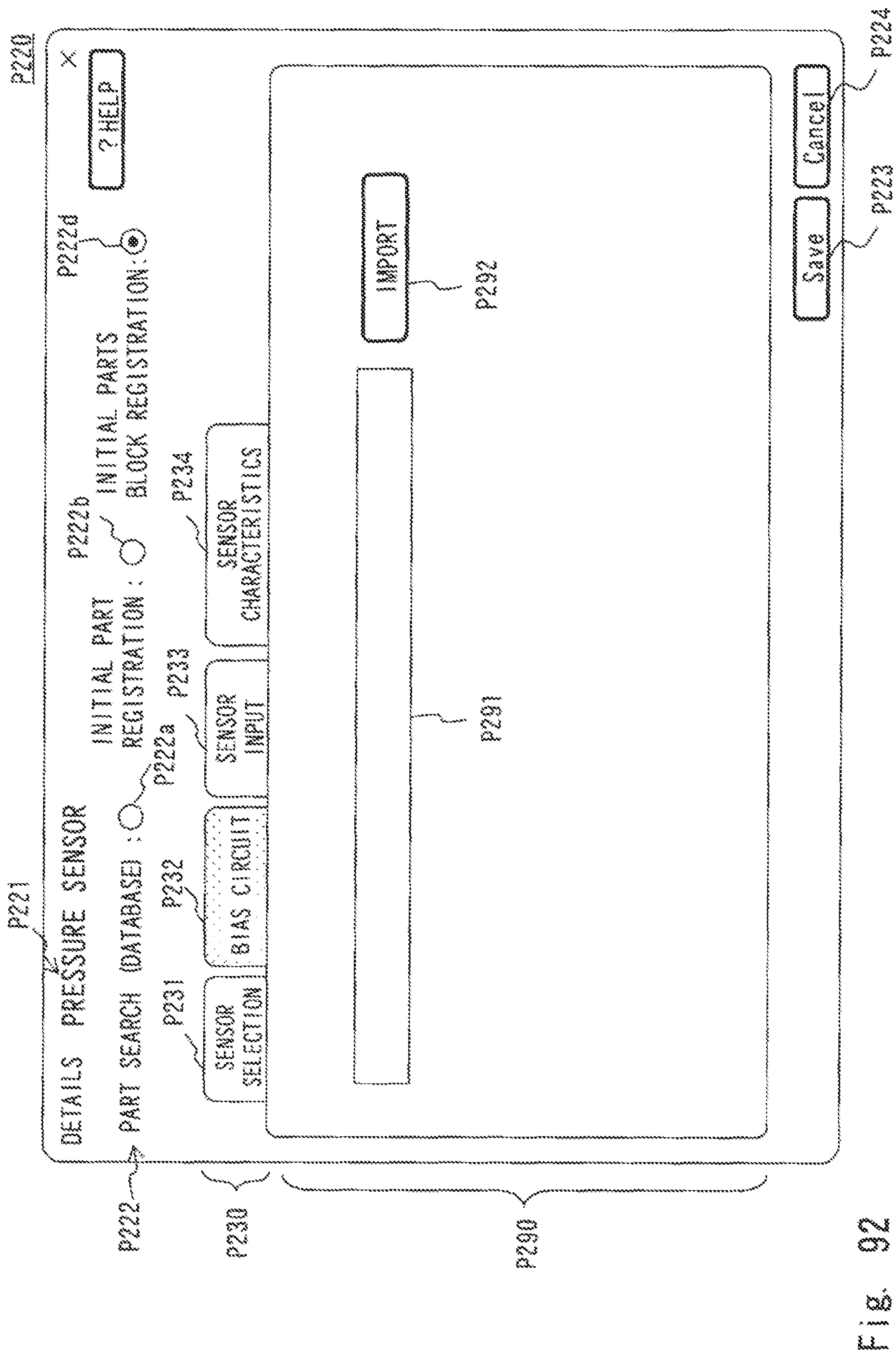
FIG. 92 is a display image diagram of a display screen used in a simulation method of the web simulator according to the third embodiment.

FIG. 92 shows a display example of the file input screen displayed in S502 of FIG. 90. As shown in FIG. 92, in this embodiment, in the part search/registration selection area P222 in the upper part of the sensor details screen P220, an "initial parts bulk registration" radio button P222*d* is displayed in addition to the "part search" radio button P222*a* and the "initial part registration" radio button P222*b*.

When the "set details" button P213 is clicked on the sensor selection screen P200, and the "initial parts bulk registration" radio button P222*d* is selected in the part search/registration selection area P222, a file input screen P290 is displayed within the sensor details screen P220. On the file input screen P290, a file input box P291 and an "import" button P292 are displayed. When a file name to be input (input sensor database name) is input to the file input box P291 and the "import" button P292 is clicked on, the file is imported into the web simulator 4. When the input sensor database is input, the format conversion unit 440 converts the format.

Note that the format of the input file may be any format because it is converted into the format that can be registered in the web simulator by the format conversion unit 440. For example, an Excel (registered trademark) file, XML file, CSV file or the like may be used. Further, a PDF file of a datasheet or data generated by scanning a datasheet may be used.

Figure 93:
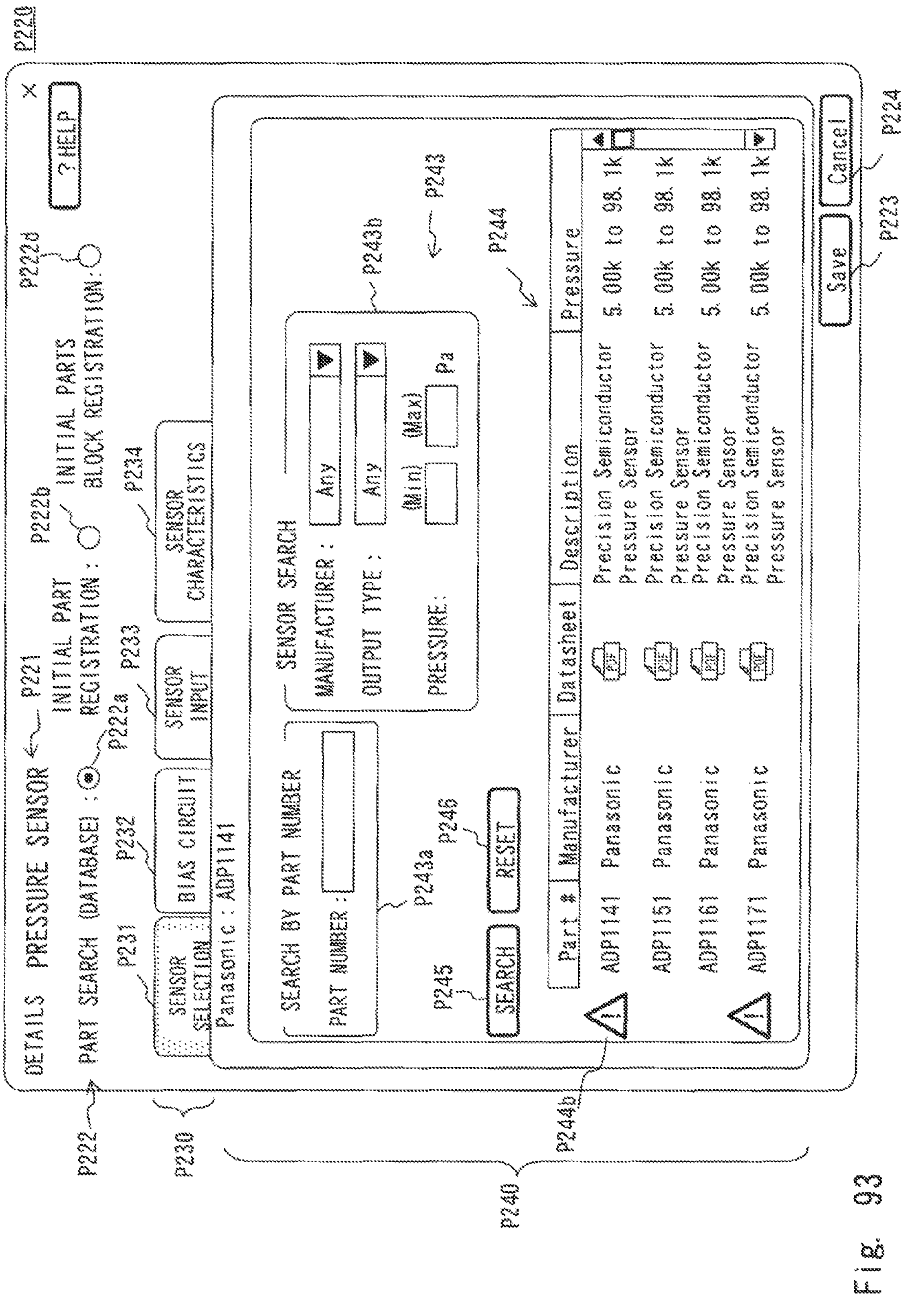
FIG. 93 is a display image diagram of a display screen used in a simulation method of the web simulator according to the third embodiment.

FIG. 93 shows a display example of an error list that is displayed in S505 of FIG. 90. In this example, as the error list, the sensor list P244 of the sensor list screen P240 is displayed with an error flag. When the file of the input sensor database is input and the format conversion is done, the sensor list screen P240 is displayed within the sensor details screen P220. In the sensor list P244, a flag mark P244*b* indicating an input error is displayed on the left of the sensor where an error is occurring based on error determination by the format error determination unit 441. Note that it is not limited to the flag mark as long as the sensor that is determined as having an error can be identified, and the sensor may be displayed in a different color, for example.

Figure 94A:
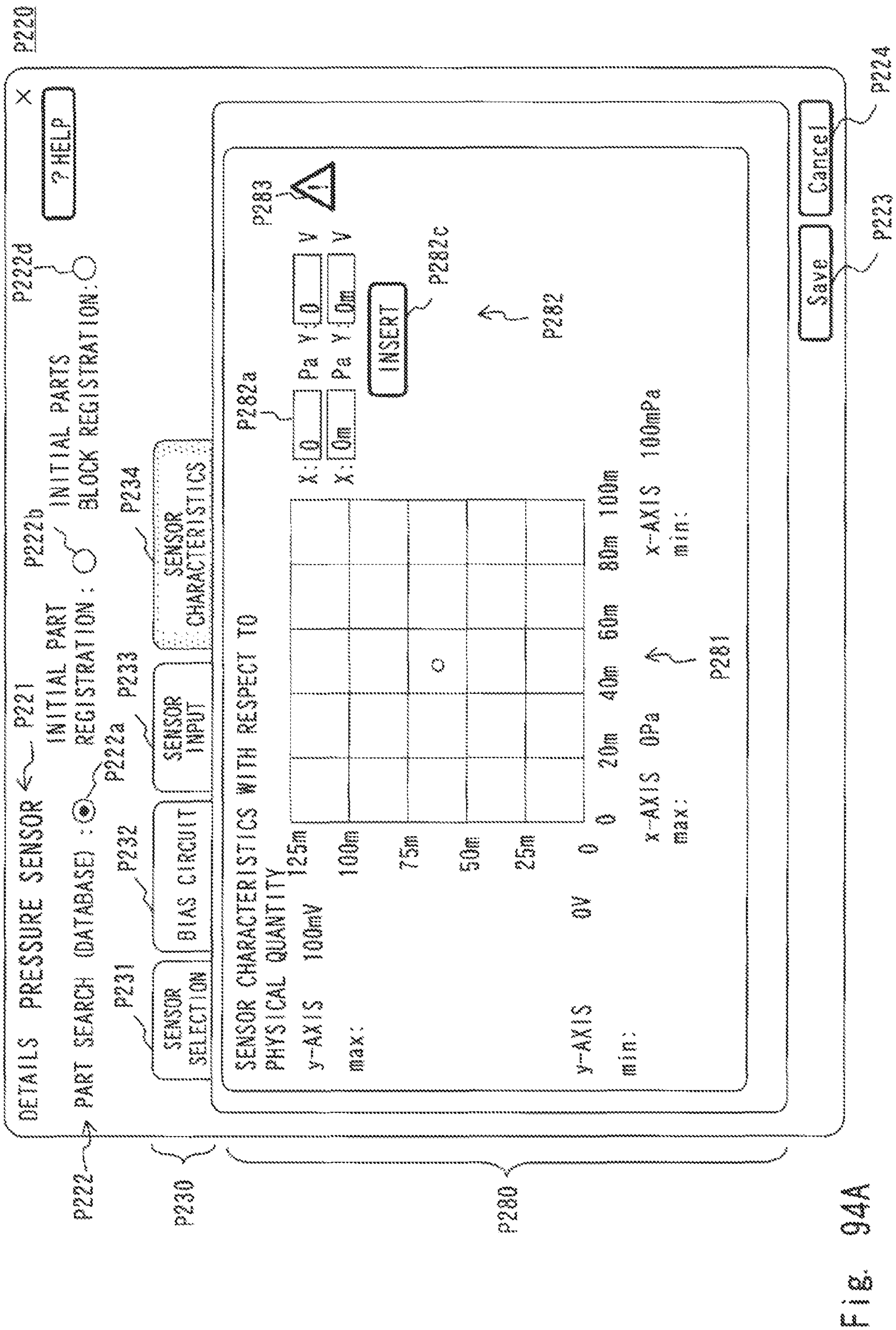
FIG. 94A is a display image diagram of a display screen used in a simulation method of the web simulator according to the third embodiment.
Figure 94B:
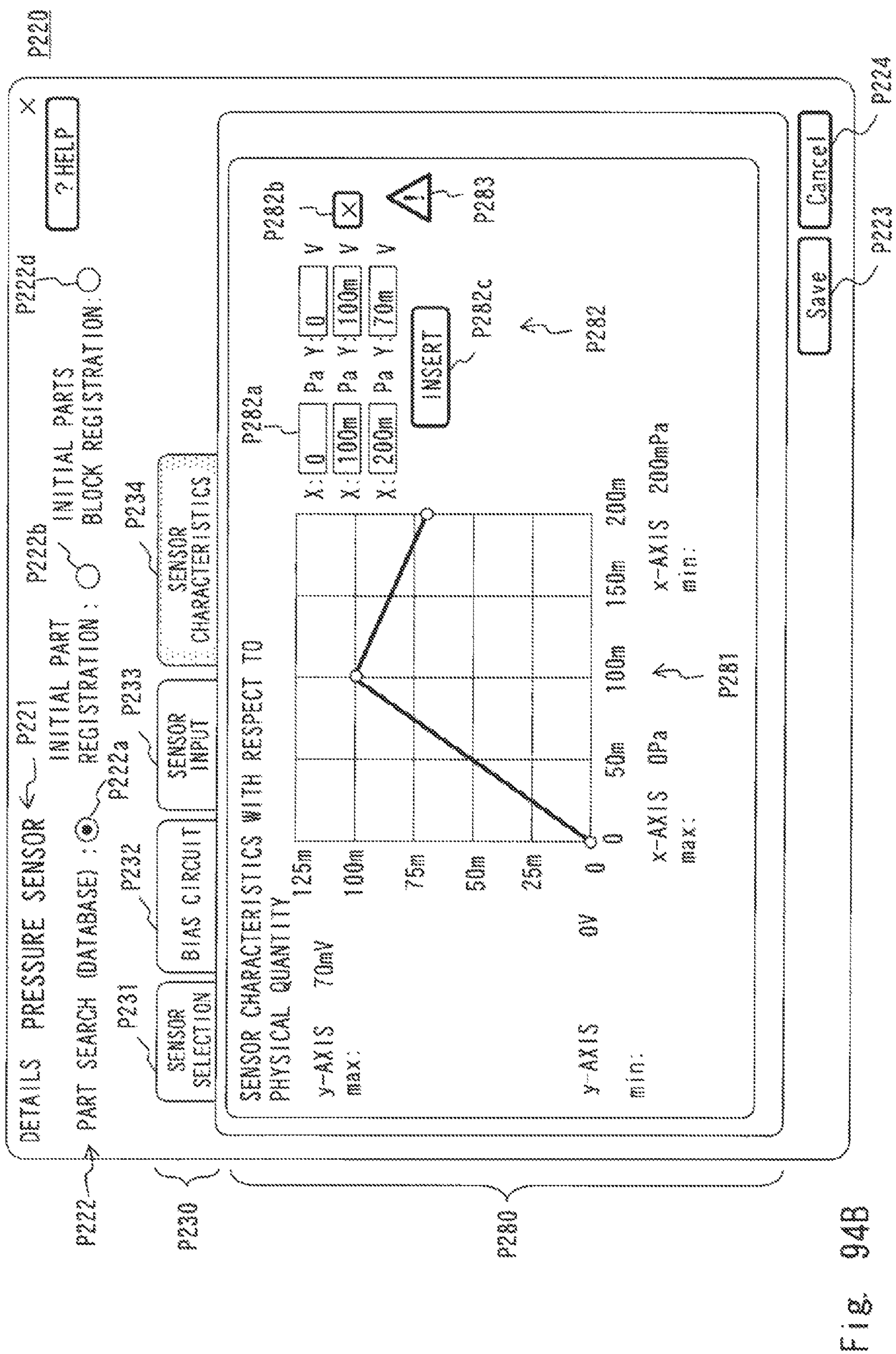
FIG. 94B is a display image diagram of a display screen used in a simulation method of the web simulator according to the third embodiment.

FIGS. 94A and 94B show display examples of an error details screen that displays the details of an error when there is an error in sensor characteristics. In this example, as the error details screen, the sensor characteristics screen is displayed with an error flag. When the sensor for which an error is displayed is selected on the sensor list screen P240 of FIG. 93, the sensor characteristics screen is displayed as shown in FIGS. 94A and 94B, and a flag mark P283 indicating an input error is displayed at the right end of the screen.

FIG. 94A shows an example that is determined as a characteristics error because "MIN" and "MAX" are "0" and the characteristics cannot be plotted. FIG. 94B shows an example that is determined as a characteristics error because the plots of characteristics indicate abnormal values. Although, as the characteristics of the sensor, the output voltage should increase with an increase in the input physical quantity, the output voltage increases and then decreases as the input physical quantity increases in FIG. 94B and is thus determined as an error. Further, a desired value for the sensor characteristics may be predicted, and it may be determined that there is an error when the input characteristics are significantly different from the predicted value.

Then, the characteristics error is eliminated by correcting the sensor characteristics by modifying the characteristics graph P281 and the characteristics plot entry area P282 on the sensor characteristics screen of FIGS. 94A and 94B, just like the case of updating the sensor characteristics (S19 in FIG. 33).

Figure 95:
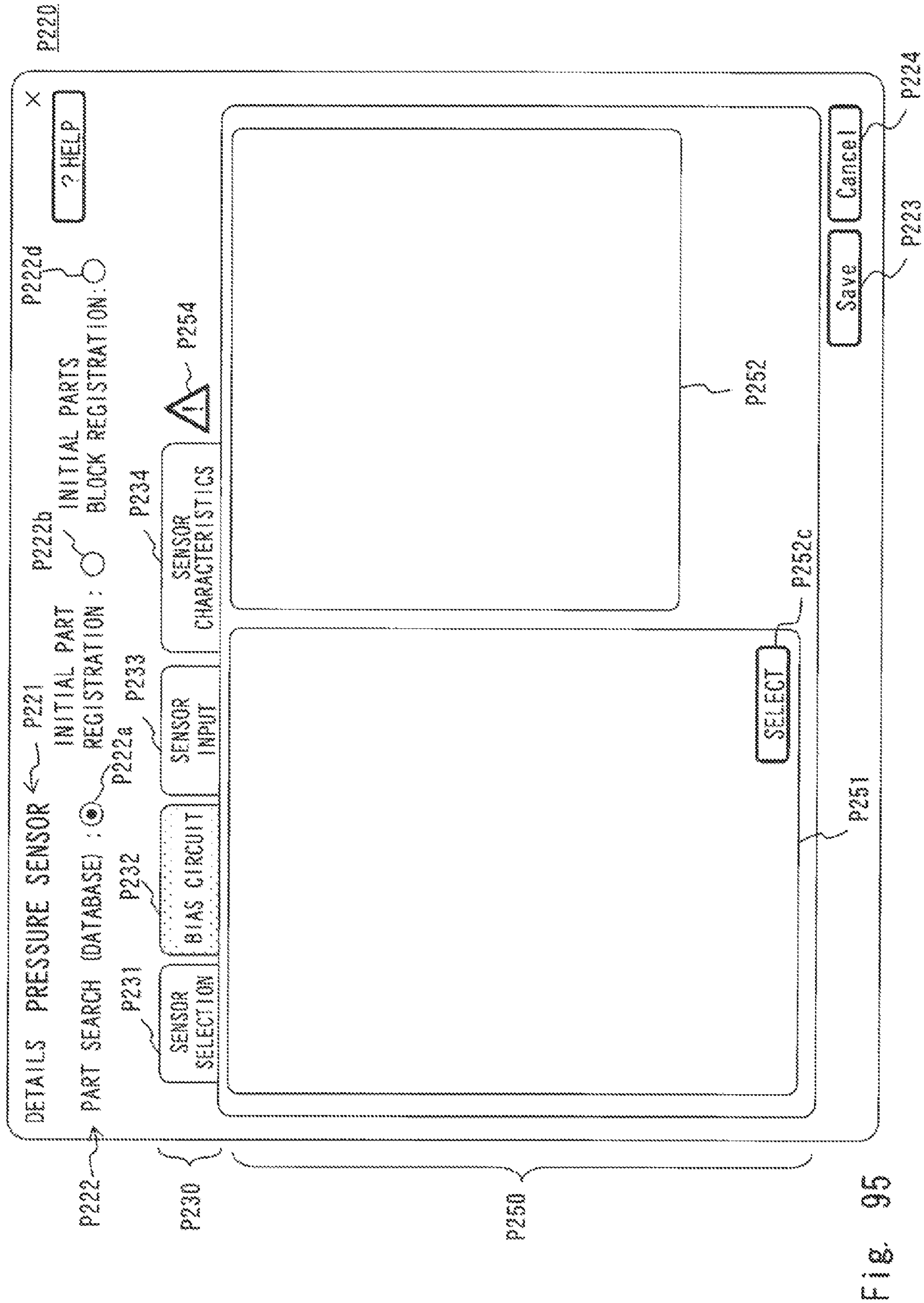
FIG. 95 is a display image diagram of a display screen used in a simulation method of the web simulator according to the third embodiment.

FIG. 95 shows a display example of an error details screen that displays the details of an error when there is an error in a bias circuit. In this example, as the error details screen, the bias circuit selection screen is displayed with an error flag. When the sensor for which an error is displayed is selected on the sensor list screen P240 of FIG. 93, the bias circuit selection screen is displayed as shown in FIG. 95, and a flag mark P252*d* indicating an input error is displayed in the upper part of the screen.

Figure 96:
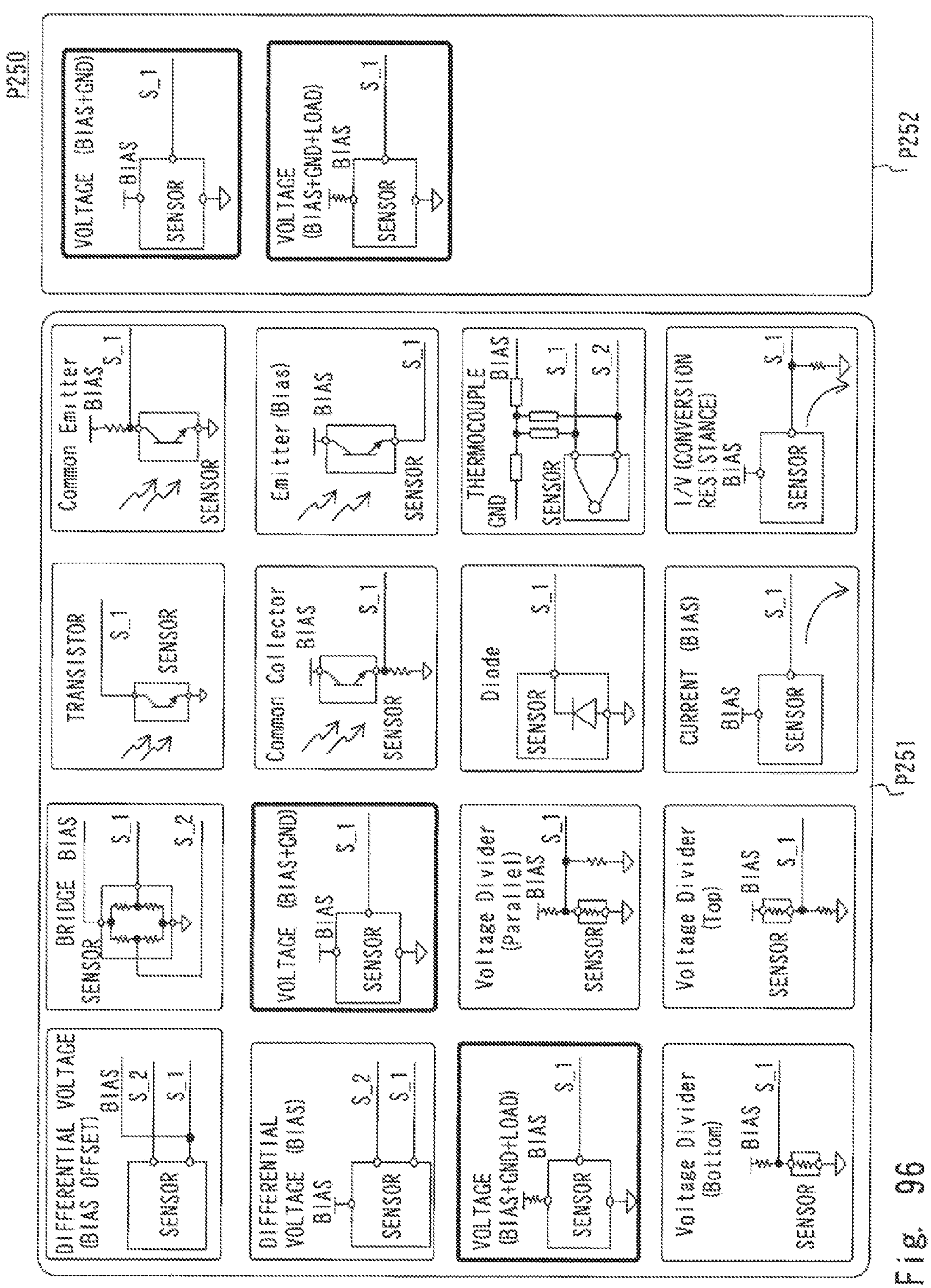
FIG. 96 is a display image diagram of a display screen used in a simulation method of the web simulator according to the third embodiment.

Because no bias circuit is displayed on the bias circuit selection screen of FIG. 95, a "select" button P252*c* that enables selection of a bias circuit is displayed. When the "select" button P252*c* is clicked on, all bias circuits are displayed in the circuit list P251 as shown in FIG. 96, so that bias circuits can be selected. Bias circuits are selected from the circuit list P251, and the selected bias circuits are displayed in the selected circuit P252, and thereby an error in the bias circuit is eliminated.

Figure 97:
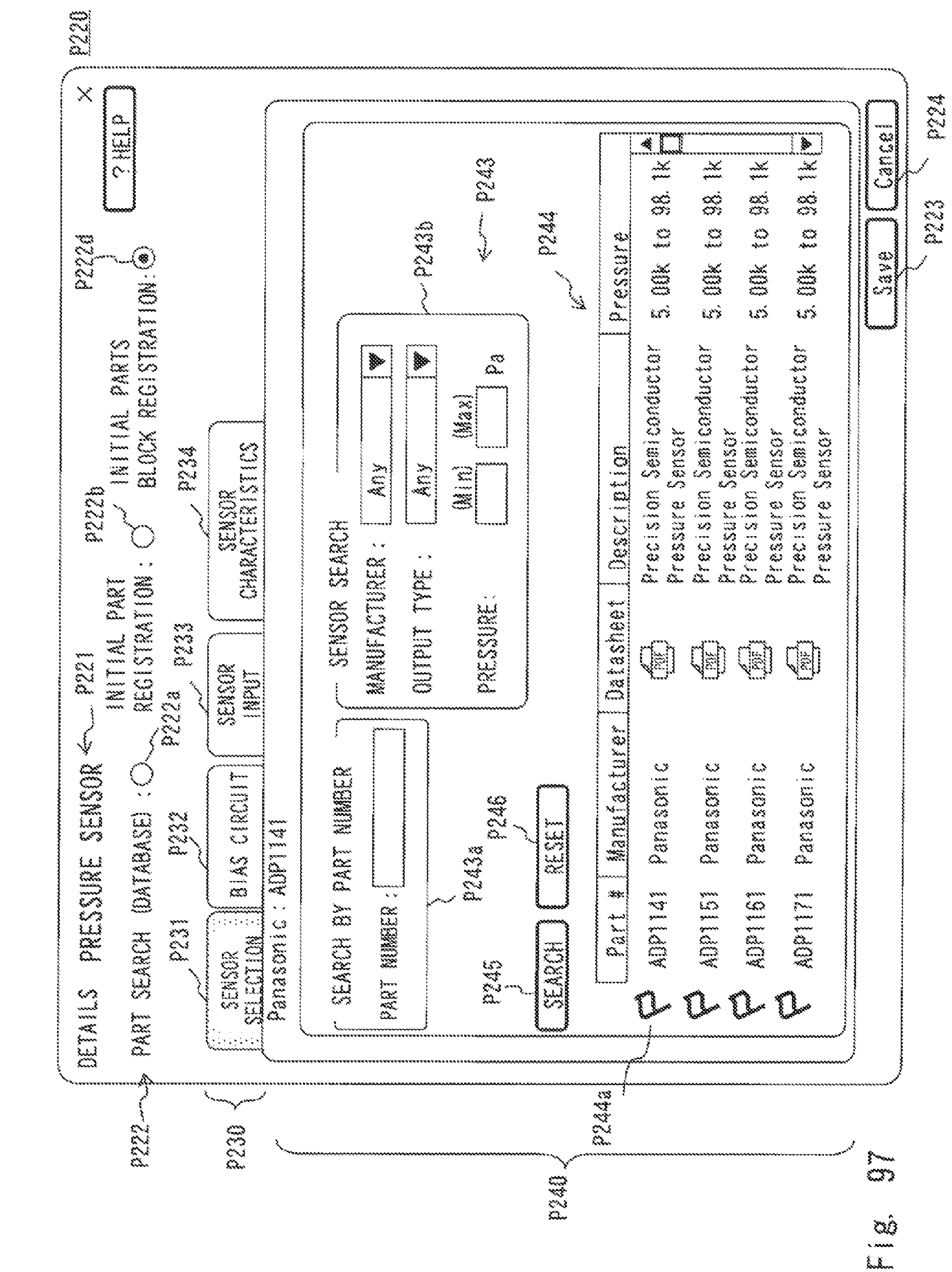
FIG. 97 is a display image diagram of a display screen used in a simulation method of the web simulator according to the third embodiment.

FIG. 97 shows a display example of the sensor list screen with a flag that is displayed in S507 of FIG. 90. After the format of the input sensor database is converted and an error is corrected, the sensor list screen P240 is displayed in the sensor details screen P220. Just like the case where the sensor vendor initially registers a sensor, the flag mark P244*a* indicating initial, bulk registration is displayed on the left of all sensors in the sensor list P244. After confirming the flag marks P244*a*, the "save" button P223 is clicked on to register all the sensors in bulk in the sensor database.

As described above, according to this embodiment, sensor information can be input (imported) using a file (database), and the format of the input sensor information (database file) is converted into the format of the sensor database of the web simulator. It is thereby possible to input sensor information in various formats, so that the sensor information can be input with a simple operation. Because a plurality of sensor information can be input at a time, a large amount of sensor information can be registered in bulk.

Fourth Embodiment

A fourth embodiment is described hereinafter with reference to the drawings. While simulation is performed by registering one sensor characteristics for one sensor and in the first embodiment, simulation is performed by registering sensor characteristics for each of a plurality of use environments (physical environmental conditions) for one sensor in this embodiment.

Figure 98:
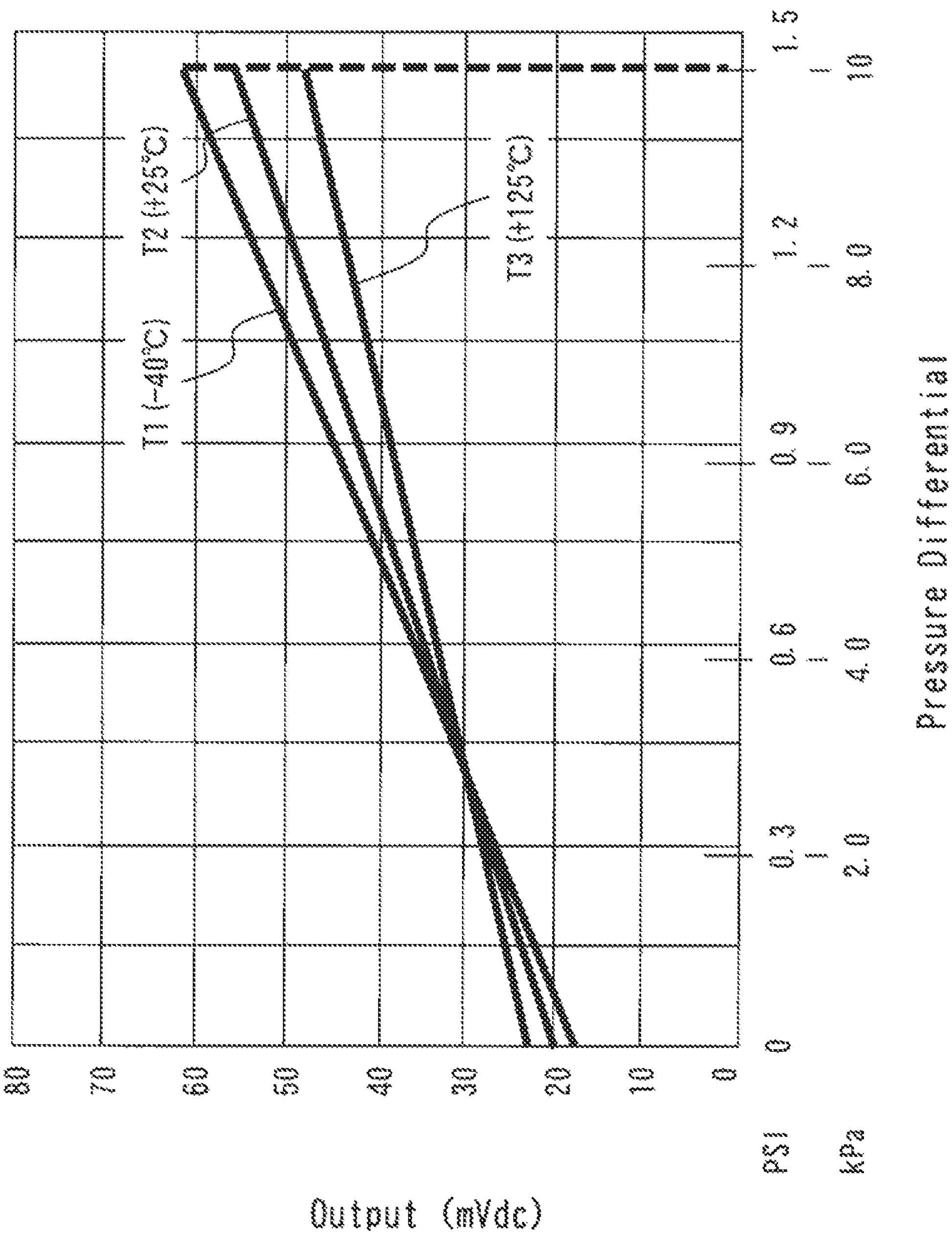
FIG. 98 is a characteristic graph to explain an overview of a simulation method according to the fourth embodiment.

FIG. 98 shows one example of the characteristics of an output voltage with respect to a pressure in a pressure sensor. Further, FIG. 98 shows characteristics T1 at low temperature of −40° C., characteristics T2 at room temperature of 25° C. and characteristics T3 at high temperature of 125° C. under certain driving conditions. As shown in FIG. 98, the slope of the characteristics is different depending on temperature, and the sensor sensitivity varies. At −40° C., the slope of the characteristics is steeper than at 25° C. and the sensitivity is high, and at 125° C., the slope of the characteristics is slower than at 25° C. and the sensitivity is low.

Thus, when simulation is performed using the sensor characteristics at room temperature (25° C.) only, the sensor characteristics vary when the use environment of the user is low temperature (−40° C.) or high temperature (125° C.), and it is not possible to perform simulation accurately according to the use environment.

In view of the above, according to this embodiment, the characteristics at low temperature (−40° C.) and high temperature (125° C.) in addition to the characteristics at 25° C. are registered, and simulation is performed according to the use environment. For example, because the sensor sensitivity at −40° C. increases by about 10% (a gain increases by 0.8 dB) compared with that at 25° C., the setting file in which the amplifier gain is reduced by 0.8 dB compared with that at 25° C. is generated, and because the sensor sensitivity at 125° C. decreases by about 12% (a gain decreases by 1.1 dB; compared with that at 25° C., the setting file in which the amplifier gain is increased by 1.1 dB compared with that at 25° C. is generated, and simulation is performed.

Figure 99:
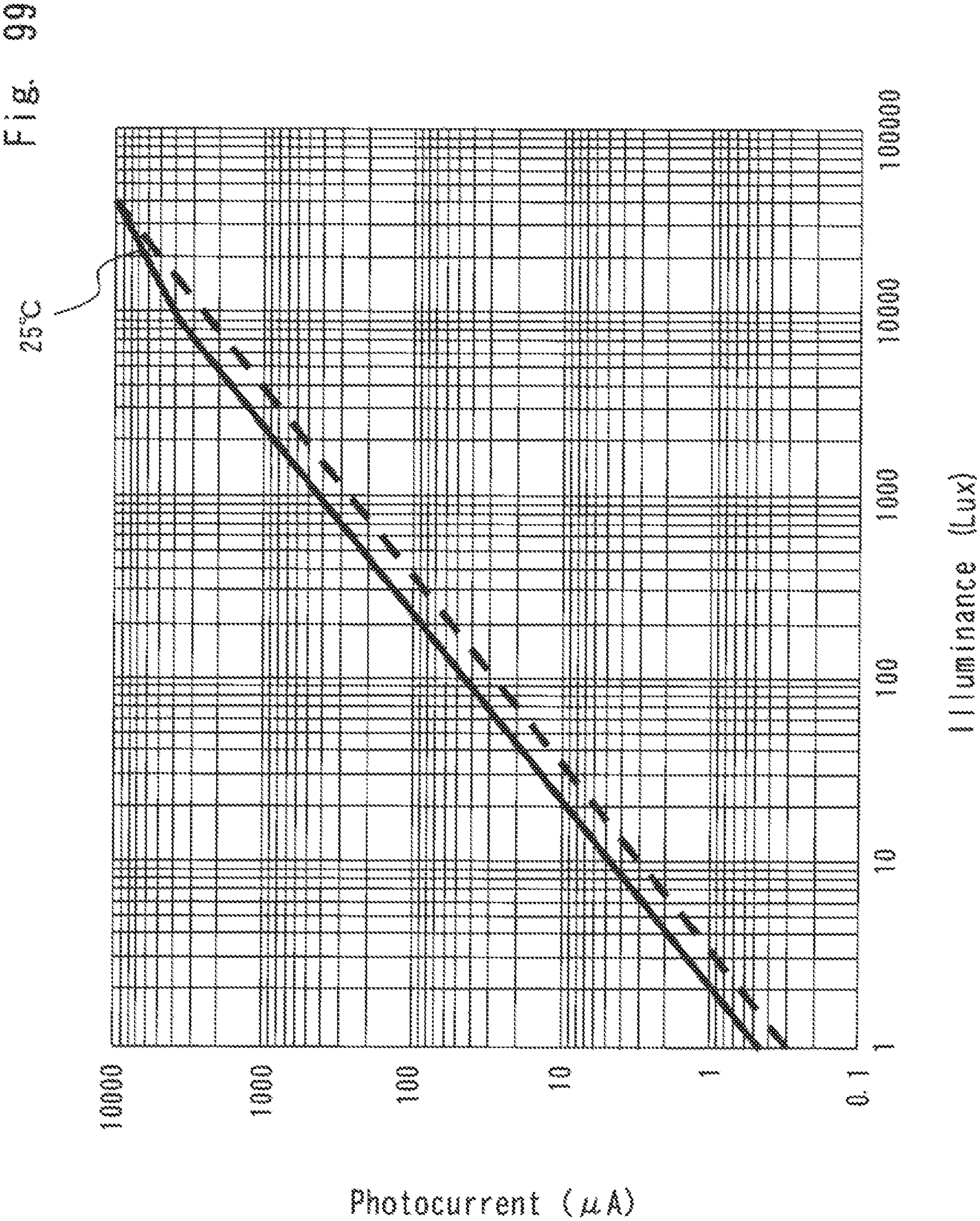
FIG. 99 is a characteristic graph to explain an overview of a simulation method according to the fourth embodiment.
Figure 100:
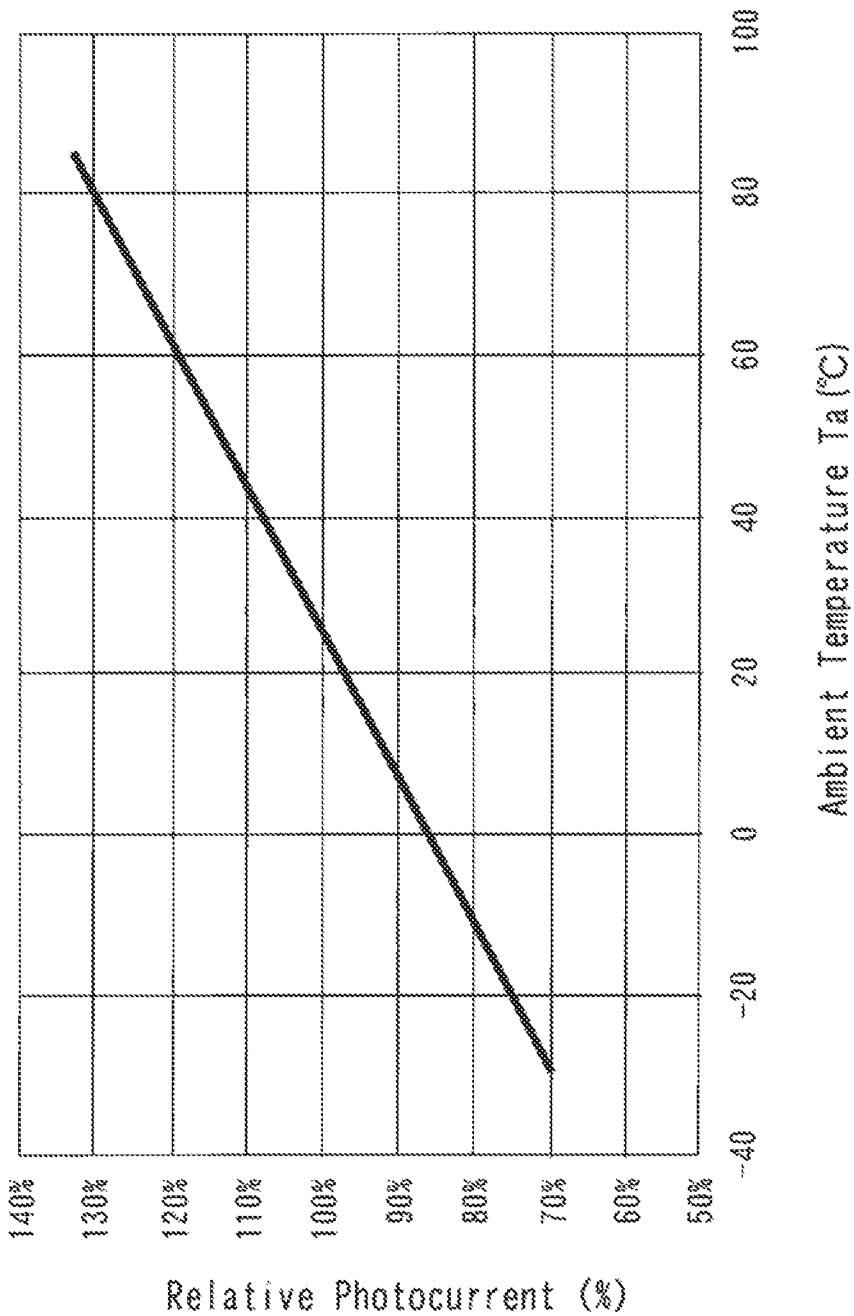

FIG. 99 shows the characteristics of an output current (photocurrent) with respect to illuminance in a phototransistor, and FIG. 100 shows the characteristics of a relative output current (photocurrent) with respect to temperature in a phototransistor. As shown in FIG. 100, the output current is different depending on temperature, and the sensor sensitivity varies. At low temperature, the output current is lower than at high temperature and the sensitivity is low, and at high temperature, the output current is higher than at low temperature and the sensitivity is high.

Thus, when simulation is performed using the sensor characteristics at room temperature only, it is not possible to perform simulation accurately according to the use environment just like the case of a pressure sensor. In view of this, according to this embodiment, the characteristics at low temperature and high temperature in addition to the characteristics at room temperature (25° C.) are registered, and simulation is performed according to the use environment. For example, because the sensor sensitivity at 0° C. decreases by about 14% (a gain decreases by 1.3 dB) compared with that at 25° C., the setting file in which the amplifier gain is increased by 1.3 dB compared with that at 25° C. and further the offset is changed is generated, and because the sensor sensitivity at 60° C. increases by about 20% (a gain decreases by 1.6 dB) compared with that at 25° C., the setting file in which the amplifier gain is increased by 1.6 dB compared with that at 25° C. and further the offset is changed is generated, and simulation is performed.

Note that, although an example of temperature in a pressure sensor or a phototransistor is described as the use environment of the sensor, it is not limited thereto as long as it is the physical environment that affects the sensor characteristics, and this embodiment is equally applicable to a distance in an photosensor, a pressure in an infrared sensor and the like.

A specific example of the web simulator that implements this embodiment is described hereinbelow. This embodiment is the same as the first embodiment except that it performs simulation by registering the sensor characteristics for each use environment.

Figure 101:
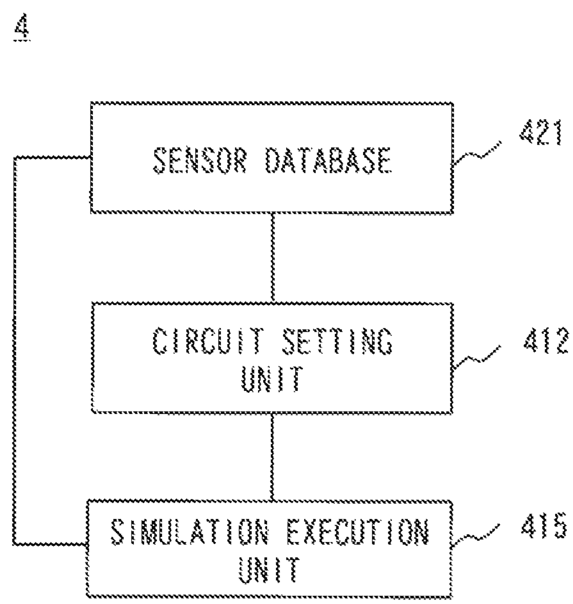

For example, as shown in FIG. 101, the web simulator 4 may be configured using some of the blocks shown in FIGS. 28A and 28B in this embodiment. The web simulator 4 of FIG. 101 includes the sensor database (sensor information storage unit) 421, the circuit setting unit (selection unit) 412 and the simulation execution unit 415.

In FIG. 101, the sensor database 421 stores a plurality of sensor characteristics of a sensor that opiates under certain driving conditions and a plurality of different physical environmental conditions, the plurality of sensor characteristics respectively corresponding to the plurality of physical environmental conditions, which is the sensor characteristics for each physical environmental conditions affecting the sensor characteristics. The circuit setting unit 412 generates a setting file to set the configuration of a connection circuit in which a sensor with certain sensor characteristics and the semiconductor device 1 having an analog front-end circuit with a variable circuit configuration are connected for each of the physical environmental conditions. Further, the circuit setting unit 412 selects the physical environmental conditions where simulation is to be performed from the plurality of physical environmental conditions. The simulation execution unit 415 executes simulation of the connection circuit including the sensor having the sensor characteristics corresponding to the selected physical environmental conditions and the semiconductor device 1 for each of the physical environmental conditions based on the sensor characteristics and the setting file for each physical environmental conditions.

Further, the web simulator 4 may include a sensor characteristics display unit that displays sensor characteristics for each physical environmental conditions, a sensor registration and update unit that registers/updates the sensor characteristics in response to an input operation on the displayed sensor characteristics, a connection display unit that displays the configuration of a connection circuit for each physical environmental conditions, a setting file registration and update unit that registers/updates a setting file in response to an input operation on the displayed configuration of the connection circuit and the like.

In this embodiment, in the sensor and bias circuit registration and selection process of FIG. 32, a plurality of sensor characteristics are registered or updated for each use environment. Specifically, when the sensor vendor has selected registration of a sensor in S12 of FIG. 32, the web page processing unit 411 displays the sensor characteristics screen on the sensor vendor terminal 5, and the sensor vendor inputs a plurality of sensor characteristics (S13). At this time, the screen is displayed so that a plurality of sensor characteristics can be input corresponding to each use environment for one sensor. When the sensor vendor sets the sensor characteristics for each use environment on the sensor characteristics screen, the sensor registration and update unit 418 stores the set plurality of sensor characteristics information in association with the use environment into the sensor database 421.

Then, the web page processing unit 411 displays the bias circuit selection screen on the sensor vendor terminal 5, and the sensor vendor selects a bias circuit (S14). As in the first embodiment, the sensor registration and update unit 418 stores the bias circuit selected by a sensor vendor on the bias circuit selection screen in the simulation bias circuit data 422*b* of the sensor bias circuit database 422. Although a plurality of bias circuits are selected for one sensor in the simulation bias circuit data 422*b* in this example, a plurality of bias circuits may be selected respectively for a plurality of sensor characteristics of one sensor. For example, the sensor vendor may select different bias circuits for different use environments on the bias circuit selection screen, and the sensor registration and update unit 418 may store the selected bias circuits in association with the use environment into the simulation bias circuit data 422*b*.

On the other hand, when the sensor vendor selects a sensor from the sensor list in S18 of FIG. 32, the web page processing unit 431 displays the sensor characteristics screen on the sensor vendor terminal 5, and the sensor vendor inputs a plurality of sensor characteristics (S19). When the sensor vendor modifies and sets the sensor characteristics for each use environment on the sensor characteristics screen just like in the registration of the sensor characteristics in S13, the sensor registration and update unit 418 updates the corresponding sensor information in the sensor database 421 using the plurality of set sensor characteristics information.

Then, the web page processing unit 411 displays the bias circuit selection screen on the sensor vendor terminal 5, and the sensor vendor selects bias circuits (S20). The sensor vendor may select a plurality of bias circuits for one sensor or select a plurality of bias circuits respectively for a plurality of sensor characteristics of one sensor as in S14. For example, when the sensor vendor updates (adds/deletes) a bias circuit for each use environment on the bias circuit selection screen, the sensor registration and update unit 418 updates the corresponding bias circuit in the simulation bias circuit data 422*b*.

Further, in this embodiment, connections are set for each use environment in the sensor-AFE connection process of FIG. 34. Specifically, as shown in FIG. 34, the sensor-AFE connection screen is displayed on the sensor vendor terminal 5 (S31), connections for automatic connection are displayed on the sensor-AFE connection screen (S32), and the circuit setting unit 412 performs setting and registration of a plurality of sensor vendor recommended connections according to the operation by the sensor vendor (S33). The sensor-AFE connection screen is displayed so that different sensor vendor recommended connections can be set for different use environments. When the sensor vendor sets a recommended connection recommended to a user for each of use environments on the sensor-AFE connection screen, the circuit setting unit 412 stores connections of the selected sensor vendor recommended connection in association with a use environment in the vendor circuit setting file 426*b* of the circuit information storage unit 426. Note that, in the case where a plurality of bias circuits are set, sensor vendor recommended connection is set and stored for each combination of a bias circuit and a use environment in order to set sensor vendor recommended connection for each bias circuit.

Further, in this embodiment, simulation is performed for each use environment in the simulation process of FIGS. 36 to 43. Specifically, as shown in FIGS. 36 and 37, the simulation screen is displayed on the sensor vendor terminal 5 or the user terminal 3 (S201, S212), connections for automatic connection or sensor vendor recommended connection are displayed on the simulation screen (S202, S213), and a simulation process is executed in response to an operation by the sensor vendor or the user (S203, S214). The simulation screen is displayed so that simulation can be executed for each use environment. Simulation is performed based on the sensor characteristics and connections for each use environment. The automatic setting process (amplifier gain setting) is executed for each use environment in FIG. 38, the transient analysis process is executed for each use environment in FIG. 41, the AC analysis process is executed for each use environment in FIG. 42, the filter effect analysis process is executed for each use environment in FIG. 43, and the synchronous detection analysis process is executed for each use environment in FIG. 44.

Figure 102:
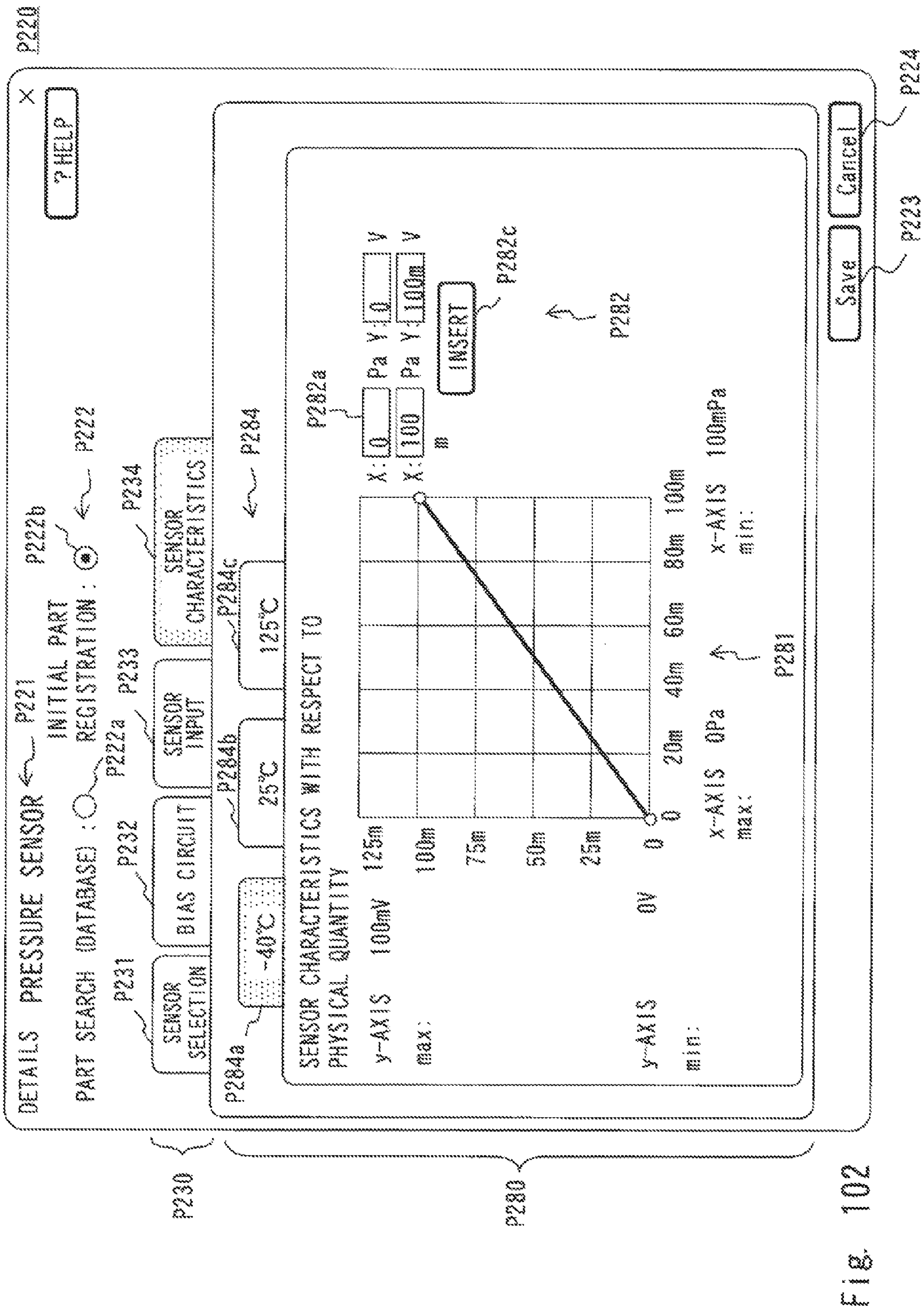

A specific example of screen display according to this embodiment is described hereinbelow. FIG. 102 shows a display example of the sensor characteristics screen P280 within the sensor details screen P220 according to this embodiment. On the sensor characteristics screen P280, the sensor vendor registers and updates the sensor characteristics for each use environment.

The sensor characteristics screen P280 of FIG. 102 has a use environment selection area P284 in its upper part, which is different from that in the first embodiment. In the use environment selection area P284, tabs to select an environment where a sensor is used are displayed. In FIG. 102, "−40° C." tab P284*a*, "25° C." tab P284*b* and "125° C." tab P284*c* are displayed in the use environment selection area P284 as one example of the use environment of a pressure sensor.

Figure 103:
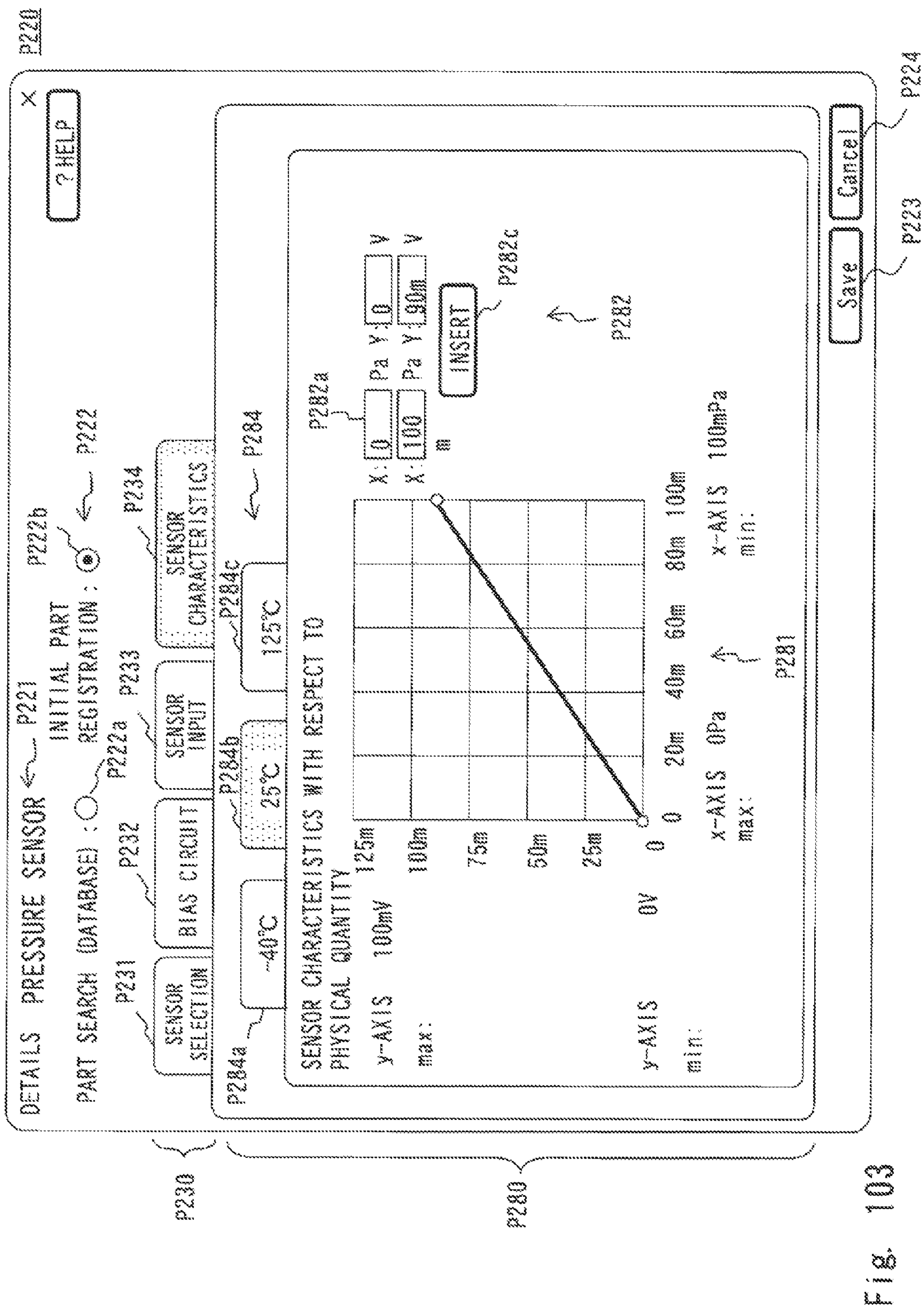
Figure 104:
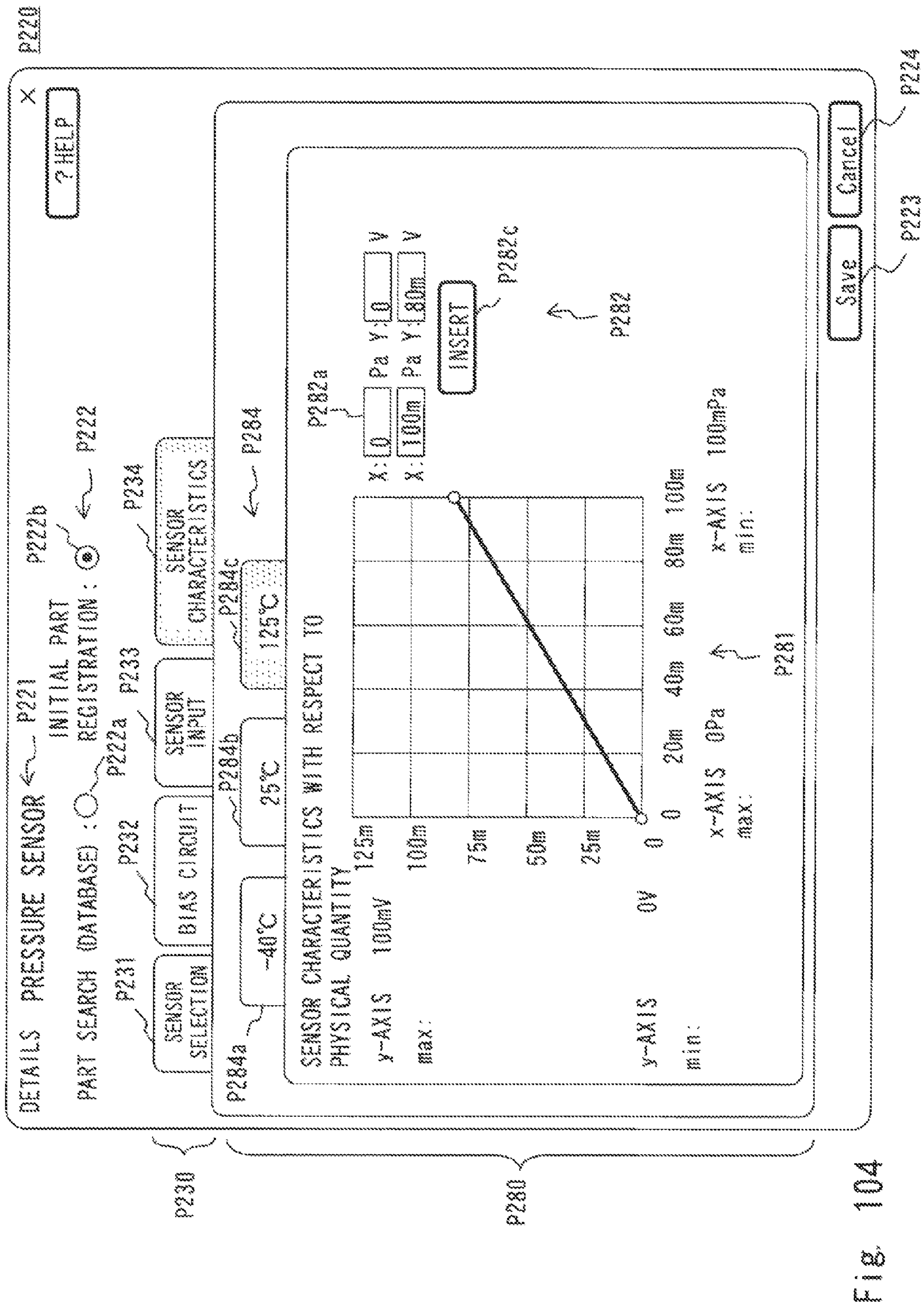

As in FIG. 102, when the "−40° C." tab P284*a* is clicked on, it becomes the input state of the sensor characteristics at −40° C. In this state, when the sensor vendor sets the sensor characteristics in the characteristics graph P281 and the characteristics plot entry area P282 based on the characteristics of the datasheet as shown in FIG. 98 and clicks on the "save" button P223, the sensor characteristics at −40° C. are registered or updated in the sensor database 421. Further, when the "25° C." tab P284*b* is clicked on as shown in FIG. 103, it becomes the input state of the sensor characteristics at 25° C. In this state, when the sensor vendor sets the sensor characteristics in the characteristics graph P281 and the characteristics plot entry area P282 based on the characteristics of the datasheet as shown in FIG. 98 and clicks on the "save" button P223, the sensor characteristics at 25° C. are registered or updated in the sensor database 421. Further, when the "125° C." tab P284*c* is clicked on as shown in FIG. 104, it becomes the input state of the sensor characteristics at 125° C. In this state, when the sensor vendor sets the sensor characteristics in the characteristics graph P281 and the characteristics plot entry area P282 based on the characteristics of the datasheet as shown in FIG. 98 and clicks on the "save" button P223, the sensor characteristics at 125° C. are registered or updated in the sensor database 421.

Note that a plurality of sensor characteristics at different temperatures of a phototransistor may be registered and updated based on the characteristics of the datasheet as shown in FIGS. 99 and 100. Further, a sensor vendor may input the sensor characteristics at room temperature as shown in FIG. 99 and the temperature characteristics as shown in FIG. 100, and the web simulator 4 may generate a plurality of sensor characteristics at different temperatures based on the temperature characteristics and register and update them.

Figure 105:
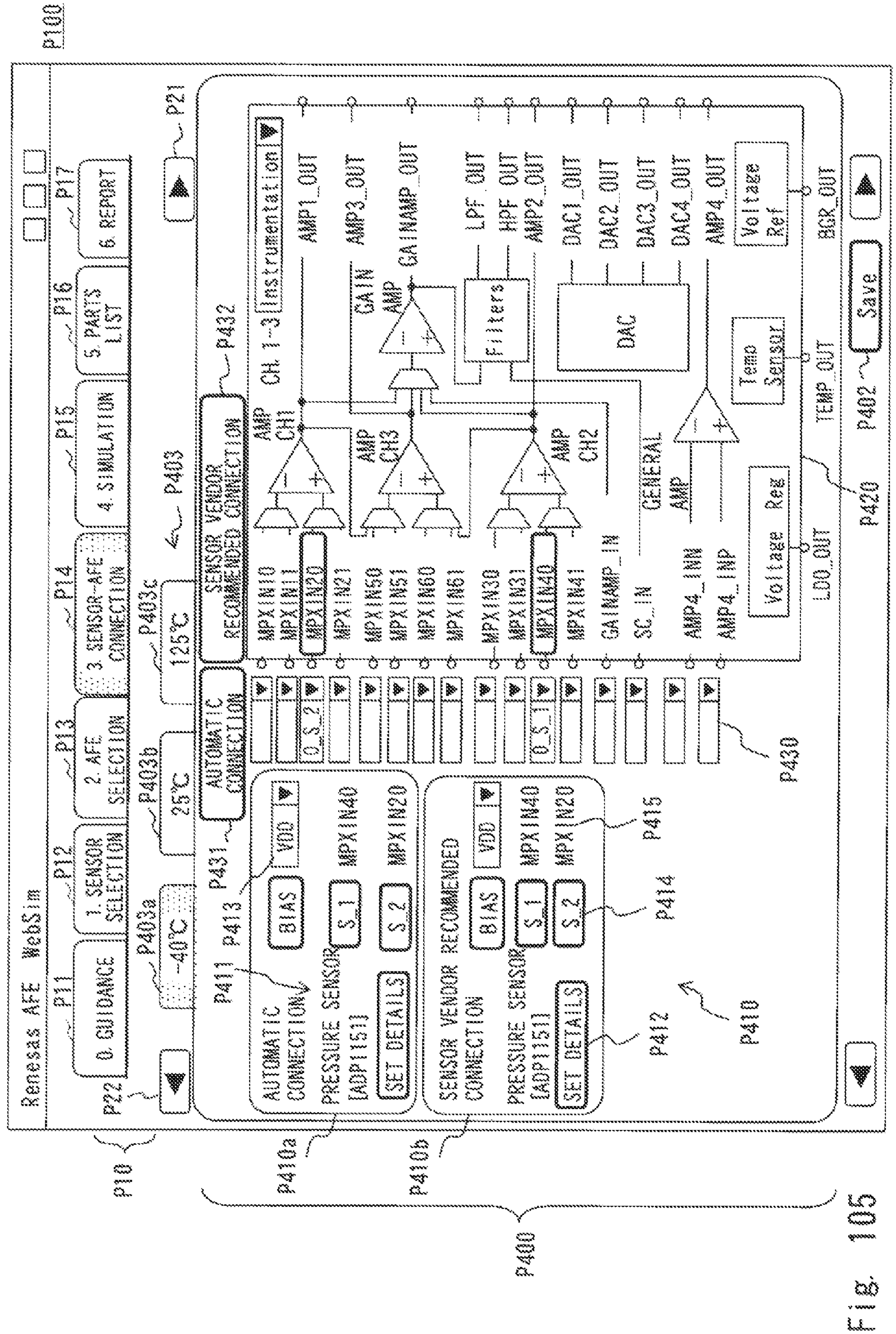

FIG. 105 shows a display example of the sensor-AFE connection screen P400 according to this embodiment. On the sensor-AFE connection screen P400, a sensor vendor sets the vendor recommended connection for each use environment.

The sensor-AFE connection screen P400 of FIG. 105 has a use environment selection area P403 in its upper part, which is different from that in the first embodiment. In the use environment selection area P403, tabs to select an environment where a sensor is used are displayed. In the use environment selection area P403, tabs corresponding to the sensor characteristics registered in S102 are displayed, and "−40° C." tab P403*a*, "25° C." tab P403*b* and "125° C." tab P403*c* are displayed in the use environment selection area P403 in FIG. 105. Note that tabs to select a bias circuit may be displayed in the bias circuit selection area P401 on the sensor-AFE connection screen P400 just like in the first embodiment.

When the "−40° C." tab P403*a* is clicked on, it becomes the input state of the connections at −40° C. In this state, when a sensor vendor sets the connections between the sensor and the semiconductor device 1 by operating the input terminal pulldown menu P430 or the like and clicks on the "save" button P402, the selected connections are stored as vendor recommended connection at −40° C. in the vendor circuit setting file 426*b* of the circuit information storage unit 426.

Figure 106:
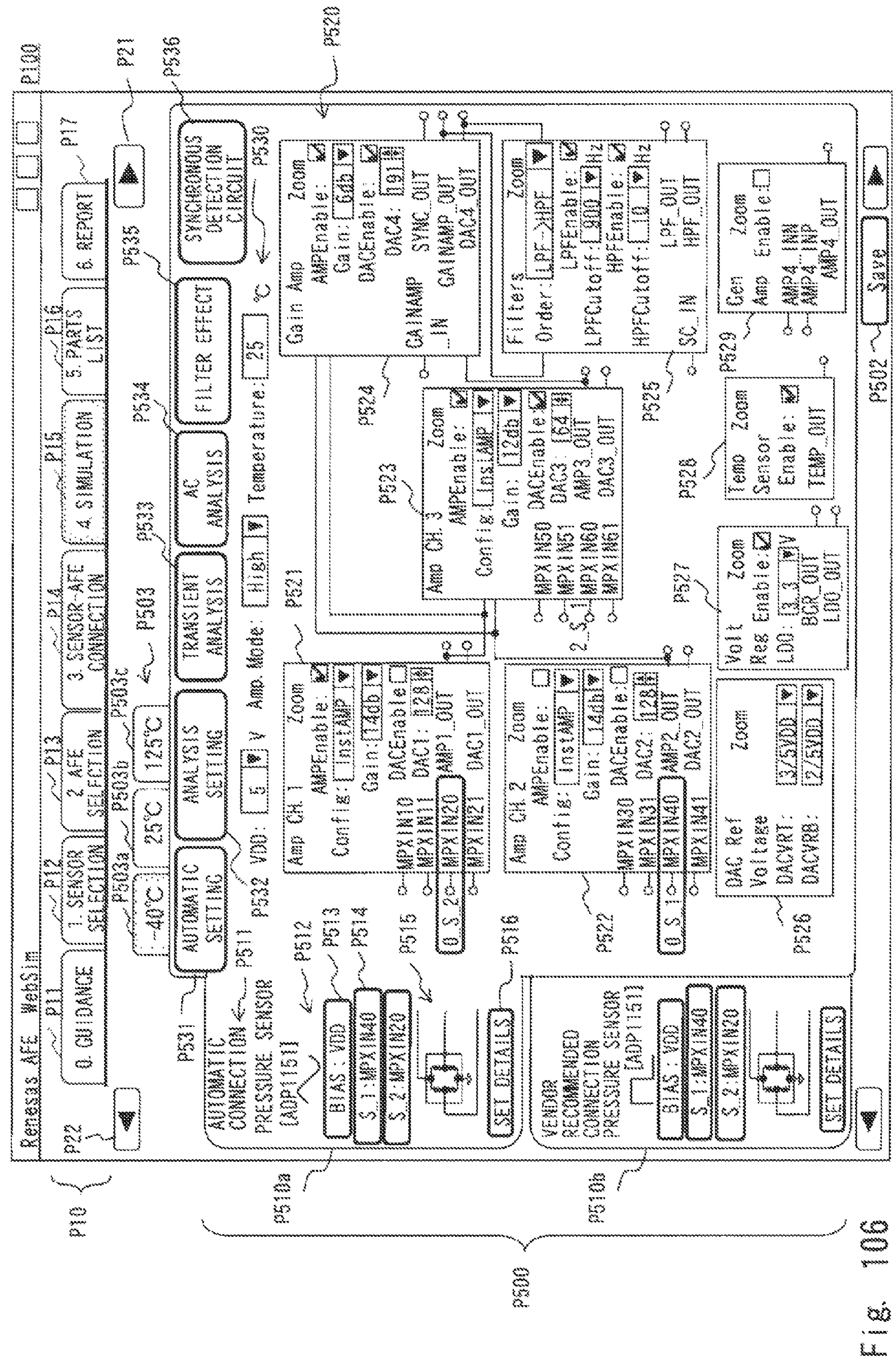

FIG. 106 shows a display example of the simulation screen P500 according to this embodiment. On the simulation screen P500, a sensor vendor or a user performs simulation for each use environment.

The simulation screen P500 of FIG. 106 has a use environment selection area P503 in its upper part, which is different from that in the first embodiment. In the use environment selection area P503, tabs to select an environment where a sensor is used are displayed. In the use environment selection area P503, tabs corresponding to the sensor characteristics registered in S102 are displayed, and "−40° C." tab P503*a*, "25° C." tab P503*b* and "125° C." tab P503*c* are displayed in the use environment selection area P503 in FIG. 106. Note that tabs to select a bias circuit may be displayed in the bias circuit selection area P501 on the simulation screen P500 just like in the first embodiment.

When the "−40° C." tab P503*a* is clicked on, it becomes a state where simulation at −400° C. can be executed. In this state, when a sensor vendor or a user clicks on the "transient analysis" button P533 or the like, simulation is executed with the sensor characteristics and connections at −40° C.

Note that, simulation results for different use environments may be displayed side by side on the report screen as described in the second embodiment.

Further, the sensor characteristics for different use environments of a plurality of sensors may be registered in bulk as described in the third embodiment. FIG. 107 shows an example of the input sensor database D110 for bulk registration. In FIG. 107, items of "unit of output", "environmental dependence", "range of dependence" and "sensor characteristics" are added compared with FIG. 91A. The type of a use environment such as temperature, distance or pressure is stored in "environmental dependence", the environmental condition to be used is stored in "range of dependence", and the sensor characteristics for each use environment are stored in "sensor characteristics". By importing such a file, it is possible to register the sensor characteristics for different use environments of a plurality of sensors at a time.

As described above, according to this embodiment, the sensor characteristics are registered for each use environment (physical environmental conditions), and the setting file is generated and simulation is performed. It is thereby possible to perform simulation with appropriate simulation conditions in accordance with the use environment, thus enabling accurate simulation.

Fifth Embodiment

Figure 108:
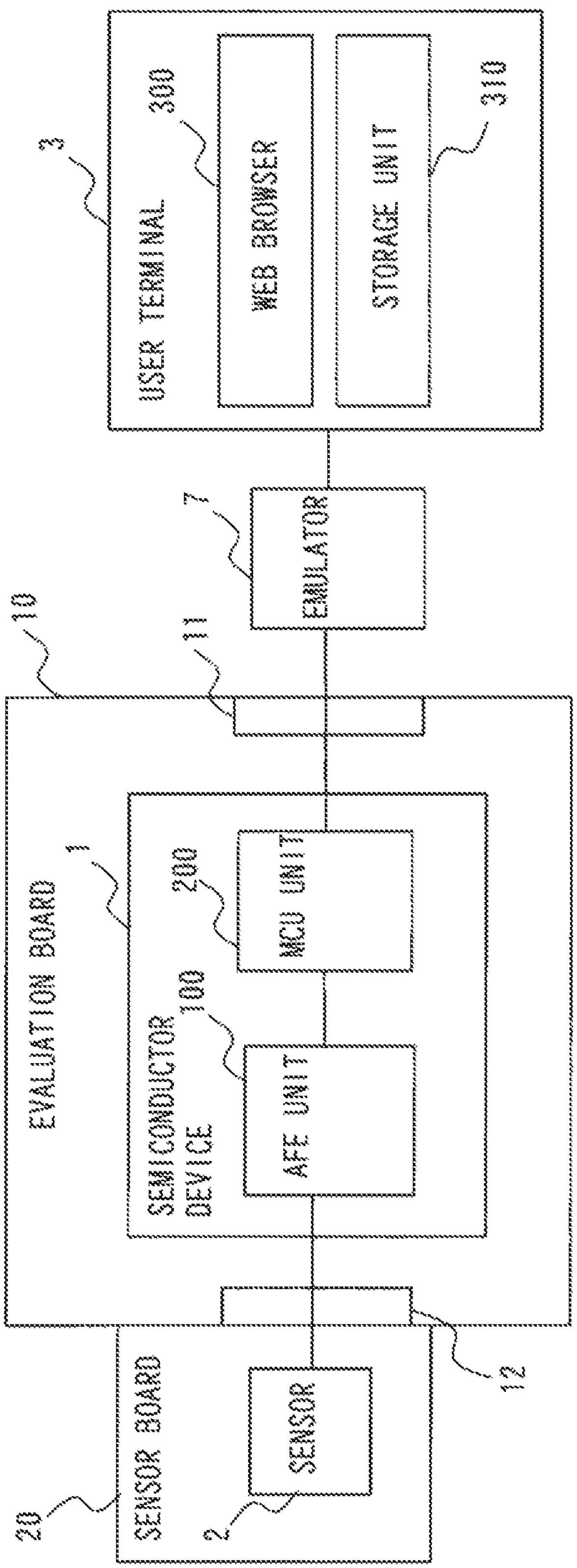

FIG. 108 shows one example of the configuration of the setting system of the semiconductor device according to this embodiment. This setting system is a system in which a user performs simulation using a sensor registered by a sensor vendor or the user and then the user terminal 3 sets register information acquired from the web simulator 4 to the semiconductor device 1 as described in the first to fourth embodiments. As shown in FIG. 108, the setting system includes an evaluation board 10 on which the semiconductor device 1 is mounted, a sensor board 20 on which the sensor 2 is mounted, the user terminal 3 and an emulator 7.

The evaluation board 10 includes an USB interface 11 and a sensor interface 12. The user terminal 3 is connected with the USB interface 11 through the emulator 7 by a USB cable, so that data can be input and output between the user terminal 3, the emulator 7 and the semiconductor device 1 via the USB interface 11. The sensor board 20 is connected by the sensor interface 12, so that data can be input and output between the sensor 2 and the semiconductor device 1 via the sensor interface 12.

The emulator 7 is connected to the MCU unit 200 of the semiconductor device 1 and emulates the MCU unit 200. By connection with the emulator 7, the user terminal 3 can write register information in the AFE unit 100 and a program in the MCU unit 200.

Figure 109:
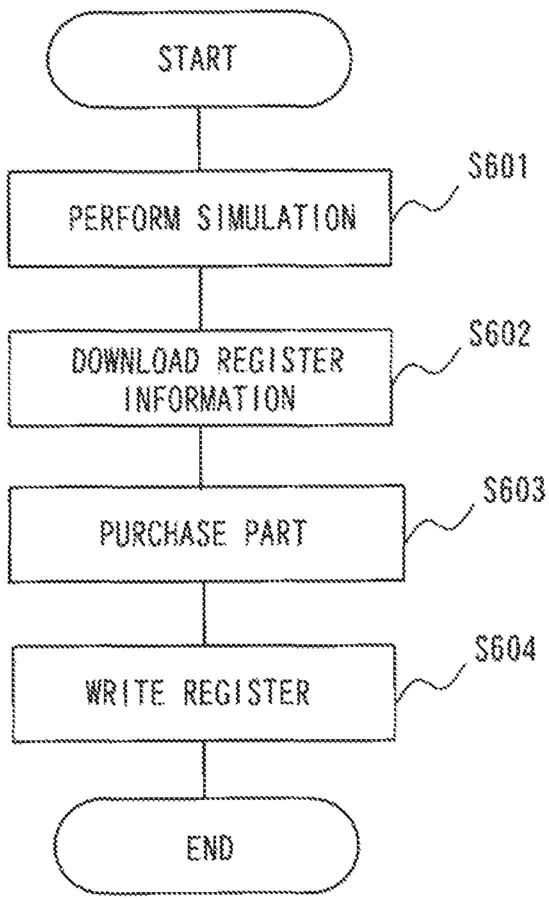

FIG. 109 shows a method of making settings of the semiconductor device 1 in the setting system of FIG. 108. First, simulation of the operation of the semiconductor device 1 is performed on the web simulator 4 as described in the first embodiment (S601). The user terminal 3 accesses the web simulator 4 and executes simulation on the web simulator 4. As described in the first embodiment, the user terminal 3 simulates the operation of the semiconductor device 1 that is set in accordance with the sensor and the bias circuit on the web simulator 4 by operating the simulation screen on the web simulator 4.

Next, the user terminal 3 downloads register information (S602). As described in the first embodiment, the user terminal 3 downloads the register information of the semiconductor device 1 that is generated in the web simulator 4 by operating the report screen on the web simulator 4. The user terminal 3 stores the downloaded register information in the storage unit 310.

Then, the user terminal 3 purchases a part (S603). As described in the first embodiment, the user terminal 3 purchases the sensor and the semiconductor device 1 for which simulation is performed from a part dealer by operating the parts list screen on the web simulator 4. The user connects the purchased sensor to the sensor board 20 and connects the semiconductor device 1 to the evaluation board 10 to thereby build the setting system shown in FIG. 108.

After that, the user terminal 3 writes the register information into the semiconductor device 1 (S604). In the built setting system of FIG. 108, the user terminal 3 writes the register information downloaded from the web simulator 4 into the register 181 of the semiconductor device 1 through the emulator 7.

The setting of the AFE unit 100 of the semiconductor device 1 thereby ends. After that, when the semiconductor device 1 is started, the configuration and characteristics of the AFE unit 100 are set by the register information written in the register 181, and the AFE unit 100 starts operation. Thus, the semiconductor device 1 can operate with the configuration for which simulation is done.

The first to fifth embodiments can be combined as desirable by one of ordinary skill in the art.

Further, a semiconductor device simulator comprising:

a sensor information storage unit that stores a plurality of sensor characteristics of a sensor to operate under certain driving conditions and a plurality of different physical environmental conditions, the plurality of sensor characteristics respectively corresponding to the plurality of physical environmental conditions;

a selection unit that selects physical environmental conditions where simulation is to be performed from the plurality of physical environmental conditions; and a simulation execution unit that executes simulation of a circuit including a sensor having the sensor characteristics corresponding to the selected physical environmental conditions and a semiconductor device having an analog front-end circuit with a variable circuit configuration.

Further, a semiconductor device simulation method comprising:

storing a plurality of sensor characteristics of a sensor to operate under certain driving conditions and a plurality of different physical environmental conditions, the plurality of sensor characteristics respectively corresponding to the plurality of physical environmental conditions, into a sensor information storage unit;

selecting physical environmental conditions where simulation is to be performed from the plurality of physical environmental conditions; and executing simulation of a circuit including a sensor having the sensor characteristics corresponding to the selected physical environmental conditions and a semiconductor device having an analog front-end circuit with a variable circuit configuration.

Further, a non-transitory computer readable medium storing a simulation program causing a computer to execute a semiconductor device simulation process, the simulation process comprising:

storing a plurality of sensor characteristics of a sensor to operate under certain driving conditions and a plurality of different physical environmental conditions, the plurality of sensor characteristics respectively corresponding to the plurality of physical environmental conditions, into a sensor information storage unit;

selecting physical environmental conditions where simulation is to be performed from the plurality of physical environmental conditions; and executing simulation of a circuit including a sensor having the sensor characteristics corresponding to the selected physical environmental conditions and a semiconductor device having an analog front-end circuit with a variable circuit configuration.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:

1. A semiconductor device simulator comprising:
- a sensor information storage unit that stores first sensor information belonging to a first access group and second sensor information belonging to a second access group;
- an account information storage unit that stores first access authorization information permitting writing of the first sensor information to the first access group and denying writing of the second sensor information to the second access group for an account belonging to the first access group;
- an access authorization specifying unit that specifies access authorization to the first access group and the second access group in accordance with an account of an accepted access by reference to the stored first access authorization information;
- a sensor writing unit that writes the first sensor information to the first access group permitted to write based on the specified access authorization in accordance with the access; and
- a simulation execution unit that executes simulation of a circuit including a sensor indicated by the written first sensor information and a semiconductor device having an analog front-end circuit with a variable circuit configuration in accordance with the access.

2. The semiconductor device simulator according to claim 1, wherein writing of the first or second sensor information includes registration or update of the first or second sensor information.

3. The semiconductor device simulator according to claim 1, comprising:
- a selection unit that selects the first sensor information of the first access group permitted to write based on the specified access authorization, wherein
- the sensor writing unit writes the selected first sensor information.

4. The semiconductor device simulator according to claim 3, wherein
- the selection unit displays the first sensor information of the first access group permitted to write and selects the first sensor information to be written in accordance with an input operation on the displayed first sensor information.

5. The semiconductor device simulator according to claim 1, wherein
- the account information storage unit stores second access authorization information permitting writing of the second sensor information to the second access group and denying writing of the first sensor information to the first access group for an account belonging to the second access group, and
- the access authorization specifying unit specifies access authorization to the first access group and the second access group by reference to the first access authorization information or the second access authorization information in accordance with the account of the accepted access.

6. The semiconductor device simulator according to claim 1, wherein
- the first access group is a group corresponding to a first sensor vendor, and
- the second access group is a group corresponding to a second sensor vendor.

7. The semiconductor device simulator according to claim 6, wherein
- the sensor writing unit writes the first sensor information in association with the first sensor vendor corresponding to the account of the access.

8. The semiconductor device simulator according to claim 1, comprising:
- a bias circuit information storage unit that stores first bias circuit information belonging to the first access group and second bias circuit information belonging to the second access group, wherein
- the first access authorization information defines access authorization that permits writing of the first bias circuit information to the first access group and denies writing of the second bias circuit information to the second access group, and
- the sensor writing unit writes the first bias circuit information to the first access group permitted to write based on the specified access authorization in accordance with the access.

9. The semiconductor device simulator according to claim 8, comprising:
- a selection unit that selects the first bias circuit information of the first access group permitted to write based on the specified access authorization, wherein
- the sensor writing unit writes the selected first bias circuit information.

10. The semiconductor device simulator according to claim 9, wherein the selection unit displays the first bias circuit information of the first access group permitted to write and selects the first bias circuit information to be written in accordance with an input operation on the displayed first bias circuit information.

11. The semiconductor device simulator according to claim 9, wherein the selection unit selects the first bias circuit information of a bias circuit connectable to the sensor indicated by the first sensor information during simulation.

12. The semiconductor device simulator according to claim 11, wherein the selection unit selects the first bias circuit information corresponding to a type of the sensor indicated by the first sensor information.

13. The semiconductor device simulator according to claim 11, wherein the selection unit selects the first bias circuit information corresponding to an output format of the sensor indicated by the first sensor information.

14. The semiconductor device simulator according to claim 8, wherein the account information storage unit stores second access authorization information permitting writing of the second bias circuit information to the second access group and denying writing of the first bias circuit information to the first access group for an account belonging to the second access group, and the access authorization specifying unit specifies access authorization to the first access group and the second access group by reference to the first access authorization information or the second access authorization information in accordance with the account of the accepted access.

15. The semiconductor device simulator according to claim 1, comprising:

a flag display unit that displays a flag indicating writing of the first sensor information when the sensor writing unit writes the first sensor information into the sensor information storage unit.

16. The semiconductor device simulator according to claim 1, comprising:

a format conversion unit that converts a format of a sensor information file input for registering the first sensor information into a format of the sensor information storage unit.

17. A semiconductor device simulation method comprising:

storing first sensor information belonging to a first access group and second sensor information belonging to a second access group into a sensor information storage unit;

storing first access authorization information permitting writing of the first sensor information to the first access group and denying writing of the second sensor information to the second access group for an account belonging to the first access group into an account information storage unit;

specifying access authorization to the first access group and the second access group in accordance with an account of an accepted access by reference to the stored first access authorization information;

writing the first sensor information to the first access group permitted to write based on the specified access authorization in accordance with the access; and executing simulation of a circuit including a sensor indicated by the written first sensor information and a semiconductor device having an analog front-end circuit with a variable circuit configuration in accordance with the access.

18. A non-transitory computer readable medium storing a simulation program causing a computer to execute a semiconductor device simulation process, the simulation process comprising:

storing first sensor information belonging to a first access group and second sensor information belonging to a second access group into a sensor information storage unit;

storing first access authorization information permitting writing of the first sensor information to the first access group and denying writing of the second sensor information to the second access group for an account belonging to the first access group into an account information storage unit;

specifying access authorization to the first access group and the second access group in accordance with an account of an accepted access by reference to the stored first access authorization information;

writing the first sensor information to the first access group permitted to write based on the specified access authorization in accordance with the access; and executing simulation of a circuit including a sensor indicated by the written first sensor information and a semiconductor device having an analog front-end circuit with a variable circuit configuration in accordance with the access.

* * * * *